US012789645B2

(12) United States Patent
Frihauf et al.

(10) Patent No.: US 12,789,645 B2
(45) Date of Patent: Nov. 10, 2026

(54) SYSTEM AND METHODS FOR BATTERY MANAGEMENT AND CONTROL OF AN ELECTRIC VEHICLE

(71) Applicant: Archer Aviation Inc., San Jose, CA (US)

(72) Inventors: Paul Frihauf, San Jose, CA (US); Anirudh Allam, San Jose, CA (US); Yalan Bi, San Jose, CA (US); Scott Forrest Furman, San Jose, CA (US); Weiyu Cao, San Jose, CA (US)

(73) Assignee: Archer Aviation Inc., San Jose, CA (US)

( * ) Notice: Subject to any disclaimer, the term of this patent is extended or adjusted under 35 U.S.C. 154(b) by 0 days.

(21) Appl. No.: 19/432,841

(22) Filed: Dec. 24, 2025

(65) Prior Publication Data

US 2026/0116253 A1 Apr. 30, 2026

Related U.S. Application Data

(63) Continuation of application No. PCT/US2024/059093, filed on Dec. 8, 2024.

(Continued)

(51) Int. Cl.

*B60L 50/60* (2019.01)
*B60L 3/00* (2019.01)

(Continued)

(52) U.S. Cl.

CPC ............. *B60L 50/60* (2019.02); *B60L 3/0046* (2013.01); *B60L 58/12* (2019.02); *B60L 58/16* (2019.02);

(Continued)

(58) Field of Classification Search

CPC .......... B60L 58/12; B60L 58/16; B60L 58/24; B64C 29/00; B64D 27/357; B64D 45/00; G01K 1/026; G01K 7/22; G01R 31/367

See application file for complete search history.

(56) References Cited

U.S. PATENT DOCUMENTS 11,828,813 B2 11/2023 Kurtz et al.
11,996,831 B2 5/2024 Culpin et al.

(Continued)

FOREIGN PATENT DOCUMENTS

CA 2897054 A1 * 7/2014 .............. H02J 7/963
CN 110171018 A * 8/2019 .............. B25J 19/00

(Continued)

OTHER PUBLICATIONS

International Search Report and Written Opinion in PCT/US2024/059093, dated Sep. 4, 2025, (13 pages).

*Primary Examiner* — Redhwan K Mawari
(74) *Attorney, Agent, or Firm* — Finnegan, Henderson, Farabow, Garrett & Dunner, LLP

(57) ABSTRACT

This disclosure relates to flight control of electric aircraft and other vehicles. A computer-implemented method for estimating available range of an aircraft in flight is disclosed, comprising: receiving electrical information of one or more batteries measured using a first sensor; estimating aircraft-level energy based on electrical information of the one or more batteries; receiving one or more of an altitude of the aircraft or a current airspeed of the aircraft measured using a second sensor; estimating a steady-state force based on the one or more of the altitude of the aircraft or the current airspeed of the aircraft; estimating one or more of a vertical landing range or a horizontal landing range based on the one or more of the estimated aircraft-level energy or the estimated steady-state force; and displaying the one or more of (Continued)

1800 the estimated vertical landing range or the estimated horizontal landing range on a display.

26 Claims, 54 Drawing Sheets

Related U.S. Application Data

(60) Provisional application No. 63/616,316, filed on Dec. 29, 2023, provisional application No. 63/608,240, filed on Dec. 9, 2023.

(51) Int. Cl.

| | |
|---|---|
| ***B60L 58/12*** | (2019.01) |
| ***B60L 58/16*** | (2019.01) |
| ***B60L 58/24*** | (2019.01) |
| ***B64C 29/00*** | (2006.01) |
| ***B64D 27/34*** | (2024.01) |
| ***B64D 27/357*** | (2024.01) |
| ***B64D 31/16*** | (2024.01) |
| ***B64D 43/00*** | (2006.01) |
| ***B64D 45/00*** | (2006.01) |
| ***G01K 1/02*** | (2021.01) |
| ***G01K 7/22*** | (2006.01) |
| ***G01R 31/367*** | (2019.01) |
| ***G01R 31/374*** | (2019.01) |
| ***G01R 31/3842*** | (2019.01) |
| ***G01R 31/396*** | (2019.01) |
| ***G05D 1/654*** | (2024.01) |
| *G05D 109/22* | (2024.01) |

(52) U.S. Cl.

CPC .............. *B60L 58/24* (2019.02); *B64C 29/00* (2013.01); *B64D 27/34* (2024.01); *B64D 27/357* (2024.01); *B64D 31/16* (2024.01); *B64D 43/00* (2013.01); *B64D 45/00* (2013.01); *G01K 1/026* (2013.01); *G01K 7/22* (2013.01); *G01R 31/367* (2019.01); *G01R 31/374* (2019.01); *G01R 31/3842* (2019.01); *G01R 31/396* (2019.01); *G05D 1/6546* (2024.01); *B60L 2200/10* (2013.01); *B60L 2210/42* (2013.01); *B60L 2240/12* (2013.01); *B60L 2240/545* (2013.01); *B60L 2240/547* (2013.01); *B60L 2240/549* (2013.01); *B60L 2240/662* (2013.01); *B60L 2250/16* (2013.01); *B60L 2260/26* (2013.01); *B64D 2045/0085* (2013.01); *G05D 2109/23* (2024.01)

(56) References Cited

U.S. PATENT DOCUMENTS

| | | | | |
|---|---|---|---|---|
| 12,188,985 | B2 | 1/2025 | Kurtz et al. | |
| 2014/0062494 | A1* | 3/2014 | Lin | H01M 10/482 324/434 |
| 2014/0097290 | A1 | 4/2014 | Leng | |
| 2014/0372053 | A1* | 12/2014 | Lin | B60L 58/16 702/63 |
| 2016/0018472 | A1* | 1/2016 | Sung | G01R 31/367 702/63 |
| 2016/0363629 | A1* | 12/2016 | Frost | B60W 30/188 |
| 2017/0045587 | A1* | 2/2017 | Kim | H01M 10/482 |
| 2017/0363690 | A1* | 12/2017 | Kawamura | G01R 31/3648 |
| 2019/0202432 | A1* | 7/2019 | Kim | B60W 20/13 |
| 2022/0011782 | A1 | 1/2022 | Veble et al. | |
| 2022/0065940 | A1* | 3/2022 | Sudarsan | G01R 31/392 |
| 2022/0229114 | A1* | 7/2022 | Altaf | B60L 3/12 |
| 2022/0250508 | A1* | 8/2022 | Donovan | B60L 3/0046 |
| 2022/0268842 | A1 | 8/2022 | Kurtz et al. | |
| 2022/0302737 | A1* | 9/2022 | Ohishi | B60L 53/20 |
| 2023/0008268 | A1* | 1/2023 | Bansal | G06N 5/022 |
| 2023/0219458 | A1 | 7/2023 | Altaf et al. | |
| 2023/0296681 | A1* | 9/2023 | Sung | G01R 31/367 702/63 |
| 2023/0384801 | A1* | 11/2023 | Henck | B64C 29/0025 |
| 2024/0053403 | A1* | 2/2024 | Wang | G01R 31/367 |
| 2024/0248144 | A1* | 7/2024 | Fedorova | G01R 31/387 |

FOREIGN PATENT DOCUMENTS

| | | | | | |
|---|---|---|---|---|---|
| CN | 106886003 | B | * | 4/2020 | G01R 35/00 |
| CN | 112366796 | A | * | 2/2021 | H02J 7/80 |
| CN | 113826019 | A | * | 12/2021 | H02J 7/82 |
| CN | 115828032 | A | * | 3/2023 | |
| DE | 102020113498 | A1 | | 11/2021 | |
| EP | 2975421 | A1 | * | 1/2016 | B60L 58/10 |
| EP | 3998667 | A1 | | 5/2022 | |
| EP | 4295432 | A1 | | 12/2023 | |
| KR | 20230135537 | A | | 9/2023 | |
| WO | WO-2022076827 | A1 | * | 4/2022 | H02J 7/82 |
| WO | 2022175055 | A1 | | 8/2022 | |
| WO | 2025122995 | A2 | | 6/2025 | |

* cited by examiner

1600A

3600C

3600D

Descent Rate v. Airspeed

3600E

SYSTEM AND METHODS FOR BATTERY MANAGEMENT AND CONTROL OF AN ELECTRIC VEHICLE

CROSS-REFERENCE TO RELATED APPLICATIONS

This application is a continuation of and claims the benefit of priority to International Patent Application No. PCT/US2024/059093 filed on Dec. 8, 2024, which claims priority to U.S. Provisional Application No. 63/616,316, titled "BATTERY MANAGEMENT SYSTEM," filed Dec. 29, 2023, and to U.S. Provisional Application No. 63/608,240, titled "SYSTEMS AND METHODS FOR CONTROLLED EMERGENCY LANDING OF AN ELECTRIC VERTICAL AND TAKE-OFF LANDING AIRCRAFT," filed Dec. 9, 2023. The entire contents of the aforementioned applications are incorporated by reference herein for all purposes.

TECHNICAL FIELD

This disclosure relates generally to powered aerial vehicles. More particularly, and without limitation, the present disclosure relates to innovations in aircraft driven by electric propulsion systems. Certain aspects of the present disclosure generally relate to systems and methods for battery management and control of aircraft driven by electric propulsion systems and in other types of vehicles, as well as aircraft in flight simulators and video games. Other aspects of the present disclosure generally relate to improvements in battery state estimation, range estimation, and controlled emergency landing systems and methods that provide particular advantages in aerial vehicles and may be used in other types of vehicles.

BACKGROUND

The inventors have recognized several problems that may be associated with flight control of an aircraft, including a tilt-rotor aircraft, that uses electric or hybrid-electric propulsion systems (hereinafter referred to as electric propulsion units or "EPUs"). Many conventional aircraft, such as an airplane or helicopter, typically use fuel to power the aircraft. If a conventional aircraft runs out of fuel while in the air and is no longer able to self-generate thrust, a pilot may still be able to control or stabilize the vehicle as it descends using a combination of reserve hydraulic power for control surface actuators, the kinetic energy of the vehicle, and the air moving around the vehicle. For a conventional helicopter that has run out of fuel, the pilot may perform autorotation by putting the helicopter in a steep descent which creates an upward flow of air through the rotor. Further, as the helicopter is closer to the ground, hydraulic control may allow the pilot to flare the helicopter by raising the collective. For a conventional aircraft that has run out of fuel, the pilot may glide off the wings and use hydraulic control to adjust the control surfaces, and flare before landing to soften and control impact to ground.

In contrast with conventional aircraft, an electric aircraft may use stored electric energy for both thrust and control of flight elements. In such scenarios, a complete loss of electrical energy could make the aircraft uncontrollable. Therefore, unlike conventional aircraft, declaring an emergency upon full loss of power, rather than before, may be detrimental to the aircraft and flight safety.

While in use, it is critical for an electric vehicle, especially an aircraft, to have an accurate estimation of battery states, including remaining energy. This estimation is necessary to ensure the vehicle can perform necessary operations, such as reaching a desired destination safely and, if necessary, perform an emergency landing operation in a controlled manner, for example when an aircraft operational capacity is diminished, before running out of energy. Electric or hybrid-electric aircraft, however, may be architecturally and functionally complex, requiring sophisticated methods for energy estimation. For example, some aircraft may have multiple components of the same type, such as batteries and engines, which may have complex configurations requiring careful understanding and management that a pilot cannot apply during flight. Also, electric or hybrid-electric aircraft, including those with vertical take-off and landing capabilities or distributed propulsions systems, may utilize one or more electric power sources to provide an amount of energy to one or more engines, thus requiring more advanced techniques for range estimation and controlled emergency landing operations. These techniques, as described herein, may also be used to provide similar benefits to conventional aircraft and other electric or hybrid-electric vehicles.

Further, electric and hybrid-electric aircraft may require different, advanced techniques for monitoring and tracking the state of their power sources (e.g., battery packs). For example, each battery pack and its associated battery cells have a number of important states that require regular monitoring and estimation, including state of charge and state of energy. However, due to the architectural and functional complexities of electric aircraft influenced by certain design considerations, estimating battery state information may require more sophisticated methods. For example, soft shorts in the high voltage circuitry can be difficult to detect and can influence battery state information.

SUMMARY

The present disclosure relates generally to flight control of electric aircraft and other powered aerial vehicles. More particularly, and without limitation, the present disclosure relates to innovations in tilt-rotor aircraft that use electrical propulsion systems. For example, certain aspects of the present disclosure relate to systems and methods for energy estimation for an electric vehicle. Further, certain embodiments related to systems and methods for range estimation and controlled emergency landing operations for an electric vehicle.

Disclosed embodiments may include battery management functions. For example, battery management functions may include battery state estimation functions. Due to the complexities and design constraints of an electric or hybrid-electric aircraft, management, including monitoring, of the state of each battery is critical to safe operation of the aircraft. These states may include the temperature, charge, energy, power, and/or health of the battery pack, which may provide advanced insight into aircraft system operation, allowing for aircraft processing devices to make more intelligent decisions to maintain safety, energy efficiency, and longevity of the aircraft and its constituent components. For example, the battery states are utilized by control law algorithms to operate various elements (e.g., control surfaces, EPUs). By utilizing one or more advanced estimation methods, processes, and/or algorithms, the states of the battery can be accurately estimated.

Disclosed embodiments may include a range estimation function. Further, disclosed embodiments may include a controlled emergency landing function. For example, embodiments of the present disclosure provide safety functions that ensure sufficient energy is always available to control an electric aircraft, including for a controlled emergency landing that provides reasonable chance of occupant survival. The present disclosure solves this and other problems by, among other things, determining a battery level threshold level at which an emergency needs to be declared. Further, there may be situations where the pilot is not paying attention, does not understand the gravity of the situation, or is otherwise unable to control the aircraft to the ground upon reaching the battery level threshold. The present disclosure solves this problem, and others, by controlling the aircraft into a descent to ensure sufficient battery is maintained to land the aircraft. Further, some electric aircraft may have different modes of operation (e.g., wing-borne flight or powered lift), and the determination of an emergency and the best means to control the aircraft may vary based on the mode of operation. The present disclosure solves this problem, and others, by considering the mode of operation when determining an emergency and selecting a mode of operation to perform the controlled emergency landing. Finally, a pilot may desire to perform an emergency landing in a different mode of operation than the one the aircraft is currently in. The present disclosure solves this problem, and others, by allowing the pilot, and controlling the aircraft, to perform a controlled emergency landing in a different mode of operation.

One aspect of the present disclosure comprises a computer-implemented method for estimating available range of an aircraft in flight, the method comprising: receiving, using the at least one hardware processor, electrical information of one or more batteries measured using a first sensor; estimating, using the at least one hardware processor, an aircraft-level energy based on electrical information of the one or more batteries; receiving, using the at least one hardware processor, one or more of an altitude of the aircraft or a current airspeed of the aircraft measured using a second sensor; estimating, using the at least one hardware processor, a steady-state force based on the one or more of the altitude of the aircraft or the current airspeed of the aircraft; estimating, using the at least one hardware processor, one or more of a vertical landing range or a horizontal landing range based on the one or more of the estimated aircraft-level energy or the estimated steady-state force; and displaying, using the at least one hardware processor, the one or more of the estimated vertical landing range or the estimated horizontal landing range on a display.

Another aspect of the present disclosure comprises a non-transitory computer-readable medium storing instructions that, when executed by at least one processor, cause the at least one process to perform operations comprising: receiving, using the at least one hardware processor, electrical information of one or more batteries measured using a first sensor; estimating, using the at least one hardware processor, an aircraft-level energy based on electrical information of the one or more batteries; receiving, using the at least one hardware processor, one or more of an altitude of the aircraft or a current airspeed of the aircraft measured using a second sensor; estimating, using the at least one hardware processor, a steady-state force based on the one or more of the altitude of the aircraft or the current airspeed of the aircraft; estimating, using the at least one hardware processor, one or more of a vertical landing range or a horizontal landing range based on the one or more of the estimated aircraft-level energy or the estimated steady-state force; and displaying, using the at least one hardware processor, the one or more of the estimated vertical landing range or the estimated horizontal landing range on a display.

Another aspect of the present disclosure comprises a system for estimating available range of an aircraft in flight, the system comprising: at least one processor; and at least one non-transitory computer-readable medium containing instructions that, when executed by the at least one processor, causes the at least one processor to perform operations comprising: receiving, using the at least one hardware processor, electrical information of one or more batteries measured using a first sensor; estimating, using the at least one hardware processor, an aircraft-level energy based on electrical information of the one or more batteries; receiving, using the at least one hardware processor, one or more of an altitude of the aircraft or a current airspeed of the aircraft measured using a second sensor; estimating, using the at least one hardware processor, a steady-state force based on the one or more of the altitude of the aircraft or the current airspeed of the aircraft; estimating, using the at least one hardware processor, one or more of a vertical landing range or a horizontal landing range based on the one or more of the estimated aircraft-level energy or the estimated steady-state force; and displaying, using the at least one hardware processor, the one or more of the estimated vertical landing range or the estimated horizontal landing range on a display.

Another aspect of the present disclosure comprises an aircraft, the aircraft comprising: at least one processor; and at least one non-transitory computer-readable medium containing instructions that, when executed by the at least one processor, causes the at least one processor to perform operations comprising: receiving, using the at least one hardware processor, electrical information of one or more batteries measured using a first sensor; estimating, using the at least one hardware processor, an aircraft-level energy based on electrical information of the one or more batteries; receiving, using the at least one hardware processor, one or more of an altitude of the aircraft or a current airspeed of the aircraft measured using a second sensor; estimating, using the at least one hardware processor, a steady-state force based on the one or more of the altitude of the aircraft or the current airspeed of the aircraft; estimating, using the at least one hardware processor, one or more of a vertical landing range or a horizontal landing range based on the one or more of the estimated aircraft-level energy or the estimated steady-state force; and displaying, using the at least one hardware processor, the one or more of the estimated vertical landing range or the estimated horizontal landing range on a display.

Another aspect of the present disclosure comprises a computer-implemented method for controlled emergency landing of an aircraft, the method comprising: receiving, using at least one hardware processor, a current airspeed of the aircraft measured using at least one sensor; receiving, using the at least one hardware processor, a battery level of the aircraft, the battery level of the aircraft being based on respective battery states of multiple battery packs, the respective battery states being based on measurements of dynamic electrical information of the multiple battery packs; determining, using the at least one hardware processor, at least one threshold battery level to perform an emergency landing based on the current airspeed of the aircraft; determining, using the at least one hardware processor, if the received battery level is below the at least one threshold battery level; and based on determining the received battery level is below the at least one threshold battery level, performing, using the at least one hardware processor, one or more of: controlling a descent rate of the aircraft while permitting a pilot maneuver; or outputting an alert.

Another aspect of the present disclosure comprises a non-transitory computer-readable medium storing instructions that, when executed by at least one processor, cause the at least one process to perform operations comprising: receiving, using at least one hardware processor, a current airspeed of the aircraft measured using at least one sensor; receiving, using the at least one hardware processor, a battery level of the aircraft, the battery level of the aircraft being based on respective battery states of multiple battery packs, the respective battery states being based on measurements of dynamic electrical information of the multiple battery packs; determining, using the at least one hardware processor, at least one threshold battery level to perform an emergency landing based on the current airspeed of the aircraft; determining, using the at least one hardware processor, if the received battery level is below the at least one threshold battery level; and based on determining the received battery level is below the at least one threshold battery level, performing, using the at least one hardware processor, one or more of: controlling a descent rate of the aircraft while permitting a pilot maneuver; or outputting an alert.

Another aspect of the present disclosure comprises a system for controlled emergency landing of an aircraft, the system comprising: at least one processor; and at least one non-transitory computer-readable medium containing instructions that, when executed by the at least one processor, causes the at least one processor to perform operations comprising: receiving, using at least one hardware processor, a current airspeed of the aircraft measured using at least one sensor; receiving, using the at least one hardware processor, a battery level of the aircraft, the battery level of the aircraft being based on respective battery states of multiple battery packs, the respective battery states being based on measurements of dynamic electrical information of the multiple battery packs; determining, using the at least one hardware processor, at least one threshold battery level to perform an emergency landing based on the current airspeed of the aircraft; determining, using the at least one hardware processor, if the received battery level is below the at least one threshold battery level; and based on determining the received battery level is below the at least one threshold battery level, performing, using the at least one hardware processor, one or more of: controlling a descent rate of the aircraft while permitting a pilot maneuver; or outputting an alert.

Another aspect of the present disclosure comprises an aircraft, the aircraft comprising: at least one processor; and at least one non-transitory computer-readable medium containing instructions that, when executed by the at least one processor, causes the at least one processor to perform operations comprising: receiving, using at least one hardware processor, a current airspeed of the aircraft measured using at least one sensor; receiving, using the at least one hardware processor, a battery level of the aircraft, the battery level of the aircraft being based on respective battery states of multiple battery packs, the respective battery states being based on measurements of dynamic electrical information of the multiple battery packs; determining, using the at least one hardware processor, at least one threshold battery level to perform an emergency landing based on the current airspeed of the aircraft; determining, using the at least one hardware processor, if the received battery level is below the at least one threshold battery level; and based on determining the received battery level is below the at least one threshold battery level, performing, using the at least one hardware processor, one or more of: controlling a descent rate of the aircraft while permitting a pilot maneuver; or outputting an alert.

Another aspect of the present disclosure comprises a computer-implemented method for estimating a battery state for a vehicle, the method comprising: determining, using at least one hardware processor, a first state estimation of at least one battery component using a first estimation method, wherein first state estimation is based on measurements of dynamic electrical information of at least one battery component; determining, using the at least one hardware processor, a second state estimation of the at least one battery component using a second estimation method different from the first estimation method; and transmitting, using the at least one hardware processor, the first and second state estimations to a vehicle processor of the vehicle, wherein the vehicle processor is configured to perform one or more of: causing display of information based on the first state estimation and the second state estimation; or changing, based on the first state estimation and the second state estimation, a vehicle operation.

Another aspect of the present disclosure comprises a non-transitory computer-readable medium storing instructions that, when executed by at least one processor, cause the at least one process to perform operations comprising: determining, using at least one hardware processor, a first state estimation of at least one battery component using a first estimation method, wherein first state estimation is based on measurements of dynamic electrical information of at least one battery component; determining, using the at least one hardware processor, a second state estimation of the at least one battery component using a second estimation method different from the first estimation method; and transmitting, using the at least one hardware processor, the first and second state estimations to a vehicle processor of the vehicle, wherein the vehicle processor is configured to perform one or more of: causing display of information based on the first state estimation and the second state estimation; or changing, based on the first state estimation and the second state estimation, a vehicle operation.

Another aspect of the present disclosure comprises a battery management unit (BMU) for an electric vehicle, comprising: at least one processor; and at least one non-transitory computer-readable medium containing instructions that, when executed by the at least one processor, causes the at least one processor to perform operations comprising: determining, using at least one hardware processor, a first state estimation of at least one battery component using a first estimation method, wherein first state estimation is based on measurements of dynamic electrical information of at least one battery component; determining, using the at least one hardware processor, a second state estimation of the at least one battery component using a second estimation method different from the first estimation method; and transmitting, using the at least one hardware processor, the first and second state estimations to a vehicle processor of the vehicle, wherein the vehicle processor is configured to perform one or more of: causing display of information based on the first state estimation and the second state estimation; or changing, based on the first state estimation and the second state estimation, a vehicle operation.

Another aspect of the present disclosure comprises a battery pack for an electric vehicle, comprising: at least one battery cell; at least one processor; and at least one non-transitory computer-readable medium storing instructions that, when executed by at least one processor, cause the at least one process to perform operations comprising: determining, using at least one hardware processor, a first state estimation of at least one battery component using a first estimation method, wherein first state estimation is based on measurements of dynamic electrical information of at least one battery component; determining, using the at least one hardware processor, a second state estimation of the at least one battery component using a second estimation method different from the first estimation method; and transmitting, using the at least one hardware processor, the first and second state estimations to a vehicle processor of the vehicle, wherein the vehicle processor is configured to perform one or more of: causing display of information based on the first state estimation and the second state estimation; or changing, based on the first state estimation and the second state estimation, a vehicle operation.

Yet another aspect of the present disclosure comprises an aircraft, comprising: a battery pack including at least one battery cell; at least one processor; and at least one non-transitory computer-readable medium containing instructions that, when executed by the at least one processor, causes the at least one processor to perform operations comprising: determining, using at least one hardware processor, a first state estimation of at least one battery component using a first estimation method, wherein first state estimation is based on measurements of dynamic electrical information of at least one battery component; determining, using the at least one hardware processor, a second state estimation of the at least one battery component using a second estimation method different from the first estimation method; and transmitting, using the at least one hardware processor, the first and second state estimations to a vehicle processor of the vehicle, wherein the vehicle processor is configured to perform one or more of: causing display of information based on the first state estimation and the second state estimation; or changing, based on the first state estimation and the second state estimation, a vehicle operation.

DETAILED DESCRIPTION

Figure 1:
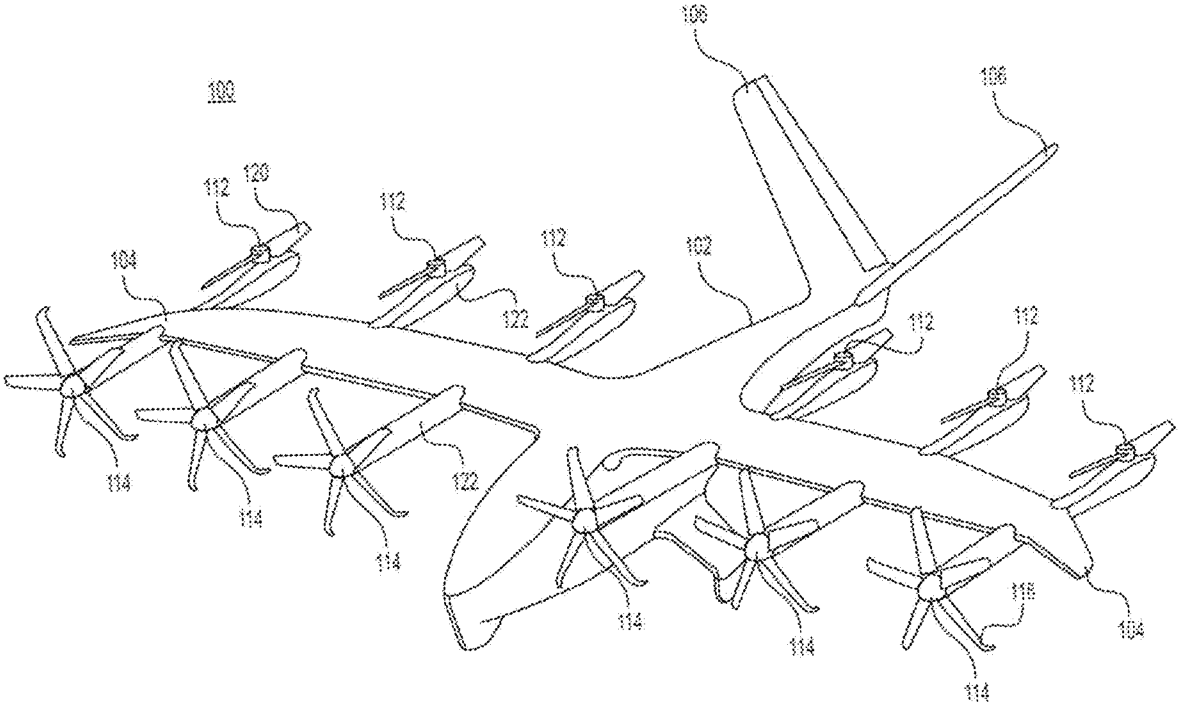
FIG. 1 illustrates an exemplary VTOL aircraft, consistent with disclosed embodiments.

The present disclosure addresses systems, components, and techniques primarily for use in an aircraft. The aircraft may be an aircraft with a pilot, an aircraft without a pilot (e.g., a UAV), a drone, a helicopter, and/or an airplane. An aircraft includes a physical body and one or more components (e.g., a wing, a tail, a propeller) configured to allow the aircraft to fly. The aircraft may include any configuration that includes at least one propeller. In some embodiments, the aircraft is driven (e.g., provided with thrust) by one or more electric propulsion systems (hereinafter referred to as electric propulsion units or "EPUs"), which may include at least one engine, at least one rotor, at least one propeller, or any combination thereof. The aircraft may be fully electric, hybrid, or gas powered. For example, in some embodiments, the aircraft is a tilt-rotor aircraft configured for frequent (e.g., over 50 flights per work day), short-duration flights (e.g., less than 160 km or 100 miles per flight) over, into, and out of densely populated regions. The aircraft may be configured to carry 4-6 passengers or commuters who have an expectation of a comfortable experience with low noise and low vibration. Accordingly, it is desirable to provide accurate battery state estimations (e.g., SOE estimation for range estimation or controlled emergency landing operations) to improve electric vehicle performance (e.g., increase safety, fuel efficiency).

Disclosed embodiments provide new and improved configurations of aircraft components, some of which are not observed in conventional aircraft, and/or identified design criteria for components that differ from those of conventional aircraft. Such alternate configurations and design criteria, in combination addressing drawbacks and challenges with conventional components, yielded the embodiments disclosed herein for various configurations and designs of components for an aircraft (e.g., electric aircraft or hybrid-electric aircraft) driven by a propulsion system.

In some embodiments, the aircraft driven by a propulsion system of the present disclosure may be designed to be capable of both vertical and conventional takeoff and landing, with a distributed propulsion system enabling vertical flight, horizontal and lateral flight, and transition (e.g., transitioning between vertical flight and horizontal flight). The aircraft may generate thrust by supplying high voltage electrical power to a plurality of EPUs of the distributed propulsion system, which may include components to convert the high voltage electrical power into mechanical shaft power to rotate a propeller.

Embodiments may include an electric engine (e.g., motor) connected to an onboard electrical power source, which may include a device capable of storing energy such as a battery or capacitor, and may optionally include one or more systems for harnessing or generating electricity such as a fuel powered generator or solar panel array. In some embodiments, the aircraft may comprise a hybrid aircraft configured to use at least one of an electric-based energy source or a fuel-based energy source to power the distributed propulsion system. In some embodiments, the aircraft may be powered by one or more batteries, internal combustion engines (ICE), generators, turbine engines, or ducted fans. An engine may constitute or be part of an EPU, as discussed above.

The EPUs may be mounted directly to the wing, or mounted to one or more booms attached to the wing. The amount of thrust each EPU generates may be governed by a torque command from a Flight Control System (FCS) over a digital communication interface to each EPU Embodiments may include forward EPUs (and associated propellers) that are capable of altering their orientation, or tilt.

The EPUs may rotate the propellers in a clockwise or counterclockwise direction. In some embodiments, the difference in propeller rotation direction may be achieved using the direction of EPU rotation. In other embodiments, the EPUs may all rotate in the same direction, and gearing may be used to achieve different propeller rotation directions.

In some embodiments, an aircraft may possess quantities of EPUs in various combinations of forward and aft EPU configurations. A forward EPU may be considered an EPU that is positioned predominantly towards the leading edge of a wing. An aft EPU may be considered an EPU that is positioned predominantly towards the trailing edge of a wing. For example, an aircraft may possess six forward and six aft EPUs, five forward and five aft EPUs, four forward and four aft EPUs, three forward and three aft EPUs, two forward and two aft EPUs, or any other combination of forward and aft EPUs, including embodiments where the number of forward EPUs and aft EPUs are not equivalent.

In some embodiments, for a vertical takeoff and landing (VTOL) mission, the forward and aft EPUs may provide vertical thrust during takeoff and landing. During flight phases where the aircraft is moving forward, the forward EPUs may provide horizontal thrust, while the propellers of the aft EPUs may be stowed at a fixed position in order to minimize drag. The aft EPUs may be actively stowed with position monitoring.

Transition from vertical flight to horizontal flight and vice-versa may be accomplished via the tilt propeller subsystem. The tilt propeller subsystem may redirect thrust between a primarily vertical direction during vertical flight phase (e.g., hover-phase) to a horizontal or near-horizontal direction during a forward-flight cruising phase, based on a tilt of one or more propellers (e.g., determining directionality of one or more propellers). A variable pitch mechanism may change the forward engine's propeller-hub assembly blade collective angles for operation during phases of flight, such as a hover-phase, transition phase, and cruise-phase. Vertical lift may be thrust in a primarily vertical direction (e.g., during a hover-phase). Horizontal thrust may be thrust in a primarily horizontal direction (e.g., during a cruise-phase).

In some embodiments, a "phase of flight," or "flight mode," (e.g., hover, cruise, forward flight, takeoff, landing, transition) may be defined by a combination flight conditions (e.g., a combination of flight conditions within particular ranges), which may include one or more of an airspeed (e.g., of the aircraft), altitude, pitch angle (e.g., of the aircraft), tilt angle (e.g., of one or more propellers), roll angle, rotation speed (e.g., of a propeller), torque value, pilot command, or any other value indicating a current or requested (e.g., commanded) state of at least part of the aircraft. Additionally or alternatively, in some embodiments, flight mode may include a mode for landing (e.g., conventional, wing-borne landing; vertical, thrust-borne landing).

In some embodiments, in a conventional takeoff and landing (CTOL) mission, the forward EPUs may provide horizontal thrust for wing-borne take-off, cruise, and landing, and the wings may provide vertical lift. In some embodiments, the aft EPUs may not be used for generating thrust during a CTOL mission and the aft propellers may be stowed in place. In other embodiments, the aft EPUs may be used at reduced power to shorten the length of the CTOL takeoff or landing. In some embodiments, a "conventional takeoff" may also be referred to and considered as a horizontal takeoff (and vice versa), and may include the aircraft taking off with at least a threshold amount of lift provided by the wings, which may be a greater amount of lift than the wings provide during a vertical takeoff, where more lift may be provided by EPUs. Similarly, a "conventional landing" may also be referred to and considered as a horizontal landing, and may include the aircraft landing with at least a threshold amount of lift provided by the wings, which may be a greater amount of lift than the wings provide during a vertical landing, where more lift may be provided by EPUs. These terms may also apply to larger phrases in which the same terms appear. For example, a "conventional landing range" may also be referred to and considered as a "horizonal landing range" (and vice versa).

As detailed herein, embodiments may be implemented in electric or hybrid-electric vehicles (e.g., including the exemplary aircraft detailed herein). The battery state estimation embodiments may be utilized by one or more processors of the electric vehicle to perform operations. For example, state of temperature (SOT), state of charge (SOC), state of energy (SOE), state of power (SOP), and/or state of health (SOH) estimations may be performed by at least one processor (e.g., BMU) for one or more power sources (e.g., battery pack) of the vehicle. The state estimations may be used, for example, as inputs to a control law algorithm and/or used to determine information that is displayed to a user (e.g., driver, pilot) of the vehicle. Additionally, accurately estimating the available or remaining energy of the one or more power sources of an electric vehicle is critical to the safety and operation of the electric vehicle. For example, an accurate SOE estimation may provide a user of the vehicle with a range estimation. As another example, a battery state estimation may be used to provide vehicle control systems and/or a pilot with updated information about the capabilities of the aircraft based on its battery components. Furthermore, an accurate SOE estimation may be used to determine when to execute controlled emergency landing operations.

In some embodiments, an aircraft of any of the disclosed embodiments may be simulated. For example, the aircraft may be simulated in a simulation environment, such as in a simulator (e.g., a simulator for flight training), a testing simulation environment, or a virtual environment in a video game. Additionally or alternatively, in some embodiments, at least one device of an aircraft may be simulated. For example, the at least one device (e.g., EPU, display wing, effector, and/or actuator, etc.) may be simulated in a simulation environment, such as in a simulator (e.g., a simulator for flight training), a simulated testing environment, or a virtual environment in a video game. A representation of the simulated display may be displayed on at least one display device (e.g., monitor, tablet, smartphone, computer screen, or any other display device) operatively connected to at least one processor configured to execute software code stored in a storage medium for performing flight controls operations, such as those further detailed below. To the extent that any of the disclosed embodiments describe functionality with respect to a real aircraft using sensors, actuators, aircraft structures or other aircraft components, this disclosure contemplates equivalent simulated and virtual aircraft embodiments in which similar or identical functionality may be enabled by using equivalent sensors, actuators, or other hardware components in the simulated/virtual embodiment, by modeling the described functionality using one or more software modules, or by a combination of such hardware and software. Persons having ordinary skill in the art would be able to make and use such functionalities in equivalent simulated/virtual embodiments using known hardware sensors and/or actuators and known software modeling techniques.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims.

Figure 2:
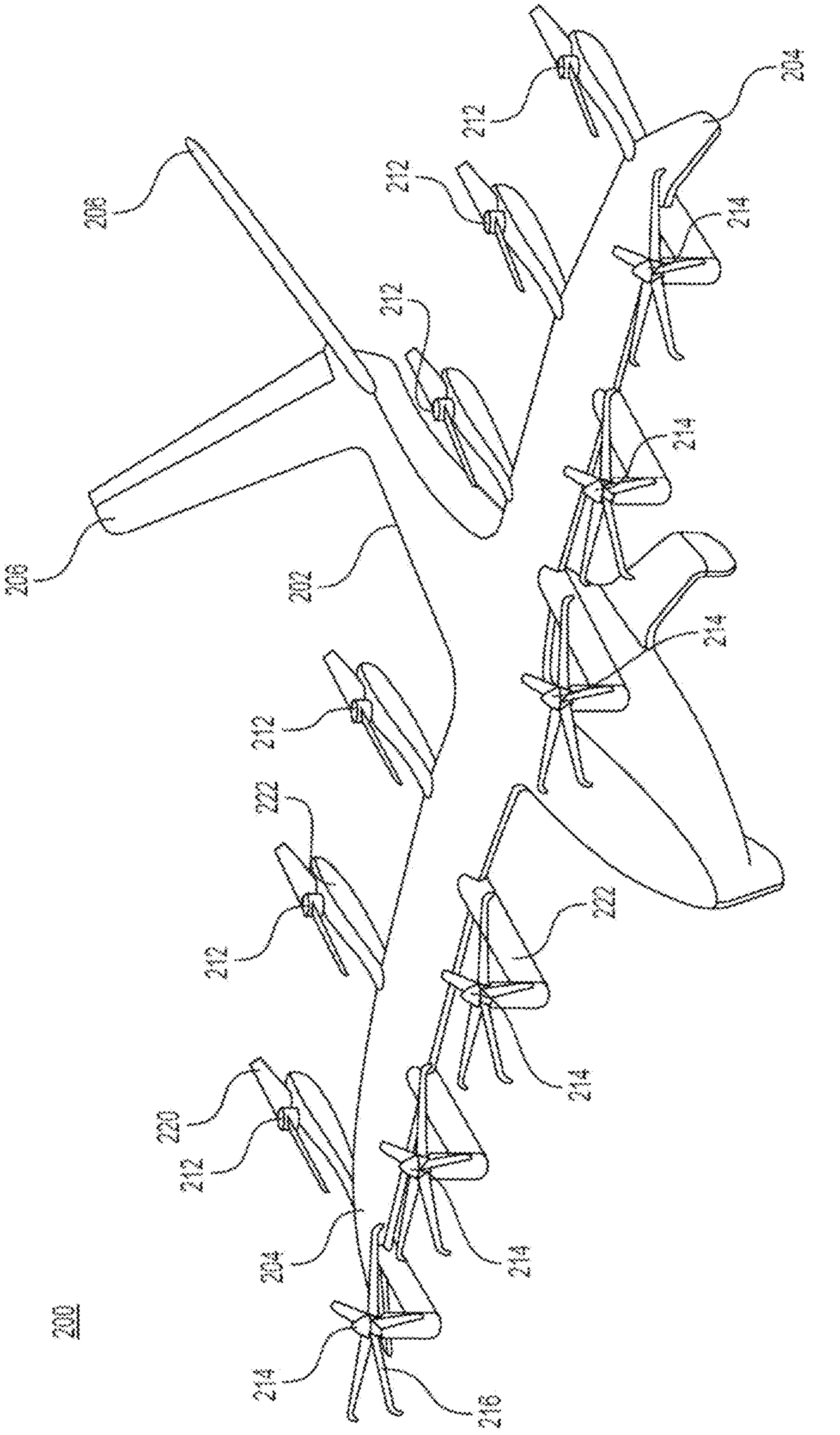
FIG. 2 illustrates an exemplary VTOL aircraft, consistent with disclosed embodiments.

FIG. 1 is an illustration of a perspective view of an exemplary VTOL aircraft, consistent with disclosed embodiments. FIG. 2 is another illustration of a perspective view of an exemplary VTOL aircraft in an alternative configuration, consistent with embodiments of the present disclosure. FIGS. 1 and 2 illustrate a VTOL aircraft 100, 200 in a cruise configuration and a vertical take-off, landing and hover configuration (also referred to herein as a "lift" configuration), respectively, consistent with embodiments of the present disclosure. Elements corresponding to FIGS. 1 and 2 may possess like numerals and refer to similar elements of the aircrafts 100, 200. The aircraft 100, 200 may include a fuselage 102, 202, wings 104, 204 mounted to the fuselage 102, 202 and one or more rear stabilizers 106, 206 mounted to the rear of the fuselage 102, 202. A plurality of lift propellers 112, 212 may be mounted to wings 104, 204 and may be configured to provide lift for vertical take-off, landing and hover. A plurality of tilt propellers 114, 214 may be mounted to wings 104, 204 and may be tiltable (e.g., configured to tilt or alter orientation) between the lift configuration in which they provide a portion of the lift required for vertical take-off, landing and hovering, as shown in FIG. 2, and the cruise configuration in which they provide forward thrust to aircraft 100 for horizontal flight, as shown in FIG. 1. As used herein, a tilt propeller lift configuration refers to any tilt propeller orientation in which the tilt propeller thrust is providing primarily lift to the aircraft and tilt propeller cruise configuration refers to any tilt propeller orientation in which the tilt propeller thrust is providing primarily forward thrust to the aircraft.

In some embodiments, lift propellers 112, 212 may be configured for providing lift only, with all horizontal propulsion being provided by the tilt propellers. For example, lift propellers 112, 212 may be configured with fixed positions and may only generate thrust during take-off, landing and hover phases of flight. Meanwhile, tilt propellers 114, 214 may be tilted upward into a lift configuration in which thrust from propellers 114, 214 is directed downward to provide additional lift.

For forward flight, tilt propellers 114, 214 may tilt from their lift configurations to their cruise configurations. In other words, the orientation of tilt propellers 114, 214 may be varied from an orientation in which the tilt propeller thrust is directed downward (to provide lift during vertical take-off, landing and hover) to an orientation in which the tilt propeller thrust is directed rearward (to provide forward thrust to aircraft 100, 200). The tilt propellers assembly for a particular EPU may tilt about an axis of rotation defined by a mounting point connecting the boom and the electric engine. When the aircraft 100, 200 is in full forward flight, lift may be provided entirely by wings 104, 204. Meanwhile, in the cruise configuration, lift propellers 112, 212 may be shut off. The blades 120, 220 of lift propellers 112, 212 may be held in low-drag positions for aircraft cruising. In some embodiments, lift propellers 112, 212 may each have two blades 120, 220 that may be locked, for example while the aircraft is cruising, in minimum drag positions in which one blade is directly in front of the other blade as illustrated in FIG. 1. In some embodiments, lift propellers 112, 212 have more than two blades. In some embodiments, tilt propellers 114, 214 may include more blades 116, 216 than lift propellers 112, 212. For example, as illustrated in FIGS. 1 and 2, lift propellers 112, 212 may each include, e.g., two blades, whereas and tilt propellers 114, 214 may each include more blades, such as the five blades shown. In some embodiments, each of the tilt propellers 114, 214 may have 2 to 5 blades, and possibly more depending on the design considerations and requirements of the aircraft.

In some embodiments, the aircraft may include a single wing 104, 204 on each side of fuselage 102, 202 (or a single wing that extends across the entire aircraft). At least a portion of lift propellers 112, 212 may be located rearward of wings 104, 204 (e.g., rotation point of propeller is behind a wing from a bird's eye view) and at least a portion of tilt propellers 114, 214 may be located forward of wings 104, 204 (e.g., rotation point of propeller is in front of a wing from a bird's eye view). In some embodiments, all of lift propellers 112, 212 may be located rearward of wings 104, 204 and all of tilt propellers 114, 214 may be located forward of wings 104, 204. According to some embodiments, all lift propellers 112, 212 and tilt propellers 114, 214 may be mounted to the wings—e.g., no lift propellers or tilt propellers may be mounted to the fuselage. In some embodiments, lift propellers 112, 212 may be all located rearwardly of wings 104, 204 and tilt propellers 114, 214 may be all located forward of wings 104, 204. According to some embodiments, all lift propellers 112, 212 and tilt propellers 114, 214 may be positioned inwardly of the ends of the wing 104, 204.

In some embodiments, lift propellers 112, 212 and tilt propellers 114, 214 may be mounted to wings 104, 204 by booms 122, 222. Booms 122, 222 may be mounted beneath wings 104, 204, on top of the wings, and/or may be integrated into the wing profile. In some embodiments, lift propellers 112, 212 and tilt propellers 114, 214 may be mounted directly to wings 104, 204. In some embodiments, one lift propeller 112, 212 and one tilt propeller 114, 214 may be mounted to each boom 122, 222. Lift propeller 112, 212 may be mounted at a rear end of boom 122, 222 and tilt propeller 114, 214 may be mounted at a front end of boom 122, 222. In some embodiments, lift propeller 112, 212 may be mounted in a fixed position on boom 122, 222. In some embodiments, tilt propeller 114, 214 may mounted to a front end of boom 122, 222 via a hinge. Tilt propeller 114, 214 may be mounted to boom 122, 222 such that tilt propeller 114, 214 is aligned with the body of boom 122, 222 when in its cruise configuration, forming a continuous extension of the front end of boom 122, 222 that minimizes drag for forward flight.

In some embodiments, aircraft 100, 200 may include, e.g., one wing on each side of fuselage 102, 202 or a single wing that extends across the aircraft. According to some embodiments, the at least one wing 104, 204 is a high wing mounted to an upper side of fuselage 102, 202. According to some embodiments, the wings include control surfaces, such as flaps, ailerons, and/or flaperons (e.g., configured to perform functions of both flaps and ailerons). According to some embodiments, wings 104, 204 may have a profile that reduces drag during forward flight. In some embodiments, the wing tip profile may be curved and/or tapered to minimize drag.

In some embodiments, rear stabilizers 106, 206 include control surfaces, such as one or more rudders, one or more elevators, and/or one or more combined rudder-elevators. The wing(s) may have any suitable design for providing lift, directionality, stability, and/or any other characteristic beneficial for aircraft. In some embodiments, the wings have a tapering leading edge.

In some embodiments, lift propellers 112, 212 or tilt propellers 114, 214 may be canted relative to at least one other lift propeller 112, 212 or tilt propeller 114, 214, where canting refers to a relative orientation of the rotational axis of the lift propeller/tilt propeller about a line that is parallel to the forward-rearward direction, analogous to the roll degree of freedom of the aircraft.

Figure 9C:
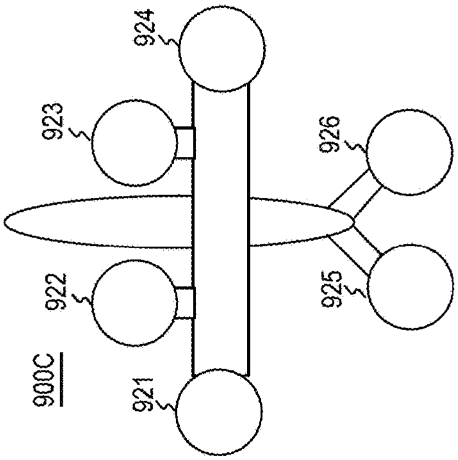
FIGS. 9A-9F illustrate exemplary top plan views of VTOL aircraft, consistent with disclosed embodiments.
Figure 9B:
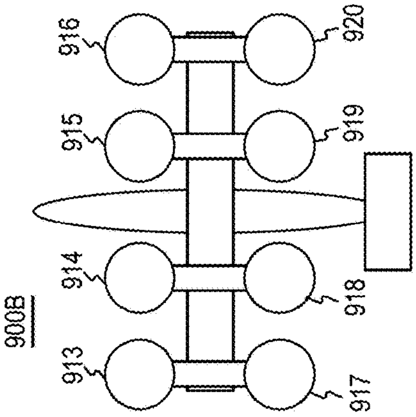

In some embodiments, one or more lift propellers 112, 212 and/or tilt propellers 114, 214 may canted relative to a cabin of the aircraft, such that the rotational axis of the propeller in a lift configuration is angled away from an axis perpendicular to the top surface of the aircraft. For example, in some embodiments, the aircraft is a flying wing aircraft as shown in FIG. 9E below, and some or all of the propellers are canted away from the cabin.

Figure 3:
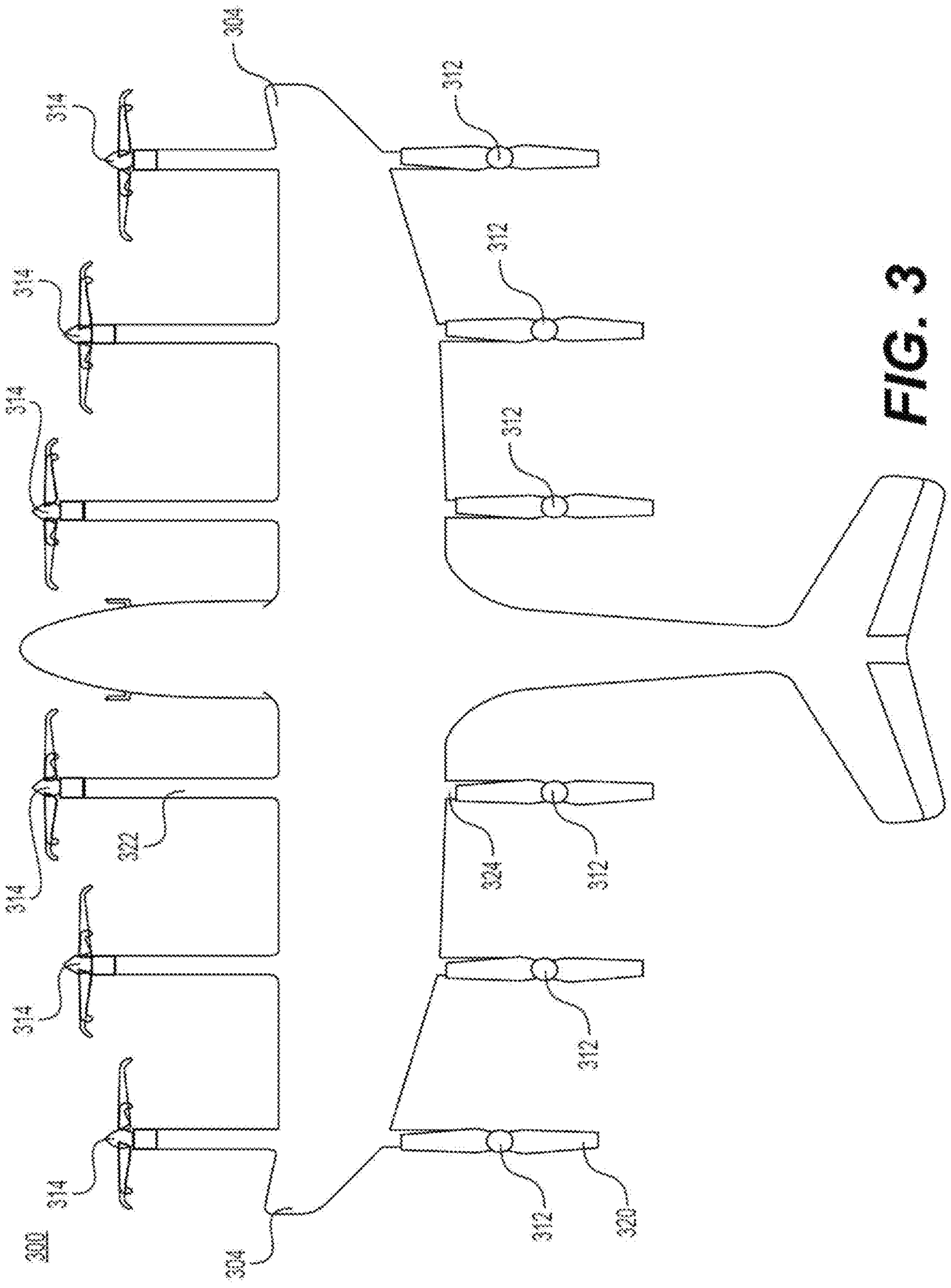
FIG. 3 illustrates an exemplary top plan view of a VTOL aircraft, consistent with disclosed embodiments.

FIG. 3 is an illustration of a top plan view of an exemplary VTOL aircraft, consistent with embodiments of the present disclosure. Aircraft 300 shown in the figure may be a top plan view of the aircraft 100, 200 shown in FIGS. 1 and 2, respectively. As discussed herein, an aircraft 300 may include twelve electric propulsion systems distributed across the aircraft 300. In some embodiments, a distribution of electric propulsion systems may include six forward electric propulsion systems 314 and six aft electric propulsion systems 312 mounted on booms forward and aft of the main wings 304 of the aircraft 300. In some embodiments, forward electric propulsion systems may be mounted to wings 304 by booms 322. In some embodiments, aft electric propulsion systems may be mounted to wings 304 by booms 324. In some embodiments, a length of the rear end of the boom 324 from the wing 304 to a lift propeller (part of electric propulsion system 312) may comprise a similar rear end of the boom 324 length across the numerous rear ends of the booms. In some embodiments, the length of the rear ends of the booms may vary, for example, across the six rear ends of the booms. Further, FIG. 3 depicts an exemplary embodiment of a VTOL aircraft 300 with forward propellers (part of electric propulsion system 314) in a horizontal orientation for horizontal flight and aft propeller blades 320 in a stowed position for a forward phase of flight.

Figure 4:
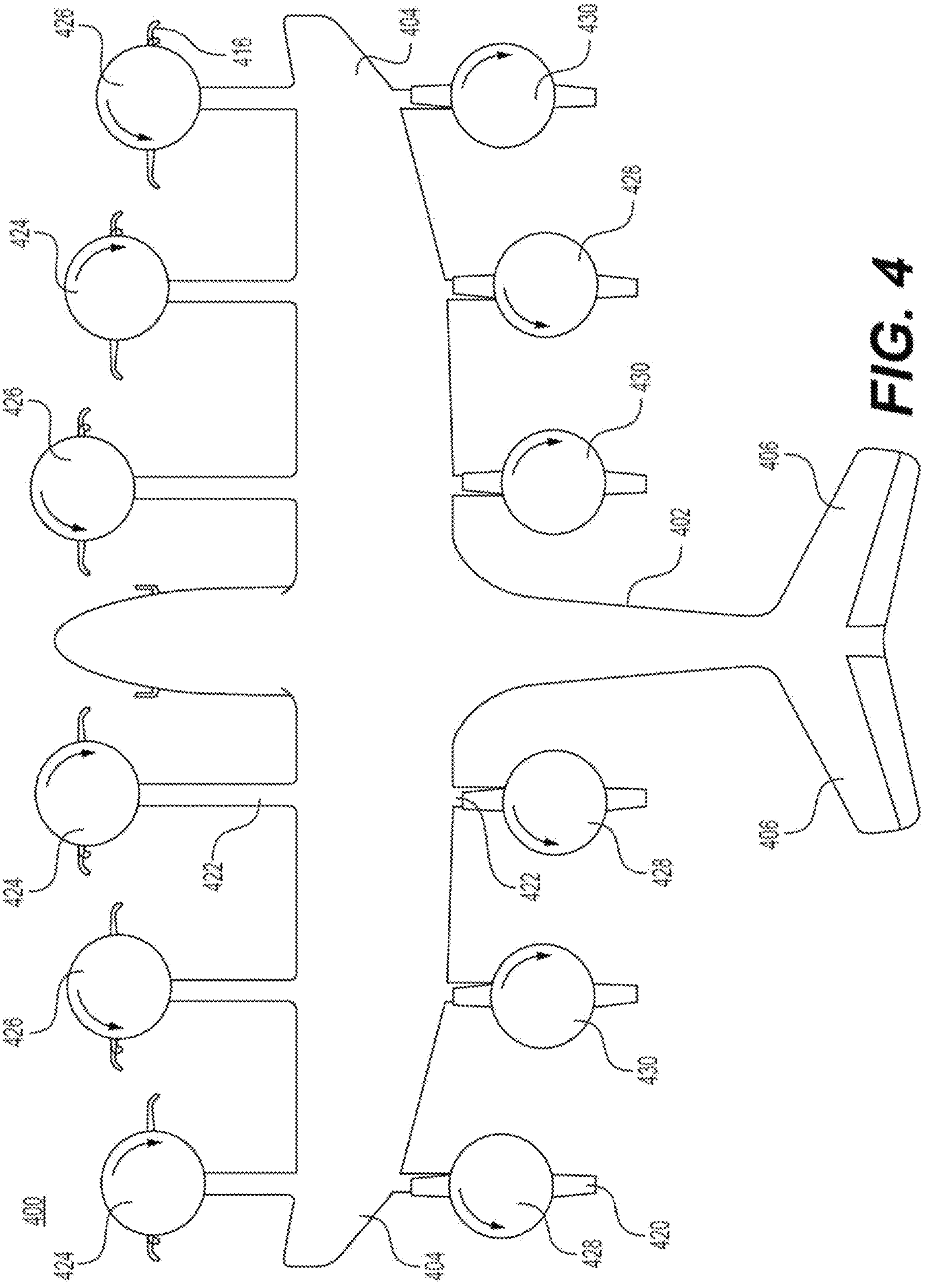
FIG. 4 illustrates exemplary propeller rotation of a VTOL aircraft, consistent with disclosed embodiments.

FIG. 4 is a schematic diagram illustrating exemplary propeller rotation of a VTOL aircraft, consistent with disclosed embodiments. Aircraft 400 shown in the figure may be a top plan view of the aircraft 100, 200, and 300 shown in FIGS. 1, 2, and 3, respectively. An aircraft 400 may include six forward electric propulsion systems with three of the forward electric propulsion systems being of clockwise (CW) type 424 and the remaining three forward electric propulsion systems being of counter-clockwise (CCW) type 426. In some embodiments, three aft electric propulsion systems may be of CCW type 428 with the remaining three aft electric propulsion systems being of CW type 430. Some embodiments may include an aircraft 400 possessing four forward electric propulsion systems and four aft electric propulsion systems, each with two CW types and two CCW types. In some embodiments, aircraft 400 may include a fuselage 402, wing(s) 404 mounted to the fuselage 402, and one or more rear stabilizers 406 mounted to the rear of the fuselage 402. In some embodiments, each forward electric propulsion system may include propeller blades 416. In some embodiments, each aft electric propulsion system may include propeller blades 420. In some embodiments, electric propulsion systems may be mounted to wing(s) 404 by booms 422. In some embodiments, propellers may counter-rotate with respect to adjacent propellers to cancel torque steer, generated by the rotation of the propellers, experienced by the fuselage or wings of the aircraft. In some embodiments, the difference in rotation direction may be achieved using the direction of EPU rotation. In other embodiments, the EPUs may all rotate in the same direction, and gearing may be used to achieve different propeller rotation directions.

Some embodiments may include an aircraft 400 possessing forward and aft electric propulsion systems where the amount of CW types 424 and CCW types 426 is not equal among the forward electric propulsion systems, among the aft electric propulsion systems, or among the forward and aft electric propulsion systems.

Figure 5:
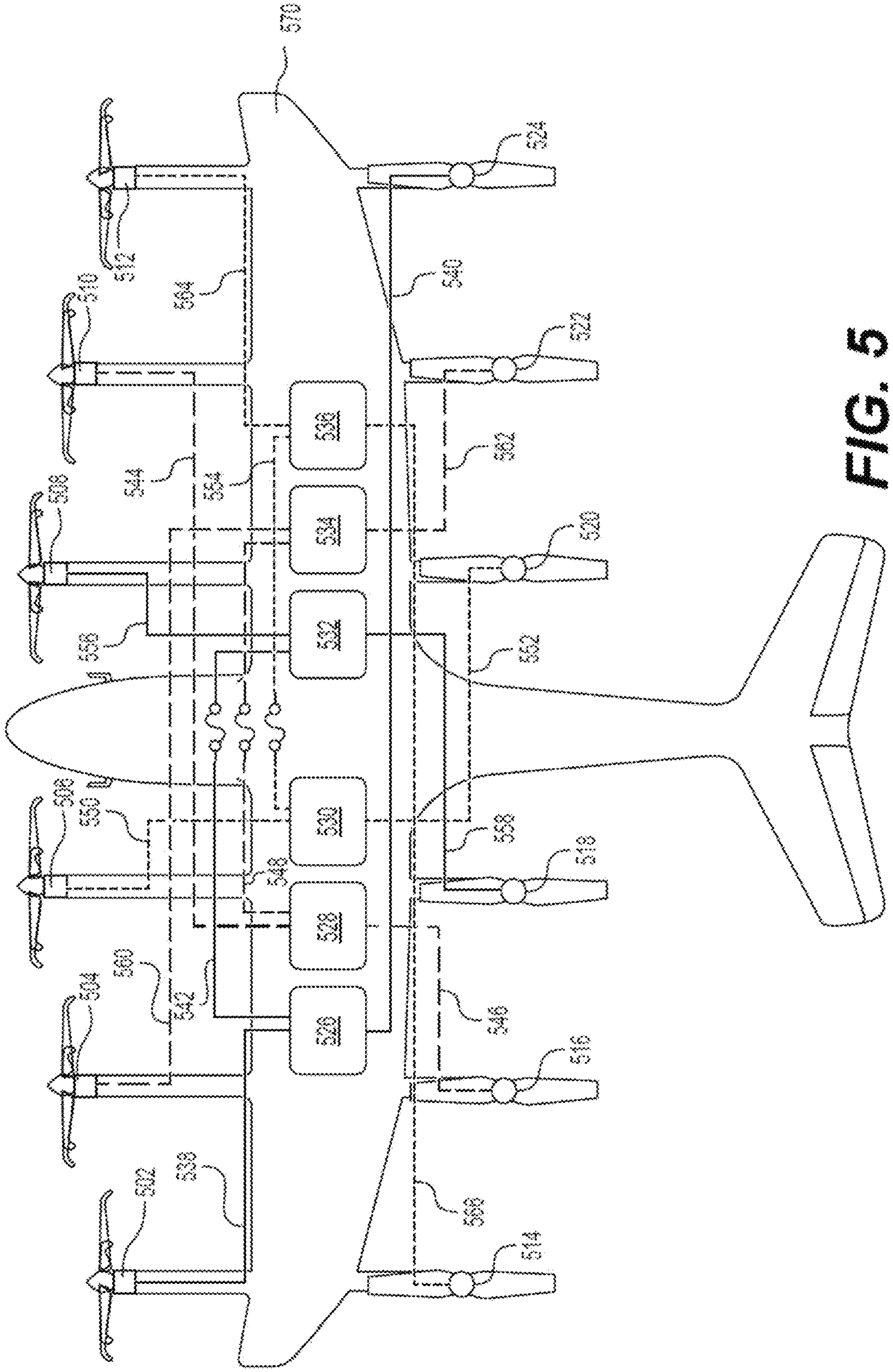
FIG. 5 illustrates exemplary power connections in a VTOL aircraft, consistent with disclosed embodiments.

FIG. 5 is a schematic diagram illustrating exemplary power connections in a VTOL aircraft, consistent with disclosed embodiments. A VTOL aircraft may have multiple power systems connected to diagonally opposing electric propulsion systems. In some embodiments, the power systems may include high voltage power systems. Some embodiments may include high voltage power systems connected to electric EPUs via high voltage channels. In some embodiments, an aircraft 500 may include six power systems (e.g., battery packs), including power systems 526, 528, 530, 532, 534, and 536 stored within the wing 570 of the aircraft 500. The power systems may power electric propulsion systems and/or other electric components of the aircraft 500. In some embodiments, the aircraft 500 may include six forward electric propulsion systems having six electric EPUs 502, 504, 506, 508, 510, and 512 and six aft electric propulsion systems having six electric EPUs 514, 516, 518, 520, 522, and 524. In some embodiments, one or more power systems (e.g., battery packs) may include a battery management system ("BMS") (e.g., one BMS for each battery pack). While six power systems are shown in FIG. 5, the aircraft 500 may include any number and/or configuration of power systems.

In some embodiments, the one or more battery management systems may communicate with a Flight Control System ("FCS") of the aircraft (e.g., FCS 612 shown in FIG. 6). For example, the FCS may monitor the status of one or more battery packs and/or provide commands to the one or more battery management systems which make corresponding adjustments to the high voltage power supply. It is appreciated that while some operations may be described with respect to an FCS, in some embodiments, another processing device (e.g., BMU, separate controller) or a subset of the FCS (e.g., a single flight control computer or FCC) may carry out one or more of the operations instead.

Figure 6A:
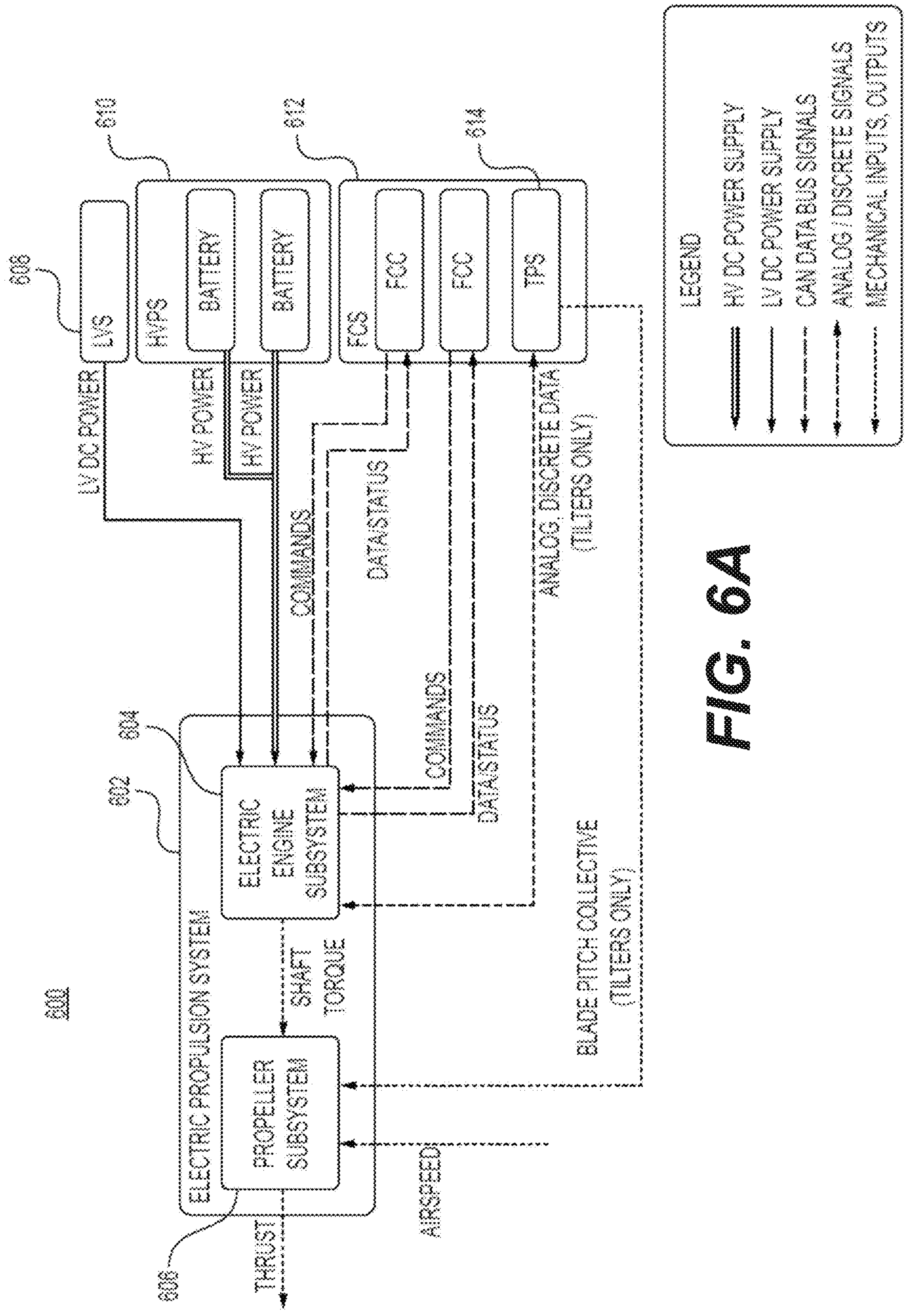
FIGS. 6A and 6B illustrate an exemplary architecture of an electric system, consistent with disclosed embodiments.
Figure 6B:
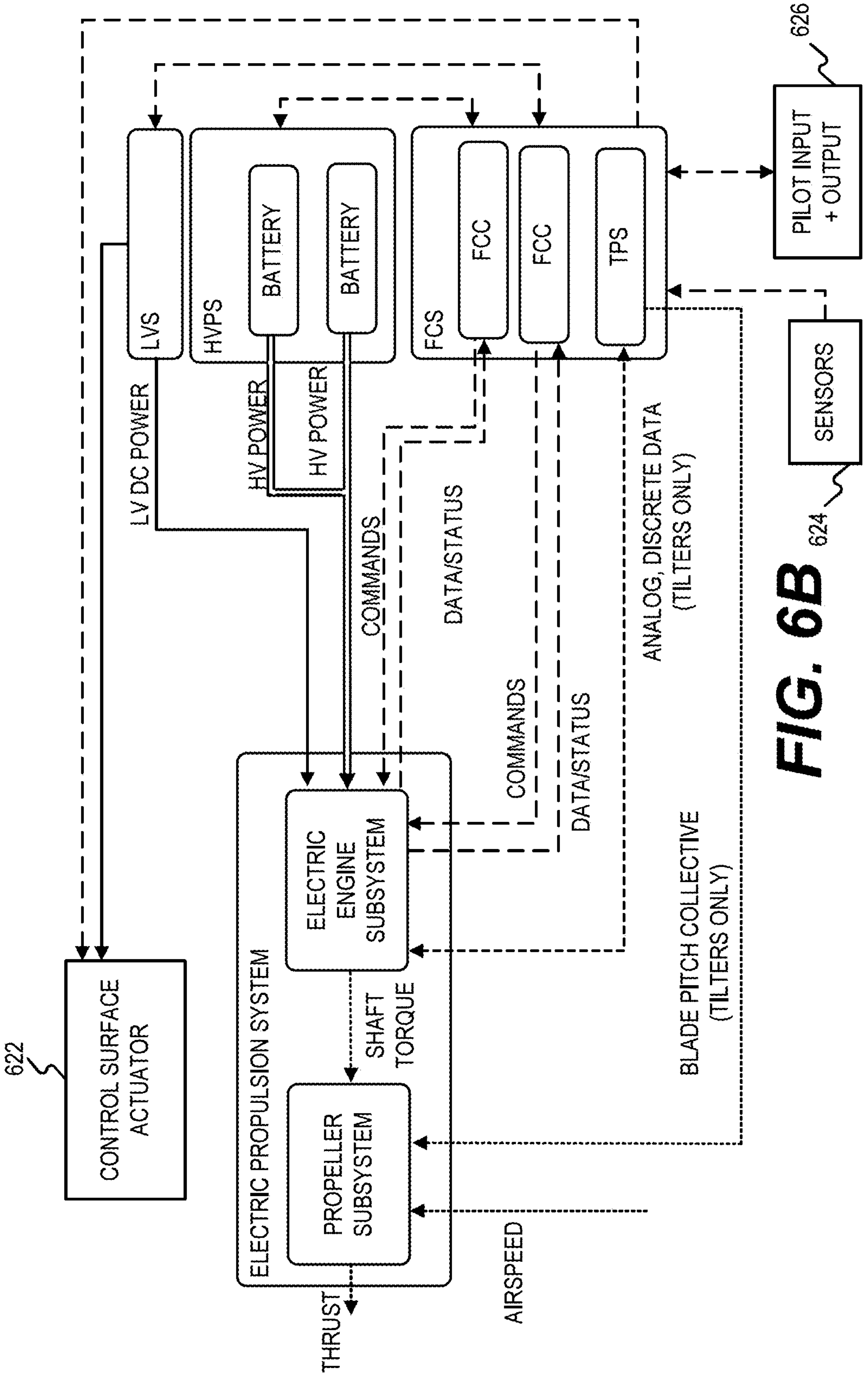

FIGS. 6A and 6B illustrate a block diagram of an exemplary architecture and design of an electric system, consistent with disclosed embodiments.

With reference to FIG. 6A, in some embodiments, exemplary electric system 600 includes an electric propulsion system 602, which may be configured to control aircraft propellers. Electric propulsion system 602 may include an electric engine subsystem 604 that may supply torque, via a shaft, to a propeller subsystem 606 to produce the thrust of the electric propulsion system 602. Some embodiments may include the electric engine subsystem 604 receiving low voltage direct current (LV DC) power from a Low Voltage System (LVS) 608. In some embodiments, the electric engine subsystem 604 may be configured to receive high voltage (HV) power from a High Voltage Power System (HVPS) 610 comprising at least one battery or other device capable of storing energy. HV power may refer to power that is greater in voltage than voltage provided by Low Voltage System (LVS) 608. For example, HV power may include electric power having a voltage of at least 50 V, at least 270 V, at least 400 V, at least 800 V, or at least 1000 V, etc. and LV power may include electric power having a voltage of 50 V or less, 12 V or less, 28 V or less, or 48 V or less, etc.

Some embodiments may include an electric propulsion system 602 including an electric engine subsystem 604 receiving signals from and sending signals to a flight control system 612. In some embodiments, a flight control system (FCS) 612 may comprise a flight control computer (FCC) capable of using Controller Area Network (CAN) data bus signals to send commands to the electric engine subsystem 604 and receive status and data from the electric engine subsystem 604. An FCC may include a device configured to perform one or more operations (e.g., computational operations) for an aircraft, such as at least one processor and a memory component, which may store instructions executable by the at least one processor to perform the operations, consistent with disclosed embodiments. It should be understood that while CAN data bus signals are used between the flight control computer and the electric engine(s), some embodiments may include any form of communication with the ability to send and receive data from a flight control computer to an electric engine. Some embodiments may include electric engine subsystems 604 capable of receiving operating parameters from and communicating operating parameters to an FCC in FCS 612, including speed, voltage, current, torque, temperature, vibration, propeller position, and/or any other value of operating parameters. It is appreciated that while some operations may be described with respect to an FCC, in some embodiments, another processing device (e.g., BMU, separate controller) may carry out one or more of the operations instead.

In some embodiments, a flight control system 612 may also include a Tilt Propeller System (TPS) 614 capable of sending and receiving analog and/or discrete data to and from the electric engine subsystem 604 of the tilt propellers. TPS 614 may include an apparatus capable of communicating operating parameters to an electric engine subsystem 604 and articulating an orientation of the propeller subsystem 606 to redirect the thrust of the tilt propellers during various phases of flight using mechanical means such as a gearbox assembly, linear actuators, and any other configuration of components to alter an orientation of the propeller subsystem 606. In some embodiments, electric engine subsystem may communicate an orientation of the propeller system (e.g., an angle between lift and forward thrust) to TPS 614 and/or FCS 612 (e.g., during flight).

As discussed throughout, an exemplary VTOL aircraft may possess various types of electric propulsion systems including tilt propellers and lift propellers, including forward electric EPUs with the ability to tilt during various phases of flight, and aft electric EPUs that remain in one orientation and may only be active during certain phases of flight (i.e., take off, landing, and hover). In some embodiments, when these propulsion systems are not activated (e.g., not actively generating thrust), they may be used to re-generate power in the HVPS 610.

With reference to FIG. 6B, in some embodiments, an electric propulsion system 602 may generate thrust by supplying High Voltage (HV) electric power to an electric engine (e.g., electric propulsion system 602), which in turn converts HV power into mechanical shaft power which is used to rotate a propeller. An aircraft as described herein may include multiple electric EPUs mounted forward and aft of the wing. The EPUs may be mounted directly to the wing or mounted to one or more booms attached to the wing. The amount of thrust each electric engine generates may be influenced by (e.g., governed by) a torque command from an FCS 612 over a digital communication interface to each electric engine. Some embodiments may include an electric engine capable of receiving operating parameters from and communicating operating parameters to the FCC. Such operating parameters may include one or more of speed, voltage, current, torque, temperature, vibration, propeller position, and any other type of operating parameters.

In some embodiments, a flight control system 612 may send control signals to control surface actuators 622 to maintain control and stability of the aircraft. The control surface actuators 622 may be powered by LVS 608.

The flight control system 612 may receive input from one or more sensors 624 to perform flight control. Sensors 624 may include vehicle dynamics sensors (e.g. attitude sensors), battery sensors (e.g. battery level, fault), tilt angle sensors for propellers, rpm sensors, torque sensors, vibration sensors, altitude sensors (e.g. radar altimeter, GPS, laser altimeter, vision ground based recognition system etc.), airspeed sensors, and/or landing detection sensors (e.g. landing gear detection sensors, wheel sensors, pressure sensors, strain gauges, GPS sensors (including real time kinetic sensors) etc.). Some or all of these sensors may be high integrity sensors. A high integrity or high-fidelity sensor may refer to a sensor that performs battery cell-level measurements with high accuracy and/or precision (e.g., above a particular threshold) and may be designed to avoid frequent component or aircraft failure or inaccurate measurements. For example, sensors 624 may be configured for one type of input, may include fault detection, and/or may include a plurality of sensor inputs (e.g., at different sensor positions) to detect sensor error. In some embodiments, the airspeed sensor and/or altitude sensor may be high integrity sensors. The FCS 612 may include one or more receivers and/or transceivers to receive flight plan information and/or altitude information from remote locations.

The FCS 612 may also receive pilot input 626. Pilot input 626 may include aircraft control commands (e.g., pilot inceptors, button switch etc.) to control the movement of an aircraft and/or to command the aircraft into a certain mode of operation (e.g., VTOL emergency landing mode). Pilot input 626 may also include flight plan information. For example, pilot input 626 may include flight mission information, such as a location of the destination, a distance to the next destination, a flight path to an expected destination, a sequence and/or duration of phases of flight, or an expected flight time required to get to the next destination. Flight mission information may include a type of flight expected. For example, flight mission information may include a duration or distance to be covered in each flight mode (e.g., thrust-borne, wing-borne). In some embodiments, flight mission information may include an expected EPU output throughout the flight, e.g., as a unit of power or percentage of max EPU power. In some embodiments, flight mission information may be provided for each EPU on an aircraft.

Flight mission information may include information on predicted weather conditions throughout the flight. Weather conditions may include one or more of temperatures, pressures, wind conditions, and precipitation expected throughout the flight. Additionally or alternatively, flight mission information may include an expected weight of an aircraft, e.g., based on the number of passengers or an amount of cargo. The weight of an aircraft may be predicted or measured (e.g., while the aircraft is charging) and may include the weight of the aircraft along with the weight of one or more passengers or cargo onboard). Additionally or alternatively, flight information may include historical battery information. For example, in some embodiments, battery information may include historical battery consumption of each battery pack on a particular flight path. The flight mission information may further include details on flight modes, weight, and weather, for the FCS 612 to determine its relevance to the flight mission ahead.

Flight mission information may include a route and a set of emergency landing locations in proximity to the route. The FCS 612 may store route information, emergency landing locations, and associated information related to landing at the emergency landing locations. For example, the FCS 612 may store information on the terrain and/or runway at an emergency landing location. The FCS 612 may store flight profile information (e.g., including a descent rate trajectory, as shown in FIG. 36B) for landing at each emergency landing location.

Figure 7:
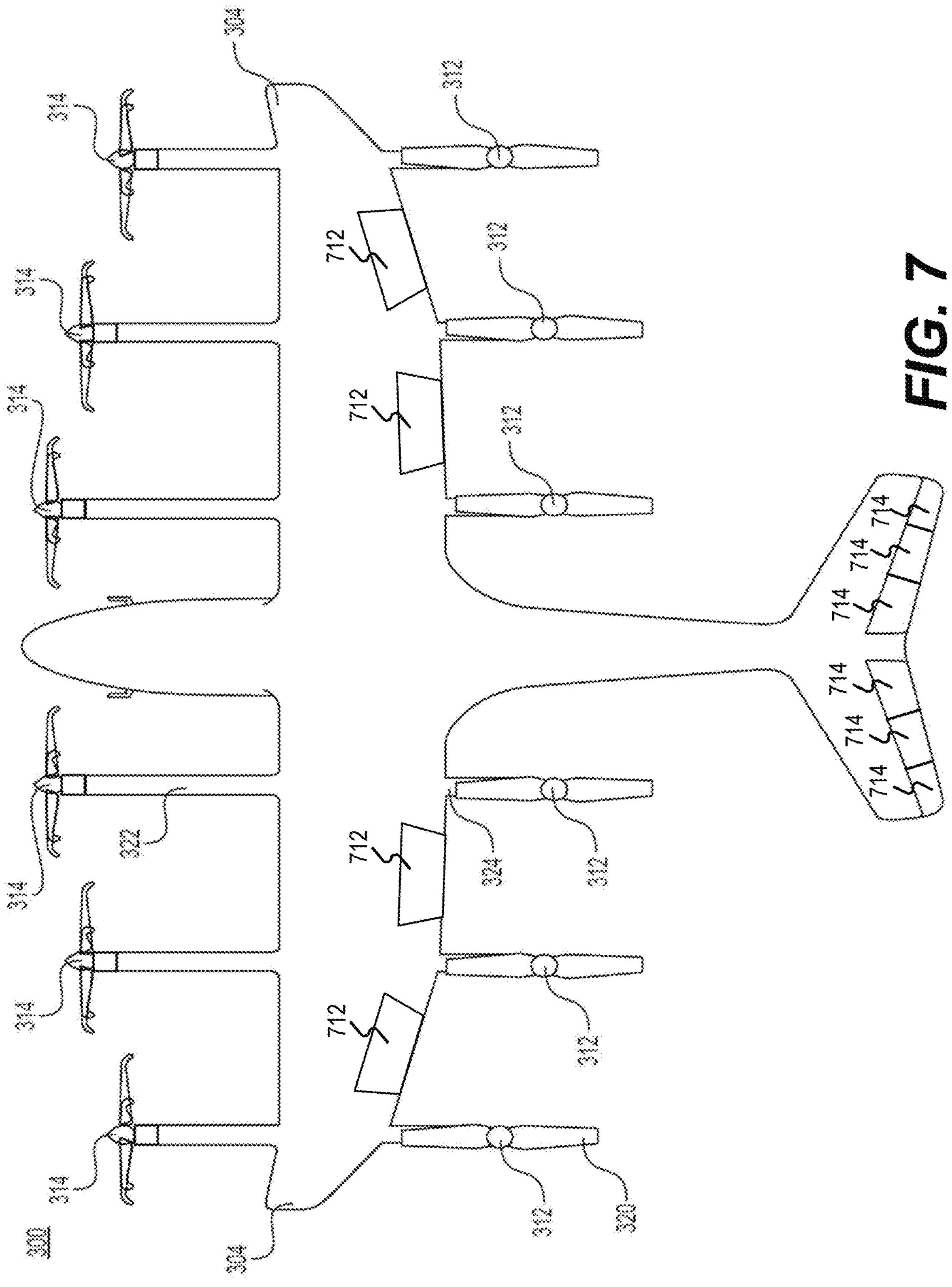
FIG. 7 illustrates an exemplary top plan view of a VTOL aircraft, consistent with disclosed embodiments.

In some embodiments, a flight control system may include a system capable of controlling control surfaces and their associated actuators in an exemplary VTOL aircraft. FIG. 7 is an illustration of a top plan view of an exemplary VTOL aircraft, consistent with embodiments of the present disclosure. Aircraft 700 shown in the figure may be a top plan view of the aircraft 100, 200 shown in FIGS. 1 and 2, respectively, in addition to the aircraft components described above with reference to FIG. 3. In aircraft 700, the control surfaces may include, in addition to the propeller blades discussed earlier, flaperons 712 and ruddervators 714. Flaperons 712 may combine functions of one or more flaps, one or more ailerons, and/or one or more spoilers. Ruddervators 714 may combine functions or one or more rudders and/or one or more elevators. Additionally or alternatively, control surfaces may include separate rudders and elevators. In aircraft 700, the actuators may include, in addition to the electric propulsion systems discussed earlier, control surface actuators (CSAs) associated with flaperons 712 and ruddervators 714, as discussed further below with reference to FIG. 8.

Figure 8:
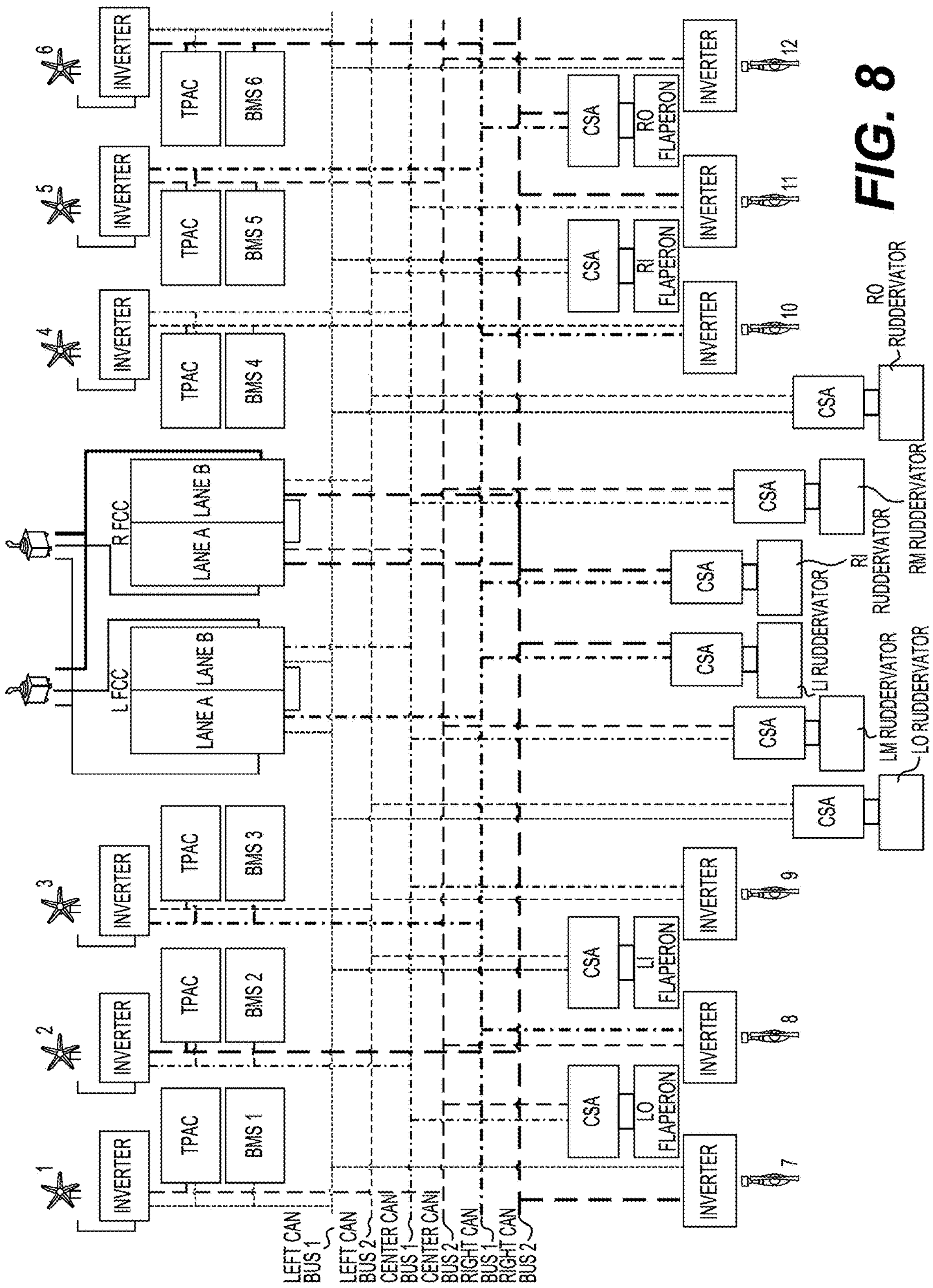
FIG. 8 illustrates an exemplary flight control signaling architecture, consistent with disclosed embodiments.

FIG. 8 illustrates a flight control signaling architecture for controlling the control surfaces and associated actuators, according to various embodiments. Although FIG. 7 illustrates twelve EPU inverters and associated propeller blades, six tilt propeller actuators (TPACs), six battery management systems (BMSs), four flaperons and associated control surface actuators (CSAs), and six ruddervators and associated CSAs, aircraft according to various embodiments can have any suitable number of these various elements. As shown in FIG. 8, control surfaces and actuators may be controlled by a combination of four flight control computers (FCCs)-Left FCC, Lane A (L FCC-A); Left FCC, Lane B (L FCC-B); Right FCC, Lane A (R FCC-A); and Right FCC, Lane A (R FCC-B), although any other suitable number of FCCs may be utilized. The FCCs may each individually control all control surfaces and actuators or may do so in any combination with each other. In some embodiments, each FCC may include one or more hardware computing processors. In some embodiments, each FCC may utilize a single-threaded computing process or a multi-threaded computing process to perform the computations required to control the control surfaces and actuators. In some embodiments, all computing process required to control the control surfaces and actuators may be performed on a single computing thread by a single flight control computer.

The FCCs may provide control signals to the control surface actuators, including the EPU inverters, TPACs, BMSs, flaperon CSAs, and ruddervator CSAs, via one or more bus systems. For different control surface actuators, the FCC may provide control signals, such as voltage or current control signals, and control information may be encoded in the control signals in binary, digital, or analog form. In some embodiments, the bus systems may each be a CAN bus system, e.g., Left CAN bus 1, Left CAN bus 2, Right CAN bus 1, Right CAN bus 2, Center CAN bus 1, Center CAN bus 2. In some embodiments, multiple FCCs may be configured to provide control signals via each CAN bus system, and each FCC may be configured to provide control signals via multiple CAN bus systems. In the exemplary architecture illustrated in FIG. 8, for example, L FCC-A may provide control signals via Left CAN bus 1 and Right CAN bus 1; L FCC-B may provide control signals via Left CAN bus 1 and Center CAN bus 1; R FCC-A may provide control signals via Center CAN bus 2 and Right CAN bus 2; and R FCC-B may provide control signals via Left CAN bus 2 and Right CAN bus 2.

FIGS. 9A-9F are illustrations of atop plan view of exemplary VTOL aircrafts, consistent with embodiments of the present disclosure. There may be a number of design considerations (cost, weight, size, performance capability etc.) that may influence the number and/or combination of tilt and lift propellers in a VTOL aircraft. The number and orientation of propellers (and other effectors or actuators) may affect a configuration (e.g., number, connection) of power sources (e.g., battery packs). By way of non-limiting example, an aircraft may have a number of battery packs equal to the number of electric propulsion systems. Further, an aircraft may have a number of battery packs proportionate to the number of electric propulsion systems (e.g., half, double, etc.).

Figure 9A:
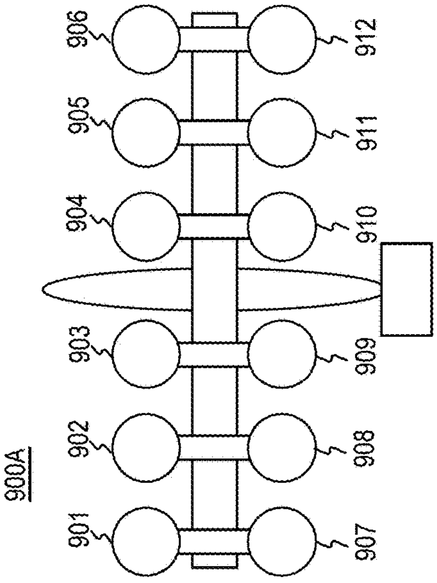

FIG. 9A illustrates an arrangement of electric propulsion units, consistent with embodiments of the present disclosure. Referring to FIG. 9A, the aircraft shown in the figure may be a top plan view of an exemplary aircraft (e.g., a VTOL aircraft). The aircraft may include twelve electric propulsion systems distributed across the aircraft. In some embodiments, a distribution of electric propulsion systems may include six forward electric propulsion systems (901, 902, 903, 904, 905, and 906) and six aft electric propulsion systems (907, 908, 909, 910, 911, and 912). In some embodiments, the six forward electric propulsion systems may be operatively connected to tilt propellers and the six aft electric propulsion systems may be operatively connected to lift propellers. In other embodiments, the six forward electric propulsion systems and a number of aft electric propulsion systems may be operatively connected to tilt propellers and the remaining aft electric propulsion systems may be operatively connected to lift propellers. In other embodiments, all forward and aft electric propulsion systems may be operatively coupled to tilt propellers.

FIG. 9B illustrates an alternate arrangement of electric propulsion units, consistent with embodiments of the present disclosure. Referring to FIG. 9B, the aircraft shown in the figure may be a top plan view of an exemplary aircraft (e.g., a VTOL aircraft). The aircraft may include eight electric propulsion systems distributed across the aircraft. In some embodiments, a distribution of electric propulsion systems may include four forward electric propulsion systems (913, 914, 915, and 916) and four aft electric propulsion systems (917, 918, 919, and 920). In some embodiments, the four forward electric propulsion systems may be operatively connected to tilt propellers and the four aft electric propulsion systems may be operatively connected to lift propellers. In other embodiments, the four forward electric propulsion systems and a number of aft electric propulsion systems may be operatively connected to tilt propellers and the remaining aft electric propulsion systems may be operatively connected to lift propellers. In other embodiments, all forward and aft electric propulsion systems may be operatively coupled to tilt propellers.

FIG. 9C illustrates an alternate arrangement of electric propulsion units, consistent with embodiments of the present disclosure. Referring to FIG. 9C, the aircraft shown in the figure may be a top plan view of an exemplary aircraft (e.g., a VTOL aircraft). The aircraft may include six electric propulsion systems distributed across the aircraft. In some embodiments, a distribution of electric propulsion systems may include a first set of four electric propulsion systems 921, 922, 923, and 924 coplanar in a first plane and a second set of two electric propulsion systems 925 and 926 coplanar in a second plane. In some embodiments, the first set of electric propulsion systems 921-924 may be operatively connected to tilt propellers and second set of electric propulsion systems 925 and 926 may be operatively connected to lift propellers. In other embodiments, the first set of electric propulsion systems 921-924 and the second set of aft electric propulsion systems 925 and 926 may all be operatively connected to tilt propellers.

Figure 9F:
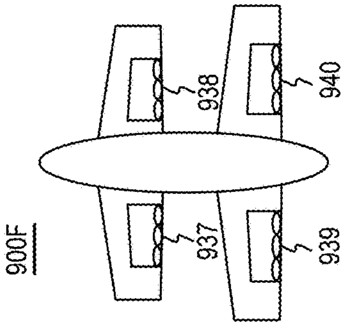
Figure 9E:
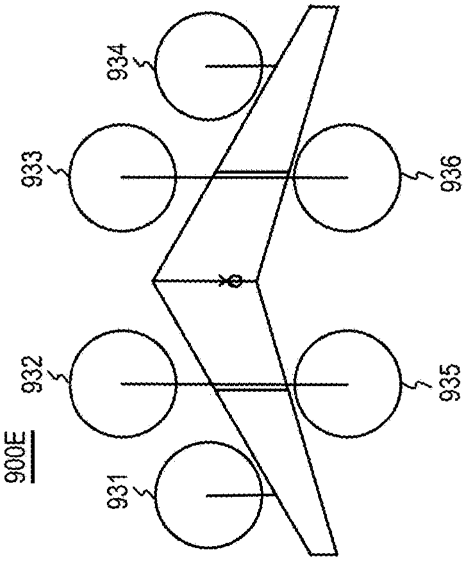
Figure 9D:
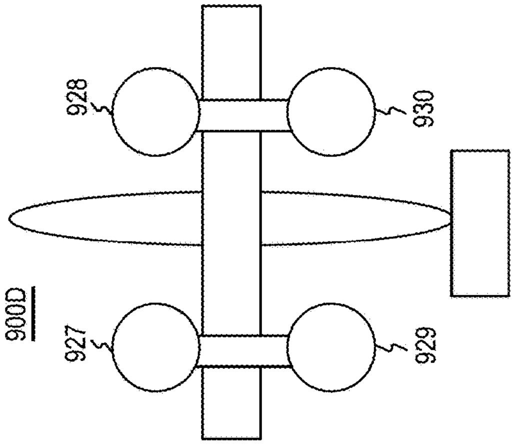

FIG. 9D illustrates an alternate arrangement of electric propulsion units, consistent with embodiments of the present disclosure. Referring to FIG. 9D, the aircraft shown in the figure may be a top plan view of an exemplary aircraft (e.g., a VTOL aircraft). The aircraft may include four electric propulsion systems distributed across the aircraft. In some embodiments, a distribution of electric propulsion systems may include four coplanar electric propulsion systems 927, 928, 929, and 930. In some embodiments, all of the electric propulsion systems may be operatively connected to tilt propellers.

FIG. 9E illustrates an alternate arrangement of electric propulsion units, consistent with embodiments of the present disclosure. Referring to FIG. 9E, the aircraft shown in the figure may be a top plan view of an exemplary aircraft (e.g., a VTOL aircraft). The aircraft may include six electric propulsion systems distributed across the aircraft. For example, in some embodiments, the aircraft may include four forward electric propulsion systems 931, 932, 933, and 934 operatively connected to tilt propellers and the two aft ducted fans 935 and 936 operatively connected to lift propellers. In some embodiments, the aircraft may include ten electric propulsion systems distributed across the aircraft. For example, in some embodiments, the aircraft may include six forward electric propulsion systems operatively connected to tilt propellers and the four aft electric propulsion systems operatively connected to lift propellers. In some embodiments, some or all of the aft electric propulsion systems may operatively connected to tilt propellers.

As shown in FIG. 9E, in some embodiments, the aircraft may have a flying wing configuration, such as a tailless fixed-wing aircraft with no definite fuselage. In some embodiments, the aircraft may have a flying wing configuration with the fuselage integrated into the wing. In some embodiments, the tilt propellers may rotate in a plane above the body of the aircraft when the tilt propellers operate in a lift configuration.

FIG. 9F illustrates an alternate arrangement of electric propulsion units, consistent with the embodiments of the present disclosure. Referring to FIG. 9F, the aircraft may be a top plan view of an exemplary aircraft. In some embodiments, the aircraft may include ducted fans 937, 938, 939, and 940 operably connected to the electric propulsion systems. In some embodiments the aircraft may include a bank of ducted fans on each wing of the aircraft and the bank of ducted fans may be connected to tilt together (e.g., between lift and forward thrust configuration). In some embodiments the aircraft includes a left and right front wing and a left and right rear wing. In some embodiments, each wing of the aircraft includes a bank of connected ducted fans. In some embodiments, each bank of connected ducted fans are tiltable (e.g., between lift and forward thrust), while in other embodiments only the bank of fans on the front wing(s) are tiltable.

As disclosed herein, the forward electric propulsion systems and aft electric propulsion systems may be of a clockwise (CW) type or counterclockwise (CCW) type. Some embodiments may include various forward electric propulsion systems possessing a mixture of both CW and CCW types. In some embodiments, the aft electric propulsion systems may possess a mixture of CW and CCW type systems among the aft electric propulsion systems. In some embodiments, each electric propulsion systems may be fixed as clockwise (CW) type or counterclockwise (CCW) type, while in other embodiments, one or more electric propulsion systems may vary between clockwise (CW) and counterclockwise (CCW) rotation.

Figure 10:
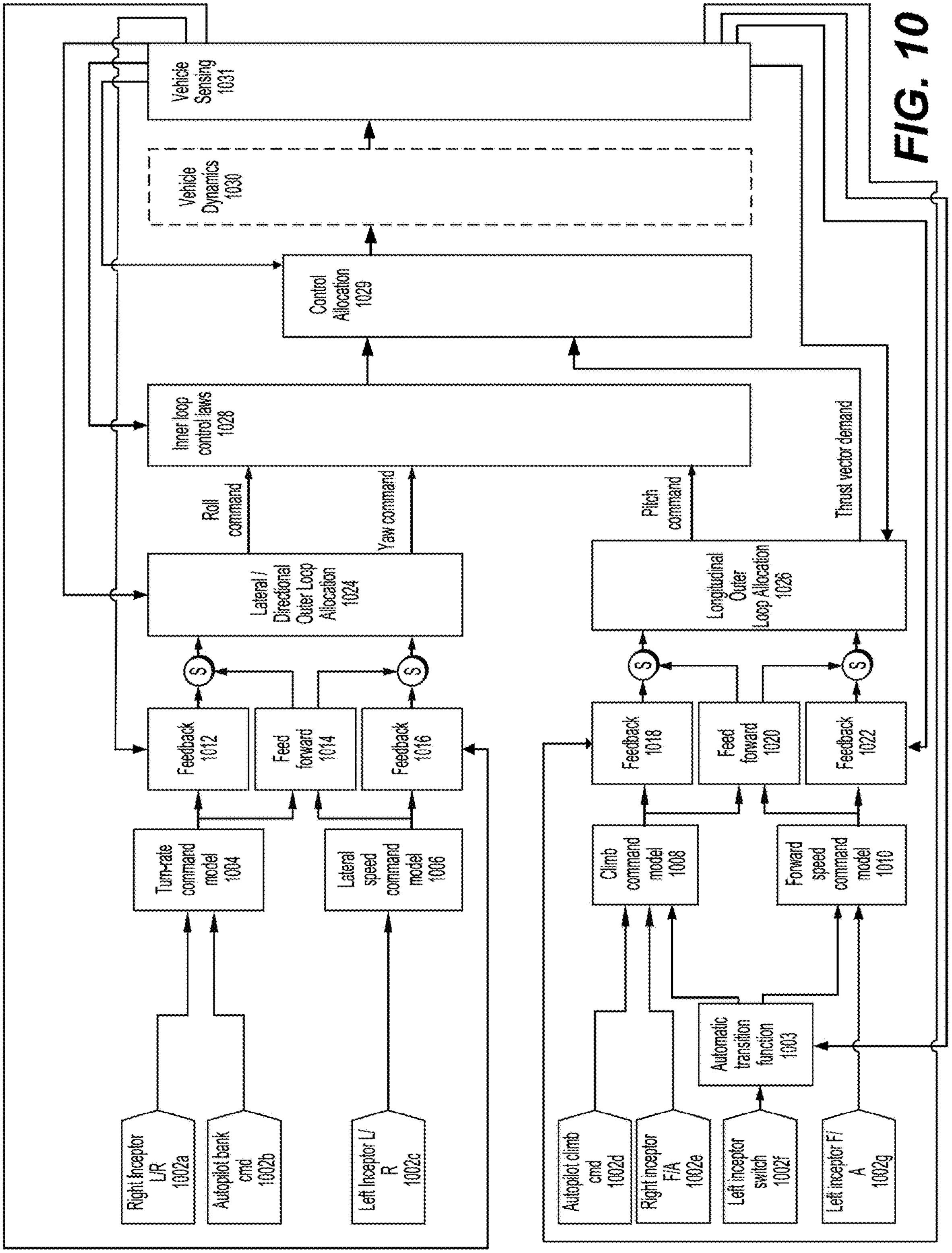
FIG. 10 illustrates a functional block diagram of an exemplary control system of an electric VTOL aircraft, consistent with disclosed embodiments.

FIG. 10 illustrates a functional block diagram of an exemplary control system 1000 of an aircraft, consistent with disclosed embodiments. System 1000 may be implemented by at least one processor (e.g., at least one a microprocessor-based controller) configured to execute software code stored in a storage medium (e.g., a computer-readable medium, a non-transitory computer-readable medium) to implement the functions described herein. System 1000 may also be implemented in hardware, or a combination of hardware and software. System 1000 may be implemented as part of a flight control system of the aircraft (e.g., part of FCS 612 in FIG. 6) and may be configured to perform a single step or sequence repeatedly until a desired or commanded outcome is achieved. It is to be understood that many conventional functions of the control system are not shown in FIG. 10 for ease of description. System 1000 further includes one or more storage mediums storing model(s), function(s), table(s), and/or any information for executing the disclosed processes. As further described below, any or each box indicating a command model (e.g., 1004, 1006, 1008, and 1010), feedback (1012, 1016, 1018, and 1022), feed forward (1014, 1020), Outer Loop Allocation (1024, 1026), inner loop control laws 1028, and control allocation 1029 may represent or include module(s), script(s), function(s), application(s), and/or program(s) that are executed by processor(s) and/or microprocessor(s) of system 1000. It is appreciated that the complexity and interconnectedness of the functional block diagram of FIG. 10 would be impossible, or at least impractical, to effectively implement by a human user, especially when considering that these functionalities are implemented while the aircraft is flying (including taking off or landing).

In some embodiments, control system 1000 may be configured based on one or more flight control laws. Flight control law may comprise a set of algorithms, models, and/or rules configured to govern a behavior of an aircraft (e.g., control or influence one or more effectors of the aircraft) in response to one or more pilot inputs and external factors. In some embodiments, flight control laws may be configured to achieve at least one of desired flight characteristics, stability, or performance. For example, flight control laws may be configured to ensure stability and controllability of an aircraft by controlling how the aircraft responds to at least one of one or more pilot inputs, vehicle dynamics (e.g., disturbances, such as turbulence, gusts, etc.), or changes in flight conditions (e.g., altitude, airspeed, angle of attack).

System 1000 may detect one or more inputs, such as from a pilot input device configured to receive at least one pilot input and generate or influence a signal. A pilot input may be generated by and/or received from an input device or mechanism of the aircraft, such as a button, a switch, a knob, a stick, a slider, an inceptor, any combination thereof, or any other device configured to generate or influence a signal based on a physical action from a pilot. For example, a pilot input device may include one or more of right inceptor(s) (e.g., moving right inceptor left/right 1002*a* and/or right inceptor forward/aft 1002*e*), left inceptor(s) (e.g., moving left inceptor left/right 1002*c* and/or left inceptor forward/aft 1002*g*), and/or left inceptor switch 1002*f*. In some embodiments, a pilot input device may include an interface with an autopilot system (e.g., display screen(s), switch(es), button(s), lever(s), and/or other interface(s)). Optionally, system 1000 may further detect inputs from an autopilot system, such as autopilot roll command 1002*b*, autopilot climb command 1002*d*, and/or other command(s) to control the aircraft.

In some embodiments, the one or more inputs may include at least one of a position and/or rate of a right inceptor and/or a left inceptor, signals received (e.g., response type change commands, trim inputs, reference inputs, backup control inputs, etc.) from switches on the inceptors, measurements of aircraft state and environmental conditions (e.g., measured load factor, airspeed, roll angle, pitch angle, actuator states, battery states, aerodynamic parameters, temperature, gusts, etc.) based on data received from and/or measured by one or more sensors of the aircraft, obstacles (e.g., presence or absence of other aircraft and/or debris), or an aircraft mode (e.g., taxiing on the ground, takeoff, in-air). For example, right inceptor L/R 1002*a* may comprise a lateral position and/or rate of a right inceptor (e.g., an inceptor positioned to the right of another inceptor and/or an inceptor positioned on the right side of a pilot area), autopilot roll command 1002*b* may comprise a roll signal received in autopilot mode, left inceptor L/R 1002*c* may comprise a lateral position and/or rate of a left inceptor (e.g., an inceptor positioned to the left of another inceptor and/or an inceptor positioned on the left side of a pilot area), autopilot climb command 1002*d* may comprise a climb signal received in autopilot mode, right inceptor F/A 1002*e* may comprise a longitudinal position and/or rate of the right inceptor, left inceptor switch 1002*f* may comprise a signal from a switch for enabling or disabling automatic transition function 1003, and left inceptor F/A 1002*g* may comprise a longitudinal position and/or rate of the left inceptor.

Each input may include data as listed above (e.g., signals from switches, measurements of aircraft state, aircraft mode, etc.). Actuator states may include actuator hardware limits, such as travel limits, speed limits, response time limits, etc., and can include actuator health indicators that may indicate deteriorations in actuator performance that may limit a given actuator's ability to satisfy actuator commands. Actuator states may be used to determine the bounds (e.g., minimum/maximum values) for individual actuator commands. Battery states may correspond to remaining energy of the battery packs of the aircraft, which may be monitored when control allocation 1029 considers balancing battery pack energy states. Aerodynamic parameters may be parameters derived from aerodynamic and acoustic modeling and can be based on the actuator Jacobian matrices and actuator states. Each input received from an inceptor may indicate a corresponding adjustment to an aircraft's heading or power output.

Command models 1004, 1006, 1008 and 1010 may be configured to determine a shape (e.g., aggressiveness, slew rate, damping, overshoot, etc.) of an ideal aircraft response. For example, each command model of command models 1004, 1006, 1008 and 1010 may be configured to receive and interpret at least one of inputs 1002*a*, 1002*b*, 1002*c*, 1002*d*, 1002*e*, 1002*f* or 1002*g* and, in response, compute a corresponding change to an aircraft's orientation, heading, and propulsion, or a combination thereof using an integrator (not pictured). In some embodiments, right inceptor L/R 1002*a* and autopilot roll command 1002*b* may be fed into turn-rate command model 1004, left inceptor L/R 1002*c* may be fed into lateral speed command model 1006, autopilot climb command 1002*d* and right inceptor F/A 1002*e* may be fed into climb command model 1008, and left inceptor F/A 1002*g* may be fed into forward speed command model 1010. In some embodiments, an output from automatic transition function 1003 may be fed into at least one of climb command model 1008 or forward speed command model 1010. For example, based on receiving an enable signal from left inceptor switch 1002*f*, automatic transition function 1003 may automatically determine at least one of a climb signal or a forward speed signal for transmission to at least one of climb command model 1008 or forward speed command model 1010.

Turn-rate command model 1004 may be configured to output a desired position and/or turn-rate command and may also be configured to compute a desired heading of the aircraft to be assumed when the inceptor is brought back to a centered position (e.g., in detent). Lateral speed command model 1006 may be configured to output a desired position and/or lateral speed command. Climb command model 1008 may be configured to output at least one of a desired altitude, vertical speed, or vertical acceleration command. Forward speed command model 1010 may be configured to output at least one of a desired position, longitudinal speed, or longitudinal acceleration command. In some embodiments, one or more of the command models may be configured to output an acceleration generated in response to changes in speed command. For example, climb command model 1008 may be configured to output a vertical acceleration generated in response to a change in vertical speed command.

Feed forward 1014 and 1020 may each receive as input one or more desired changes (e.g., desired position, speed and/or acceleration) from corresponding command models 1004, 1006, 1008 or 1010 as well as data received from and/or measured by the one or more aircraft sensors (e.g., airspeed, vehicle orientation, vehicle load factor, measured acceleration, vehicle mass and inertia, air density, altitude, aircraft mode, etc.) and may be configured to output, for each desired change, a corresponding force to accomplish the desired change. In some embodiments, feed forward 1014 and 1020 may be configured to determine the corresponding force using simplified models of aircraft dynamics. For example, based on a known (e.g., a stored value of) or determined mass of the aircraft, feed forward 1014 and 1020 may be configured to determine a force to cause the aircraft to follow a desired acceleration command. In some embodiments, feed forward 1014 and 1020 may be configured to use a model predicting an amount of drag on the vehicle produced as a function of speed in order to determine a force required to follow a desired speed command signal.

Feedback 1012, 1016, 1018, and 1022 may each receive as input the one or more desired changes (e.g., desired position, speed and/or acceleration) from command models 1004, 1006, 1008 and 1010 as well as data received from Vehicle Sensing 1031 indicative of Vehicle Dynamics 1030. For example, sensed Vehicle Dynamics 1030 may comprise the physics and/or natural dynamics of the aircraft, and Vehicle Sensing 1031 sensor measurements may capture how the aircraft moves in response to pilot inputs, propulsion system outputs or ambient conditions. In some embodiments, Vehicle Dynamics 1030 may represent the control of different flight elements (e.g., electric propulsion system(s) and/or control surfaces) and the corresponding effect on the flight elements and aircraft dynamics. Additionally or alternatively, data received from Vehicle Sensing 1031 may include error signals generated, by one or more processors, based on exogenous disturbances (e.g., wind gust causing speed disturbance). In some embodiments, feedback 1012, 1016, 1018 and 1022 may be configured to generate feedback forces (e.g., at an actuator) based on the received error signals. For example, feedback 1012, 1016, 1018 and 1022 may generate feedback forces with the intent of counteracting the effect(s) of external disturbances. Additionally or alternatively, feedback 1012, 1016, 1018 and 1022 may be configured to generate feedback forces based on modeling errors. For example, if an incorrect aircraft mass is input into either feed forward 1014 or 1020, the aircraft may accelerate faster or slower than the desired change. Based on determining a difference between the desired acceleration and the measured acceleration, one or more processors may generate an error signal (e.g., included in Vehicle Sensing 1031) which may be looped into feedback 1012, 1016, 1018 or 1022 to determine an additional force needed to correct the error.

In some embodiments, feedback 1012, 1016, 1018 or 1022 may be disabled. For example, in response to losing position and/or ground speed feedback due to disruption of global position system (GPS) communication, system 1000 may be configured to operate without feedback 1012, 1016, 1018 or 1022 until GPS communication is reconnected.

In some embodiments, feedback 1012, 1016, 1018 or 1022 may receive as input a plurality of measurements as well as a trust value for each measurement indicating whether the measurement is valid. For example, one or more processors of system 1000 may assign a Boolean (true/false) value for each measurement used in system 1000 to indicate that the measurement is trustworthy (e.g., yes) or that the measurement may be invalid (e.g., no). Based on one or more processors identifying a measurement as invalid, feedback 1012, 1016, 1018 or 1022 may omit that measurement for further processing. For example, in response to one or more processors identifying a heading measurement as invalid, feedback 1012, 1016, 1018 or 1022 may omit subsequent heading measurements in determining feedback force(s).

In some embodiments, feedback 1012, 1016, 1018 or 1022 may determine one or more feedback forces based on actuator state information received from one or more sensors (e.g., included in Vehicle Sensing 1031). For example, in response to actuator state information indicating that there is a failure of an actuator, one or more processors of system 1000 may update one or more processes of System 1000 and determine an alternative command to achieve the desired change. For example, one or more processors of system 1000 may adjust one or more model(s), function(s), algorithm(s), table(s), input(s), parameter(s), threshold(s), and/or constraint(s) based on (e.g., in response to) a change in state (e.g., failure) of an actuator (or other aircraft component, such as an engine or battery, for other examples). Alternative command(s) (e.g., yaw, pitch, roll, thrust, or torque) may be determined based on the adjustment(s). Additionally or alternatively, in response to actuator state information indicating that one or more actuators are at a maximum value, one or more processors of system 1000 may update one or more processes of system 1000 (e.g., as described above) and determine an alternative command to achieve the desired change.

Total desired forces may be calculated based on outputs of feedback 1012, 1016, 1018 and 1022 and feed forward 1014 and 1020. For example, one or more processors of system 1000 may calculate a desired turn-rate force by summing the outputs of feedback 1012 and feed forward 1014. Additionally or alternatively, one or more processors of system 1000 may calculate a desired lateral force by summing the outputs of feedback 1016 and feed forward 1014. Additionally or alternatively, one or more processors of system 1000 may calculate a desired vertical force by summing the outputs of feedback 1018 and feed forward 1020. Additionally or alternatively, one or more processors of system 1000 may calculate a desired longitudinal force by summing the outputs of feedback 1022 and feed forward 1020.

Lateral/Directional Outer Loop Allocation 1024 and Longitudinal Outer Loop Allocation 1026 may each be configured to receive as input one or more desired forces and data received from Vehicle Sensing 1031 (e.g., airspeed, vehicle orientation, vehicle load factor, measured acceleration, vehicle mass and inertia, indications of working/failed actuators, air density, altitude, aircraft mode, whether the aircraft is in the air or on the ground, weight on wheels, etc.). Based on the inputs, Outer Loop Allocation 1024 and 1026 may be configured to command roll, command yaw, command pitch, demand thrust, or output a combination of different commands/demands in order to achieve the one or more desired forces. Lateral/Directional Outer Loop Allocation 1024 may receive as input a desired turn-rate force and/or a desired lateral force and may command roll or command yaw. In some embodiments, Lateral/Directional Outer Loop Allocation 1024 may determine output based on a determined flight mode. A flight mode may be determined using pilot inputs (e.g., a selected mode on an inceptor) and/or sensed aircraft information (e.g., an airspeed). For example, Lateral/Directional Outer Loop Allocation 1024 may determine a flight mode of the aircraft using at least one of a determined (e.g., sensed or measured) airspeed or an input received at a pilot inceptor button (e.g., an input instructing the aircraft to fly according to a particular flight mode). In some embodiments, Lateral/Directional Outer Loop Allocation 1024 may be configured to prioritize a pilot inceptor button input over measured airspeed in determining the flight mode (e.g., the pilot inceptor button is associated with a stronger weight or higher priority than a measured airspeed). In some embodiments, Lateral/Directional Outer Loop Allocation 1024 may be configured to blend (e.g., using weighted summation) the determined airspeed and pilot inceptor button input to determine the flight mode of the aircraft. In a hover flight mode, Lateral/Directional Outer Loop Allocation 1024 may achieve the desired lateral force with a roll command (e.g., roll angle, roll rate) and may achieve the desired turn-rate force with a yaw command. In some embodiments, such as in hover flight mode, the aircraft may be configured to not be able to accelerate outside a predetermined hover envelope (e.g., hover speed range). In a forward-flight mode (e.g., horizontal flight), Lateral/Directional Outer Loop Allocation 1024 may achieve the desired lateral force with a yaw command and may achieve the desired turn-rate force with a roll command. In forward flight mode, Lateral/Directional Outer Loop Allocation 1024 may be configured to determine output based on sensed airspeed. In a transition between hover flight mode and forward flight mode, Lateral/Directional Outer Loop Allocation 1024 may achieve desired forces using a combination of a roll command and a yaw command.

Longitudinal Outer Loop Allocation 1026 may receive as input a desired vertical force and/or a desired longitudinal force and may output at least one of a pitch command (e.g., pitch angle) or a thrust vector demand. A thrust vector demand may include longitudinal thrust (e.g., mix of nacelle tilt and front propeller thrust) and vertical thrust (e.g., combined front and rear thrust). In some embodiments, Longitudinal Outer Loop Allocation 1026 may determine output based on a determined flight mode. For example, in a hover flight mode, Longitudinal Outer Loop Allocation 1026 may achieve a desired longitudinal force by lowering a pitch attitude and by using longitudinal thrust, and may achieve a desired vertical force with vertical thrust. In a forward-flight mode, Longitudinal Outer Loop Allocation 1026 may achieve a desired longitudinal force with longitudinal thrust (e.g., front propeller thrust). In a cruise flight mode, Longitudinal Outer Loop Allocation 1026 may achieve a desired vertical force by commanding pitch (e.g., raising pitch attitude) and demanding thrust (e.g., increasing longitudinal thrust).

Inner loop control laws 1028 may be configured to determine moment commands based on at least one of a roll command, yaw command, or pitch command from Lateral/Directional Outer Loop Allocation 1024 or Longitudinal Outer Loop Allocation 1026. In some embodiments, Inner loop control laws 1028 may be dependent on sensed Vehicle Dynamics (e.g., from Vehicle Sensing 1031). For example, Inner loop control laws 1028 may be configured to compensate for disturbances at the attitude and rate level in order to stabilize the aircraft. Additionally or alternatively, Inner loop control laws 1028 may consider periods of natural modes (e.g., phugoid modes) that affect the pitch axis, and may control the aircraft appropriately to compensate for such natural modes of the vehicle. In some embodiments, inner loop control laws 1028 may be dependent on vehicle inertia.

Inner loop control laws 1028 may determine moment commands using one or more stored dynamics models that reflect the motion characteristics of the aircraft (e.g., the aerodynamic damping and/or inertia of the aircraft). In some embodiments, the Inner loop control laws 1028 may use a dynamic model (e.g., a low order equivalent system model) to capture the motion characteristics of the aircraft and determine one or more moments that will cause the aircraft to achieve the commanded roll, yaw, and/or pitch. Some embodiments may include determining (e.g., by inner loop control laws 1028 or other component) a moment command based on at least one received command (e.g., a roll command, yaw command, and/or pitch command) and a determined (e.g., measured) aircraft state. For example, a moment command may be determined using a difference in the commanded aircraft state and the measured aircraft state. By way of further example, a moment command may be determined using the difference between a commanded roll angle and a measured roll angle. As described below, Control Allocation 1029 may control the aircraft (e.g., through flight elements) based on the determined moment command(s). For example, Control Allocation 1029 may control (e.g., transmit one or more commands to) one or more electric propulsion system(s) of the aircraft (e.g., electric propulsion system 602 shown in FIG. 6), including tilt actuator(s), electric engine(s), and/or propeller(s). Control Allocation 1029 may further control one or more control surface(s) of the aircraft (e.g., control surfaces, such as flaperons 712 and ruddervators 714 shown in FIG. 7), including flaperon(s), ruddervator(s), aileron(s), spoiler(s), rudder(s), and/or elevator(s).

While the embodiment shown in FIG. 10 includes both Inner Loop Control Laws 1028 and Outer Loop Allocations 1024 and 1026, in some embodiments the flight control system may not include Outer Loop Allocations 1024 and 1026. Therefore, a pilot inceptor input may create roll, yaw, pitch, and/or thrust commands. For example, a right inceptor may control roll and pitch and a left inceptor and/or pedal(s) may control yaw and thrust.

Control Allocation 1029 may accept as inputs one or more of force and moment commands, data received from and/or measured by the one or more aircraft sensors, envelope protection limits, scheduling parameter, and optimizer parameters. Control Allocation 1029 may be configured to determine, based on the inputs, actuator commands by minimizing an objective function that includes one or more primary objectives, such as meeting (e.g., responding to, satisfying, addressing, providing output based upon) commanded aircraft forces and moments, and one or more secondary, which can include minimizing acoustic noise and/or optimizing battery pack usage.

In some embodiments, control allocation 1029 may be configured to compute the limits of individual actuator commands based on the actuator states and envelope protection limits. Envelope protection limits may include one or more boundaries that the aircraft should operate within to ensure safe and stable flight. In some embodiments, envelope protection limits may be defined by one or more of speed, altitude, angle of attack, or load factor. Angle of attack may refer to the angle at which an aircraft's airfoil (e.g., wing, winglet, propeller blade) meets the relative wind and/or a flight angle of the aircraft. Load factor may refer to the ratio of total aerodynamic force (e.g., lift) acting on an aircraft to the aircraft's weight. For example, envelope protection limits may include one or more bending moments and/or one or more load constraints. In some embodiments, control allocation 1029 may use envelope protection limits to automatically adjust one or more control surfaces or control settings. Doing so may prevent the aircraft from undesirable scenarios such as stalling or structural strain or failure. In normal operation, the minimum command limit for a given actuator may include the maximum of: the minimum hardware based limit and the minimum flight envelope limit; and the maximum command limit for a given actuator may include the minimum of: the maximum hardware based limit and the maximum flight envelope limit. In the case of an actuator failure, the command limits for the failed actuator correspond to the failure mode.

Control allocation 1029 sends commands to one or more flight elements to control the aircraft. The flight elements will move in accordance with the controlled command. Various sensing systems and associated sensors as part of Vehicle Sensing 1031 may detect the movement of the flight elements and/or the dynamics of the aircraft and provide the information to Feedback 1012, 1016, 1018, 1022, Outer Loop allocation 1024 and 1026, Inner Loop Control laws 1028, and Control Allocation 1029 to be incorporated into flight control.

As described above, Vehicle Sensing 1031 may include one or more sensors to detect vehicle dynamics. For example, Vehicle Sensing 1031 may capture how the aircraft moves in response to pilot inputs, propulsion system outputs or ambient conditions. Additionally or alternatively, Vehicle Sensing 1031 may detect an error in the aircraft's response based on exogenous disturbances (e.g., gust causing speed disturbance). Further, Vehicle Sensing 1031 may include one or more sensors to detect propeller speed, such as a magnetic sensor (e.g., Hall effect or inductive sensor) or an optical sensor (e.g., a tachometer) configured to detect the rotor speed of the aircraft engine (and thereby the speed of the propeller). Vehicle sensing 1031 may include one or more sensors to detect a nacelle tilt angle (e.g., a propeller rotation axis angle between a lift configuration (e.g., FIG. 2) and forward thrust configuration (e.g., FIG. 1)). For example, one or more magnetic sensors (e.g., Hall effect or inductive sensor), position displacement sensors, linear displacement sensors, and/or other sensor(s) associated with the tilt actuator may detect a tilt angle (e.g., relative to the aircraft and/or wing), which may be provided to system 1000. Further, one or more pitot tubes, accelerometers, and/or gyroscopes may detect a pitch angle of the aircraft, which may be provided to system 1000. In some embodiments, Vehicle Sensing 1031 may combine tilt angle sensor measurements and aircraft pitch measurements to determine an overall nacelle tilt angle for the propellers. Vehicle sensing 1031 may include one or more sensors configured to detect an engine torque and/or thrust, such as one or more current sensors or voltage sensors, strain gauges, load cells, and/or propeller vibration sensors (e.g., accelerometers).

Vehicle sensing 1031 may include one or more sensors configured to detect vehicle dynamics, such as acceleration and/or pitch orientation sensors (e.g., accelerometer(s), 3-axis accelerometer(s), gyroscope(s), 3-axis gyroscope(s), and/or tilt-position sensors to determine angles of EPUs) and airspeed sensors (e.g., pitot tube sensors). Vehicle sensing 1031 may further include one or more inertial measurement units (IMUs) to determine an aircraft state based on these measurements. An aircraft state may refer to forces experienced by an orientation of, a position of (e.g., altitude), and/or movement of, the aircraft. For example, an aircraft state may include at least one of: a position of the aircraft (e.g., a yaw angle, roll angle, pitch angle, and/or any other orientation across one or two axes), velocity of the aircraft, angular rate of the aircraft (e.g., roll, pitch, and/or yaw rate), and/or an acceleration of the aircraft (e.g., longitudinal, lateral and/or vertical acceleration), or any physical characteristic of the aircraft or one of its components.

In some embodiments, Vehicle Sensing 1031 may include an inertial navigation system (INS) and/or an air data and/or an attitude heading reference systems (ADAHRS). The inertial navigation systems (INS) and/or an air data and attitude heading reference systems (ADAHRS) may include one or more inertial measurement units (IMUs) and corresponding sensors (e.g., accelerometers, gyroscopes, three-axis gyroscopes, and/or three-axis accelerometers). In some embodiments, the INS and/or ADAHRS may filter and/or otherwise process sensor measurements to determine an aircraft state (e.g., acceleration or angular rate). For example, in some embodiments, the INS and/or ADAHRS may determine angular rates based on gyroscope measurements and may determine acceleration based on measurements from an accelerometer. In some embodiments, system 1000 may use information from a BMU (e.g., as discussed below), such as battery state information, which may impact operations performed by the aircraft (e.g., may be used at Outer Loop allocation 1024, Outer Loop allocation 1026, Inner Loop Control laws 1028, and/or Control Allocation 1029).

Figure 11:
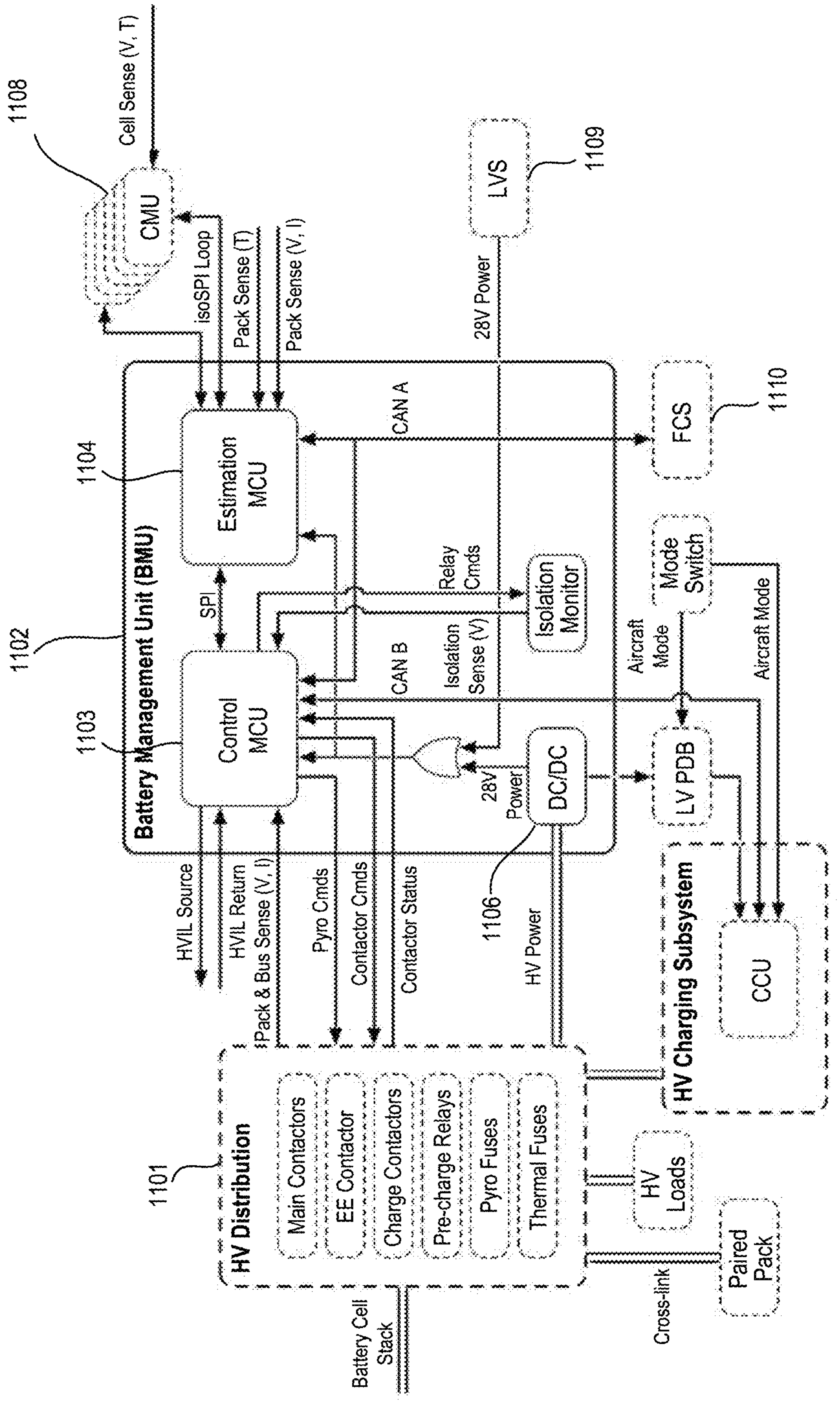
FIG. 11 illustrates a diagram of a battery management unit (BMU) and associated connections, consistent with disclosed embodiments.

FIG. 11 illustrates a diagram of an exemplary battery management unit (BMU) and associated connections, consistent with disclosed embodiments. A BMU may refer to one or more processors (e.g., a controller) configured to monitor one or more conditions of high voltage circuitry. Battery Management Unit (BMU) 1102 may be implemented by at least one processor (e.g., at least one microprocessor-based controller) configured to execute software code stored in a storage medium (e.g., a computer-readable medium, a non-transitory computer-readable medium) to implement any combination of the functions described herein. In some embodiments, BMU 1102 may include one or more multiple controllers and/or associated logic devices. BMU 1102 may monitor the conditions of one or more battery packs and may communicate with various systems within and outside the one or more battery packs. Monitoring may include accessing, detecting, receiving, and/or determining circuitry information (e.g., measurements, such as current, voltage, power, and/or temperature measurements), comparing circuitry information (e.g., to one or more thresholds), analyzing circuitry information (e.g., determining temporal circuitry information, such as by integrating current measurements over time), and/or performing a responsive operation (e.g., changing at least one switch state and/or blowing at least one fuse), consistent with disclosed embodiments.

In some embodiments, BMU 1102 may include a Control MCU 1103 and an Estimation MCU 1104, as exemplified and described below with reference to FIG. 12. In some embodiments, BMU 1102 may receive data from one or more cell measurement units (CMUs) 1108. A CMU may refer to any sensor or device configured to measure one or more data associated with a battery pack cell. For example, CMUs 1108 may record and send cell-level measurements (e.g., voltage, current, temperature) associated with one or more battery cells to Estimation MCU 1104. In some embodiments, BMU 1102 may receive data from one or more pack measurement units (e.g., CMUs for individual battery packs, for groups of battery pack cells, for individual battery pack cells, etc.). For example, BMU 1102 may receive pack-level measurements (e.g., voltage, current, temperature) associated with a battery pack via one or more pack sensing lines. In some embodiments, BMU 1102 may include a DC/DC converter 1106 configured to provide low voltage (LV) power to Control MCU 1103 and/or Estimation MCU 1104. A pack-level measurement may refer to a measurement value associated with a battery pack and may include an estimated overall value. For example, a pack-level temperature may be represented as the entire battery pack having a single temperature value (e.g., 20° C.). A cell-level measurement may refer to a measurement associated with one or more battery cells. For example, a cell-level temperature may be represented as a single battery cell having a single temperature value (e.g., 20.5° C.), which may be the same as or different from a pack-level temperature. In some embodiments, a cell-level measurement may be a high fidelity or high integrity measurement. Additionally or alternatively, in some embodiments, a pack-level measurement may be a lower fidelity or lower integrity measurement.

In some embodiments, a battery management unit may be configured to communicate with a flight control system. For example, BMU 1102 may be configured to send battery state information (e.g., battery SOT, SOC, SOE, SOP, SOH) to FCS 1110.

Figure 12:
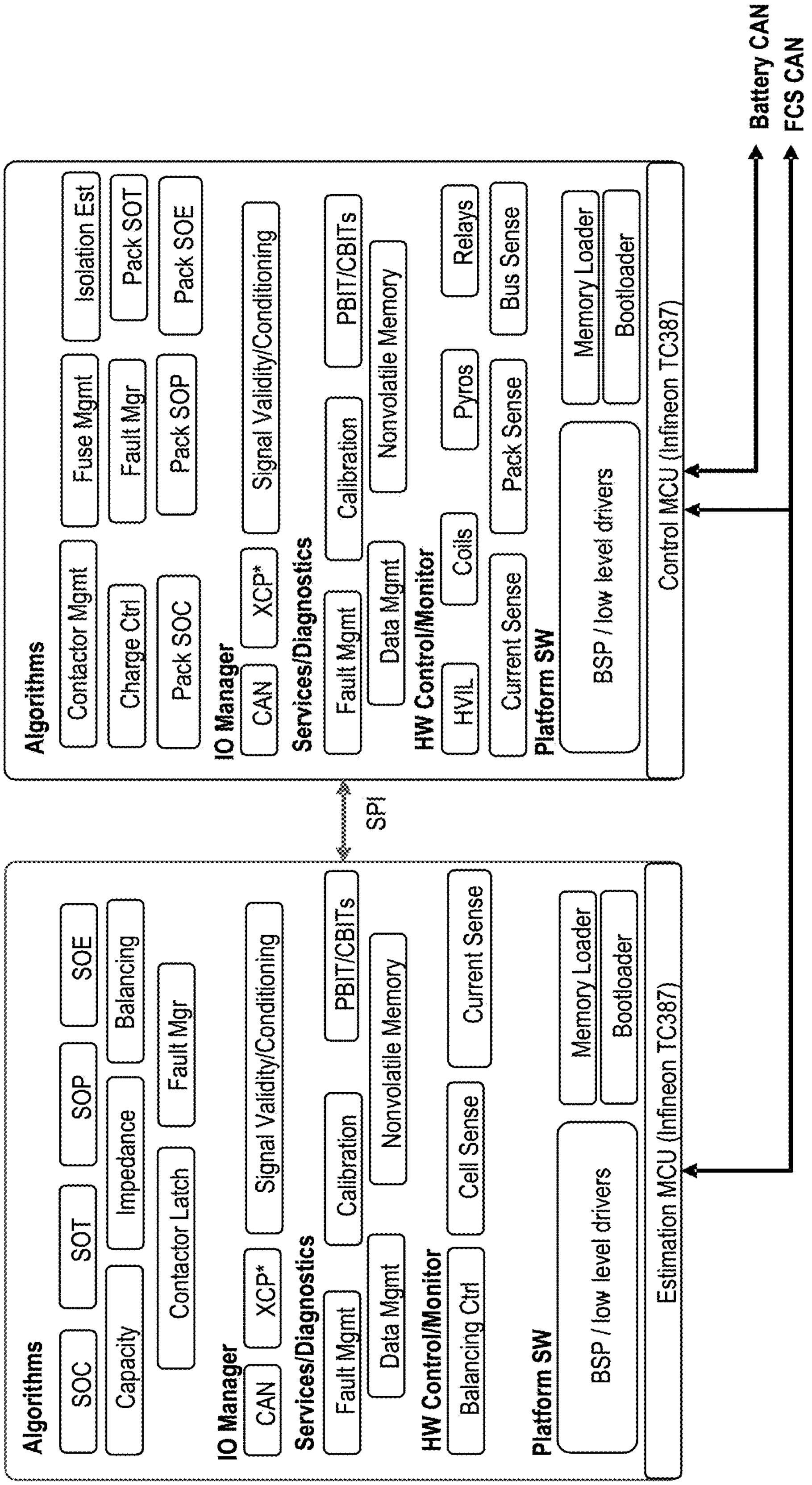
FIG. 12 illustrates an exemplary Estimation microcontroller unit (MCU) and Control MCU architecture, consistent with disclosed embodiments.

FIG. 12 illustrates an exemplary Estimation MCU and Control MCU architecture, consistent with disclosed embodiments.

In some embodiments, Control MCU may include one or more algorithms for determining a SOT, SOC, SOE, SOP, and/or SOH associated with at least one battery pack. For example, Control MCU may receive information from one or more sensing devices to determine at least one state of the battery pack (e.g., SOT, SOC, SOE, SOP, SOH) based on information from the battery pack (e.g., voltage and/or current).

In some embodiments, Estimation MCU may include one or more algorithms for detecting a SOT, SOC, SOE, SOP and/or SOH associated with one or more battery pack cells. For example, the Estimation MCU may receive information from the battery pack cells (e.g., voltage, current, temperature) to determine a SOT, SOC, SOE, SOP, and/or SOH associated with one or more battery pack cells. In some embodiments, this information may be received from one or more CMUs connected to the battery cells.

In some embodiments, Estimation MCU and Control MCU may utilize differing inputs and/or algorithms to determine at least one battery state. For example, the inputs and algorithms used by Estimation MCU to determine one or more of SOT, SOC, SOE, SOP and SOH of one or more battery pack cells may vary (e.g., partially, totally) from the inputs and algorithms used by the Control MCU to determine the same battery states for battery pack cells. Therefore, the states can be compared, for example by the FCS, to determine a more accurate estimate.

Further, in some embodiments, a sensor and/or measuring hardware may be used for each of the Control MCU and Estimation MCU to provide for redundancy and more accurate estimation. For example, Estimation MCU may communicate with one or more sensing devices (e.g., CMU) to determine the state of one or more cells.

In some embodiments, the Control MCU and the Estimation MCU may utilize same inputs and/or algorithms to determine at least one battery state. For example, the Control MCU and the Estimation MCU may both be configured to perform pack-level and/or cell-level battery state estimations using the same, shared, or similar inputs.

In some embodiments, Control MCU and/or Estimation MCU may be configured to communicate with a processor. For example, Control MCU and/or Estimation MCU may communicate battery state information (e.g., SOT, SOC, SOE, SOP, SOH, measurement(s) associated with these states, and/or other determined conditions of the battery pack) to an FCS of an aircraft. In some embodiments, the FCS may receive information from the Control MCU and/or the Estimation MCU and, based on this information, perform one or more actions. For example, the FCS may receive one or more battery state data (e.g., SOT, SOC, SOE, SOP, SOH) and determine that the received battery state is outside a tolerable range (e.g., predetermined range) of aircraft operation.

In some embodiments, based on this determination, the FCS may control the aircraft and/or alert the pilot (e.g., to perform a controlled emergency landing). For example, the FCS may cause the display of an alert (e.g., visual alert, auditory alert, and/or haptic alert) on an interface in a cockpit of the aircraft. As another example, the FCS may force the aircraft to perform at least one maneuver and/or limit the ability of some pilot inputs to control the full capabilities of the aircraft, consistent with disclosed embodiments.

In some embodiments, outputting an alert may include outputting an alert to one or more systems on the ground. For example, the FCS may output (e.g., transmit, send) an alert (e.g., visual alert, auditory alert, and/or haptic alert) to a ground control station and/or an emergency response station.

Further, the FCS may receive information on the battery state and adjust control allocation to one or more electric engines and/or tilt actuators based on the received information. For example, the FCS may lower a torque command to an electric engine that has a low battery state (e.g., low SOE and/or SOC, low battery state relative to at least one other battery, etc.) and/or increase a torque command to an electric engine that has a high battery state (e.g., high SOE and/or SOC, high battery state relative to at least one other battery, etc.). For example, the FCS may lower a torque command to an electric engine that has a high temperature and/or increase a torque command to an electric engine that has a low temperature.

Further, the Control MCU and/or Estimation MCU may receive communication from the FCS. For example, in some embodiments, the FCS may send input information for one or more of the algorithms described above (e.g., a flight path, electric engine(s) states, etc.) to the Control MCU and/or Estimation MCU.

Figure 13:
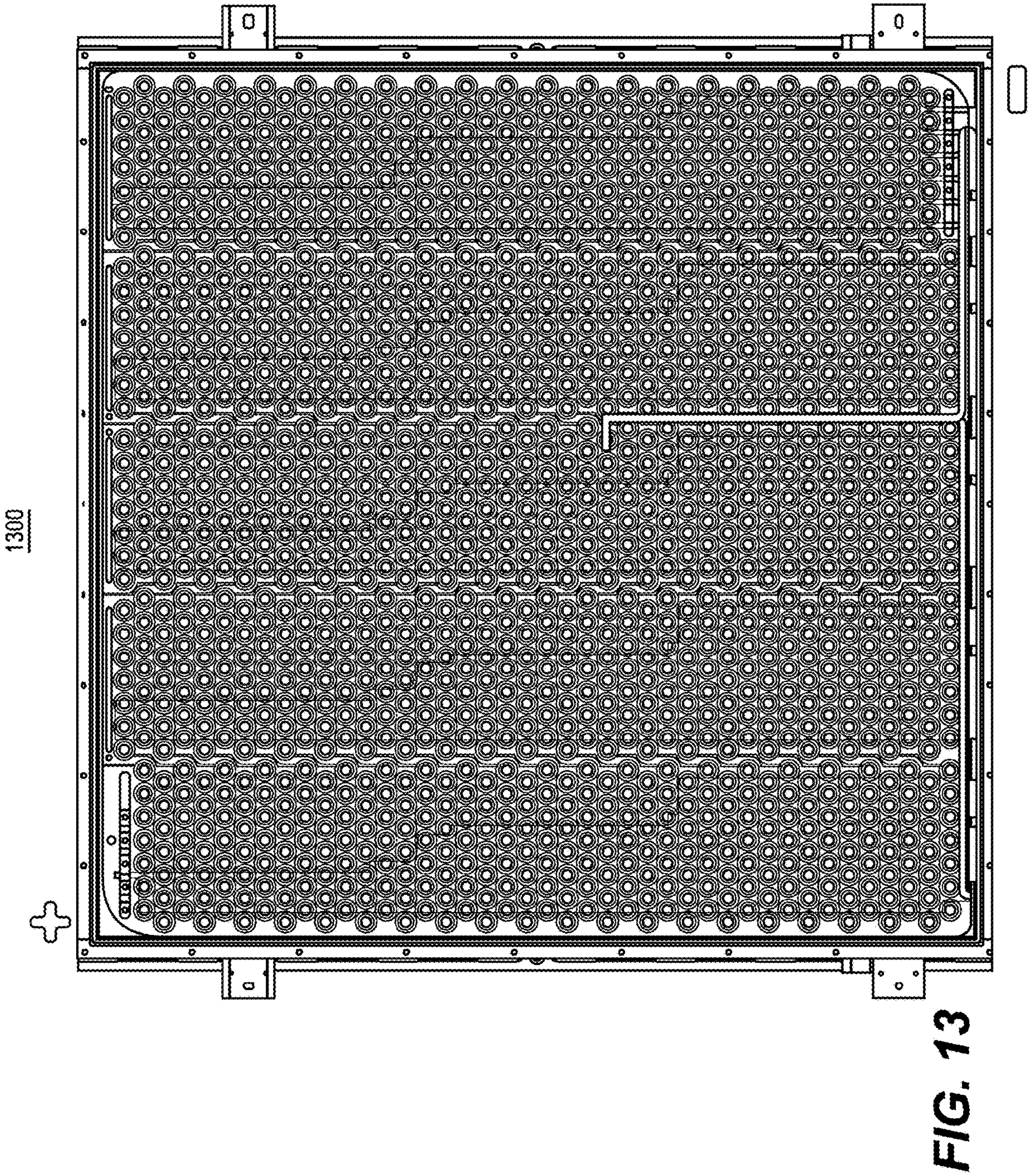
FIG. 13 illustrates an exemplary battery pack, consistent with disclosed embodiments.

FIG. 13 illustrates an exemplary battery pack 1300 from a bird's eye view, consistent with disclosed embodiments. In some embodiments, a battery pack may include a number of battery columns. For example, a battery pack may include 1, 2, 5, 10, or any other number of battery columns, which may be arranged laterally, such as 5 battery columns as depicted in FIG. 13. In some embodiments, a battery column may include a number of modules or battery rows. For example, a battery column may include 1, 5, 10, 25, 50, or any other number of battery rows, such as 42 battery rows as depicted in FIG. 13. In some embodiments, a module or battery row may include any number of battery cells. For example, a battery row may include 1, 5, 10, 50, or any other number of battery cells, such as 7 battery cells as depicted in FIG. 13.

In some embodiments, only a predetermined maximum threshold number of thermistors may be used to determine the temperature of a battery pack (e.g., up to 1, 10, 50, 100, 120, or any other number of thermistors), which may be affected by size, hardware, and/or software limitations. In some embodiments, the threshold number of thermistors may depend on the minimum number of modules and/or cells that allows for proper estimation of the temperature. For example, the number of thermistors may be a number (e.g., minimum) of thermistors that causes an observability matrix of a linear system to be full rank and/or causes the condition number of the observability matrix to coverage towards, or be as close as possible to, unity (e.g., identity matrix). Further, in some embodiments, only a predetermined number of positions or configurations for thermistors may be used to determine the temperature of a battery pack. For example, hardware or wiring constraints may prevent thermistors from being placed in certain locations.

Figure 14B:
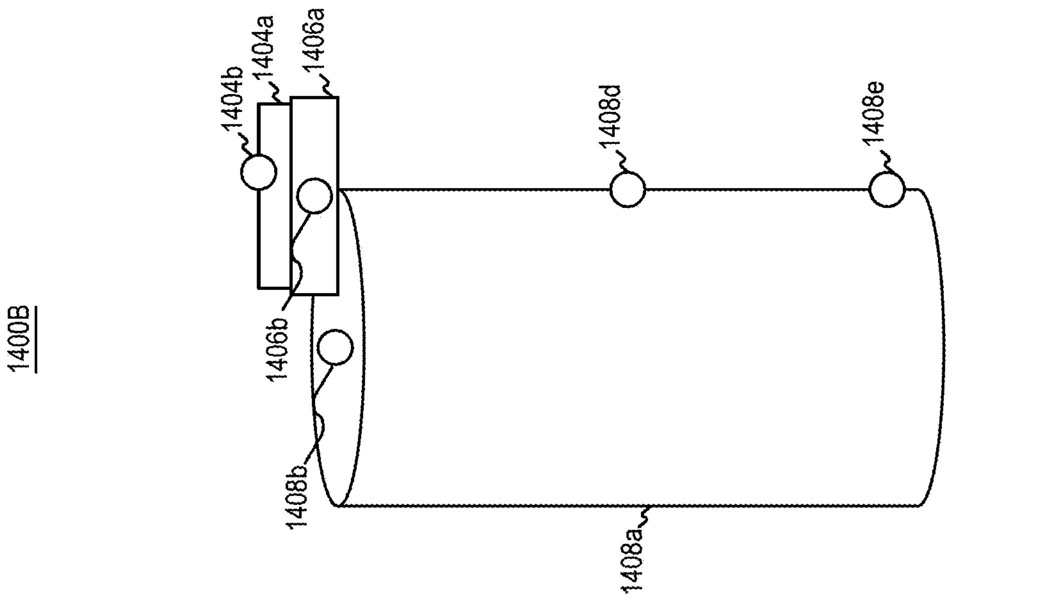
FIGS. 14A and 14B illustrate an exemplary battery cell and associated connections, consistent with disclosed embodiments.
Figure 14A:
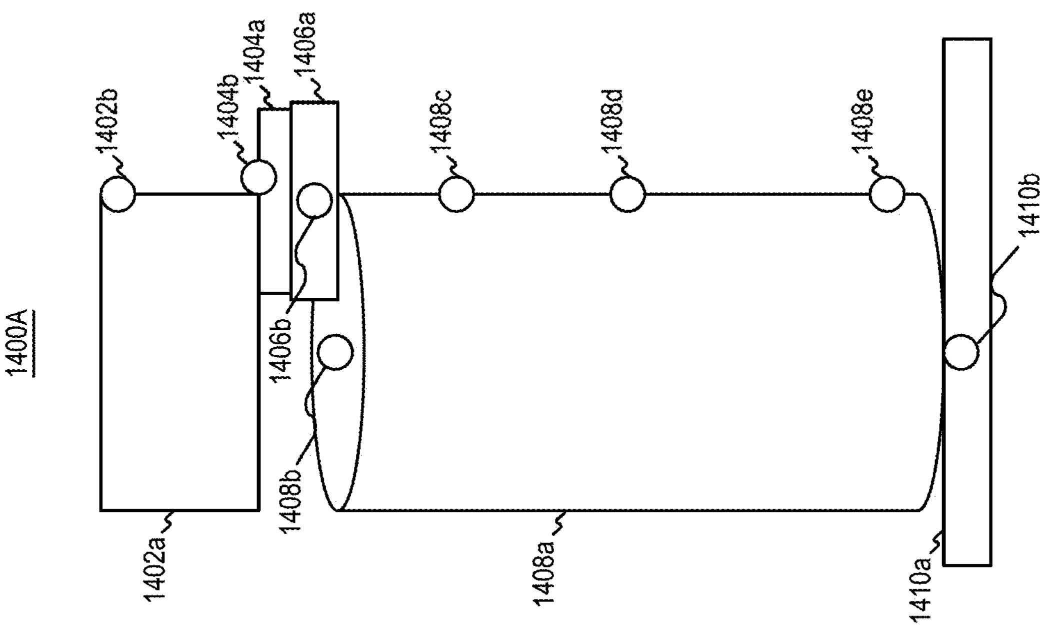

FIGS. 14A and 14B illustrate an exemplary battery cell and associated connections model, consistent with disclosed embodiments. FIG. 14A depicts exemplary battery cell model 1400A including potting layer 1402*a*, flexible printed circuit (FPC) layer 1404*a*, current collector assembly (CCA) layer 1406*a*, battery cell 1408*a*, and heat exchanger plate layer 1410*a*. Furthermore, each component may include one or more associated nodes at which point temperature information may be determined. For example, potting layer 1402*a* may include potting layer node 1402*b*; FPC layer 1404*a* may include FPC layer node 1404*b*; CCA layer 1406*a* may include CCA layer node 1406*b*; battery cell 1408*a* may include crimp node 1408*b*, top can node 1408*c*, mid can node or surface node 1408*d*, and bottom can node 1408*e*; and heat exchanger plate layer 1410*a* may include heat exchanger plate layer node 1410*b*. In general, it may be understood that the nodes depicted in FIGS. 14A and 14B are non-limiting examples and in other embodiments may be located in differing locations within the same component.

In some embodiments, a battery cell model may have (e.g., use, represent) a reduced number of state variables, which may enable more rapid analysis of battery information without sacrificing meaningful accuracy. For example, FIG. 14B depicts a reduced battery cell model 1400B including only 5 nodes: FPC layer node 1404*b*, CCA layer node 1406*b*, crimp node 1408*b*, surface node 1408*d*, and bottom can node 1408*e*. Reduced battery cell model 1400B may be used by at least one processor for state of temperature (SOT) estimation.

As used herein, information described as "pack-level" or "pack level" means that the information is expressed with respect to one or more battery packs. For example, a pack-level temperature may be a temperature of, or a temperature representation of, one or more battery packs. Additionally, as used herein, information described as "cell-level" or "cell level" means that the information is expressed with respect to one or more battery cells, such as a single battery cell or group of battery cells forming a subset of the battery cells in a battery pack. For example, a cell-level voltage may be a voltage of, or a voltage representation of, one or more battery packs.

A state of temperature (SOT) may include or indicate a temperature of at least a portion of a battery cell (e.g., at least one active material of the battery cell, the battery cell itself, multiple battery cells, a battery pack, etc.). For example, an SOT may indicate a core or inner temperature of a battery cell, a temperature of the top of the battery cell, a temperature of the middle of the battery cell, and/or the temperature of the bottom of the battery cell. In some embodiments, an SOT may be based on a measured temperature value (e.g., measured by a temperature sensor adjacent to or on a battery cell). In some embodiments, an SOT may be based on a measured temperature value (e.g., measured by a temperature sensor adjacent to or on a battery cell). An SOT may be estimated using temperature measurements, which may be associated with the at least a portion of a battery cell, such as individual battery cells. For example, an SOT may be estimated using the measured temperature value (e.g., using a model relating an outer measured temperature to an inner temperature).

As another example, an SOT may be a pack-level temperature based on (e.g., calculated using) multiple battery cell SOTs. In some embodiments, an SOT may be based on a measurement (e.g., direct measurement), an estimation (e.g., based on a direct measurement), or a combination of both. An SOT may be expressed as an absolute value of degrees (e.g., in Fahrenheit, Celsius, or Kelvin) and/or a ratio (e.g., with respect to rated limit, safety limit, etc.). In some embodiments, an SOT may be based on an SOH, as discussed further herein. In some embodiments, an SOT may be used to determine an SOC, as discussed further herein. Measurements used for SOT may be taken at a battery cell level and/or derived from measurements taken for multiple cells, such as pack-level measurements. Additionally or alternatively, the SOT of the battery pack may be equal to a combination (e.g., average, weighted average) of SOT of one or more (e.g., each) battery cells. Additionally, or alternatively, SOT of cells in a battery pack may be extrapolated from the SOT of the battery pack. For example, by applying the rationale that SOT of the battery pack estimated using pack-level measurements should be equal approximately the average of SOT of cells in the battery pack, SOT of cells in the battery pack can be estimated.

In some embodiments, the set of reduced nodes may be determined based on one or more system parameters (e.g., preferences or constraints). For example, the at least one processor configured to perform SOT estimation may not be capable of computing a temperature estimate for 8 nodes for each battery cell in a battery pack. In some embodiments, the set of reduced nodes may be determined based on a determined importance. For example, CCA layer node 1406*b* may be selected because the levels of current that travel through the CCA may strongly influence the temperature of a battery cell at that layer. Further, bottom can node 1408*e* may be selected due to its proximity to the heat exchanger plate.

Figure 15:
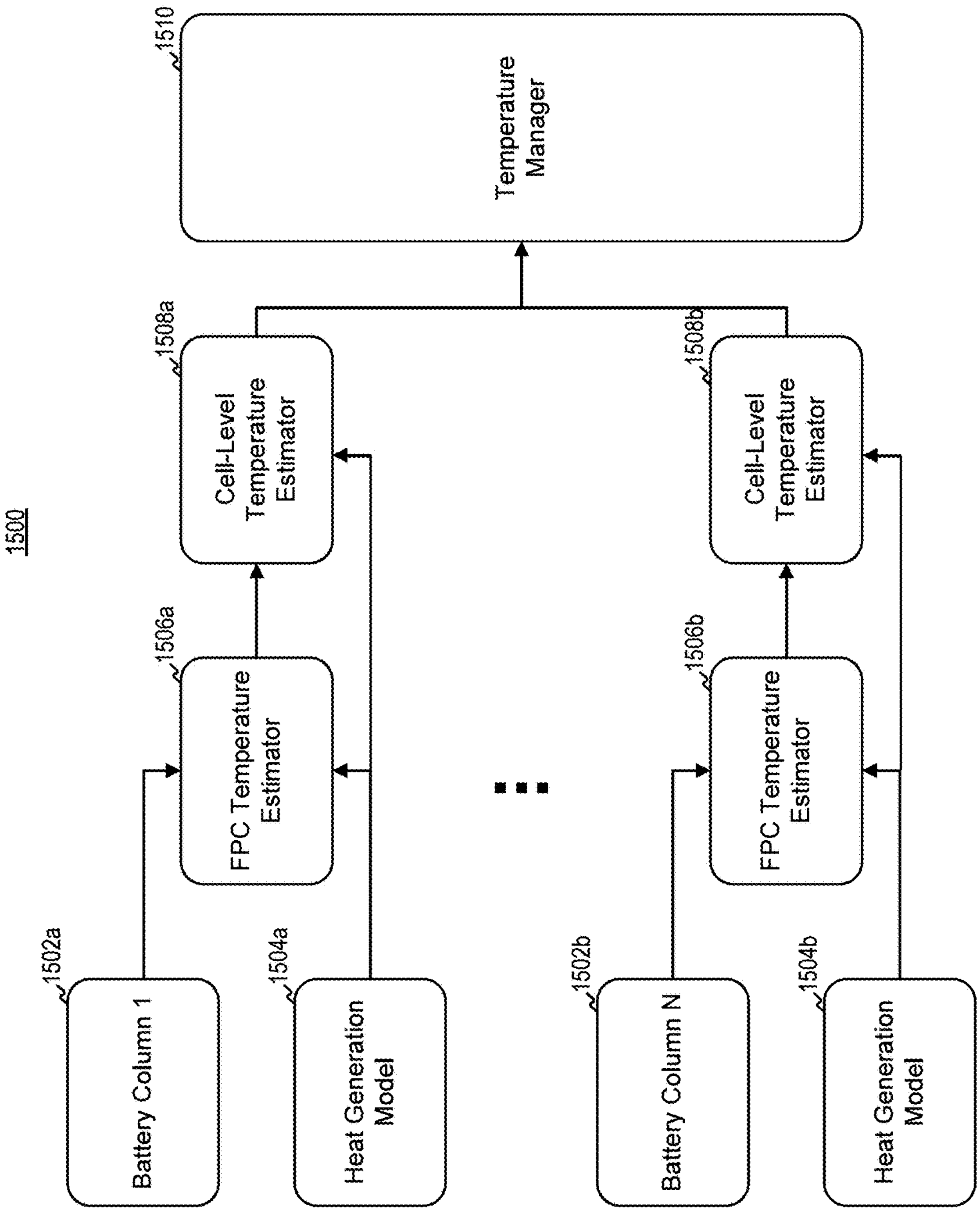
FIG. 15 illustrates an exemplary state of temperature (SOT) estimation, consistent with disclosed embodiments.

FIG. 15 illustrates an exemplary state of temperature (SOT) estimation, consistent with disclosed embodiments. Flow diagram 1500 may be implemented as software (e.g., in at least one module, at least one program, at least one application, and/or at least one function, etc.), hardware (e.g., at least one processor, such as an FCC, BMU, controller, etc.), or a combination of both. In general, it may be understood that similarly numbered components of flow diagram 1500 (e.g., 1502*a* and 1502*b*; 1504*a* and 1504*b*) may refer to similar components or functions that differ only with respect to the battery column with which they are associated. Further, it may be understood that FIG. 15 depicts flow diagram 1500 with respect to N battery columns (N is a positive, whole number, e.g., 1, 5, 10, etc.).

In some embodiments, SOT estimation may be performed based on temperature measurements in one or more battery columns (e.g., each battery column) of the battery pack. For example, at least one battery pack may include 20 thermistors configured to measure temperature, and the number of battery cells or battery cell rows may be greater than the number of thermistors. The thermistors may be located in the FPC layer, for example due to manufacturing, weight, cost, or other constraints. FPC temperature estimator 1506*a* may receive a number of temperature measurements based on (e.g., equal to) the number thermistors (e.g., 20). FPC temperature estimator 1506*a* may further receive an output of heat generation model 1504*a*. In some embodiments, heat generation model 1504*a* may be generated or determined offline or by another model or algorithm (e.g., SOC estimation). FPC temperature estimator 1506*a* may be configured to perform state transformation operations to produce a virtual temperature estimation for each module (e.g., battery cell row) in a battery column 1502*a*. A virtual temperature estimation may refer to an estimated or derived temperature value for a location (e.g., node) near which (e.g., at which, within a threshold distance of which) there is not a physical sensor measuring any values.

Then cell-level temperature estimator 1508*a* may be configured to determine a temperature estimation for a number of nodes in the battery column. For example, cell-level temperature estimator 1508*a* may receive the output of FPC temperature estimator 1506*a* and heat generation model 1504*a*, and may output a temperature estimation for each node in the reduced set of nodes for the battery column.

In some embodiments, the temperature estimation for each selected node in each battery column may be sent to at least one processor. For example, temperature manager 1510 may receive and process the virtual temperature measurements before sending to a corresponding BMU. The BMU may be configured to output to another processor (e.g., FCC) cell-level and pack-level SOT estimations, which may be based on the received virtual temperature measurements. In some embodiments, the pack-level SOT estimation may be performed by the Control MCU according to a first algorithm and the cell-level SOT estimation may be performed by the Estimation MCU according to a second algorithm. For example, the algorithms may include at least one of a weighted average, sum, maximum, minimum, range, standard deviation, or any other combination of mathematical or statistical operations and/or models to determine a cell-level SOT or pack-level SOT.

Figure 16A:
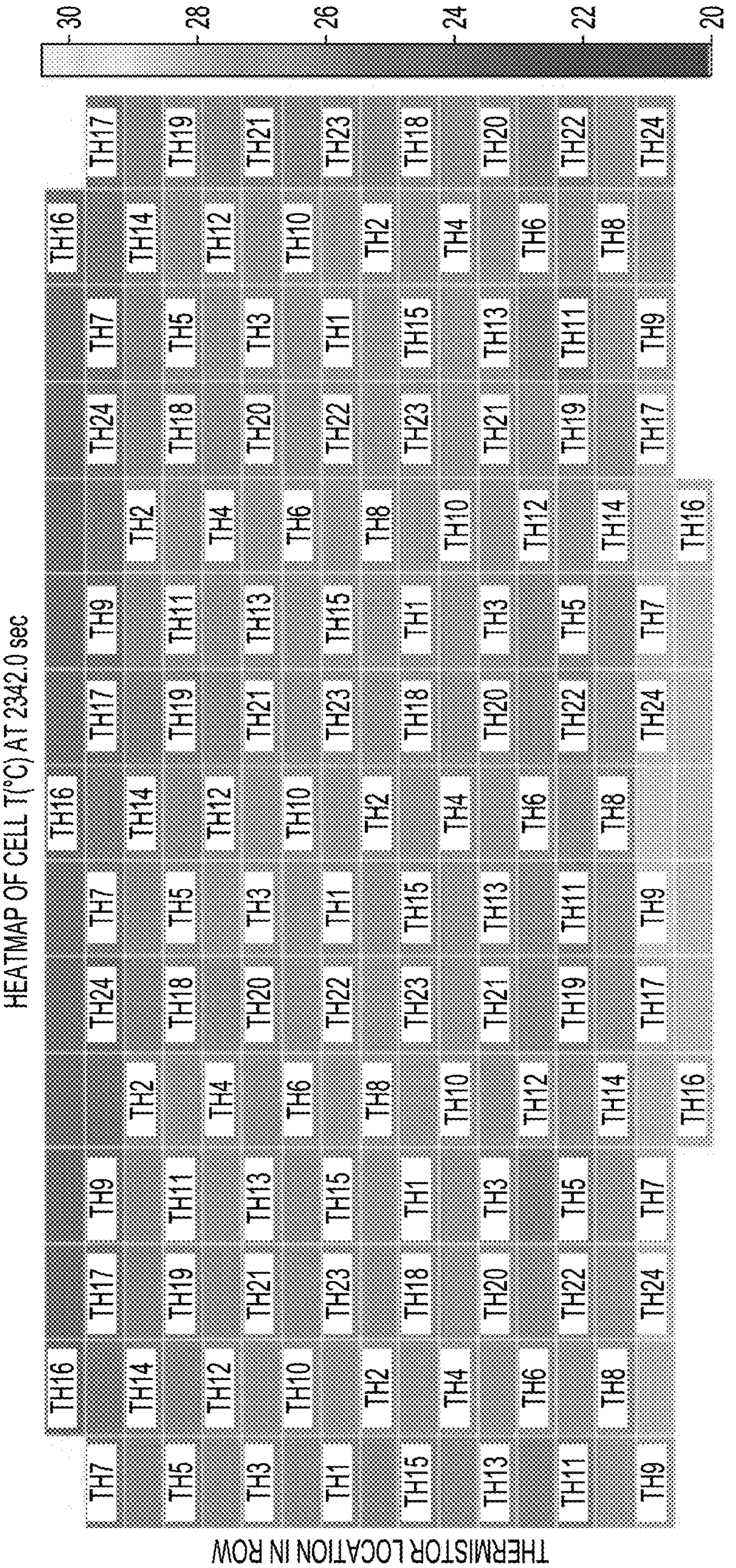
FIG. 16A illustrates an exemplary heat map, consistent with disclosed embodiments.

FIG. 16A illustrates an exemplary heat map 1600A, consistent with disclosed embodiments. A heat map may refer to a visual representation in which temperature is represented by a gradient (e.g., as depicted in FIG. 16A, a darker color is associated with a cooler temperature). Heat map 1600A depicts an exemplary battery pack and that the temperature of each battery cell in the battery pack may not be uniformly distributed throughout the battery pack. In some embodiments, thermistor placement (e.g., an optimized thermistor placement) may be determined based on experimentally derived data of temperature distribution of a battery pack. For example, based on the experimentally derived heat map 1600A, more thermistors may be placed in locations at which temperature is less uniform (e.g., around the periphery of the battery pack) and fewer thermistors may be placed in locations at which temperature is more uniform (e.g., near the center of the battery pack).

Figure 16B:
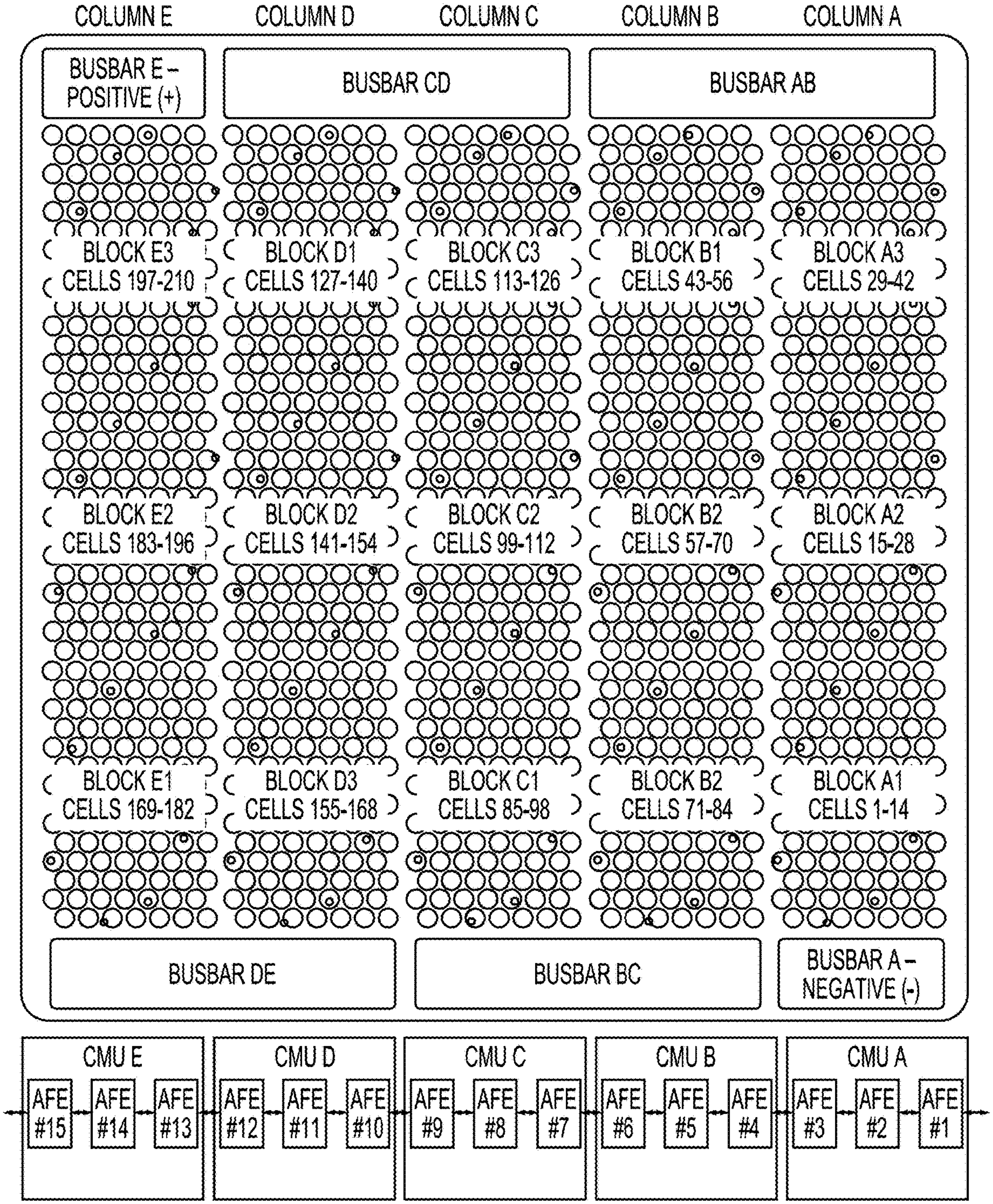
FIG. 16B illustrates an exemplary optimized thermistor placement, consistent with disclosed embodiments.

FIG. 16B illustrates an exemplary optimized thermistor placement, consistent with disclosed embodiments. For example, if the temperature of a battery pack is more uniform near the center of the pack, fewer thermistors may be placed towards the center and more thermistors may be placed around the periphery of the battery pack. For example, fewer thermistors may cover the center half-cross-sectional area of the battery pack than the outer half-cross-sectional area of the battery pack. In some embodiments, the number of thermistors may be fewer than a number of battery cells (e.g., the number of battery cells in a battery pack). In some embodiments, the number of thermistors may be less than half of the number of battery cells.

FIGS. 17, 18, 19A, and 19B illustrate an exemplary state of charge (SOC) estimation, consistent with disclosed embodiments. In some embodiments, an SOC may indicate an ability of at least a battery cell (e.g., the battery cell itself, multiple battery cells, a battery pack, multiple battery packs, etc.) at a particular instant of time to store (or provide) charge. State of charge may be expressed as an absolute number (e.g., Coulombs or Amp-hrs Ah) or as a ratio or percentage relative to a maximum ability of the at least a battery cell to store (or provide) charge. In some embodiments, a state of charge may refer to an available battery pack capacity relative to the battery pack's rated capacity. Additionally or alternatively, in some embodiments, state of charge may refer to an available battery cell capacity relative to the battery cell's rated capacity.

In some embodiments, an SOC may be based on a measured charge or voltage value (e.g., measured by a temperature sensor adjacent to or on a battery cell). An SOC may be estimated using charge or voltage measurements, which may be associated with the at least a portion of a battery cell, such as individual battery cells. Measurements used for SOC may be taken at a battery cell level and/or derived from measurements taken for multiple cells, such as pack-level measurements. Further, in some embodiments, a state of charge of a battery pack may be based on one or more states of charge of one or more battery cells. For example, a battery pack SOC may be a combination (e.g., summation, weighted summation) of each battery cell SOC. Additionally or alternatively, the SOC of the battery pack may be equal to a combination (e.g., average, weighted average) of states of charge of one or more (e.g., each) battery cells. Additionally, or alternatively, SOC of cells in a battery pack may be extrapolated from the SOC of the battery pack. For example, by applying the rationale that SOC of the battery pack estimated using pack-level measurements should be equal approximately the average of SOC of cells in the battery pack, SOC of cells in the battery pack can be estimated.

Figure 17:
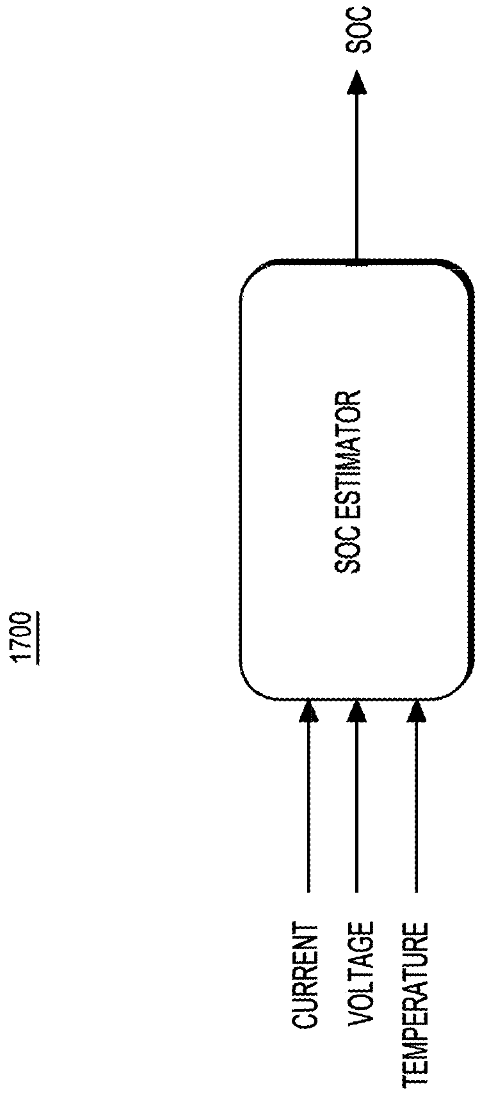
FIGS. 17, 18, 19A, and 19B illustrate an exemplary state of charge (SOC) estimation, consistent with disclosed embodiments.

FIG. 17 illustrates a flow diagram of an exemplary method for SOC estimation, consistent with disclosed embodiments. Flow diagram 1700 may be implemented as software (e.g., in at least one module, at least one program, at least one application, and/or at least one function, etc.), hardware (e.g., at least one processor, such as an FCC, BMU, controller, etc.), or a combination of both.

As shown in FIG. 17, one or more sensors may be configured to measure current, voltage, and/or temperature. These measurements may be used as inputs into an algorithm (e.g., SOC estimator) configured to determine an estimated state of charge (e.g., SOC) of the battery pack. Charge may refer, e.g., to an amount of electrical potential energy within a battery and may be measured, e.g., in Coulombs. SOC is an advantageous variable that may indicate both battery performance and safety levels of a battery (or multiple batteries), especially as applied to electrical aircraft, as it measures the current level of charge or energy stored in one or more battery packs which power the aircraft. An SOC estimator may be implemented (e.g., as a software module, model, and/or algorithm, etc.) by at least one processor (e.g., a controller, BMU, and/or FCC, etc.).

In some embodiments, an SOC estimation may be based an output of an online model which may be configured to receive input of at least one of a cell current, a cell voltage, a cell temperature or an ambient temperature, consistent with disclosed embodiments, such as those discussed with respect to FIGS. 17-19B and output the estimated state of charge. For example, at least one processor may implement a Coulomb Counting Model configured to receive an input of a current of a battery cell.

Figure 18:
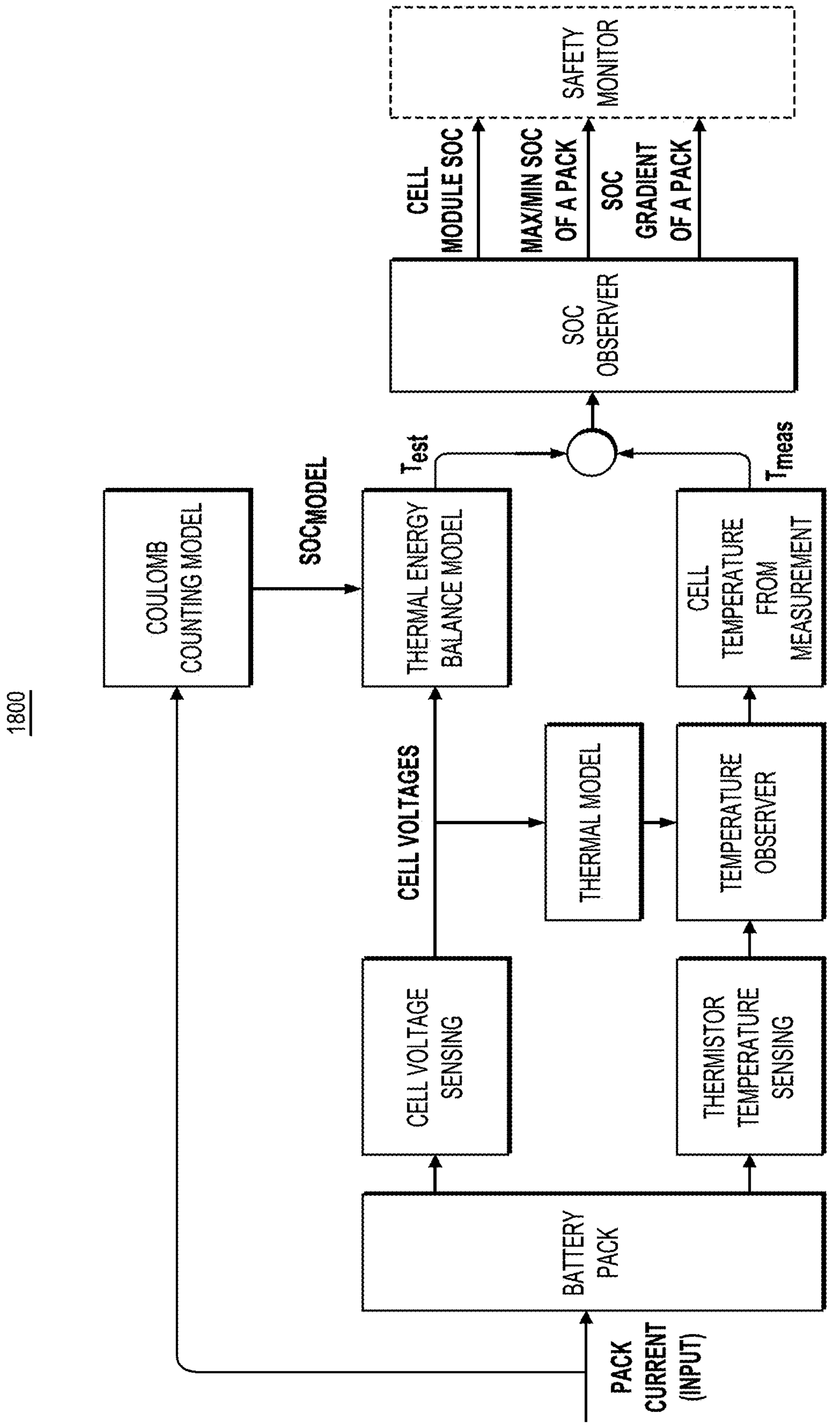

FIG. 18 is a flow diagram of another exemplary method for battery SOC estimation, consistent with disclosed embodiments. The flow diagram 1800 may be implemented (e.g., as a software module, model, and/or algorithm, etc.) by at least one processor (e.g., a controller, BMU, and/or FCC, etc.). In some embodiments, and as shown in FIG. 18, pack current may refer to an amount of current flowing through a battery pack and may be used as input into a method or system (e.g., at least one processor) for estimating SOC. A battery pack may be designed using thermistor topology design optimization and thermistor location optimization, as discussed above with respect to FIGS. 16A and 16B. Cell voltage sensing may involve sensing a cell voltage from a voltage sensor. Cell voltage may be used as an input to a thermal model. The thermal model may involve a pack-level thermal model that may characterize the thermal dynamics of the pack. Thermistor temperature sensing may involve sensing temperature from a thermistor installed and located on a battery pack. Thermistor temperature sensing and/or a thermal model may both be used as inputs into a temperature observer. In some embodiments, a temperature observer may perform an adaptive filtering algorithm. A temperature observer may be implemented in software (e.g., as a software module, model, and/or algorithm, etc.), in hardware (e.g., by at least one processor, such as a controller, BMU, and/or FCC, etc.), or a combination of both. A temperature observer may further provide an output including a cell temperature ($T_{meas}$) from measurements or calculations performed by the temperature observer. The temperature observer may communicate with (e.g., may receive input from, may access, may prompt) the thermal model to estimate the temperature of each cell in the pack based on cell voltage as an input. In some embodiments, the temperature observer may receive virtual temperature measurements from a separate entity (e.g., another processor). For example, temperature manager 1510 may send its determined virtual temperature measurements for each battery cell to the temperature observer instead of or in addition to the temperature measurements from thermistor temperature sensing.

In some embodiments, pack current (or cell current) may be provided as an input into a Coulomb Counting Model. A Coulomb Counting Model may be represented, for example, as follows (in some embodiments, $Q_{cell}$ may be multiplied by a factor to convert between different representations, such as 3600, to convert from hours to seconds):

$$\dot{SOC} = \frac{I}{Q_{cell}}$$

Coulomb Counting Model may generate an output including a model SOC value (e.g., $SOC_{MODEL}$) calculated via the above equation. Further, the model SOC value and cell voltage(s) may be provided as inputs into a thermal energy balance model. The thermal energy balancing model may involve a cell-level thermal model to characterize the thermal dynamics of the battery pack. In some embodiments, a thermal energy balance model may be represented as follows:

$$mc_p\dot{T}_{cell} = Q_{irr} + Q_{rev} + hA(T_{amb} - T_{cell})$$

$$mc_p\dot{T}_{cell} = (V_{cell} - V_{OC}(SOC))I + IT_{cell}\frac{\partial V_{oc}}{\partial T(SOC)} + hA(T_{amb} - T_{cell})$$

The variables in the above models may be understood as follows: I is current; $Q_{cell}$ is cell capacity; $T_{cell}$ is cell header temperature; $T_{amb}$ is ambient temperature; $Q_{irr}$ is irreversible heat; $Q_{rev}$ is reversible heat; m is mass; $c_p$ is specific heat; h is heat transfer coefficient; A is surface area; $V_{cell}$ is cell voltage; $V_{OC}$ is open circuit voltage and may depend on the calculated model SOC value; and $$\frac{\partial V_{OC}}{\partial T}$$

is an entropic heat coefficient and may depend on the calculated model SOC value. In the equations below, unless otherwise noted, the same terms have the same meaning. In some embodiments, open circuit voltage may be pre-characterized or predetermined, e.g., via open $V_{OC}$—SOC experiments (and, optionally, stored). In some embodiments, the entropic heat coefficient may be pre-characterized or predetermined via entropic heat experiments (and, optionally, stored). In some embodiments, a thermal energy balance model may, via the above equations, determine and/or provide an output including an estimated temperature ($T_{est}$) from measurements or calculations performed by the thermal energy balance model.

In some embodiments, $T_{meas}$ and $T_{est}$ may both be inputs into an SOC observer. In some embodiments, an SOC observer may perform an adaptive filtering algorithm (e.g., Kalman Filter, Extended Kalman Filter, recursive least squares, etc.). An SOC observer may include at least one processor and may output at least one of a cell module SOC, a maximum SOC of a battery pack, a minimum SOC of a battery pack, or a SOC gradient of a battery pack. In some embodiments, the outputs of the SOC observer may be communicated or otherwise provided to a safety monitor. In some embodiments, a safety monitor may transmit SOC-related information to another system, processor, or operator. In some embodiments, a safety monitor may process SOC-related information and generate an output based on the information received.

In some embodiments, one or more steps performed during the battery SOC estimation, such as the process depicted in FIG. 18, may involve an algorithm (e.g., an adaptive filtering algorithm) that is configured to determine and/or mitigate (e.g., correct) faulty, erroneous, and/or improbable measurements. For example, if an input into the SOC observer is determined to be a faulty or improbable measurement, the SOC observer may automatically discount and compensate for the faulty or improbable measurement. Determining a faulty or improbable measurement may be based on, e.g., a predetermined threshold value or an expected range of values. Correcting for the faulty or improbable measurement may include, e.g., removing the measurement from the collected data.

In some embodiments, temperature-based battery SOC estimation may involve a plurality of SOC estimation algorithms running on one or more processors. Each of the plurality of SOC estimation algorithms may be of the same and/or different type. For example, SOC estimation may involve a battery cell-level SOC estimation algorithm, which may run on a first processor (e.g., Estimation MCU), and a battery pack-level SOC estimation algorithm, which may run on a second processor (e.g., Control MCU). The outputs of each SOC estimation algorithm may be compared against each other to increase overall accuracy as well as to ensure that neither measurement system has failed. In some embodiments, the outputs may be combined (e.g., through a weighted summation) to produce a refined SOC estimation. In some embodiments, the outputs of each SOC estimation may be sent to a central processor. For example, an FCC may receive the cell-level and pack-level SOC estimations and may store them in a memory.

Figure 19A:
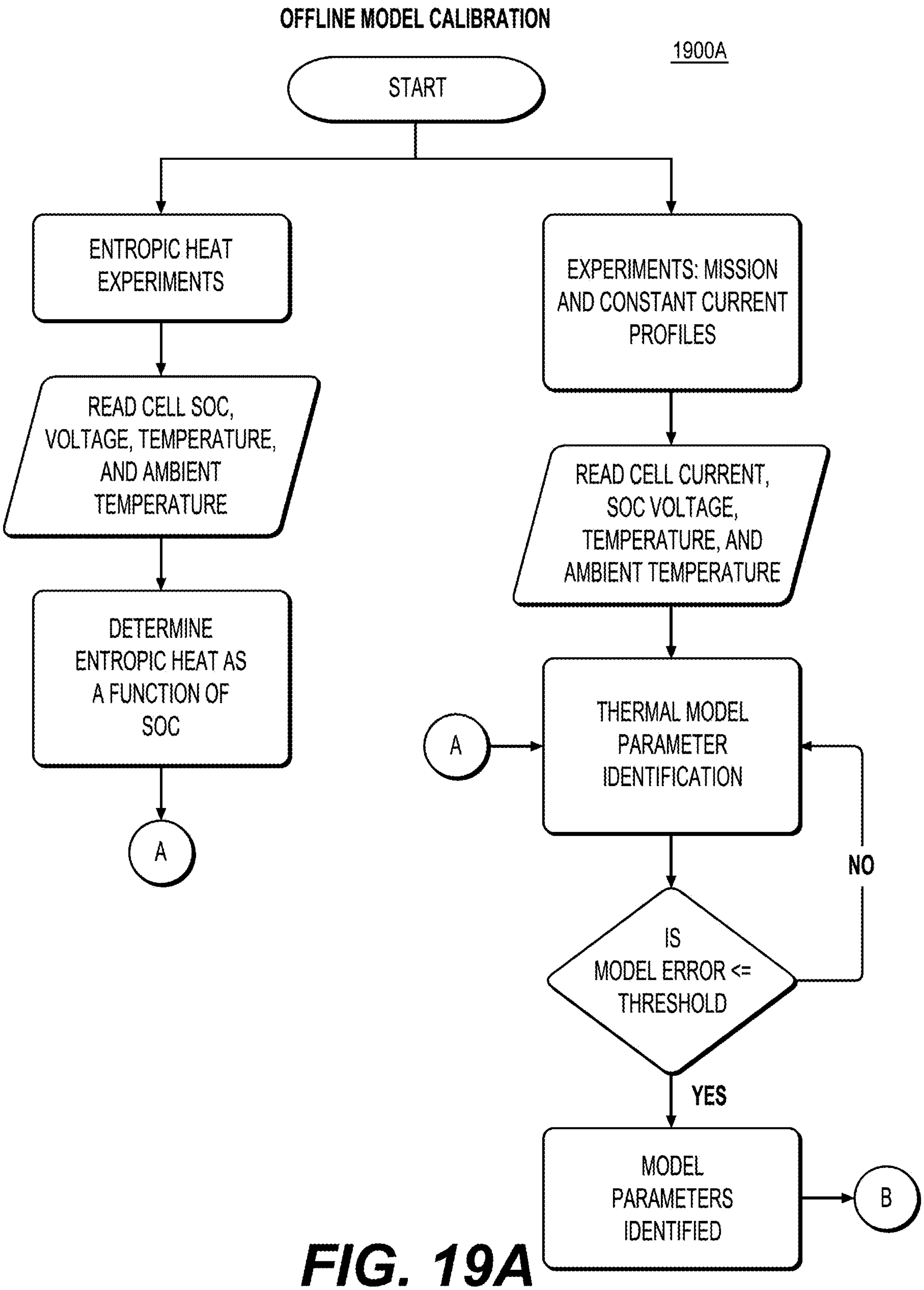
Figure 19B:
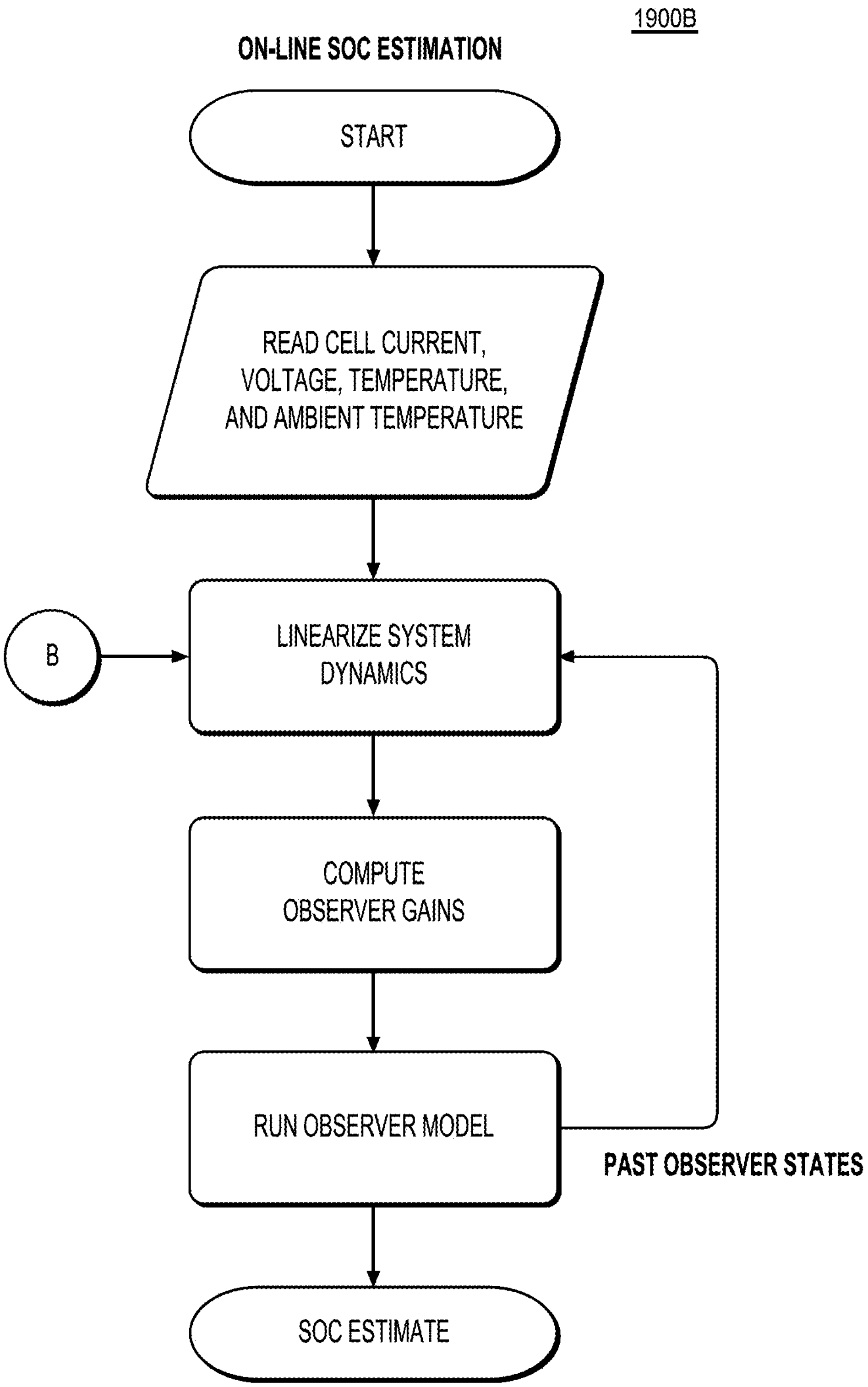

FIGS. 19A and 19B illustrate flow diagrams of exemplary methods for battery SOC estimation, consistent with disclosed embodiments. FIG. 19A depicts an exemplary model calibration process 1900A and may be implemented as software (e.g., in at least one module, at least one program, at least one application, and/or at least one function, etc.), hardware (e.g., at least one processor, such as an FCC, BMU, controller, etc.), or a combination of both. A model of battery behavior may be calibrated based on a calibration process. For example, a model of battery behavior may be generated, determined, and/or modified using a calibration process. The model of battery behavior may be an online model, consistent with disclosed embodiments. Battery behavior may include how a battery uses charge, releases current, produces heat, and/or performs any electrical or thermal activity. The calibration process may use, as inputs, one or more operating conditions, such as load combinations, load demands, flight modes, altitudes, and/or temperatures, under which to analyze the battery behavior. The model calibration process may start with one or more entropic heat experiments and/or may be performed offline, for example by ground processing systems and/or while an aircraft is not in flight. An entropic heat experiment may refer to an experimental setup configured to investigate how heat is affected (e.g., generated, absorbed) due to changes in entropy. For example, an entropic heat experiment may include a battery cell-level test configured to monitor (e.g., measure, record) one or more variables of a battery cell while charging and discharging and to characterize the reversible entropic heat of a battery cell. Entropic heat may refer to the heat generated or absorbed by the battery pack and may be considered reversible if the entropic heat can cause an entropy change in the system but leaves the surroundings unaffected, maintaining thermodynamic equilibrium.

In some embodiments, an SOC estimation may be based on at least one of an estimated temperature of one or more of at least one battery cell and at least one battery pack, consistent with disclosed embodiments. For example, the SOC estimation may be based on a temperate of one or more of at least one battery cell and at least one battery pack, where the temperature is estimated based on one or more of at least one experiment, at least one model, at least one algorithm, or at least one function, consistent with disclosed embodiments.

Based on the one or more entropic heat experiments, cell SOC, cell voltage, cell temperature, and ambient temperature may be measured and recorded. Then, based on the measured and recorded values, entropic heat may be determined as a function of SOC.

At the same time, or at a different time, one or more experiments related to mission and constant current profiles may be performed, in which cell SOC, cell voltage, cell temperature, and ambient temperature may be measured and recorded. Mission current profiles may refer to an amount of current estimated (e.g., projected or determined via one or more experiments or models) to be used for a given flight mission. Constant current profiles may refer to a constant amount of current estimated (e.g., projected or determined via one or more experiments or models) to be used at a particular time (e.g., minimum current draw during operation).

Then, a thermal model parameter identification step may be performed that uses both sets of measured and recorded values as inputs (e.g., the entropic heat values and the mission and constant current profiles values). For example, the thermal model parameter identification step may include identifying one or more parameters related to heat transfer in a battery pack (e.g., thermal conductivity, capacitance, etc.). The thermal model parameter identification step may further calculate and check a model error value. The model error value may refer to a difference between the measured temperature value and the model-predicted temperature value. If the model error value is greater than a predefined threshold, the thermal model parameters may be adjusted, and the check may be performed again. If the re-calculated model error value is less than or equal to the predefined threshold, the model parameters may be identified. In some embodiments, the model calibration process may occur offline, online, or via a combination thereof.

FIG. 19B depicts an exemplary SOC estimation process. Flow diagram 1900B may be implemented as software (e.g., in at least one module, at least one program, at least one application, and/or at least one function, etc.), hardware (e.g., at least one processor, such as an FCC, BMU, controller, etc.), or a combination of both. The SOC estimation process (e.g., an online process) may involve reading measurements associated with a battery pack (e.g., onboard an aircraft), including cell current, cell voltage, cell temperature, and ambient temperature. Then, using the read measurements and model parameters (e.g., identified from the model calibration process), SOC estimation process may involve steps of one or more of linearizing system dynamics, computing observer gains, and/or running an observer model. Further, in some embodiments, past observer states determined from running previous observer models may act as feedback loop inputs into the linearizing system dynamics step. Furthermore, the SOC estimation process may output an SOC estimate based on at least one of the linearizing system dynamics, computing observer gains, or running of the observer model.

FIGS. 20, 21, and 22A-22C illustrate an exemplary state of energy (SOE) estimation, consistent with disclosed embodiments. A state of energy (SOE) may indicate a predicted amount of energy remaining in at least one battery cell (e.g., a single battery cell, multiple battery cells, a battery pack, multiple battery packs, etc.) at a particular time. In some embodiments, an SOE may be based on (e.g., calculated using) an expected future power demand from the at least one battery cell (e.g., demanded by a system, such as a vehicle or aircraft). Additionally or alternatively, an SOE may include or may be based on one or more of an estimated range (e.g., flight range of an aircraft), an amount of useful energy, or an amount of usable energy. In some embodiments, a state of energy may be based on past use of the at least one battery cell (e.g., based on past flights). Additionally or alternatively, an SOE may include or be based on a total energy in a cell, which may be calculated by determining an area under an open circuit voltage-SOC curve. Additionally or alternatively, an SOE may include or be based on the expression of Vnom*Q, where the Vnom is the nominal voltage of a cell or battery, and Q is a charge capacity (e.g., expressed in Ah). In some embodiments, an SOE may include available discharge energy in a battery cell such that when an assumed power demand is realized, a system constraint is reached at the conclusion of the demand. For example, a system constraint may include a minimum cell voltage, a maximum cell temperature, and/or a minimum voltage of one or more connected loads (e.g., EPU). In some embodiments, an SOE may be based on a measured charge, temperature, voltage, impedance, and/or other value(s) of battery cell characteristic (physical, electrical, and/or chemical) (e.g., measured by a sensor adjacent to or on a battery cell, such as a voltage sensor). An SOE may be estimated using charge, temperature, and/or voltage measurements, which may be associated with the at least a portion of a battery cell, such as individual battery cells. Measurements used for SOE may be taken at a battery cell level and/or derived from measurements taken for multiple cells, such as pack-level measurements. Additionally or alternatively, the SOE of the battery pack may be equal to a combination (e.g., average, weighted average) of states of energy of one or more (e.g., each) battery cells. Additionally, or alternatively, SOE of cells in a battery pack may be extrapolated from the SOE of the battery pack. For example, by applying the rationale that SOE of the battery pack estimated using pack-level measurements should be equal approximately the average of SOE of cells in the battery pack, SOE of cells in the battery pack can be estimated.

Figure 20:
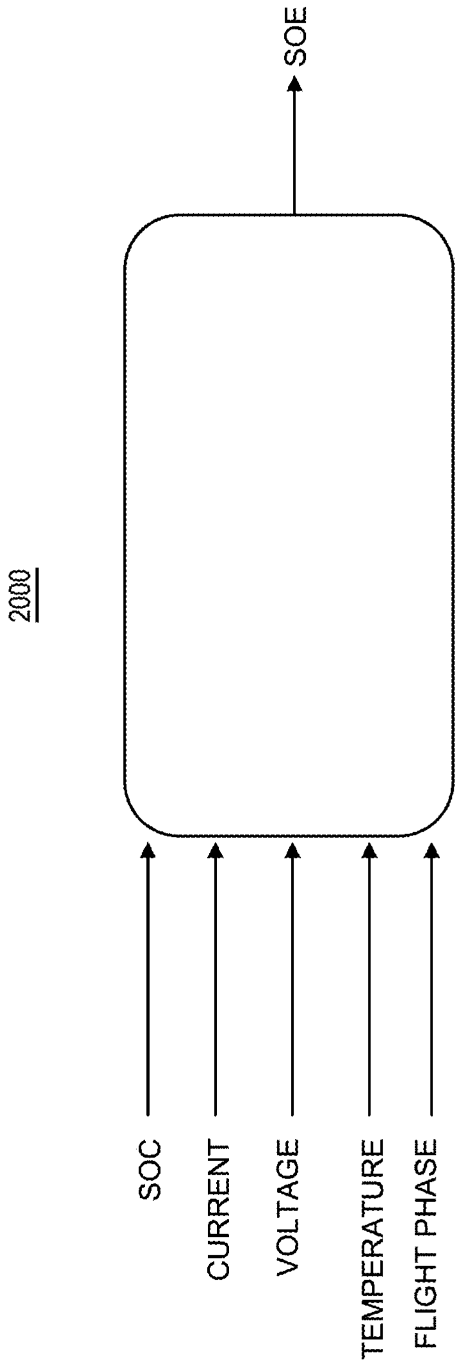
FIGS. 20, 21, and 22A-22C illustrate an exemplary state of energy (SOE) estimation, consistent with disclosed embodiments.
Figure 21:
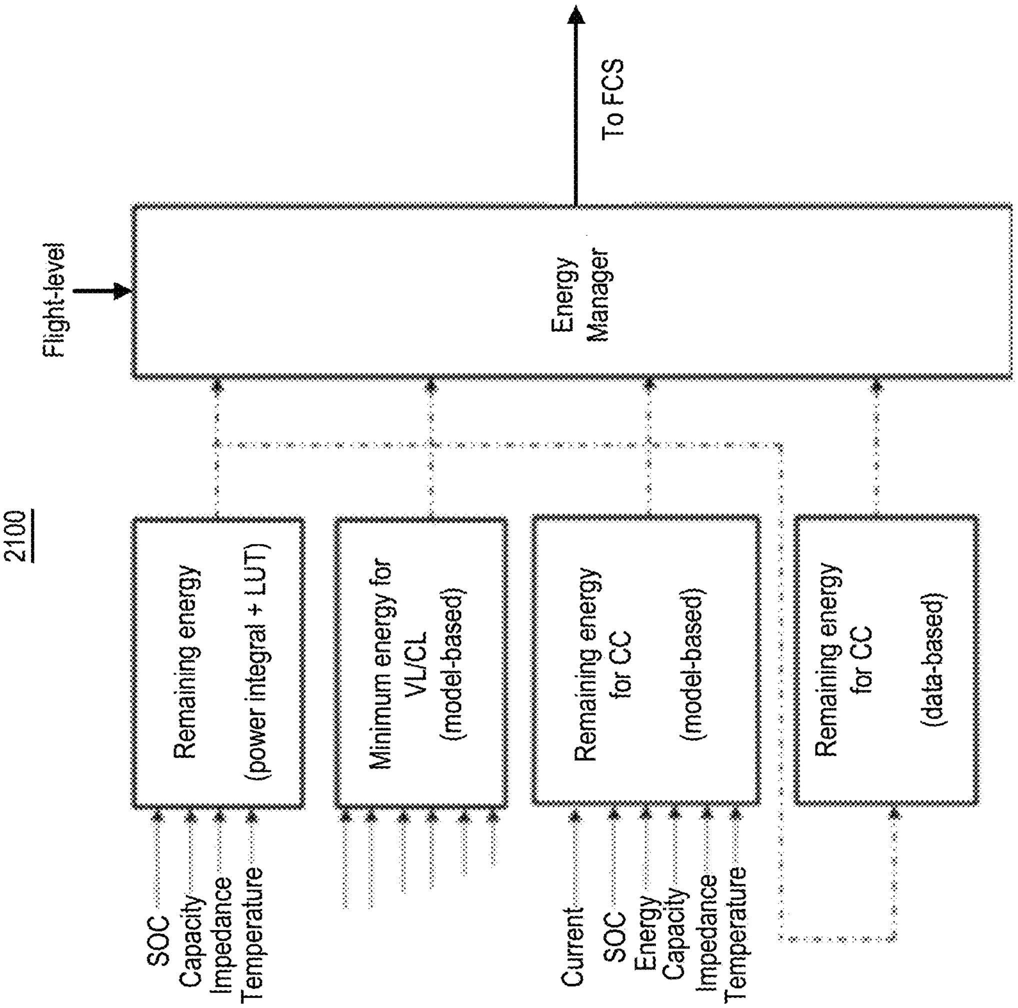

FIGS. 20 and 21 illustrate exemplary SOE estimation inputs, consistent with disclosed embodiments. Flow diagram 2000 and 2100 may be implemented as software (e.g., in at least one module, at least one program, at least one application, and/or at least one function, etc.), hardware (e.g., at least one processor, such as an FCC, BMU, controller, etc.), or a combination of both. One or more sensors may be configured to measure current, voltage, and/or temperature. These measurements, optionally with other information (e.g., SOC, flight phase, and/or flight plan information, etc.) may be input into an algorithm (e.g., SOE estimator) configured to determine an estimated SOE. SOE is an important variable, as it can be used to provide information on the available range of the aircraft. In some embodiments, the SOE may include an amount of useable energy in consideration of flight plan (e.g., landing maneuver). As described below, the Control MCU and/or Estimation MCU may store different algorithms, models and/or data structures to determine a SOE based on a flight phase and/or energy draw. In some embodiments, the Control MCU and/or Estimation MCU may receive information indicating the flight phase from the FCS, while in other embodiments, the Control MCU and/or Estimation MCU may be configured to determine the flight phase. In some embodiments, the Control MCU and/or Estimation MCU may be configured to determine the flight phase based on a measured power draw or determined change in power draw. For example, a constant power draw may indicate a cruise phase while an increasing power draw may indicate a take-off phase. Unless stated otherwise herein, vertical landing may be abbreviated by "VL" (as in FIG. 21) and conventional landing may be abbreviated by "CL" (as in FIG. 21).

Figure 22A:
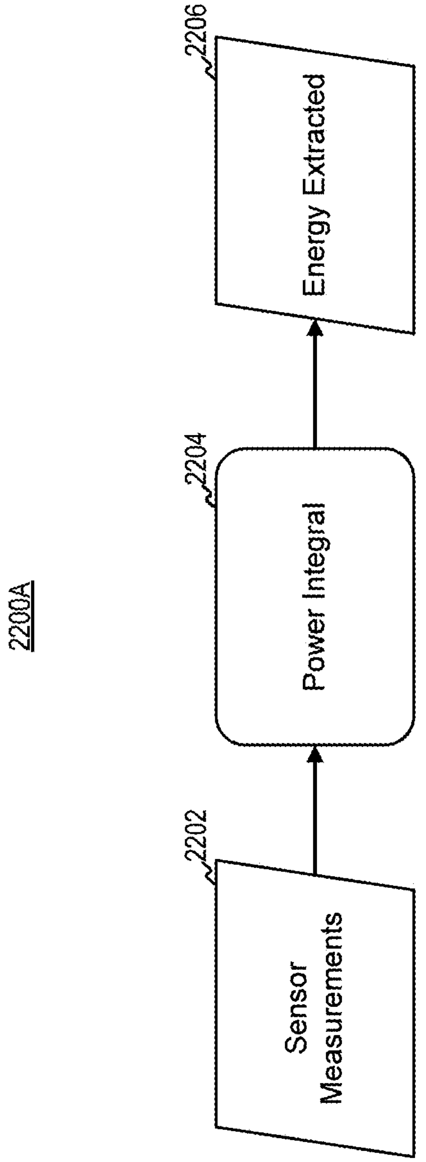
Figure 22B:
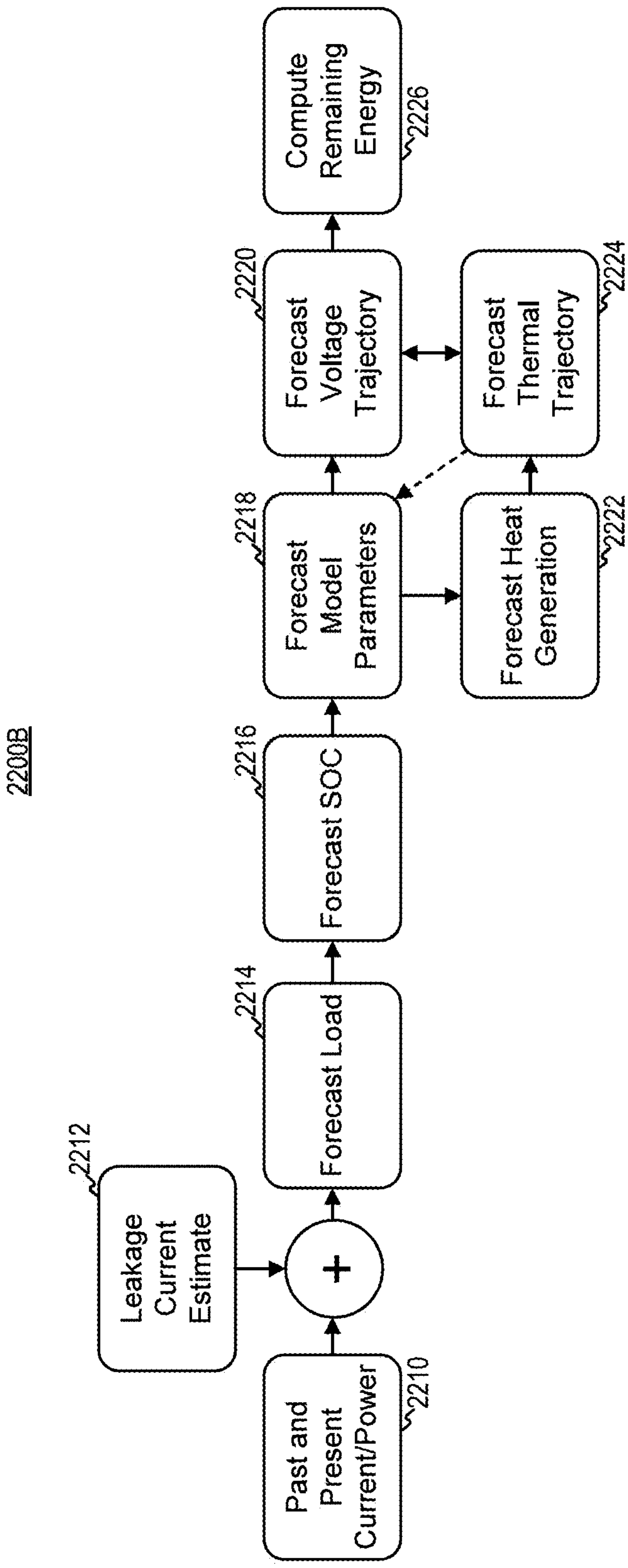
Figure 22C:
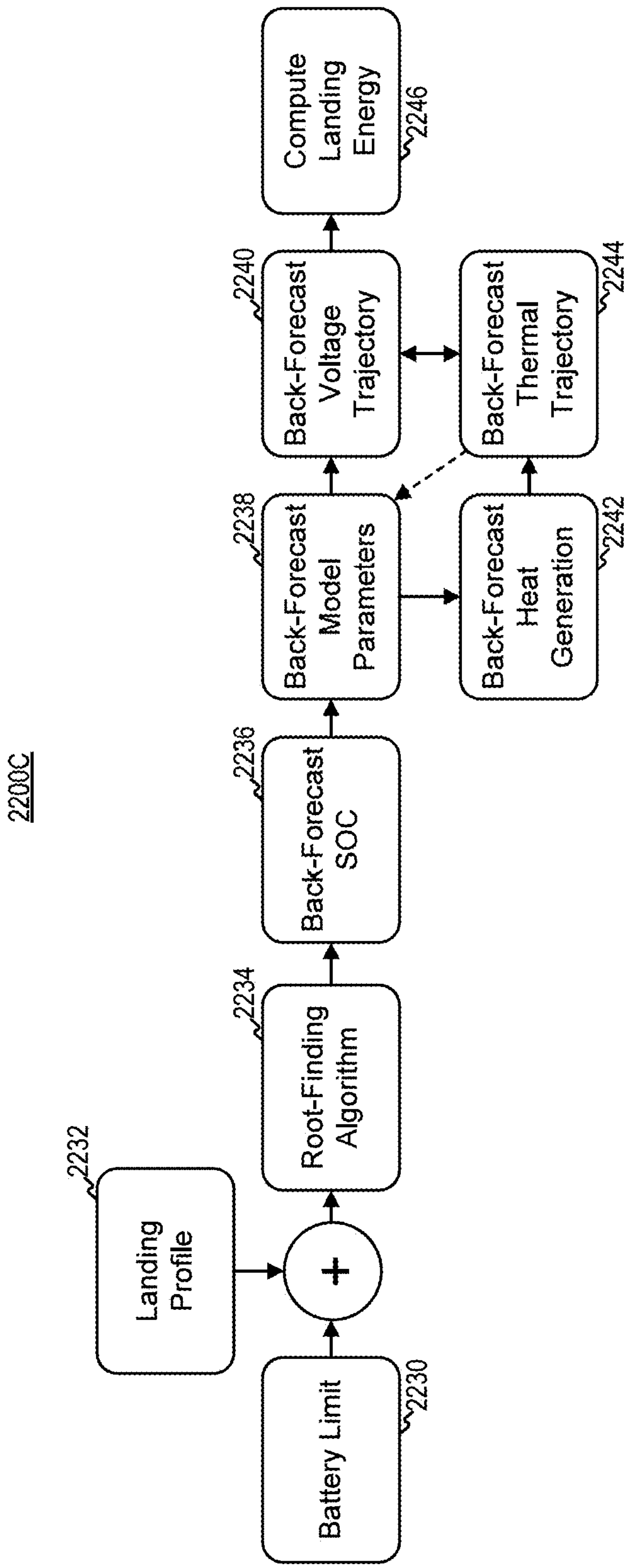

FIG. 21 depicts a different SOE estimation algorithm that may be used for different phases of flight, including take-off, cruise control (CC), and landing (e.g., VL or CL), as further described and exemplified with respect to FIGS. 22A-22C. In some embodiments, each SOE estimation may be input to a processor (e.g., BMU, FCC, controller, etc.). For example, a flight-level controller may receive each estimated SOE and may send the estimated states of energy to the FCS of the aircraft.

FIGS. 22A-22C illustrate exemplary SOE estimation algorithms for different phases of flight, consistent with disclosed embodiments. SOE algorithms 2200A, 2200B, and 2200C may be implemented as software (e.g., in at least one module, at least one program, at least one application, and/or at least one function, etc.), hardware (e.g., at least one processor, such as an FCC, BMU, controller, etc.), or a combination of both.

FIG. 22A depicts an SOE algorithm 2200A for a take-off phase of flight. In a take-off phase of flight, the aircraft may have a higher energy draw over a short period of time. In this phase, the Control MCU and/or Estimation MCU may rely on a power integral 2204 of sensor measurements 2202 (e.g., voltage, current) to calculate extracted energy 2206. Power integral 2204 may refer to integrating a power (P) over a time window to determine energy (E) and may be represented as:

$$E = \int P\, dt$$

Further, in some embodiments, this integral may be used in a landing phase of flight where energy draw may be similarly high and variable. In some embodiments, SOE algorithm 2200A may include a look-up table (LUT). For example, at least one processor (e.g., FCC, BMU) may compare received sensor measurements 2202 against values a look-up table stored in a memory to determine an SOE. Determining an SOE using SOE algorithm 2200A may avoid fluctuations in energy estimates caused by the high and variable energy draws used during take-off and/or landing phases of flight.

FIG. 22B depicts an exemplary SOE estimation algorithm 2200B for a cruise phase of flight (e.g., also referred to as cruise control or "CC"). In general, it may be understood that two or more of the below-described steps may take place simultaneously or in a different order to accomplish a same or similar end result.

In a cruise phase of flight, the aircraft may have approximately a constant power draw. The SOE can be calculated using operating parameters and a model. First, the average load conditions for the battery are determined. For example, in some embodiments this may include an average measurement of current and/or power (e.g., past and present current/power 2210) stored by the Control MCU and/or Estimation MCU over a period of time. Further, at least one processor may determine forecasted load 2214 based on the average measurement of current and/or power and leakage current estimate 2212, as further described and exemplified with respect to FIGS. 23-25B. In some embodiments, forecasted load 2214 may simply predict that load will remain the same as the average, while other embodiments may use more complex forecasting (e.g., by considering maneuvers and/or landing).

Then at least one processor may forecast SOC 2216. In some embodiments, the SOC may be forecasted using a Coulomb Counting Model wherein the SOC is a function of current (I), sampling period ($T_s$), and cell capacity (Q). In some embodiments, the Coulomb Counting Model may be represented as:

$$SOC[k+1] = SOC[k] + \frac{I[k]T_s}{3600Q}$$

In some embodiments, forecast SOC 2216 may be based on pack-level and/or cell-level SOC estimated by one or more processors (e.g., at least one Control MCU and/or at least one Estimation MCU), as described and exemplified above.

Then, at least one processor may forecast model parameters 2218, which may establish a relationship between the external characteristics exhibited by the battery operation and the internal state of the battery itself. For example, model parameters may be determined for an equivalent circuit model of the battery. Further, model parameters may be determined for a thermal model. Steps 2220, 2222, and/or 2224 may include comparing the models to determine which of a predefined thermal limit or a predefined voltage limit is reached first.

For example, step 2220 may include determining a forecast voltage trajectory via the equivalent circuit model, which may be represented as:

$$V_j[k+1] = \exp\left(\frac{-T_s}{T_j}\right)V_j[k] + R_j\left(1 - \exp\left(\frac{-T_s}{T_j}\right)\right)I[k]$$

$$V[k] = V_{OC}(SOC[k]) + \sum_{j=1}^{n} V_j[k] + I[k]R_0(SOC[k])$$

As used above, "k" refers to a step of the model (e.g., k=1, 2, 3, . . . ), "$V_j$" refers to a voltage at a "j"$^{th}$ branch of the equivalent circuit, "$T_s$" refers to a sampling period, "$T_j$" refers to a time constant of the "j"$^{th}$ branch, "$R_j$" refers to a resistance of the "j"$^{th}$ branch, and "I" refers to a current. Further, "$V_{OC}$" refers to an open-circuit voltage and "$R_0$" refers to a resistance (e.g., series resistance) of the equivalent circuit. In the equations below, unless otherwise noted, the same terms have the same meaning.

Step 2222 may include determining a forecast heat generation via a thermal model of the battery. In some embodiments, at least one processor may be configured to forecast an estimated heat generation for a battery pack for a period of time based on at least one of dynamic electrical information and historical battery information. For example, at least one processor (e.g., FCC, BMU, controller) may be configured to determine a forecast heat generation based on received voltage, current, and/or temperature associated with the battery back and/or historical battery temperature data stored in a memory (e.g., database, look-up table).

Further, step 2224 may include determining a thermal trajectory forecast via the thermal model of the battery, which may be represented as:

$$T[k+1] = A_d T[k] + B_d u[k]$$

As used above, "k" refers to a step of the model (e.g., k=1, 2, 3, . . . ), "T" refers to a temperature, "$A_d$" refers to a state transition matrix and may define how the temperature at the current step contributes to the temperature at the next step, "u" refers to a control input and may represent external inputs (e.g., heating, cooling, power dissipation, environmental changes, etc.), and "$B_d$" refers to a control input matrix and may define how the control input influences the temperature at the next step.

In some embodiments, the temperature(s) used in the thermal model may include one or more of a header temperature, a middle temperature, and a bottom temperature of one or more battery cells. Further, these temperatures may be included into a state space representation (or other mathematical representation) used in one or more battery state estimation methods. In some embodiments, the temperature(s) used in the thermal model may include SOT estimations, as described and exemplified with respect to FIG. 15.

After and based on determining which limit will be reached first (e.g., between a thermal limit and a voltage limit), at least one processor may compute remaining energy 2226. For example, a remaining energy may be computed based on a power generated and a forecasted period of time until the limit is reached.

FIG. 22C depicts an exemplary algorithm 2200C (e.g., back-forecasting algorithm) for SOE estimation for a landing phase. In general, it may be understood that two or more of the below-described steps may take place simultaneously or in a different order to accomplish a same or similar end result. Additionally or alternatively, certain steps may be combined, removed, or repeated.

In some embodiments, the target landing energy may be computed pre-flight. In other embodiments, the target landing energy may be determined in-flight based on a selected (e.g., commanded) and/or detected mode of landing. Target landing energy may refer to the amount of energy (e.g., SOE, SOC) estimated to be required to land the aircraft (e.g., an estimate of energy below which the aircraft will physically not have sufficient energy to land, optionally with a buffer). In other embodiments, an FCS (or other device having a storage component) may store different pre-computed landing energy requirements (e.g., in a lookup table) based on the model (e.g., voltage model, thermal model) and the selected and/or detected mode of landing. As shown, in the landing phase of flight, the landing energy may be determined by computing the energy consumption backwards (e.g., backward forecasting or back-forecasting) from the limits of the battery using the flight profile.

In step 2230, at least one processor may receive and/or determine (e.g., calculate) a predetermined voltage and/or temperature limit for the battery pack. In step 2232, information on a landing profile may be received (e.g., flight plan information, engine status, aircraft orientation, weather information, wind information, etc.). In some embodiments, the at least one processor may determine a change to the landing profile based on a change to the state of the aircraft. For example, a faster deceleration and/or faster airspeed may result in a different landing profile and energy requirements. In some embodiments at least one processor may generate an energy consumption trajectory for the landing profile. For example, in step 2236, at least one processor may, based on the battery limit from step 2230 and landing profile from step 2232, use a root-finding algorithm in step 2234 to determine 2236 (e.g., back-forecast) a minimum SOC required for the landing profile.

In step 2238, the at least one processor may back-forecast 2238 model parameters to establish a relationship between the external characteristics exhibited by the battery operation and the internal state of the battery itself.

In step 2240, information on the landing trajectory and voltage limit at landing may be input into an equivalent circuit model. The equivalent circuit model can compute (e.g., back-forecast) a second minimum state of charge needed to ensure the voltage limit is not exceeded. At least one processor may back-forecast a voltage trajectory based on an equivalent circuit model. For example, at least one processor (e.g., FCC, BMU, controller) may use the equivalent circuit model (e.g., as used in step 2220) to determine a first minimum battery level (e.g., SOC, SOE) while ensuring the voltage limit is not exceeded. In steps 2242 and 2244, information on the landing trajectory and temperature limit at landing may be input into a thermal model. The thermal model may be configured to compute (e.g., back-forecast) a second minimum battery level (e.g., SOC, SOE) needed to perform the landing while ensuring the temperature limit is not exceeded. In some embodiments, both the thermal model and the equivalent circuit model may include the models (e.g., forward-forecasting models) shown above with respect to exemplary FIG. 22B.

In step 2246, at least one processor may compute the target energy to land (e.g., estimated to be required to land) based on the higher of the two determined minimum state of charge requirements.

Figure 23:
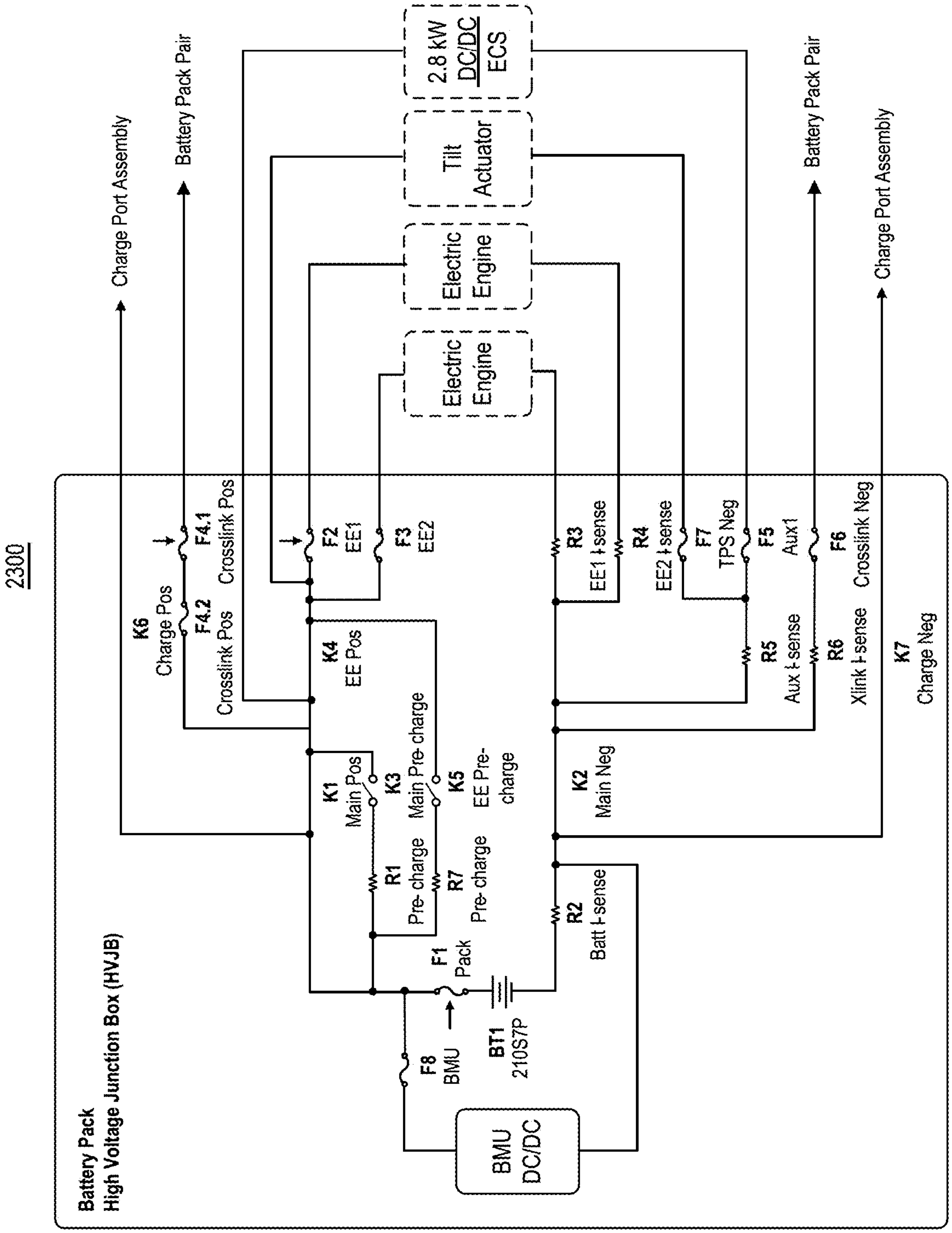
FIG. 23 illustrates exemplary high voltage electrical circuitry, consistent with disclosed embodiments.

FIG. 23 illustrates exemplary high voltage electrical circuitry 2300, consistent with disclosed embodiments. In some embodiments, the high voltage system may be configured to detect an external soft short condition. A soft short condition may refer to a circumstance where aircraft circuitry (including, possibly, a battery) is experiencing a short that leads to at least a partial loss of current to an unintended source, such as a frame of the aircraft or non-electrical part of the aircraft. An external soft short condition may refer to a situation in which there is a partial, low-resistance electrical connection between a circuit and a conductor (e.g., not inside the battery pack), where there should be no connection. For example, aircraft circuitry may unintentionally come into contact with a part of the frame of the aircraft. An external soft short condition may be referred to as and/or considered to be at least a partial short connected to an electrical component external to a battery pack.

For example and with reference to exemplary FIG. 23, an external soft short condition may be detected by one or more current sensors configured to measure the currents entering and exiting a given segment (e.g., portion) of the electrical wiring interconnection system (EWIS). When the current entering (e.g., total current entering the segment) differs from the current exiting (e.g., total current exiting the segment) by a more than a predetermined threshold, at least one processor coupled to the one or more current sensors may send a signal to a central processor (e.g., FCC) that an external soft-short condition is detected.

In some embodiments, the at least one processor (e.g., in the aircraft) may determine a power entering and exiting the given segment of the EWIS based on the received current measurements. For example, the at least one processor may determine an external soft-short condition when the power entering differs from the power exiting by more than a predetermined threshold. Further, the at least one processor coupled to the one or more current sensors may send a signal to at least one processor (e.g., FCC) that an external soft-short condition is detected.

In some embodiments, the one or more current sensors may measure either a current entering or a current exiting. In some embodiments, the at least one processor may compare the measured current to a predetermined, stored value stored in a memory to detect an external soft short condition. In some embodiments, the at least one processor may similarly detect the presence of an external soft short condition based on power.

In some embodiments, an arc-fault detection device (e.g., in the aircraft) may be configured to detect the presence of an external soft-short. In some embodiments, the at least one processor may be configured to utilize spread spectrum time domain reflectometry to detect an external soft short condition.

In some embodiments, after the at least one processor has received a signal indicating the presence of an external soft short condition, the at least one processor may perform one or more corrective actions. For example, the FCC of an aircraft may limit aircraft capability (e.g., prevent VTOL operation, reduce available power to the affected HV channel, deprioritize loads, such as effectors, drawing power from the affected HV channel, and/or prioritize loads, such as effectors, drawing power from an unaffected HV channel), output an alert to a pilot of the aircraft notifying the pilot of the external soft short condition, output an alert to a pilot of the aircraft notifying the pilot that the predicted SOE or available range is reduced, record a maintenance or error log, and/or any other corrective (e.g., responsive, alerting, controlling) action. In some embodiments, the FCC may electrically isolate the affected segment by commanding one or more pyro fuses to blow and/or one or more contactors or open.

Figure 24B:
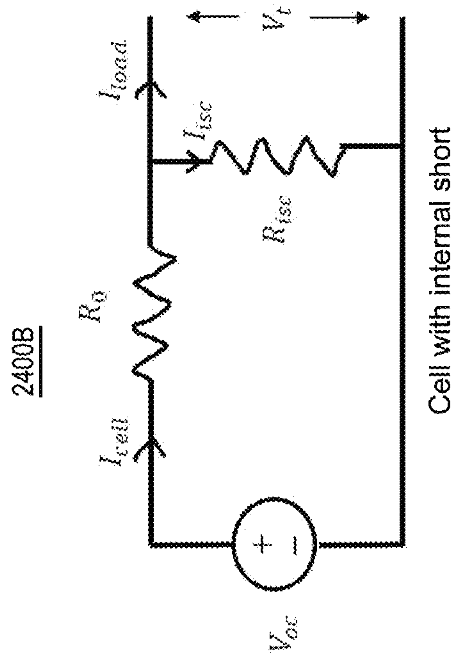
FIGS. 24A and 24B illustrate a model for a soft short condition on a cell, consistent with disclosed embodiments.
Figure 24A:
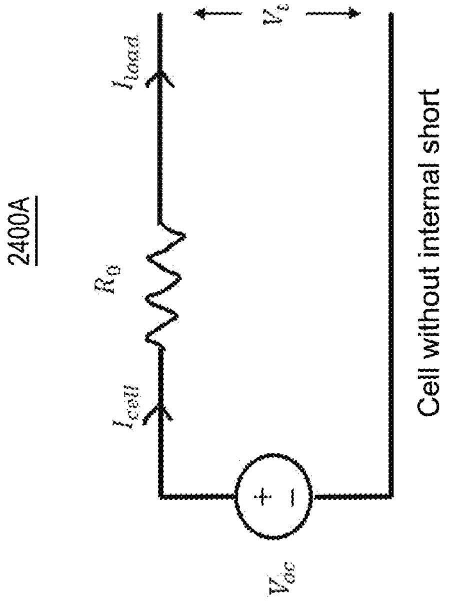

FIGS. 24A and 24B illustrate an exemplary model for a soft short condition on a cell, consistent with disclosed embodiments. In some embodiments, at least one processor may be configured to detect an internal soft short condition. An internal soft short condition may refer to a situation where there is at least a partial, unintended conductive path between battery cells themselves and/or between at least one battery cell and an unintended or incorrect part of the battery pack (e.g., internal to a battery pack), such as between a battery cell and part of a battery housing structure, which may result in low-level leakage current between the anode and cathode. An internal soft short condition may be referred to as and/or considered to be at least a partial short connected to an electrical component internal to a battery pack.

FIG. 24A depicts an exemplary cell 2400A without an internal soft short condition. The current of the cell equals the current of the load. The terminal voltage is the voltage of the cell minus the current of the cell multiplied by the resistance of the cell. For example, this relationship can be represented by the following equations:

$$I_{cell} = I_{load}$$

$$V_t = V_{OC} - I_{cell}R_0$$

FIG. 24B depicts an exemplary cell 2400B with an internal soft short condition. The current of the cell equals the current of the load plus the current of the internal short circuit. The voltage of the cell equals the sum of current of the cell multiplied by the resistance and the current of short circuit times the resistance of the short circuit. For example, this relationship can be represented by the following equations:

$$I_{cell} = \frac{\frac{V_{OC}}{R_{isc}} + I_{load}}{\frac{R_0}{R_{isc}} + 1}$$

$$V_{cell} = \frac{1}{\frac{R_0}{R_{isc}} + 1}V_{OC} - \frac{R_0}{\frac{R_0}{R_{isc}} + 1}I_{load}$$

Figure 25A:
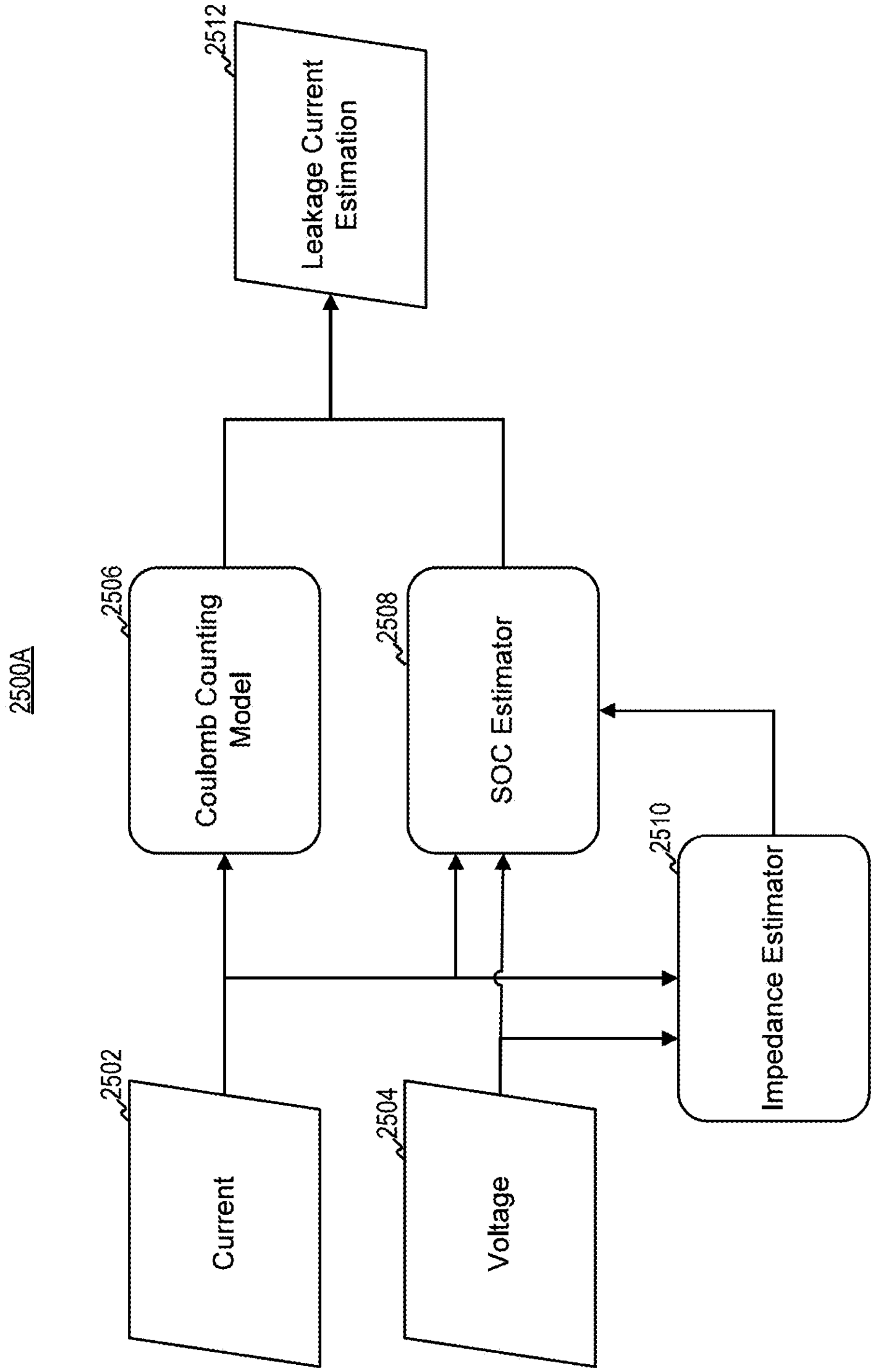
FIG. 25A illustrates an exemplary leakage current estimation for a soft short condition on a cell, consistent with disclosed embodiments.

FIG. 25A illustrates an exemplary leakage current estimation process 2500A for a soft short condition on a cell, consistent with disclosed embodiments. Process 2500A may be implemented as software (e.g., in at least one module, at least one program, at least one application, and/or at least one function, etc.), hardware (e.g., at least one processor, such as an FCC, BMU, controller, etc.), or a combination of both. In some embodiments, at least one processor may be configured to determine a leakage current estimation caused by an internal soft short condition. For example, Coulomb Counting Model 2506 may use current 2502 (e.g., stack current through series-connected battery cells to determine a measured SOC.

In some embodiments, SOC estimator 2508 may use current 2502 and/or voltage 2504 to determine an estimated change in SOC. In some embodiments, process 2500A further includes impedance estimator 2510. Impedance estimator 2510 may be configured to, based on (e.g., using) received current 2502 and/or voltage 2504, estimate an impedance in a battery cell or battery cell stack. Impedance estimator 2510 may send the estimated impedance to SOC estimator 2508 as another input (e.g., in place of a predetermined impedance) to determine an estimated SOC. In some embodiments, at least one processor may determine leakage current estimation 2512 by comparing the measured SOC and the estimated SOC. In some embodiments, the determined leakage current estimation may be used in estimating SOE (e.g., as described and exemplified above with respect to FIG. 22B), which may in turn impact capabilities of the aircraft, automatic control of the aircraft, and/or the issuing of an alert, consistent with disclosed embodiments.

Figure 25B:
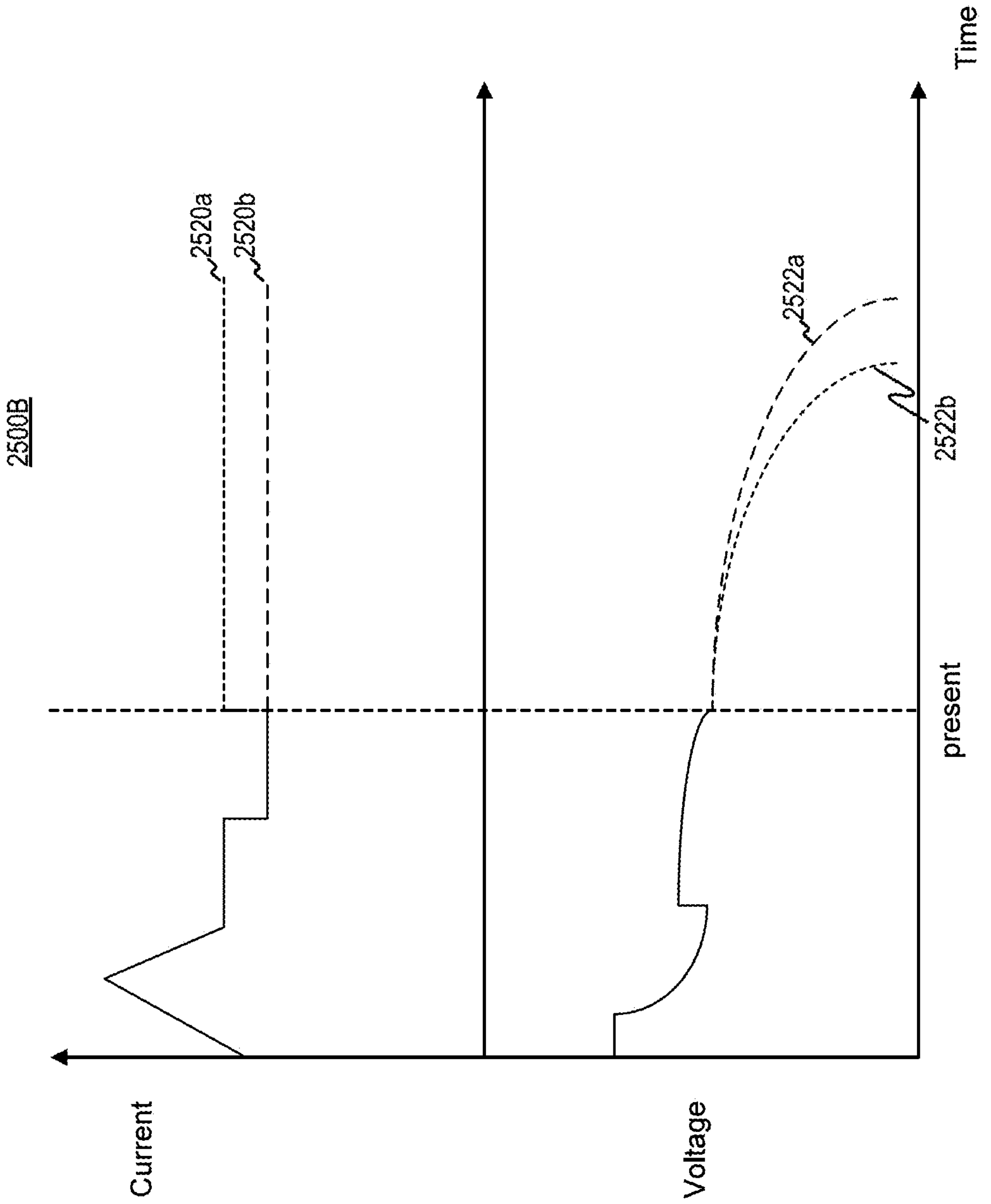
FIG. 25B illustrates exemplary graphs of a soft short condition on a cell, consistent with disclosed embodiments.

FIG. 25B illustrates exemplary graphs 2500B of a soft short condition on a cell, consistent with disclosed embodiments. As depicted in FIG. 25B, an internal soft short condition would cause a higher current draw 2520*a* compared to a non-internal soft short battery 2520*b*. Further, the forecasted voltage of an internal soft short condition battery 2522*b* may indicate a lower forecasted energy (e.g., SOE) than a non-internal soft short condition battery 2522*a*. By detecting and compensating for the effects of an internal soft short condition, SOE estimation is more accurate and less prone to overestimating SOE.

Figure 26:
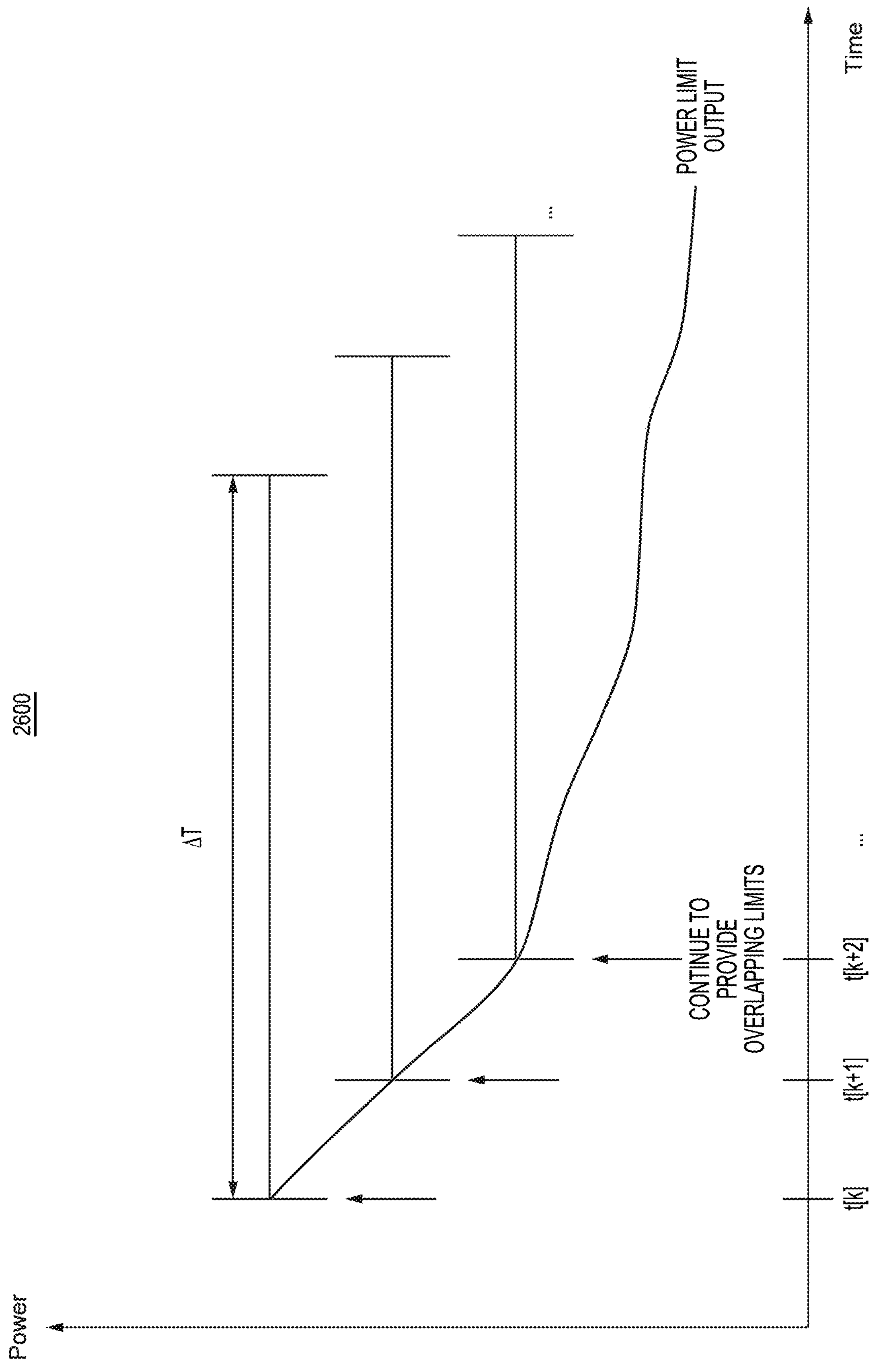
FIG. 26 illustrates an exemplary state of power (SOP) estimation, consistent with disclosed embodiments.

FIG. 26 illustrates an exemplary state of power (SOP) estimation, consistent with disclosed embodiments. In some embodiments, state of power may indicate an available power that can be provided by the battery pack over a time horizon, e.g., without exceeding at least one system constraint (such as a battery pack voltage constraint, battery cell temperature constraint, HV wiring current carrying constraint, etc.). SOP may be expressed as an absolute number (e.g., kW, W) or as a ratio or percentage relative to a maximum rated power (e.g., a maximum rated system power).

In some embodiments, an SOP may be based on a measured charge, temperature, voltage, power, impedance, and/or other value(s) of battery cell characteristic (physical, electrical, and/or chemical) (e.g., measured by a sensor adjacent to or on a battery cell, such as a voltage sensor). An SOP may be estimated using charge or voltage measurements, which may be associated with the at least a portion of a battery cell, such as individual battery cells. Measurements used for SOP may be taken at a battery cell level and/or derived from measurements taken for multiple cells, such as pack-level measurements. Further, in some embodiments, an SOP of a battery pack may be based on one or more SOPs of one or more battery cells. For example, a battery pack SOP may be a combination (e.g., summation, weighted summation) of each battery cell SOP. Additionally or alternatively, the SOP of the battery pack may be equal to a combination (e.g., average, weighted average) of states of charge of one or more (e.g., each) battery cells. Additionally, or alternatively, SOP of cells in a battery pack may be extrapolated from the SOP of the battery pack. For example, by applying the rationale that SOP of the battery pack estimated using pack-level measurements should be equal approximately the average of SOP of cells in the battery pack, SOC of cells in the battery pack can be estimated.

In some embodiments, an SOP estimation may define a limit to prevent a battery component, such as at least one battery cell, battery pack, or circuit, from violating an operating range, consistent with disclosed embodiments, such as those discussed below with respect to FIGS. 26-28. An operating range may include one or more of: a cell voltage range, a cell temperature range, a maximum current carry limit, and a voltage range of a connected load.

In some embodiments, at least one processor (e.g., a first processor) may be configured to determine a first power forecast based on cell-level measurements. For example, the Estimation MCU may be configured to provide a higher fidelity power forecast based on battery cell voltages (e.g. voltage measurements taken for one or more cell modules of a battery pack), SOC determined for one or more cell modules (or an average of SOC for multiple modules), and temperatures of one or more cell modules (or an average temperature for multiple modules). A high fidelity forecast may be based on measurements received from one or more high-fidelity sensors (e.g., cell-level sensors, cell row-level sensors), discussed further above.

In some embodiments, at least one processor (e.g., a second processor) may be configured to determine a second power forecast based on pack-level measurements. For example, the Control MCU may be configured to provide a lower fidelity power forecast based on battery pack voltage (e.g., voltage measurement on high voltage circuitry), battery pack SOC, additional pack-level temperature sensing, and/or additional pack-level temperature modeling. A lower fidelity forecast may be based on measurements received from one or more lower fidelity sensors (e.g., pack-level sensors) or estimations of measurements (e.g., mean of cell-level sensors).

In some embodiments, the sensors used by the Estimation MCU to calculate SOP may vary from sensors used by the Control MCU to measure power. By determining SOP via two differing processors and sets of inputs, a layer of redundancy is provided and the safe operation of the electric vehicle is increased.

In some embodiments, SOP may be estimated for overlapping time horizons of duration ΔT. For example, as depicted in FIG. 26, SOP may be estimated for overlapping time horizons at t[k], t[k+1], and t[k+2]. By estimating SOP in overlapping time horizons, the accuracy of the SOP estimation may be increased. Further, the SOP estimation is more robust and capable of adapting to changing conditions. For example, because battery conditions (e.g., temperature, voltage, current) may change during a flight, which affect SOP estimations, SOP estimations performed for overlapping time windows can properly incorporate the current state of the aircraft. Further, overlapping time windows may provide more historical data for reference. For example, SOP estimations performed for overlapping time windows provide more SOP estimations, which can provide insight into the battery (e.g., SOH).

Figure 27:
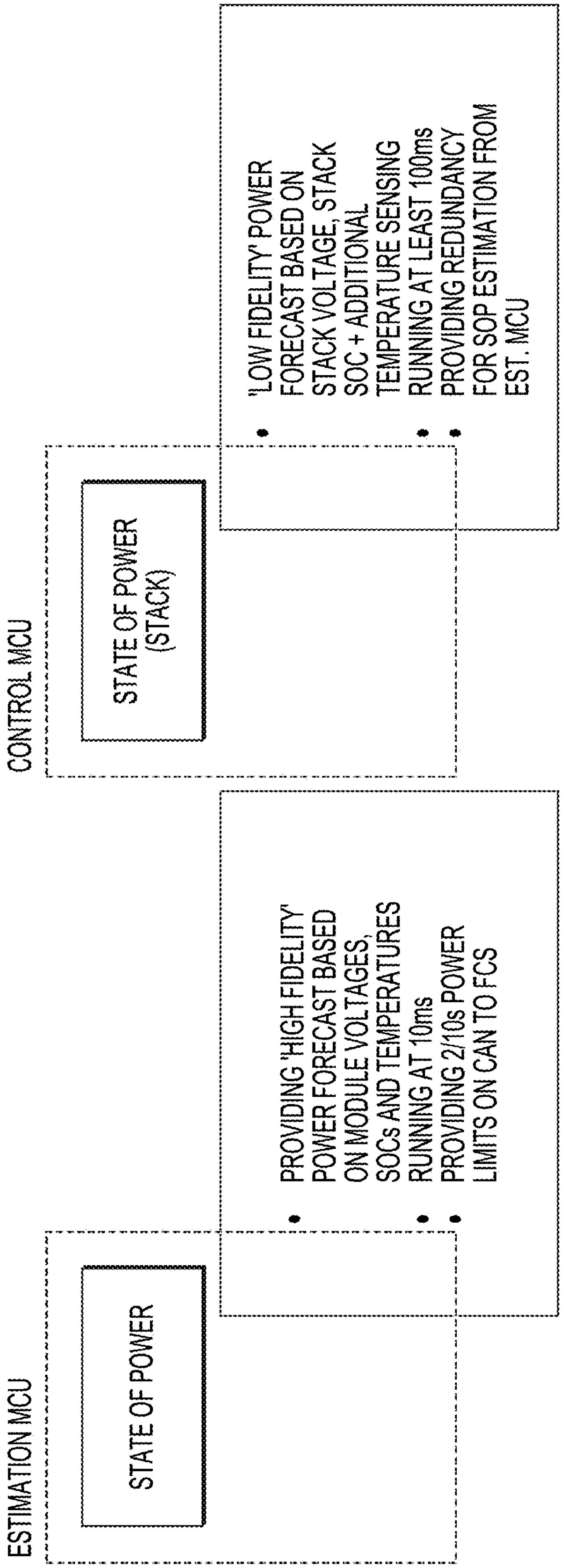
FIG. 27 illustrates an exemplary SOP estimation performed in an Estimation MCU and in a Control MCU, consistent with disclosed embodiments.

FIG. 27 illustrates an exemplary SOP estimation performed in an Estimation MCU and in a Control MCU, consistent with disclosed embodiments. In some embodiments, the BMU may be configured to determine a constraint for use in estimating SOP. For example, the BMU may determine which of voltage-based derating, SOC-based derating, or thermal-based derating is the most limiting and base an SOP estimation on the determined constraint. At different battery pack stages and operation conditions, the dominant algorithm will be different. The overall limits will be the minimum of limits from each algorithm. While certain portions of FIG. 27 may discuss certain aspects being performed at a particular frequency (e.g., 10 ms, 100 ms), it is appreciated that faster or slower frequencies may also be used.

By way of non-limiting example, the Estimation MCU may perform SOP estimation based on high fidelity measurements (e.g., from cell-level measurements) and Control MCU may perform SOP estimation based on low fidelity measurements (e.g., stack- or pack-level measurements). In some embodiments, the low fidelity SOP estimation may provide redundancy for the primary high fidelity SOP estimation. For example, the low fidelity SOP estimation may be used to verify the high fidelity SOP estimation (e.g., within a predetermined threshold when compared against). In some embodiments, a first SOP estimation may be performed at a first frequency and a second SOP estimation may be performed at a second frequency. For example, a high fidelity SOP estimation may be performed at a first frequency (e.g., 1 ms, 5 ms, 10 ms) and a low fidelity SOP estimation may be performed at a second, lower frequency (e.g., 50 ms, 100 ms, 200 ms, 500 ms).

Figure 28:
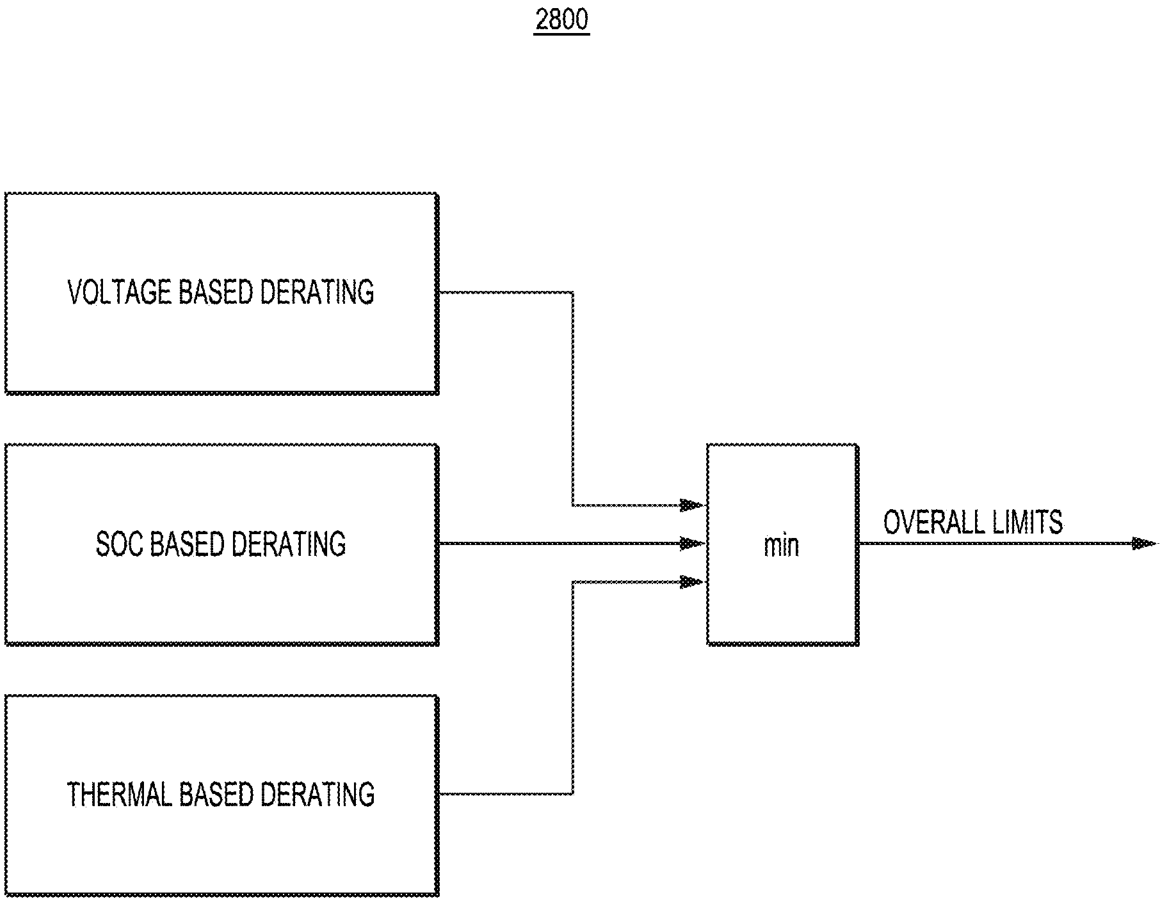
FIG. 28 illustrates an exemplary SOP estimation based on the lowest limit of multiple inputs, consistent with disclosed embodiments.

FIG. 28 illustrates an exemplary SOP estimation based on the lowest limit of multiple inputs, consistent with disclosed embodiments. Flow diagram 2800 may be implemented as software (e.g., in at least one module, at least one program, at least one application, and/or at least one function, etc.), hardware (e.g., at least one processor, such as an FCC, BMU, controller, etc.), or a combination of both.

In some embodiments, voltage-based derating may include determining voltage limits by calculating the maximum charging current and maximum discharging current using the below equations:

Cell Voltage Model:

$$V[k] = f(OCV(SOC[k],\ i[k])$$

Max Charging Current $I_{max,\ charge}$ and Max Discharging Current $I_{max,\ discharge}$ are solutions for:

$$0 = f(OCV(SOC[K],\ i[K]) - V_{max}$$

$$0 = f(OCV(SOC[k]),\ i[k]) - V_{min}$$

In some embodiments, SOC-based derating may include determining SOC limits by calculating the maximum charging current and maximum discharging current using the below equations:

SOC Model:

$$SOC[k+1] = SOC[k] + i[k]\frac{\Delta T}{Q}$$

Max Charging Current:

$$I_{max,charge} = (SOC_{max} - SOC_{cell})\frac{Q}{\Delta T}$$

Max Discharging Current:

$$I_{max,discharge} = (SOC_{min} - SOC_{cell})\frac{Q}{\Delta T}$$

In some embodiments, thermal-based derating may include determining thermal limits by calculating the maximum charging current and maximum discharging current using the below equations:

Thermal Model:

$$T[k+1] = T[k] + (q_{irr} + q_{rev} + q_{rej})\Delta T/M/c_p$$

In some embodiments, the thermal model limit is determined by solving the maximum current input at steady state, assuming instantaneous current transition. Additionally or alternatively, in some embodiments, the thermal model limit may include a closed loop controller.

In some embodiments, the overall power limit may then be defined using the maximum current from the above derating processes. For example, the maximum charging power and discharging power may be represented by:

$$P_{max,charge} = N_p N_S I_{max,charge} V_{cell,max}$$

$$P_{max,discharge} = N_p N_S I_{max,discharge} V_{cell,min}$$

In all of the above equations, V stands for voltage, "k" represents a cell, OCV represents an open-circuit voltage, "i" represents current (i.e., "i[k]" is the current of a cell), "T" represents temperature, "Q" represents charge, "q" represents heat (i.e., "$q_{irr}$" is irreversible heat, "$q_{rev}$" is reversible heat, and "$q_{rej}$" is heat rejected to environment), "M" represents mass, "$c_p$" represents specific heat capacity (e.g., of a cell), "P" represents power, "N" represents a number of cells (i.e., "$N_p$" is the number of cells in parallel, "$N_s$" is the number of cells in series).

In some embodiments, the determined voltage limit, SOC limit, and thermal limits may be system constraints for an SOP estimation. For example, the determined limits may be used as system constraints to determine overall power limits that do not exceed a predetermined number of (e.g., at least one, each) the constraints for a battery pack.

Figure 29:
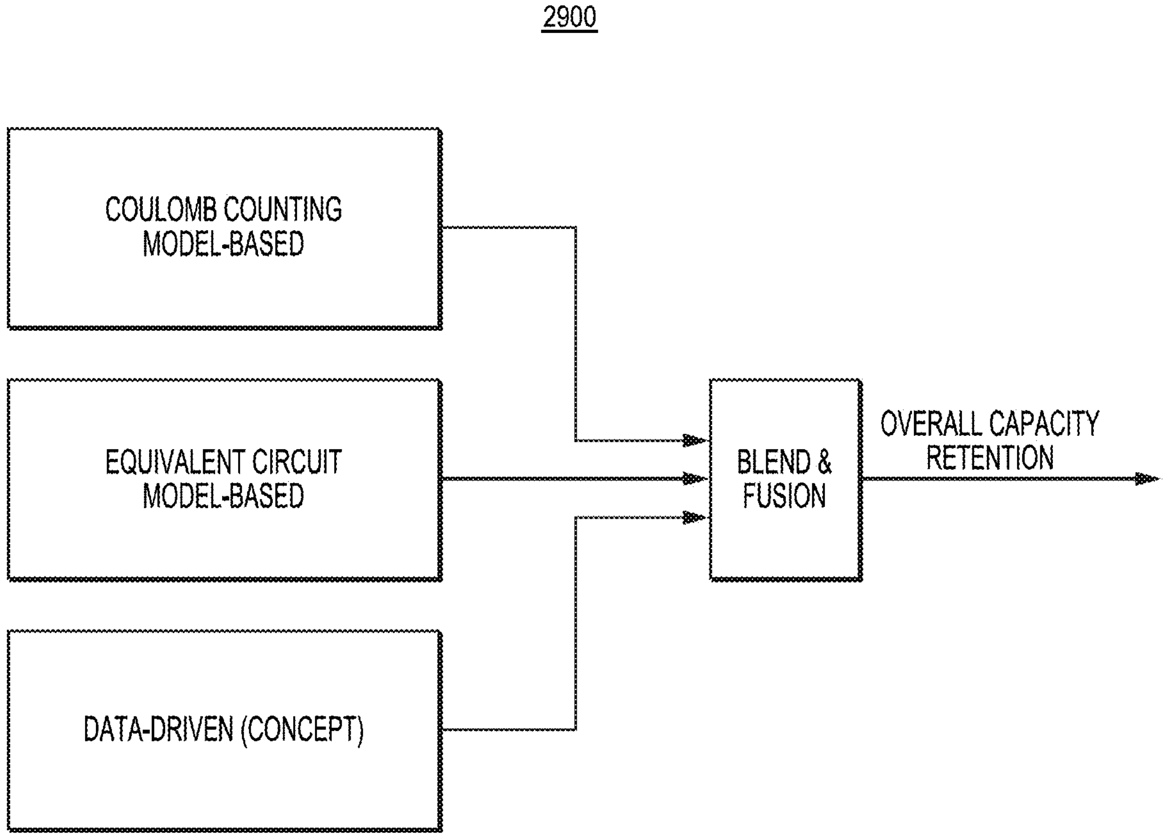
FIG. 29 illustrates an exemplary capacity state of health (SOH) estimation, consistent with disclosed embodiments.

FIG. 29 illustrates an exemplary capacity state of health (SOH) estimation, consistent with disclosed embodiments. Flow diagram 2900 may be implemented as software (e.g., in at least one module, at least one program, at least one application, and/or at least one function, etc.), hardware (e.g., at least one processor, such as an FCC, BMU, controller, etc.), or a combination of both.

A state of health (SOH) may indicate a performance capability and/or performance loss of at least a battery cell (e.g., the battery cell itself, multiple battery cells, a battery pack, multiple battery packs, etc.). For example, the SOH may indicate an amount of degradation experienced by, or performance capability of, the battery cell, which may be expressed relative to an initial (e.g., original) capability of the battery cell. The performance of the battery cell may be based on or relate to one or more of: charge capacity, energy storage, energy output, power storage, power output, a cell state, a battery state, an electrical component state, or a system state. In some embodiments, an SOH may be based on one or more of a power fade (e.g., impedance growth) or a capacity fade of the at least one battery cell.

In some embodiments, a SOH of a battery pack may be defined by the SOH of one or more battery cells of the battery pack. For example, the SOH of the battery pack may be equal to the worst SOH of a battery cell (e.g., highest impedance growth, largest capacity fade). In some embodiments, at least one processor may determine an SOH of a battery cell or a battery pack based on measurements from one or more corresponding sensors. For example, an SOH of a battery pack may be determined based on battery pack-level signals acquired by one or more pack-level sensors. Further, an SOH of a battery cell may be determined based on battery cell-level signals acquired by one or more cell-level sensors. In some embodiments, an SOH may be based on a measured charge, temperature, voltage, impedance, or other value(s) of battery cell characteristics (physical, electrical, and/or chemical) (e.g., measured by a sensor adjacent to or on a battery cell, such as a voltage sensor). An SOH may be estimated using charge, temperature and/or voltage measurements, which may be associated with the at least a portion of a battery cell, such as individual battery cells. Measurements used for SOH may be taken at a battery cell level and/or derived from measurements taken for multiple cells, such as pack-level measurements. Additionally or alternatively, the SOH of the battery pack may be equal to a combination (e.g., average, weighted average) of states of health of one or more (e.g., each) battery cells. Additionally, or alternatively, SOH of cells in a battery pack may be extrapolated from the SOH of the battery pack. For example, by applying the rationale that SOH of the battery pack estimated using pack-level measurements should be equal approximately the average of SOH of cells in the battery pack, SOH of cells in the battery pack can be estimated.

Figure 30:
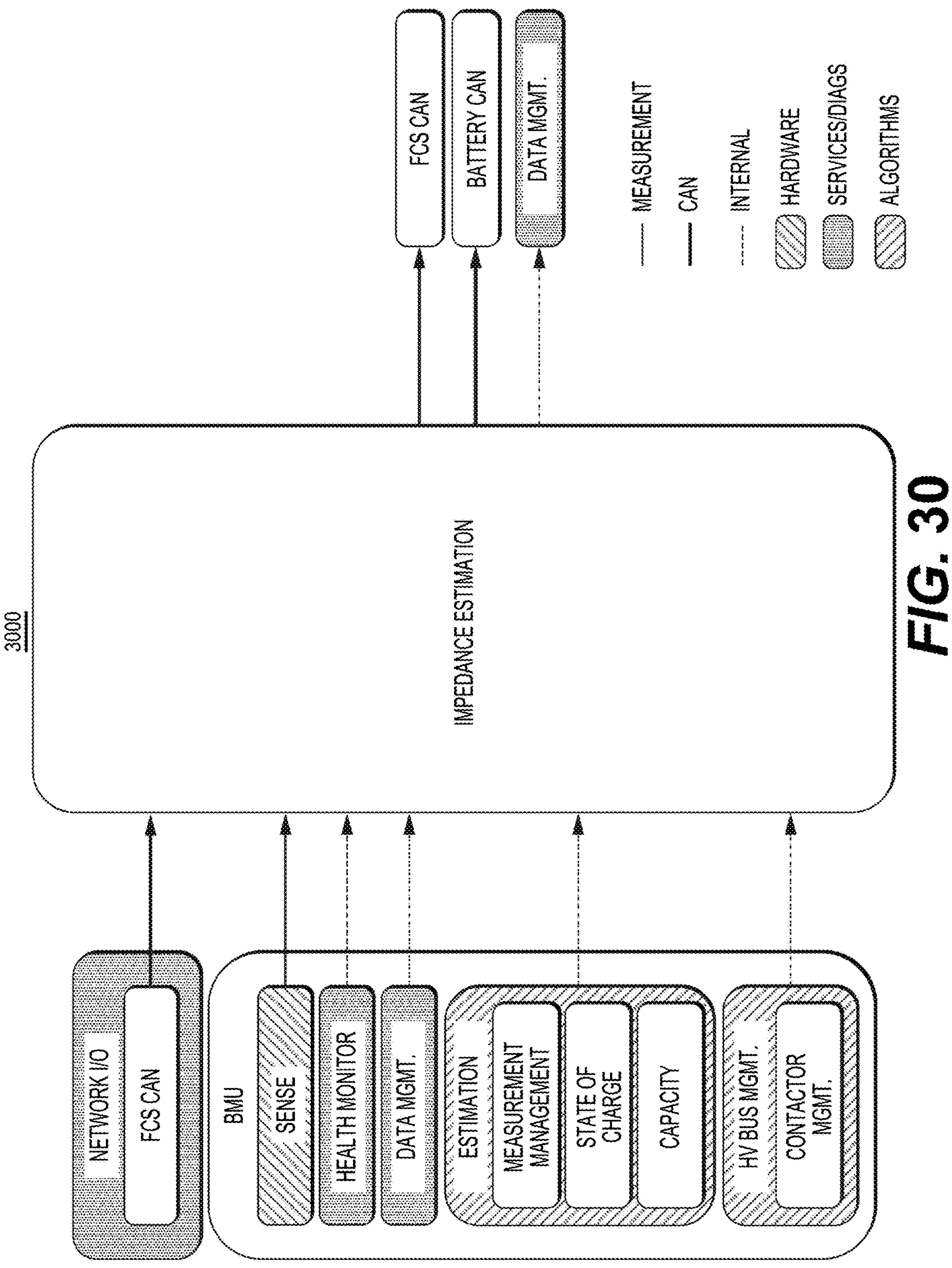
FIG. 30 illustrates an exemplary impedance SOH estimation, consistent with disclosed embodiments.

An SOH may be determined for one or more of at least one battery cell and at least one battery pack, consistent with disclosed embodiments, including, without limitation, FIGS. 29 and 30 and their associated description.

In some embodiments, the BMU may report the capacity estimation (separately or as an overall SOH value) to the FCS for display to the pilot (e.g., via an energy fade metric). The capacity estimation may also be used to update SOC, balancing (e.g., battery pack balancing operations, battery cell balancing operations), and/or other diagnostics. In some embodiments, capacity may refer to the total charge that can be extracted from a fully charged battery until its cut-off discharge voltage is reached. Over time, a battery pack may lose its ability to hold charge (also known as capacity fade), adversely affecting battery pack performance. In some embodiments, in response to determining that at least one of the capacity fade or the impedance growth has surpassed a predetermined threshold, at least one processor may be configured to output an alert for a user of the electric vehicle. For example, in response to determining that the capacity fade for a battery pack has surpassed a predetermined threshold (i.e., the battery pack has degraded too much), the BMU may be configured to send a signal to the FCS to alert the user of the electric vehicle (e.g., pilot, captain) that the battery pack should be replaced soon.

In some embodiments, because current throughput and its corresponding SOC deviation is related through the capacity Q, and assuming noise substantially equally affects both sides of the equation such that they cancel each other out, capacity fade may be represented using the following Coulomb Counting Equation:

$$\sum_{i=1}^{N} \int_{t}^{t+\Delta t} I \, dr = Q(SOC(t+\Delta t) - SOC(t))$$

In some embodiments, capacity can be solved using an equivalent circuitry model. In some embodiments, a recursive total least squares method is used to estimate capacity (Q). For example, the equivalent circuitry model may be represented as:

$$V = V_{OC}(SOC) + \sum_{j=1}^{n} V_j + IR_0(SOC)$$

-continued $$\frac{\partial V_{OC}}{\partial SOC}\frac{I}{3600}+\frac{\partial R_0}{\partial SOC3600}=Q\left(\frac{dV}{dt}-\sum_{j=1}^{n}\frac{dV_j}{dt}-\frac{dI}{dt}R_0(SOC)\right)$$

In the equations above, $V_{OC}$ is open circuit voltage, SOC is a state of charge, "I" is current, "Q" represents charge, and "$R_0$" refers to a resistance (e.g., series resistance) of the equivalent circuit.

FIG. 30 illustrates an exemplary impedance SOH estimation, consistent with disclosed embodiments. Flow diagram 3000 may be implemented as software (e.g., in at least one module, at least one program, at least one application, and/or at least one function, etc.), hardware (e.g., at least one processor, such as an FCC, BMU, controller, etc.), or a combination of both.

In some embodiments, SOH may include an impedance estimation. In some embodiments, the BMU may report the impedance estimation (separately or as an overall SOH value) to the FCS (or any other device with a processor) for causing it to be displayed to the pilot (e.g., via a power fade metric). Over time, a battery pack impedance may increase, adversely affecting battery pack performance.

In some embodiments, impedance growth may be solved by at least one processor using an equivalent circuitry model. In some embodiments, a recursive total least squares method is used to estimate capacity (Q). For example, the equivalent circuitry model may be represented as:

$$V-V_{OC}(SOC)-\sum_{j=1}^{n}V_j=R_0(SOC)I$$

Figure 31A:
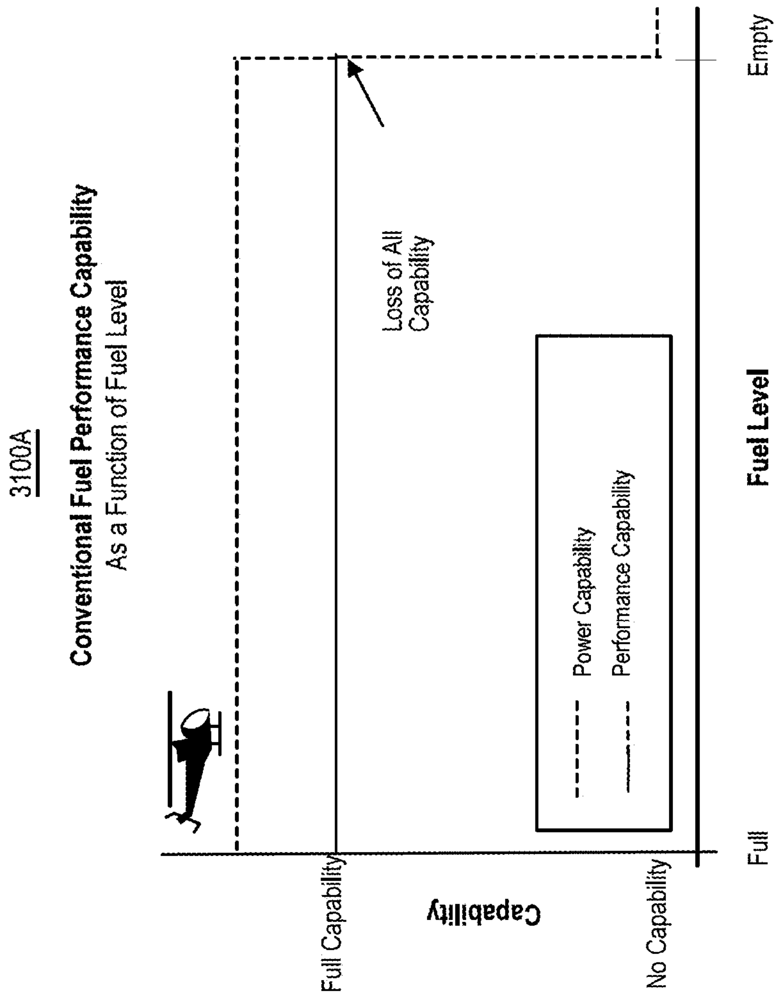
FIGS. 31A and 31B illustrate exemplary graphs relating to conventional fuel-powered aircraft and electrically powered aircraft, consistent with disclosed embodiments.
Figure 31B:
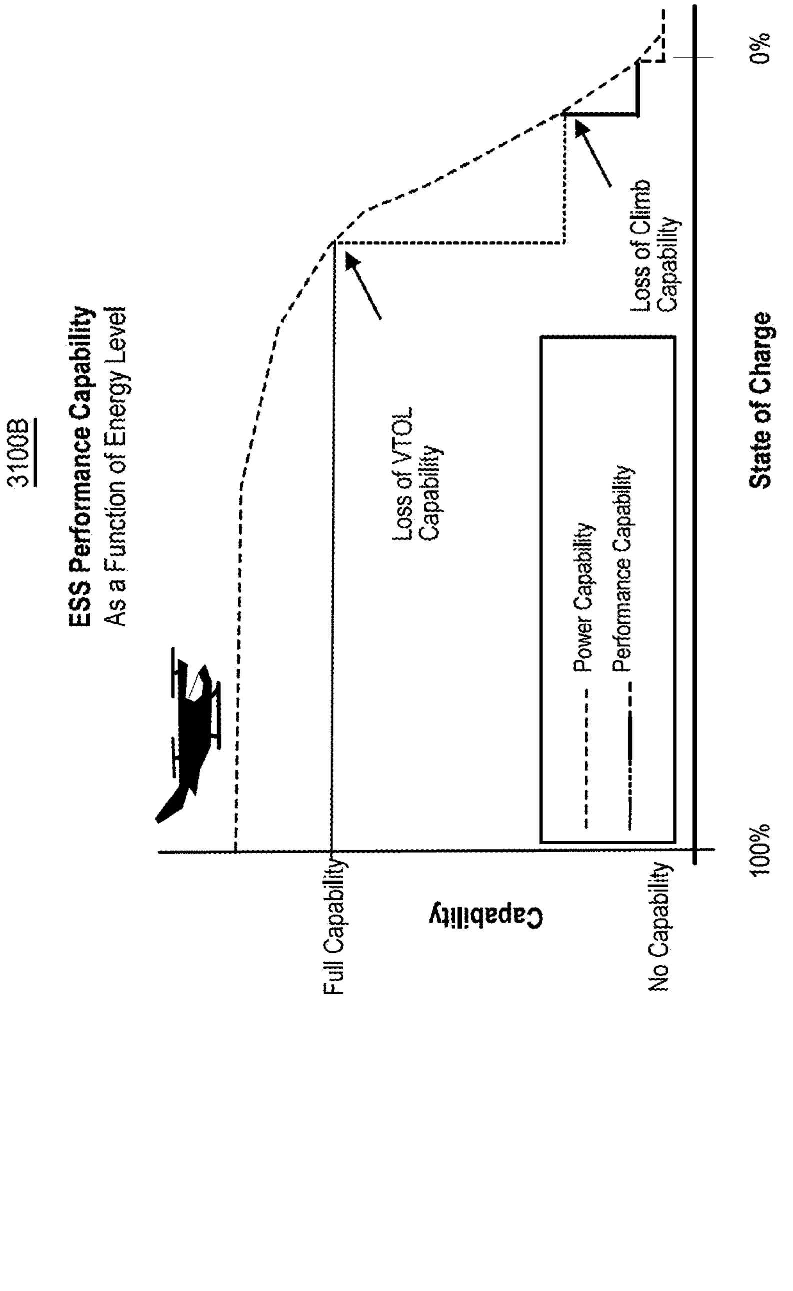

FIGS. 31A and 31B illustrate exemplary graphs relating to conventional fuel-powered aircraft and electrically powered aircraft, consistent with disclosed embodiments.

FIG. 31A depicts an exemplary graph 3100A relating to a conventional fuel-powered aircraft, consistent with disclosed embodiments. As shown in FIG. 31A, the performance capability of a conventional fuel-powered aircraft may be constant at full capability at all fuel levels except for zero or empty. Upon reaching empty, a pilot may control the conventional aircraft to the ground (e.g., using hydraulic controls).

FIG. 31B is an exemplary graph 3100B relating to an electrically powered aircraft, consistent with disclosed embodiments. As shown in FIG. 31B, the performance capability of an electrically powered vehicle may vary based on the SOC of its energy storage system or batteries. For example, the performance capability may decrease as SOC decreases. In an electrically powered aerial vehicle, such as an eVTOL aircraft, there may be an SOC greater than 0% at which point the aircraft loses VTOL capability. Losing VTOL capability may refer to the aircraft not having enough power to generate thrust to perform vertical take-off or lift functions (e.g., perform such functions within one or more safety parameters). Further, there may be an SOC greater than 0% and less than the point at which the aircraft loses VTOL capability at which point the aircraft loses climb capability (e.g., cannot climb while satisfying one or more safety parameters). Losing climb capability may refer to the aircraft not having enough power to generate thrust to climb or fly higher. Further, there may be an SOC greater than 0% and less than the point at which the aircraft loses climb capability at which point the aircraft still has some performance capability, such as descent or performing a flare maneuver. Eventually, the SOC will be so low that the aircraft will no longer be controllable by the pilot. A flare maneuver or flare may refer to a coordinated increase in the pitch angle of an aircraft just before the aircraft touches down to minimize vertical speed and reduce the impact force of the landing.

For an aircraft to complete a flight mission of a certain range, the aircraft may require at least a predetermined amount of energy, which may be sourced from fuel or one or more batteries. Thus, prior to flight, there may be a need to equip the aircraft with sufficient resources (e.g., fuel, batteries) of adequate health such that the resources may provide enough energy to enable the aircraft to complete the flight mission. Furthermore, to safely man the aircraft, there may be a need to convey accurate estimations of remaining energy or remaining range to the pilot to ensure that there is enough energy or range for the aircraft to complete the flight mission and, if there is not enough energy or range, for the aircraft to perform one or more emergency procedures.

In the aircraft, there may be one or more displays to indicate to the pilot an estimated remaining energy (e.g., SOE) or estimated remaining range of the aircraft. While an estimated remaining range for a fuel-based aircraft may be a steadily decreasing number during flight due to the nature of fuel, an estimated remaining range for an electric battery-based aircraft may be more vulnerable to changes during flight based on changing aircraft conditions, such as temperature conditions of aircraft components, and levels of power draw from batteries at different phases of flight, which may change an amount of energy remaining in batteries. In addition, some conventional battery-based systems may be subject to fluctuating range estimates as a result of battery power draw, which may be a fatal safety flaw if not addressed for electric aircrafts. Furthermore, for electric flight control system architectures where not all EPUs are connected to all batteries (i.e., architecturally isolated high voltage channels), there may be a need to resolve asymmetrical energy consumption or battery reserve.

In some embodiments, the aircraft may include one or more range estimation function(s) configured to estimate available range. In some embodiments, the range estimation function(s) may be configured within at least one of one or more energy estimation units or one or more range estimation units of the aircraft. In some embodiments, the range estimation function(s) may be configured to determine at least one of: (i) a vertical take-off and landing (VTOL) range or (ii) a conventional take-off and landing (CTOL) range. In some embodiments, the range estimation function(s) may be configured to estimate range based on a phase of flight of the aircraft. For example, the range estimation function(s) may be configured to estimate range using predetermined values when the aircraft flight speed is less than a predetermined speed. Additionally or alternatively, the range estimation function(s) may be configured to calculate range online using measured values when the aircraft flight speed is greater than or equal to the predetermined speed. In some embodiments, the predetermined speed may comprise a wing-borne speed.

Additionally or alternatively, the range estimation function(s) may be configured to estimate available range based on battery information. For example, the range estimation function(s) may be configured to estimate available range based on one or more of SOT, SOC, SOE, SOP, and SOH of one or more batteries (e.g., each battery). In some embodiments, SOH may include an age or level of degradation of the one or more batteries. For example, an aircraft with newer batteries may be capable of flying missions of greater range than an aircraft with older batteries due to a level of degradation of the older batteries (e.g., worse SOH, more capacity fade, more impedance growth).

Figure 32:
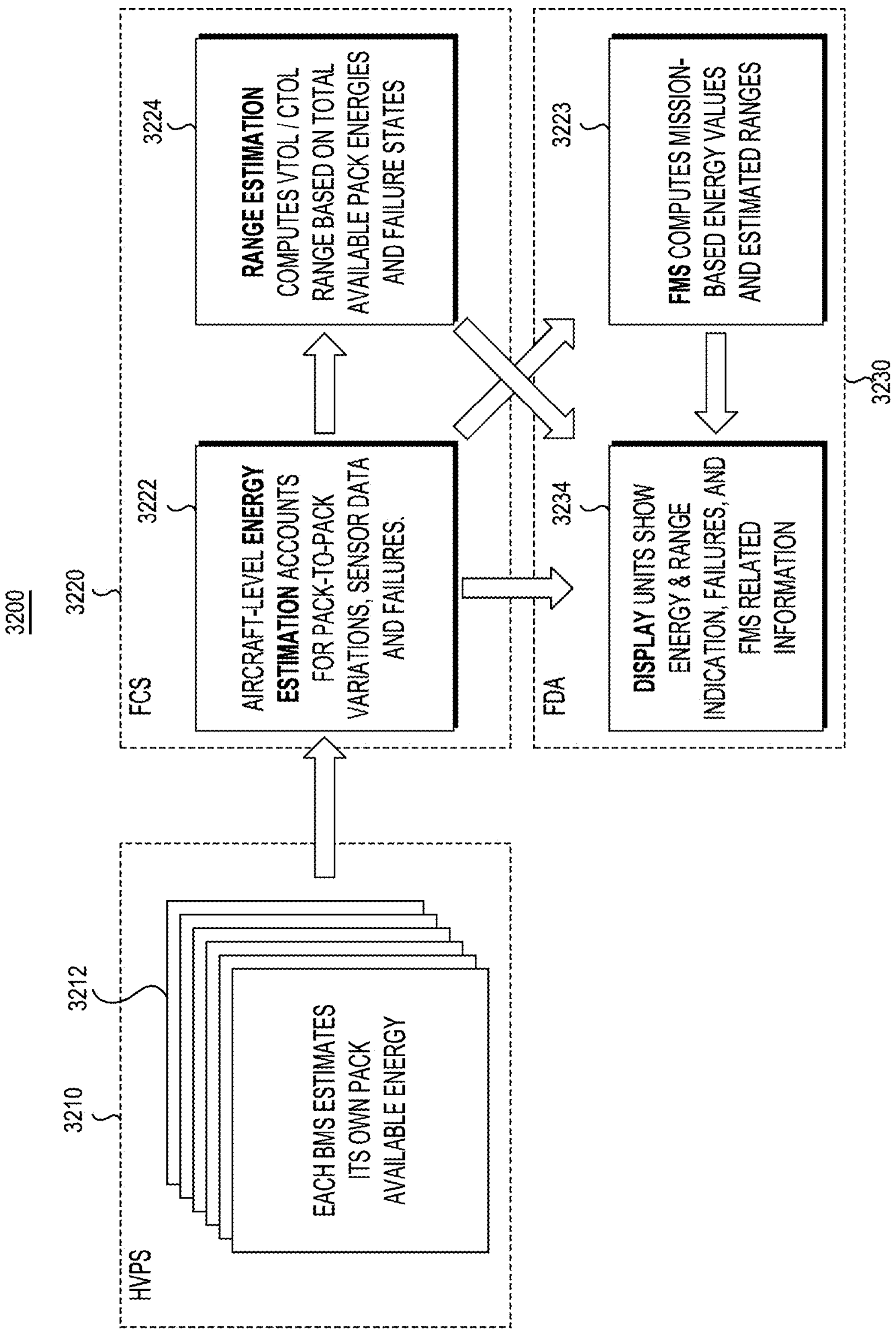
FIG. 32 illustrates an exemplary functional block diagram of an exemplary range estimation approach, consistent with disclosed embodiments.

FIG. 32 illustrates an exemplary functional block diagram 3200 of an exemplary range estimation approach, consistent with disclosed embodiments. Block diagram 3200 may be implemented as software (e.g., in at least one module, at least one program, at least one application, and/or at least one function, etc.), hardware (e.g., at least one processor, such as an FCC, BMU, controller, etc.), or a combination of both. The range estimation function(s) may begin at the HVPS 3210. The HVPS 3210 may comprise one or more BMSs, each configured to manage at least a portion of one battery pack of the one or more battery packs of the aircraft.

At step 3212, each BMS may be configured to estimate an amount of available energy associated with one or more battery packs managed by the BMS, and HVPS 3210 may transmit one or more estimated available energies (e.g., one for each battery pack) to FCS 3220.

At step 3222, FCS 3220 may be configured to determine aircraft-level energy estimates based on one or more of battery pack-to-pack variations, sensor data, or any detected damages or failures. An aircraft-level energy estimate may refer to an estimated energy (e.g., SOC, SOE, SOP) associated with the entire aircraft. For example, an aircraft-level energy estimate may be a combination (e.g., summation, weighted summation) of energy estimates of one or more (e.g., each) battery packs.

At step 3224, the range estimation function(s) may compute at least one of VTOL range or CTOL range based on at least one of total available pack energies, damages, or failure states. FCS 3220 may transmit the outputs of 3222 and 3224 to flight deck avionics (FDA) 3230.

At step 3223, a flight management system (FMS) may compute mission-based energy values and estimated ranges.

At step 3234, using aircraft-level energy estimates from step 3222, range estimates from step 3224, and mission-based energy values and estimated ranges from step 3232, one or more display units of FDA 3230 may display at least one of energy indication, range indication, damage(s), failure(s), or FMS related information.

Figure 33:
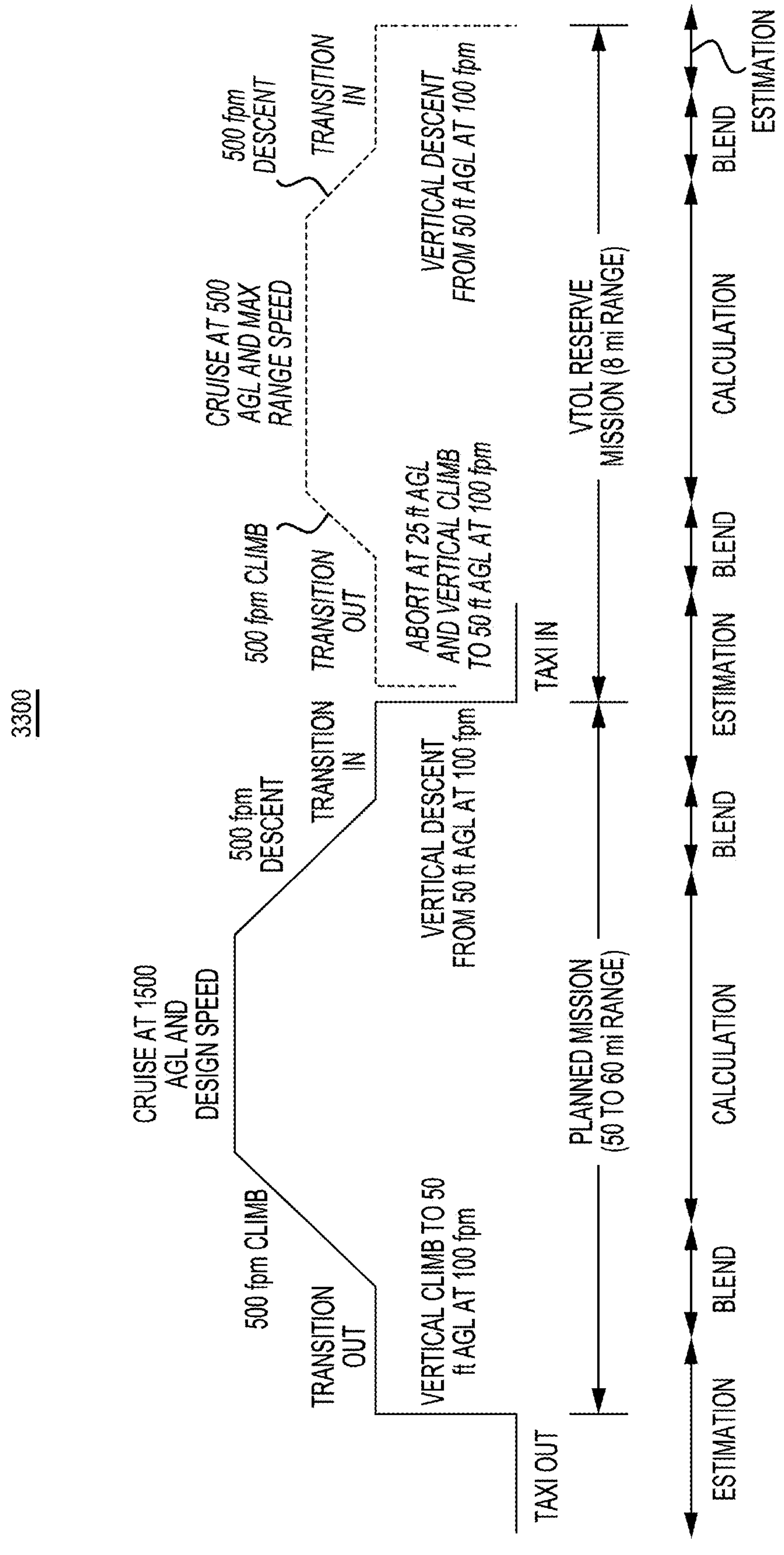
FIG. 33 illustrates exemplary power draw at different phases of flight, consistent with disclosed embodiments.

FIG. 33 illustrates exemplary power draw at different phases of flight, consistent with disclosed embodiments. An amount of power draw may be different for each phase of flight, which may affect range estimation if calculations at all phases of flight are performed using instantaneous power draw. For example, when an aircraft is in the hover-phase of flight, power draw may fluctuate much more than when the aircraft is in the cruise-phase of flight drawing a steady amount of power. As such, calculating estimated range using real-time measured values during the hover-phase of flight may result in fluctuating and inaccurate range estimates. Therefore, in order to generate more accurate and steady range estimates, the range estimation function(s) may be configured to estimate range based on a phase of flight of the aircraft.

In some embodiments, the range estimation function(s) may be configured to perform one or more of model estimation, online calculation, or blending. For example, in an outbound phase of flight, the flight speed of the aircraft may be one of a hover to mid-transition flight speed or mid-transition to $v_{cruise}$ flight speed. The range estimation function(s) may be configured to perform model estimation when (e.g., in response to determining that) the flight speed is a hover to mid-transition flight speed. Additionally or alternatively, the range estimation function(s) may be configured to perform blending when (e.g., in response to determining that) the flight speed is a mid-transition to $v_{cruise}$ flight speed. Additionally or alternatively, the range estimation function(s) may be configured to perform online calculation when (e.g., in response to determining that) the aircraft is climbing, cruising, or descending (i.e., flight speed is greater than or equal to $v_{cruise}$ or at cruise speed). Additionally or alternatively, the range estimation function(s) may be configured to subtract an energy required to reach wing-borne speed from remaining energy and/or compute remaining wing-borne range when (e.g., in response to determining that) the aircraft is in an inbound phase of flight (i.e., $v_{cruise}$ to mid-transition flight speed).

In some embodiments, model estimation may comprise using one or more offline aeromodels (e.g., model of aerodynamic forces and moments acting on aircraft) to estimate cruise power draw. For example, the range estimation function(s) may receive one or more aircraft states to predict cruise power draw using the offline aeromodel(s). In some embodiments, model estimation may further comprise subtracting a remaining outbound energy from a total remaining energy. For example, the range estimation function(s) may be configured to compute at least one of an outbound energy or range based on energy information received from an energy estimation unit (e.g., within BMS, HVPS) and based on $v_{\infty}$. Additionally or alternatively, model estimation may comprise computing an altitude-based range delta.

In some embodiments, online calculation may comprise calculating a steady-state power by subtracting power required for climb and acceleration. For example, online calculation of steady-state power (e.g, of the aircraft) may comprise computing a thrust required to maintain steady speed at a current altitude (e.g., based on measured altitude and measured airspeed). In some embodiments, online calculation may further comprise computing a remaining range based on current ground speed, estimated steady power, and one or more energies (e.g., remaining outbound energy, total remaining energy).

In some embodiments, blending may comprise blending the model estimated cruise power with the online-calculated steady power. Additionally, the range estimation function(s) may compute remaining wing-borne range after subtracting remaining outbound energy.

In some embodiments, one or more of model estimation, online calculation or blending may be performed regardless of phase of flight. For example, online calculation may be performed throughout a course of a flight, even when an aircraft is not climbing, cruising, or descending. In some embodiments, model estimation, online calculation and blending may each be performed throughout an entire flight of an aircraft. Additionally or alternatively, the range estimation function(s) may perform two or more of model estimation, online calculation or blending at the same time. In some embodiments, dynamically switching between model estimation, online calculation, and blending (e.g., switching based on a phase of flight, flight plan, and/or battery state determination, etc.) may provide benefits such as increased accuracy of range estimation, increased safety, as well as improving computational efficiency by reducing a size of any aeromodels used for model estimation.

Some embodiments may include comparing the estimated at least one of the vertical landing range or the conventional landing range to a range remaining to an initial destination to obtain a range comparison result, which may be performed by a model, algorithm, function, and/or at least one processor, consistent with disclosed embodiments. An initial destination may be an intended landing location of the aircraft or the aircraft's pilot (for a manned aircraft) and/or may be included in a flight plan for the aircraft. A range remaining may include a distance between a current location of the aircraft and a location of the initial destination. In some embodiments, the model, algorithm, function, and/or at least one processor may calculate the range remaining based on an altitude of the aircraft and past, present, and/or predicted energy usage of the aircraft, for one or more landing modes. In some embodiments, the range estimation function(s) may use the range comparison result to determine range information to render (also referred to as "display") on the display. Range information may include one or more ranges based on one or more energy usages, such as energy usages during at least one previous flight, energy usage during a current flight, energy usage during a particular phase of flight, and/or energy predicted to be used during a remainder of a current flight. For example, the range estimation function(s) may determine that multiple ranges corresponding to a range based on a conventional landing energy usage and a range based on a vertical landing energy usage should be rendered, and/or may cause the rendering.

In some embodiments, the range estimation function(s) may be configured to determine an alternate destination within a remaining range of the aircraft, where the alternate destination may be different than an initial destination (e.g., a destination associated with a flight plan of the aircraft). In some embodiments, location information for optional alternate destinations may be stored in a storage medium accessible to the range estimation function(s), and may be used by the range estimation functions to determine one or more alternate destinations within the remaining range. In some embodiments, the location information may be associated with a map. For example, in response to a trigger event, the range estimation function(s) may be configured to identify one or more alternate destinations and determine whether a remaining range is sufficient for the aircraft to land (either conventionally or vertically) at each alternate destination. A trigger event may include one or more of receiving pilot input (e.g., physical button, display button, audible command, inceptor command) indicating an abort of the planned mission, determining that an estimated available range is insufficient for landing at a planned destination, or any event that changes the planned destination. For example, an aircraft may descend and prepare for landing at a planned destination, but may be unable to land at the planned destination for one or more reasons (e.g., too much traffic at the planned destination, planned destination only allows vertical landing but range requires conventional landing).

The range estimation function(s) may be configured to communicate, in response to the trigger event, with other components of the aircraft to detect one or more alternate destinations and determine a distance to each alternate destination and/or an estimated range needed to reach each alternate destination. For example, an FCC may search (e.g., via look-up table, on a closed communication system, in a database) for an alternate destination. In some embodiments, only alternate destinations within an estimated range may be searched. The FCC may perform range estimation functions to determine which alternate destinations are within the estimated range, similar to those range estimation functions described and exemplified below with respect to FIGS. 34, 35A, and 35B. In some embodiments, the range estimation function(s) may be configured to compare each alternate destination range to an estimated available range of the aircraft to determine which alternate destinations are within a reachable distance. Based on the determined alternate destinations, the range estimation function(s) may be configured to communicate with various aircraft components to abort the planned mission and pursue an alternate mission.

Figure 34:
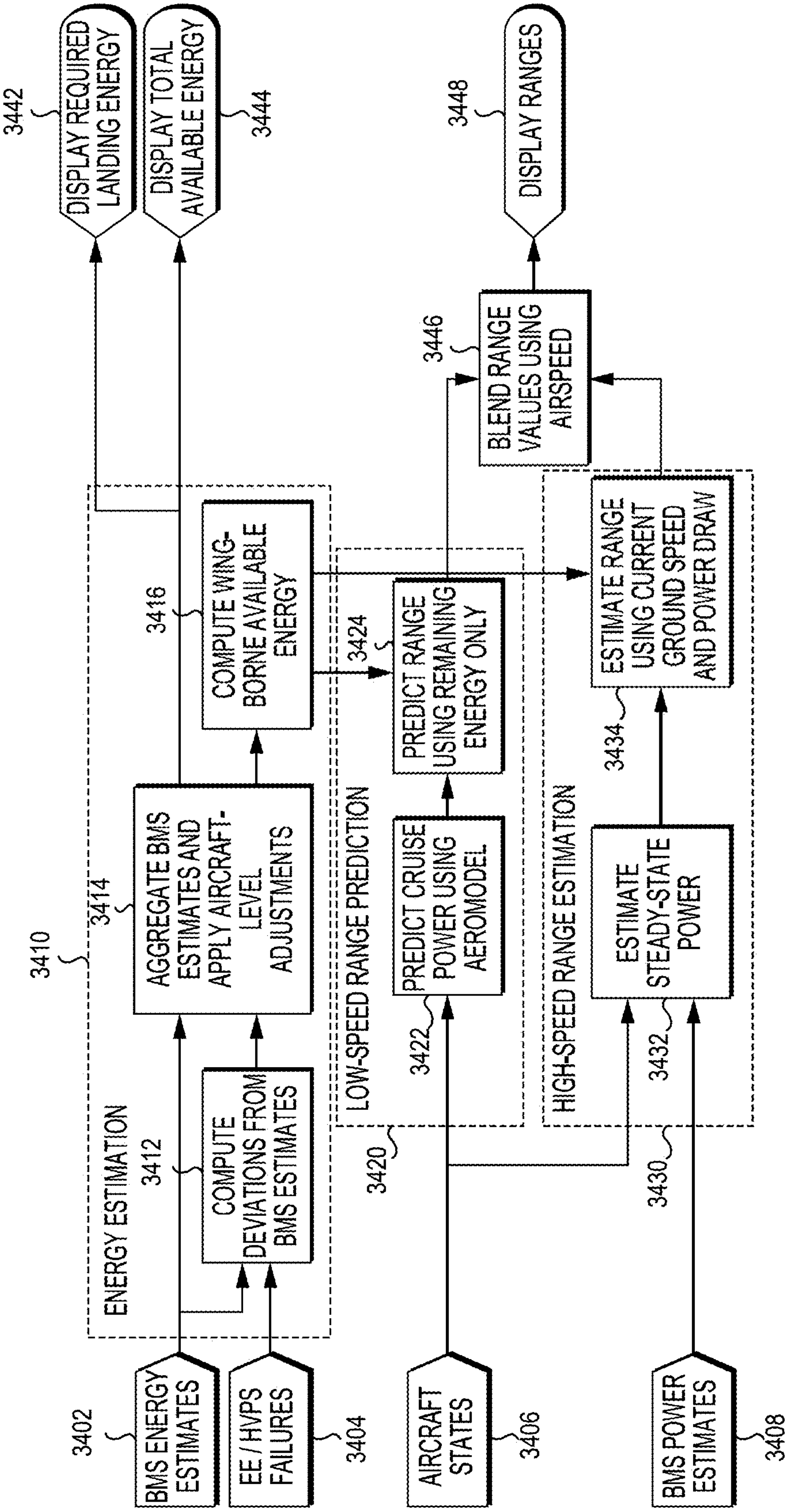
FIG. 34 illustrates a flow diagram of an exemplary range estimation approach, consistent with disclosed embodiments.

FIG. 34 illustrates a flow diagram of an exemplary range estimation approach, consistent with disclosed embodiments. Flow diagram 3400 may be implemented as software (e.g., in at least one module, at least one program, at least one application, and/or at least one function, etc.), hardware (e.g., at least one processor, such as an FCC, BMU, controller, etc.), or a combination of both. In some embodiments, the range estimation function(s) may comprise energy estimation 3410, low-speed range prediction 3420 and high-speed range estimation 3430. In some embodiments, energy estimation 3410, low-speed range prediction 3420 and high-speed range estimation 3430 may be performed by any of one or more battery management systems, the HVPS, the flight control system, or a combination thereof.

Energy estimation 3410 may comprise receiving inputs BMS energy estimates 3402 and electric engine (EE) or HVPS failures 3404 to compute deviations from BMS estimates 3412. For example, BMS energy estimates may include one or more estimated battery states (e.g., SOC, SOE, SOP) for one or more battery packs. Further, HVPS failures may include a condition in which one or more battery packs are not performing as expected. For example, HVPS failures may include a thermal runaway event, an inverter malfunction, one or more short circuits, one or more blown pyro fuses, one or more opened contactors, or the like.

Energy estimation 3410 may further comprise aggregating BMS energy estimates 3402 and applying aircraft-level adjustments 3414. Aircraft-level adjustments 3414 may include controlling one or more actuators, control surfaces, EPUs, or any electrical or mechanical component of the aircraft, and may be implemented via control allocation 1029. The output of 3414 (e.g., required landing energy, total available energy) may be displayed at 3442 and 3444. Energy estimation 3410 may further comprise computing wing-borne available energy based on the output of 3414 and transmitting the wing-borne available energy for low-speed range prediction 3420 or high-speed range estimation 3430. Wing-borne available energy may refer to an amount of energy (e.g., SOC, SOE, SOP) estimated to be required to be consumed or utilized to maintain wing-borne flight.

Low-speed range prediction 3420 may comprise receiving aircraft states 3406 to predict cruise power using one or more aeromodels. Aircraft states 3406 may include one or more of an aircraft altitude, an aircraft velocity, and a flight path angle. For example, particular combinations of ranges for at least two of an aircraft altitude, an aircraft velocity, or a flight path angle may correspond to a hover state (e.g., hover mode, thrust-borne mode), a transition state (e.g., a transition mode), and a flight state (e.g., flight mode, wing-borne mode), consistent with disclosed embodiments. Aeromodels may comprise offline generated aeromodels configured to predict cruise power based on aircraft states. Low-speed range prediction 3420 may further comprise predicting range 3424 using only remaining energy, based on outputs from computed wing-borne available energy 3416 and predict cruise power 3422.

High-speed range estimation 3430 may comprise estimating steady-state power 3432 based on aircraft states 3406 and BMS power estimates 3408. High-speed range estimation 3430 may further comprise estimating range using current ground speed and power draw based on outputs from compute wing-borne available energy 3416 and estimate steady-state power 3432.

In some embodiments, range values from predict range 3424 and estimate range 3434 may be blended using airspeed 3446, and may be displayed at an output step 3448 that displays ranges. Blending may refer to combining (e.g., summation, weighted summation) two or more values (e.g., predicted range and estimated range). For example, based on the current airspeed of the aircraft indicating cruise speed, blending range values may comprise weighting the predicted range 3424 at 0% and weighting the estimated range 3434 at 100%. Additionally or alternatively, based on the airspeed being between mid-transition and $v_{cruise}$ and closer to mid-transition, blending range values may comprise giving more weight to predicted range 3424 than estimated range 3434. In some embodiments, the ranges displayed at step 3448 may comprise at least one of a VTOL range or a CTOL range.

Figure 35A:
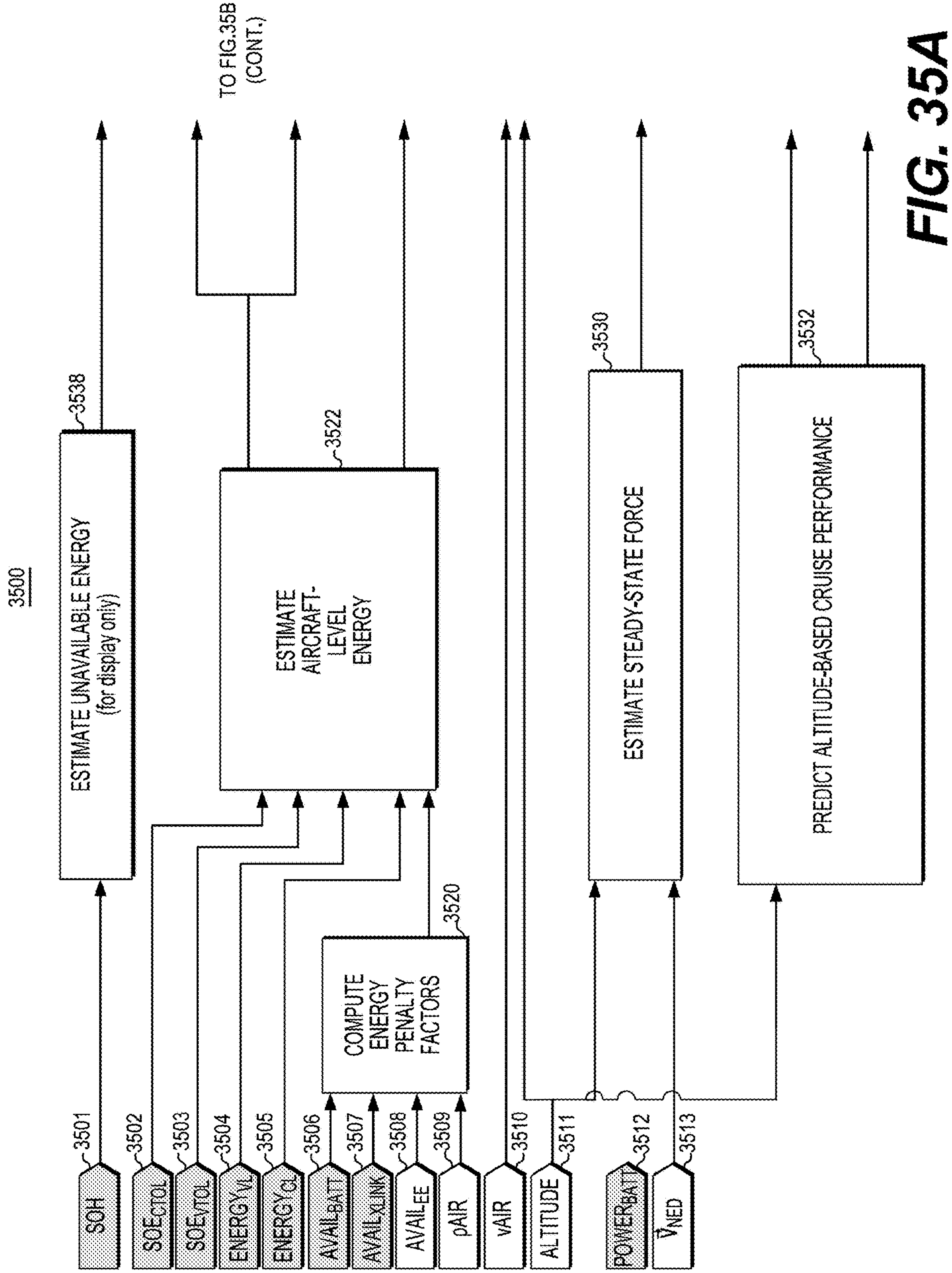
FIGS. 35A and 35B illustrate a flow diagram of an exemplary range estimation approach, consistent with disclosed embodiments.
Figure 35B:
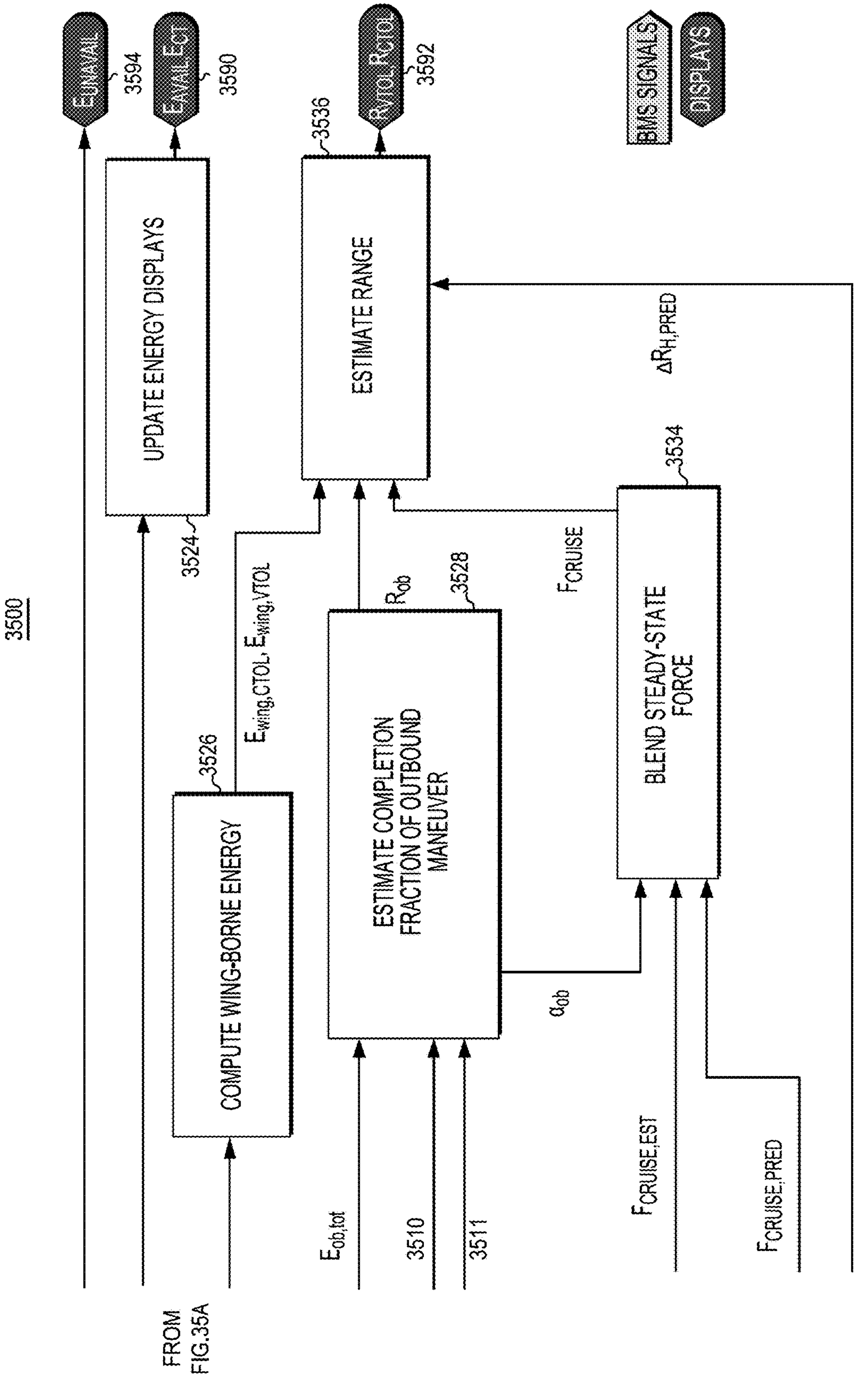

FIGS. 35A and 35B illustrate a flow diagram of an exemplary range estimation approach, consistent with disclosed embodiments. Flow diagram 3500 may be implemented as software (e.g., in at least one module, at least one program, at least one application, and/or at least one function, etc.), hardware (e.g., at least one processor, such as an FCC, BMU, controller, etc.), or a combination of both.

In some embodiments, the range estimation function(s) may comprise computing energy penalty factors at step 3520, estimating aircraft level energy at step 3522, updating energy displays at step 3524, computing wing-borne energy at step 3526, estimating completion fraction of outbound maneuver at step 3528, estimating steady-state force at step 3530, predicting altitude-based cruise performance at step 3532, blending steady-state force at step 3534, and estimating range at step 3536. In some embodiments, the range estimation function(s) may further comprise estimating unavailable energy, which may be displayed at output step 3538.

The range estimation function(s) may be configured to, e.g., at step 3520, compute energy penalty factors (η). Energy penalty factors may refer to additional energy costs or losses incurred in a system due to conditions, inefficiencies, or operational requirements. Computing energy penalty factors may comprise estimating energy knockdown factors due to failures or changes in ambient conditions. In some embodiments, energy penalty factors may be computed based on one or more of available batteries 3506, available cross link 3507 (i.e., connections between batteries), available EPUs 3508, or air density 3509.

At 3522, the range estimation function(s) may be configured to estimate aircraft-level energy. Aircraft-level energy may refer to SOC, SOE, SOP, or any other information representing the capabilities of one or more power sources of the aircraft (e.g., representing the capabilities of all or multiple battery packs of the aircraft). Inputs to 3522 may include one or more of a CTOL state of energy (SOE) 3502, VTOL SOE 3503, vertical landing (VL) energy 3504 or conventional landing (CL) energy 3505. In some embodiments, at least one processor may be configured to determine CTOL SOE, VTOL SOE, VL energy, and CL energy via the SOE algorithms exemplified and described above with respect to FIGS. 22A-22C. For example, CTOL SOE may refer to an SOE associated with conventional take-off and landing operations, VTOL SOE may refer to an SOE associated with vertical take-off and landing operations, VL energy may refer to an amount of energy estimated to be required to perform a vertical landing, and CL energy may refer to an amount of energy estimated to be required to perform a conventional landing. In some embodiments, estimating aircraft-level energy may be based on a battery balancing function. In some embodiments, estimating aircraft-level energy may include combining (e.g., adding, using a weighted combination, such as a weighted summation) battery pack-level energy and/or battery cell-level energy.

In some embodiments, estimating aircraft-level energy may comprise estimating total outbound energy using the following:

$$E_{outbound,total} = \eta_{outbound} E_{outbound0}$$

In some embodiments, estimating aircraft-level energy may further comprise estimating aircraft-level landing energies using the following:

$$E_{CL} = \eta_{CL} \sum E_{BMS,CL}$$

$$E_{VL} = \eta_{VL} \sum (E_{BMS,VL} - SOE_{CTOL} + SOE_{VTOL})$$

In some embodiments, estimating aircraft-level energy may further comprise estimating aircraft-level available energies using the following:

$$E_{avail,C} = \eta_{CTOL} \sum SOE_{BMS,CTOL}$$

$$E_{avail,V} = \eta_{VTOL} \sum SOE_{BMS,VTOL}$$

At 3524, the range estimation function(s) may be configured to receive estimated aircraft-level energies from 3522 and may update energy displays. In some embodiments, vertical landing energy may need to account for a delta in inaccessible energies. Updating energy displays may comprise the following to output $E_{avail}$, $E_{CL}$ 3590:

$$E_{avail,display} = E_{avail,C}$$

$$E_{VL,display} = E_{VL} + (E_{avail,C} - E_{avail,V})$$

At 3526, the range estimation function(s) may be configured to compute wing-borne energy. Wing-borne energy may refer to an amount of energy (e.g., SOE) available for wing-borne flight. For example, using the estimated aircraft-level energies from 3522, wing-borne energy may be estimated for both CTOL and VTOL using the following:

$$E_{wing} = E_{avail} - E_{landing} - E_{outbound}$$

At 3528, the range estimation function(s) may be configured to estimate a completion fraction of an outbound maneuver. A completion fraction may refer to a fraction (e.g., percentage) of a maneuver that has been completed, which may be expressed in terms of distance, energy (e.g., used or remaining), altitude, flight phase, or any combination thereof. Inputs to 3528 may include one or more of the estimated total outbound energy from 3522, airspeed 3510, and altitude 3511. In some embodiments, the completion fraction of the outbound transition maneuver ($\alpha_{ob}$), outbound energy ($E_{ob}$), and outbound range ($R_{ob}$) may be estimated using aircraft velocity and altitude as follows:

$$\alpha_{ob} = F(v_{air}, h)$$

$$E_{ob} = (1 - \alpha_{ob})E_{ob,tot}$$

$$R_{ob} = (1 - \alpha_{ob})R_{ob,tot}$$

At 3530, the range estimation function(s) may be configured to estimate steady-state force, which may be based on based on at least one of a measured altitude or a measured airspeed of the aircraft, which may be a current airspeed of the aircraft. Inputs to 3530 may include altitude 3511, battery power 3512, and/or inertial speed $v_{ned}$ 3513. A steady-state force may refer to an aerodynamic or control force that balances out dynamic effects and results in a stable and unchanging condition (e.g., in a control law, during flight). For example, a steady-state force may be a control force for maintaining the aircraft at a constant airspeed. The steady-state force may include a thrust at which value the aircraft state (e.g., airspeed) does not change. In some embodiments, estimating steady-state force may comprise computing thrust for maintaining steady speed at a current altitude (e.g., estimated as needed to maintain steady speed at a current altitude) using the following:

$$P_{cruise,est} = P_{total} - \frac{M}{\eta_{pwrtrain}}\left(g\frac{dh}{dt} - v_{ned}\frac{dv_{ned}}{dt}\right)$$

$$F_{cruise,esC} = \frac{P_{cruise,}}{v_{gnd}}$$

At 3532, the range estimation function(s) may be configured to predict altitude-based cruise performance. Cruise performance may refer to activity of an aircraft during a cruise flight mode relative to a capability of the aircraft and/or commanded activity, and may include at least one of efficiency, airspeed, range, lift-to-drag ratio, a ratio of lift caused by the wings vs. caused by EPUs, or any other metric of aircraft or aircraft component (e.g., battery pack, EPU) performance. Input to 3532 may include altitude 3511. In some embodiments, predicting altitude-based cruise performance may comprise estimating range using an aeromodel-predicted power draw when the aircraft is below wing-borne speed using the following:

$$P_{cruise,pred} = G(h, v_{cruise})$$

$$F_{cruise,pred} = \frac{P_{cruise,}}{v_{cruise}}$$

In some embodiments, predicting altitude-based cruise performance may further comprise computing an altitude-based range delta to account for any increase in range due to altitude gain using the following:

$$\Delta R_{h,pred} = H(h, v_{cruise})$$

At 3534, the range estimation function(s) may be configured to blend steady-state forces. For example, blending a steady-state force may include determining an updated steady-state force using inputs including $\alpha_{ob}$ from 3528, estimated steady state force from 3530, and/or predicted cruise performance from 3532. In some embodiments, blending steady-state forces may comprise blending one or more outbound forces and/or one or more outbound forces. For example, moments blending steady-state forces may comprise blending outbound forces and outbound forces using the estimated completion percentage of transition maneuver as follows:

$$F_{cruise} = (1 - \alpha_{ob})F_{cruise,est} + \alpha_{ob}F_{cruise,pred}$$

At 3536, the range estimation function(s) may be configured to estimate range. Inputs to 3536 may include estimated wing-borne energies from 3526, the completion fraction from 3528, blended steady-state force from 3534, and/or the altitude-based range delta from 3532. In some embodiments, estimating range may comprise estimating ranges (e.g., output 3592 including VTOL range $R_{VTOL}$, CTOL range $R_{CTOL}$) for various sections of a remaining flight profile using the following:

$$R_{wing} = E_{wing}/F_{cruise}$$

$$R_{tot} = R_{wing} + R_{outbound} + \Delta R_{h,pred}$$

In some embodiments, the range estimation function(s) may be configured to estimate unavailable energy 3538. For example, the range estimation function(s) may receive a state of health (SOH) 3501 of the batteries to estimate unavailable energy due to degradation for output to a display 3594 using the following:

$$E_{unavail} = \sum(E_{rated} - E_{fullcharge})$$

In some embodiments, based on the estimated available range or energy, the flight control system may cause the aircraft to output visual and/or audible signals to warn the pilot of insufficient range or energy for certain modes of landing. For example, each mode of landing may require a certain amount of energy or range for the aircraft to perform the mode of landing. In some embodiments, vertical landing may require more energy than conventional landing. In some embodiments, conventional landing may require more range than vertical landing. Based on the estimated available range or energy, certain modes of landing may be made unavailable by the flight control system (e.g., aircraft operation may be restricted), thereby enforcing less energy consuming modes of landing.

In some embodiments, the range estimation function(s) may be configured to estimate available range based on information from the flight management system. For example, the range estimation function(s) may receive flight management information such as one or more of terrain or flight plan information, which may allow for a more accurate estimation of available range.

A controlled emergency landing for an aircraft (e.g., eVTOL) may be desirable when a battery level drops below a predetermined battery level threshold. A battery level may refer to an SOC, SOE, SOP, any combination of the foregoing, or any other means of representing the ability of a battery to provide electric power (e.g., to one or more aircraft components). An emergency landing may refer to any unplanned landing of an aircraft (e.g., VTOL, CTOL)

due to one or more unforeseen circumstances that compromise safety. A controlled emergency landing may refer to a type of emergency landing in which the pilot retains significant control over the aircraft and is able to deliberately guide it to a safe location for touchdown.

For example and with reference to FIG. 6B, FCS 612 may determine from sensors 624 and/or communication with the HVPS 610, including the battery packs and their corresponding BMUs, a present SOC, SOE, and/or range estimate. It is to be understood that, in various embodiments discussed throughout the present disclosure, any description relating to use or application of SOC may equally apply or utilize an alternate parameter, such as SOE or range estimate. Further, as described in more detail below, the FCS 612 may determine a threshold battery level, which may be an amount of energy needed to descend to the ground. In some embodiments, the threshold battery level may be set as within 5%, 10%, and/or 15% of the energy required to descend to the ground.

In some embodiments, the threshold battery level may be based on at least one attribute of the aircraft or environmental attribute, such as at least one of a set descent rate, airspeed, altitude, mode of operation (e.g., wing-borne or thrust-borne), weather conditions, or terrain and/or obstacle conditions (e.g., from an inputted flight plan). In some embodiments, the descent rate may be limited to a rate designated for a survivable descent. Survivable descent may refer to an aircraft descending scenario (e.g., controlled emergency landing) in which the occupants have a reasonable chance for survival (e.g., between 2.5 and 5 m/s or 500 and 1000 feet per minute). For example, in some embodiments the maximum descent rate may be between 3 m/s and 6 m/s (10 ft/s-20 ft/s). In some embodiments (e.g., when less data gathering is possible), the threshold battery level may simply be based on the airspeed, altitude, and/or the set descent rate (e.g., all three of the foregoing). Based on determining that the SOC has dropped below the threshold battery level, the FCS 612 may send warnings to the pilot 626 and/or may control the descent of the aircraft by sending (and/or adjusting) descent commands to electric propulsion system 602 and/or control surface actuators 616. In some embodiments, a pilot may override the commanded descent, while in other embodiments the pilot may not override the commanded descent. Further, in some embodiments, the FCS 612 may control the aircraft to limit the flight envelope to reduce energy consumption of the aircraft. For example, in some embodiments, the FCS 612 may adjust commands sent to the electric propulsion system 602 and/or control surface actuators 616 to reduce the envelope (e.g., limit a pitch angle, roll angle, and/or yaw angle). For example, in some embodiments, the FCS 612 may increase/decrease the airspeed envelope protection—if for instance one of the engines has failed and the other has been turned off or is deliberately producing less torque for balancing/stabilizing the aircraft, then the control system may increase the low airspeed limit. In some embodiments, a pilot may override the envelope controls, while in other embodiments the pilot may not override the envelope controls. Envelope controls may refer to control limits beyond which prevent or reduce the aircraft from operating in a flight configuration that would violate them (e.g., having a violative speed, angle, bank, roll, and/or pitch), despite pilot input, and may be part of a control law (e.g., outer loop allocation 1024, inner loop control laws 1028). Further, in some embodiments, the FCS 612 may control the aircraft to increase its airspeed to allow for a wing-borne landing. For example, in some embodiments, the FCS 612 may send and/or adjust commands sent to the electric propulsion system 602 to adjust the angle of the propellers and/or increase propeller RPM.

Further, the FCS 612 may control the power consumption of the aircraft by commanding one or more different HVPS and LVS components to be shut off. In some embodiments, the FCS 612 may control LVS 608 to ensure power is maintained to the FCS 612, control surface components (e.g., control surface actuator 616), electric propulsion components (e.g., electric propulsion system 602), and pilot interface components. However, the FCS 612 may turn off power to climate control systems, interior lighting etc., and/or some display elements—e.g., heading, attitude, rate of descent, etc., but not others. Further, in some embodiments, when the aircraft is performing a controlled emergency landing in wing-borne flight, the FCS 612 may turn off power to the electric propulsion system 602.

FIGS. 36A-36E are graphs illustrating exemplary relationships between power, energy, airspeed, descent rate, and altitude, consistent with disclosed embodiments. The battery level threshold for triggering an emergency landing may be set to meet an energy target for landing the aircraft at a survivable descent rate. In some embodiments, the target energy for an emergency landing (e.g., estimated as needed for an emergency landing) may be determined based on the following relationship: Energy Target=(Altitude/Descent Rate)*Power to Descend+Energy to Decelerate+Energy to Flare. As exemplified and described below, in some embodiments, the Power to Descend may be a function of the airspeed and/or flight mode of the aircraft. Further, the Energy to Decelerate and Energy to Flare may be a function of the descent rate and/or flight mode.

Figure 36A:
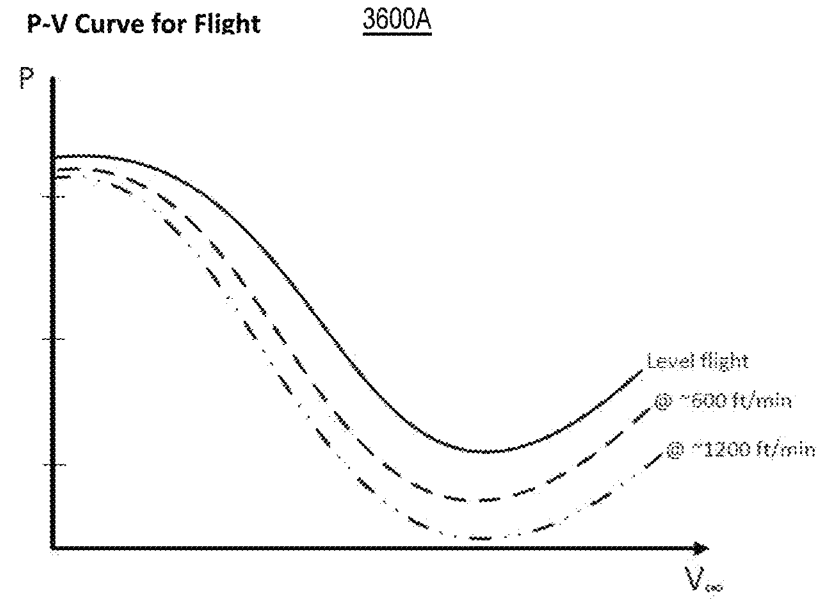
FIGS. 36A-36E are graphs illustrating exemplary relationships between power, energy, airspeed, descent rate, and altitude, consistent with disclosed embodiments.
Figure 36B:
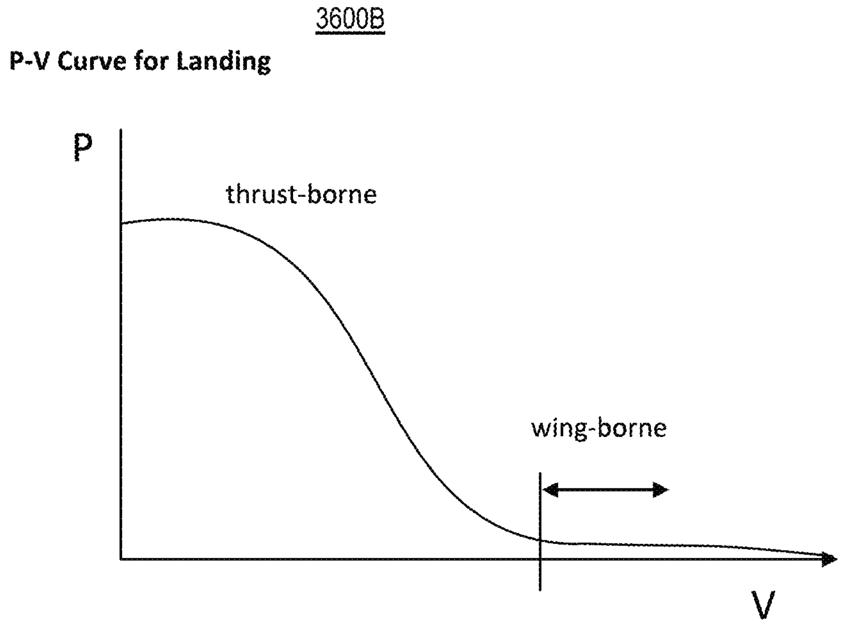

FIGS. 36A and 36B are exemplary graphs illustrating target power estimated to perform different descent rates (e.g., estimated as required for performing different descent rates) and target power to perform a landing (e.g., estimated as required for performing one or more different types of landing), consistent disclosed embodiments. Graphs 3600A and 3600B have a descent rate axis (V) and a power estimated to perform the descent rate axis (P).

In a thrust-borne mode at a lower air speed (e.g., hover), more power may be required to land the aircraft because the powered lift elements support lift of the aircraft. In wing-borne flight, less power may be required to land the aircraft because the aircraft gets lift support from its wings. In some embodiments, less power may be required in wing-borne deceleration because the aircraft is able to re-generate electrical energy through the propellers. Additionally, at a higher descent rate, less energy may be needed to descend the aircraft. At a lower descent rate, more energy may be needed to descend the aircraft. Therefore, in some embodiments, the FCS 612 may consider the airspeed and descent rate when determining the threshold battery level. In some embodiments, the FCS 612 may receive other information to determine a mode of aircraft operation (and therefore power consumption). For example, the FCS 612 may measure the RPM of the propellers and/or the pitch angle of the propellers to determine whether the aircraft is in a thrust-borne mode, transition mode, and/or wing-borne flight mode.

Figure 36C:
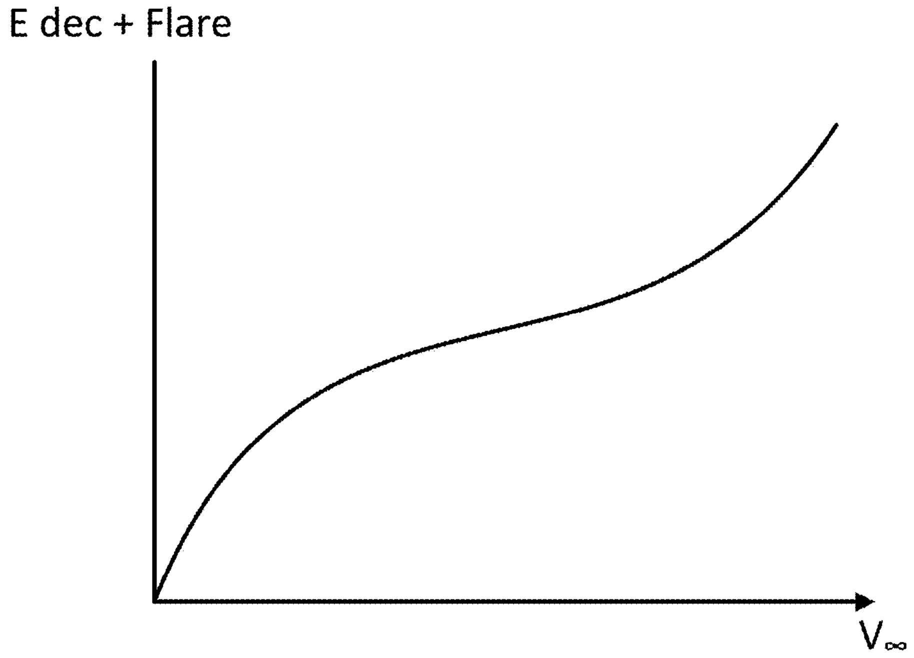

FIG. 36C illustrates an example graph of the target energy to perform an emergency deceleration (E dec) and execute a flare (e.g., estimated as required for performing an emergency deceleration and executing a flare deployment) for a given descent rate V, consistent disclosed embodiments. Energy for emergency deceleration may include energy to reduce (or stop) the descent of the aircraft before landing (e.g., estimated as required for reducing or stopping the descent of the aircraft before landing). Energy for flare (e.g., estimated as required for deploying a flare) may include energy to adjust the orientation (e.g., pitch) of the aircraft before landing. At higher descent rates, more energy may be required to decelerate and perform the flare maneuver to land the aircraft. At lower descent rates, less energy may be required to decelerate and perform the flare maneuver to land the aircraft. Therefore, in some embodiments, the FCS 612 may consider the target energy to decelerate and flare when determining the threshold battery level.

Figure 36D:
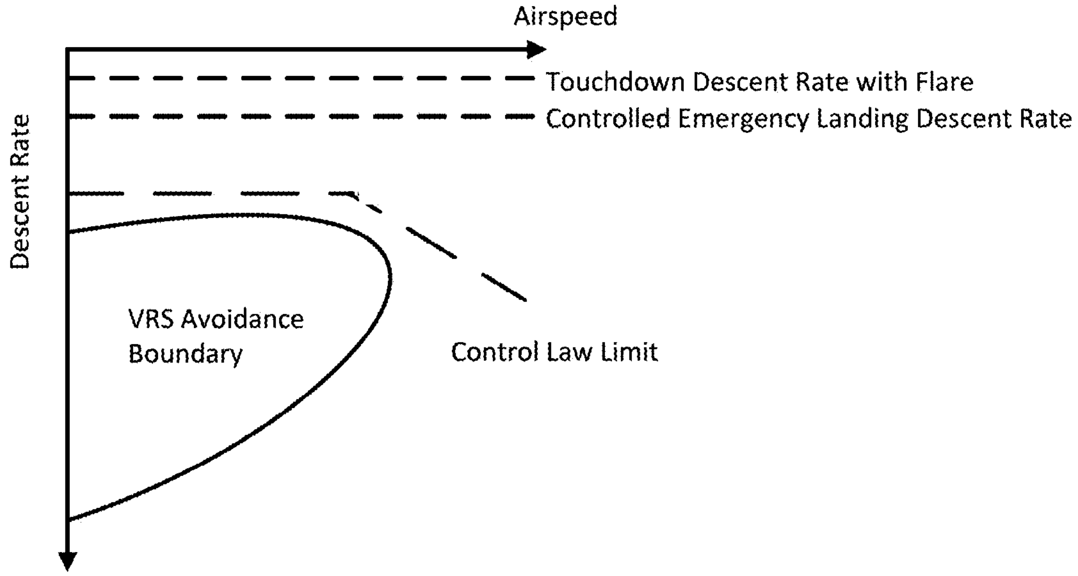

FIG. 36D illustrates an example graph of descent rates based on airspeed, consistent with embodiments of the present disclosure. In some embodiments, the descent rate may be set to avoid a vortex ring state (VRS) of the aircraft (where propellers suck air back into their own downwash, creating turbulent recirculating flow in their wake during descent). The vortex ring state may be a function of the airspeed and the descent rate. Further, the graph illustrates different descent rates relative to another. For example, the touchdown descent rate may be a descent rate at which the FCS 612 allows the pilot to flare the aircraft (e.g., manual flare). The controlled emergency landing (CEL) descent rate may be a maximum allowable rate of descent prior to landing (e.g., within a time threshold of landing). The controlled emergency landing descent rate may be set to ensure pilot survival (e.g., 3 m/s-6 m/s or 10 ft/s-20 ft/s). The control law limit rate may be the maximum allowable descent rate that will be allowable by the aircraft. As shown, it may be set at a constant value (e.g., 8 m/s or 1600 ft/min) at lower airspeeds and a higher value(s) at higher airspeeds when the aircraft is better able to avoid VRS. For example, in some embodiments, the control law descent rate limit may increase around 13-25 m/s (25-50 knots). In some embodiments, when performing a controlled emergency landing, the FCS 612 may set the descent rate at the CEL descent rate. In some embodiments, when performing a controlled emergency landing, the FCS 612 may set the descent rate as a value between the CEL descent rate and the Control Law Limit. In some embodiments, the FCS 612 may set variable descent rates (e.g., a descent rate trajectory) where the values fall between the CEL descent rate and the Control Law Limit.

Figure 36E:
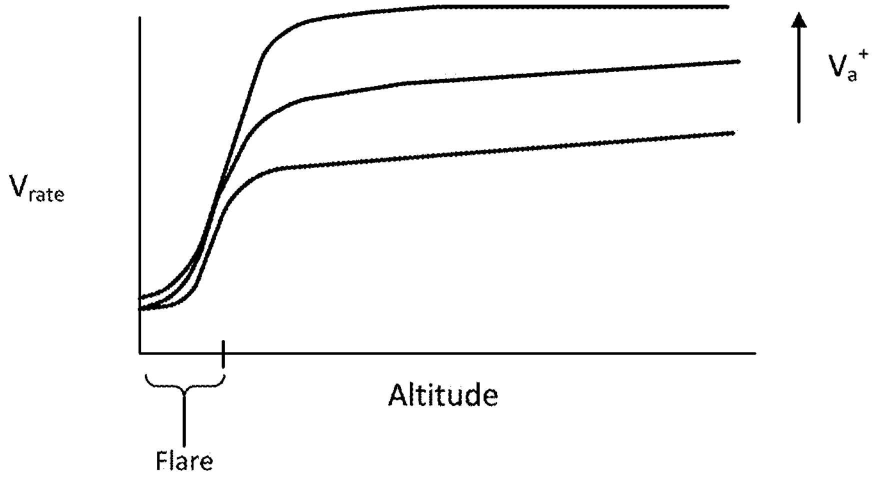

FIG. 36E illustrates an example graph showing how the FCS 612 may vary the descent rate based on the altitude and current airspeed of the aircraft when performing a controlled emergency landing, consistent disclosed embodiments. As used in graph 3600E, $V_{rate}$ refers to a descent rate, flare refers to the altitude at which point a flare maneuver should be executed, and $V_a^+$ refers to an airspeed of the aircraft. Graph 3600E includes three altitude vs descent rate curves for three different airspeeds (higher curve indicates higher airspeed).

When the FCS 612 detects the aircraft is at a higher altitude, it may command a larger descent rate. When the FCS 612 detects the aircraft is in proximity of the ground (e.g., as determined by altitude sensors and/or a pilot input on an inceptor), the FCS 612 may reduce the aircraft descent rate. Further, the FCS 612 may control the aircraft descent in a manner that avoids a vortex ring state (VRS) of the aircraft (where propellers suck in their wake during descent) (as shown in FIG. 36D). When the FCS 612 determines the aircraft is at a higher airspeed and better able to avoid VRS, the FCS 612 may increase the descent rate. When the FCS 612 determines the aircraft is at a lower airspeed and susceptible to VRS, the FCS 612 may decrease the descent rate. In some embodiments, the FCS 612 may detect other measurements from sensors (e.g., torque, RPM, vibration etc.) to determine whether the aircraft is in a VRS and may control the descent trajectory accordingly.

Figure 37A:
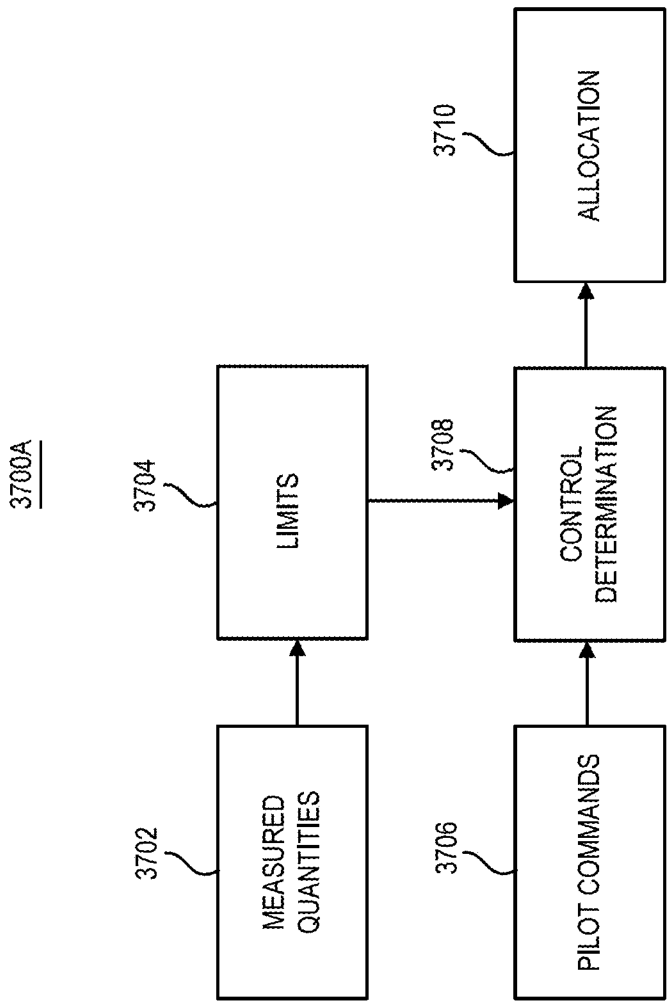
FIGS. 37A and 37B are diagrams illustrating exemplary aspects of a controlled emergency landing function, consistent with disclosed embodiments.
Figure 37B:
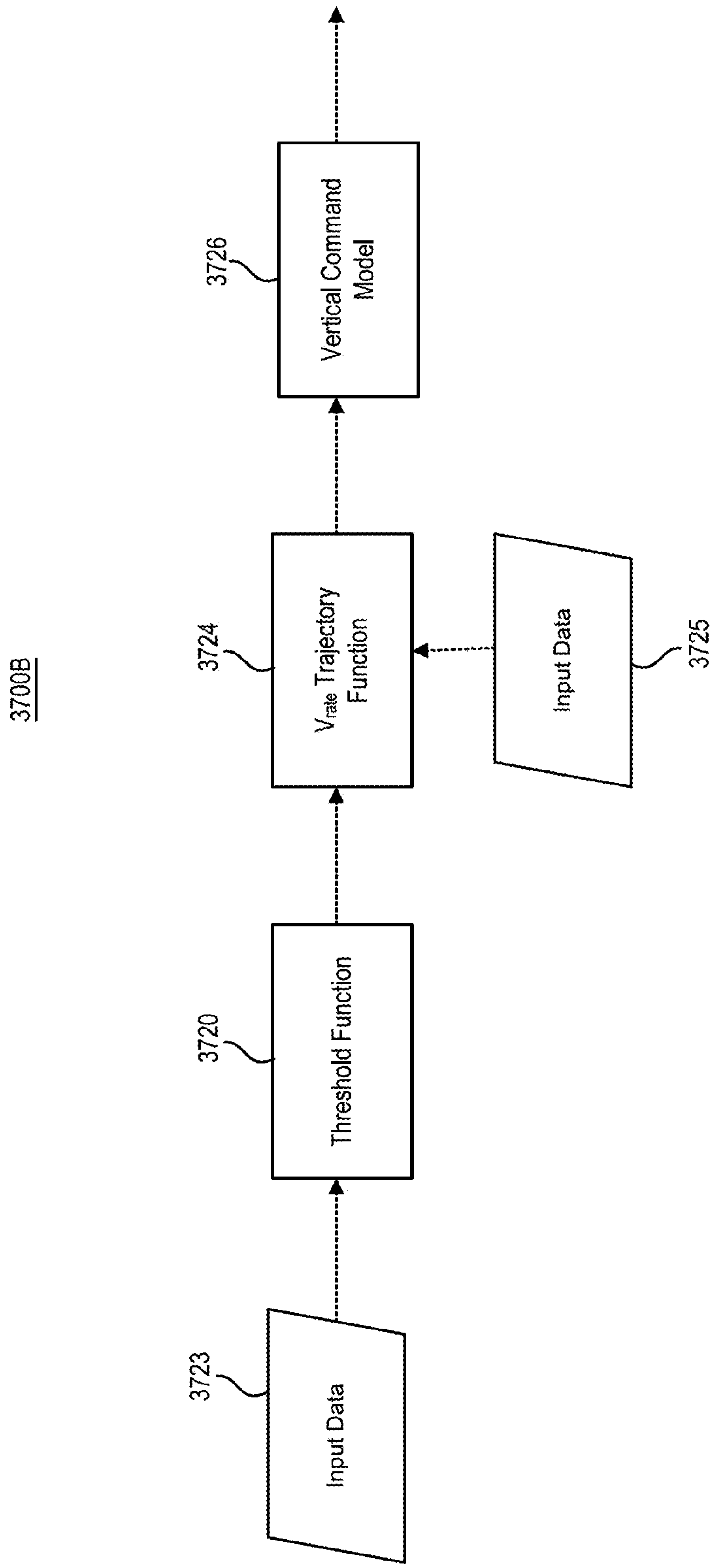

FIGS. 37A and 37B are diagrams illustrating exemplary aspects of a controlled emergency landing function, consistent with disclosed embodiments.

FIG. 37A depicts a block diagram 3700A of an exemplary flight control system comprising a controlled emergency landing function, according to various embodiments. Block diagram 3700A may be implemented as software (e.g., in at least one module, at least one program, at least one application, and/or at least one function, etc.), hardware (e.g., at least one processor, such as an FCC, BMU, controller, etc.), or a combination of both.

The flight control system may receive one or more pilot commands 3706, such as a climb/descent rate command, gamma command (e.g., flight path angle command), speed command, pitch command, and/or roll command, and may input the received pilot command(s) to control determination 3708 configured to control the aircraft. Control determination 3708 may receive control limit(s) from limit function 3704. In some embodiments, limit function 3704 may include a set of limits for normal operation of the aircraft (e.g., reference values designated for expected or desired aircraft operation), such as normal descent rate limits, normal speed limits, and/or normal envelope limits to ensure safe operation of the aircraft. In some embodiments, these limits may be based on a stored flight plan and/or based on a flight plan command from an avionics system. In some embodiments, limit function 3704 may further include a second set of limits which control the aircraft during an emergency, such as emergency descent rate limits, emergency speed limits, or emergency envelope limits. In some embodiments, such as shown in FIG. 36B, emergency limit function 3704 may set the emergency descent rate based on an airspeed and altitude. In some embodiments, limit function 3704 may set the descent rate based on terrain (e.g., poor terrain may require reduced descent rate). In some embodiments, limit function 3704 may set the descent rate based on at least one of a landing mode (e.g., conventional or thrust-borne) or a mode of flight (e.g., thrust-borne, transition, and/or wing-borne flight). Further, in some embodiments the limit function 3704 may set limits to the envelope in order to reduce the power consumption of the aircraft. Further, in some embodiments the limit function 3704 may set the limits to the speed of an aircraft. For example, the speed limits may be set to ensure the aircraft does not drop below a speed for wing-borne flight and/or to ensure the aircraft maintains a speed range that provides for safe landing. The flight control system 612 may feed the output of control determination 3708 to allocation 3710, which may output one or more torque commands to one or more EPUs.

FIG. 37B is a flow diagram 3700B of an exemplary flight control system comprising a controlled emergency landing function, consistent with embodiments of the present disclosure. Flow diagram 3700B may be implemented as software (e.g., in at least one module, at least one program, at least one application, and/or at least one function, etc.), hardware (e.g., at least one processor, such as an FCC, BMU, controller, etc.), or a combination of both.

Controlled emergency landing function 3700B may include threshold function 3720. Threshold Function 3720 may be configured to generate a battery SOC threshold and/or check if the current battery SOC is near (e.g., within a predetermined range of), at, and/or below the threshold. In some embodiments, the battery SOC threshold may refer to the amount of charge required to perform a controlled emergency landing. Threshold Function 3720 may be configured to generate the SOC threshold based on input data 3723. Input data 3723 may be measured or collected by one or more sensors in or on the aircraft and may include airspeed, above ground level (AGL) altitude, and/or an SOC (e.g., of one or more battery packs, or one or more battery cells). In some embodiments, Threshold Function 3720 may determine if input data 3723 is high-integrity and may use only high-integrity signals as inputs, while in other embodiments other signal inputs may be considered. A high-integrity signal may originate from a high integrity sensor or may be based on a high integrity measurement (as discussed above, such as cell-level measurement). In other embodiments, Threshold Function 3720 may use a constant predetermined SOC threshold. In some embodiments, Threshold Function 3720 may be further configured to determine if a controlled emergency landing should be performed. For example, a Threshold Function 3720 may determine a controlled emergency landing should be performed when the measured battery SOC is at and/or below the SOC threshold.

If Threshold Function 3720 determines that a controlled emergency landing should be performed, Threshold Function 3720 may send a signal to activate $V_{rate}$ Trajectory Function 3724. $V_{rate}$ Trajectory Function 3724 may be configured to generate a descent rate when activated. The descent rate may refer to the speed at which the aircraft approaches the ground. In some embodiments, $V_{rate}$ Trajectory Function 3724 may be configured to generate a constant descent rate. For example, $V_{rate}$ Trajectory Function 3724 may output a single, constant descend rate when activated (e.g., 3 m/s or 600 feet per minute). In other embodiments, $V_{rate}$ Trajectory Function 3724 may be configured to generate a variable descend rate based on input data 3725. Input data 3725 may refer to data measured or collected by one or more sensors in or on the aircraft. Input data 3725 may also refer to data stored in a computer memory. Input data 3725 may include at least one of AGL altitude, the rate at which AGL altitude changes, airspeed, or a descent rate threshold associated with vortex ring state. For example, $V_{rate}$ Trajectory Function 3724 may initially output a maximized descent rate but then automatically reduce the descend rate as the aircraft approaches the ground. In other embodiments, $V_{rate}$ Trajectory Function 3724 may be configured to query a lookup table (not depicted) that maps a descend rate to input data 3725. For example, as shown in FIG. 36B, the descent rate may be controlled based on one or more inputs.

$V_{rate}$ Trajectory Function 3724 may be configured to output the generated descend rate to Vertical Command Model 3726. Vertical Command Model 3726 may refer to a function that takes pilot inceptor input and the generated descend rate and generates a command for the control law to accept as input and use to determine one or more outputs that will influence an aircraft behavior or flight condition. In some embodiments, Vertical Command Model 3726 may be configured to control or limit the pilot's ability to manipulate the detent of the inceptor. For example, in some embodiments, $V_{rate}$ Trajectory Function 3724 may output the generated descent rate as a limit. In this case, Vertical Command Model 3726 may ignore any inceptor commands from the pilot that correspond to a descend rate slower than the limit. In some embodiments, Vertical Command Model 3726 may accept inceptor commands from the pilot higher than the descent rate limit.

In other embodiments, $V_{rate}$ Trajectory Function 3724 may output the generated descent rate as a bias. For example, Vertical Command Model 3726 may move the inceptor to a position associated with the generated descent rate. In another example, Vertical Command Model 3726 may modify the inceptor commands. For example, Vertical Command Model 3726 may rescale and/or shift the center point of the inceptor such that all possible inceptor commands are within a predetermined range of the generated descent rate.

In other embodiments, Vertical Command Model 3726 may be configured to prevent or limit any pilot implementation or pilot modification for a set amount of time or until the aircraft is in proximity of the ground. For example, Vertical Command Model 3726 may use the generated descent rate to generate an associated command for the control law to follow and block all inceptor commands from the pilot. In other embodiments, the set amount of time may involve the initial part of the descent such that the pilot regains control towards the end of the descent. For example, Vertical Command Model 3726 may restore control to the pilot near the ground so that the pilot may perform a flare maneuver to arrest the descent rate with any remaining energy.

Figure 38:
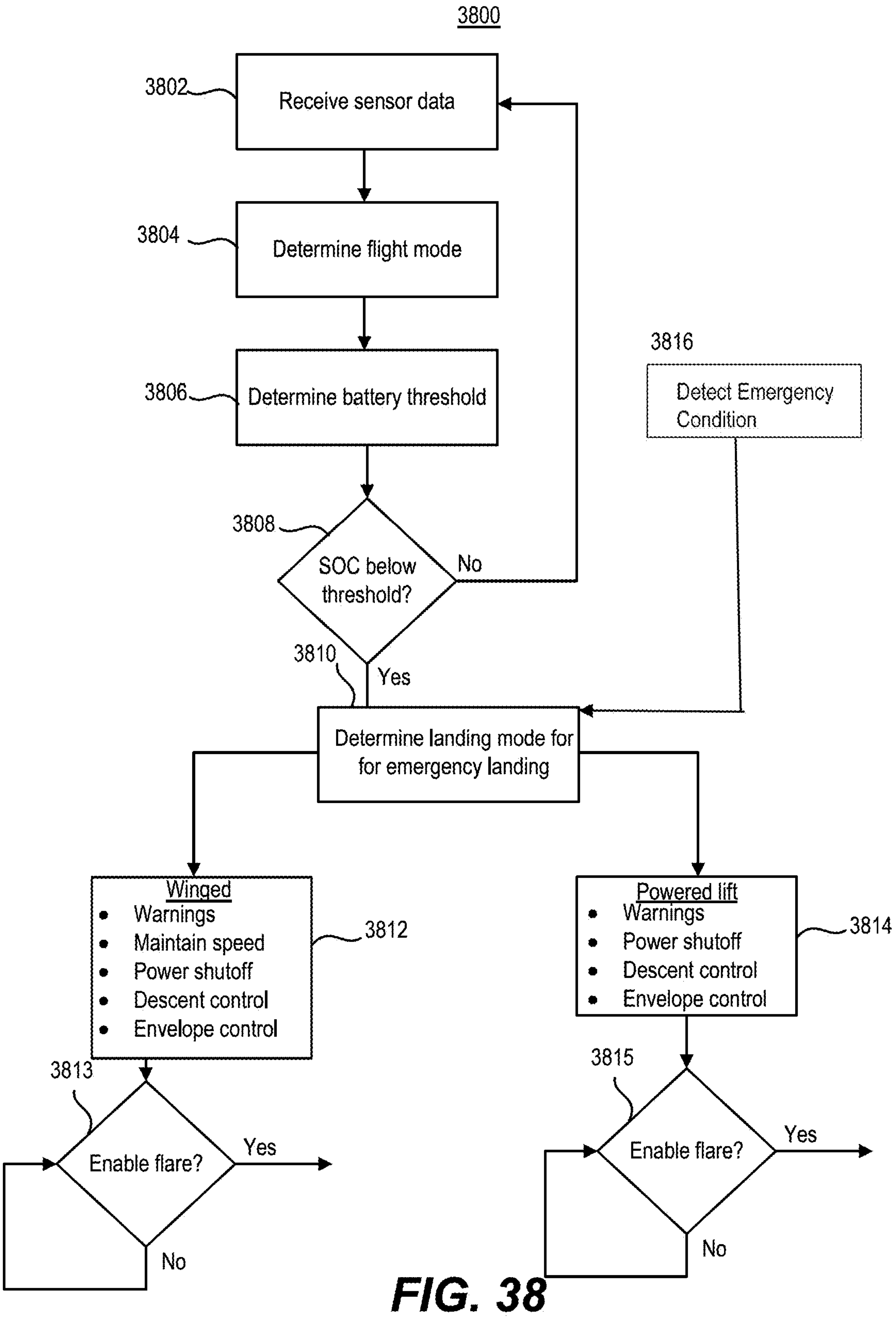
FIG. 38 illustrates a flow diagram of an exemplary method of a controlled emergency landing, consistent with disclosed embodiments.

FIG. 38 illustrates a flow diagram 3800 of an exemplary method of a controlled emergency landing, consistent with disclosed embodiments. Flow diagram 3800 may be implemented as software (e.g., in at least one module, at least one program, at least one application, and/or at least one function, etc.), hardware (e.g., at least one processor, such as an FCC, BMU, controller, etc.), or a combination of both.

In step 3802, method 3800 may involve receiving sensor data. In some embodiments, in addition to or instead of receiving the sensor data, method 3800 may access the sensor data (e.g., from a storage medium), may manipulate the sensor data (e.g., use it for one or more algorithms, calculations, preprocessing operations, etc.), may analyze the sensor data, and/or may store the sensor data. Sensor data may include at least one of an altitude measurement, airspeed measurement, an SOC, a GPS location, flight plan information, an angle of one or more EPUs (e.g., tiltable EPUs), or an angle of one or more propellers. In some embodiments, sensor data may include data estimated, determined, and/or calculated by one or more processors (e.g., BMU, FCC, controller, etc.). For example, sensor data may include an estimated SOT, SOC, SOE, SOP, and/or SOH. Additionally or alternatively, the sensor data may include an airspeed of the aircraft and/or a battery level of the aircraft (e.g., of one or more batteries or battery packs of the aircraft).

In step 3804, method 3800 may involve determining a flight mode. Based on the sensor data received in step 3802, an FCC (e.g., FCS 612) may determine the current mode of operation of the aircraft. For example, the FCC may determine that the aircraft is in thrust-borne mode (e.g., hover mode or a hover flight phase, consistent with disclosed embodiments) because the airspeed is lower and/or the angle of the lifters. For example, the FCC may determine that the aircraft is in wing-borne mode because the airspeed is higher and/or the angle of the lifters.

In step 3806, method 3800 may involve determining a battery level threshold based on the mode. Each mode may require different amounts of power. For example, a conventional landing may require power for control surface actuation, whereas a thrust-borne landing may require additional power for engines. As used throughout, a conventional landing may refer to a landing mode in which at least a predetermined proportion of lift (e.g., at least 50%, at least 75%, at least 90%, etc.) is provided by the wings (e.g., wing-borne landing). In some embodiments, step 3806 may involve determining a battery level threshold for each mode, while in other embodiments the battery level threshold is only determined for the current mode of operation. The battery level threshold may be determined through offline simulations and/or calculations using a range of values for sensor data.

In step 3808, method 3800 may involve determining if the battery SOC is below the threshold. If the battery SOC is not below the threshold, step 3808 may return to step 3802. If the battery SOC is at or below the threshold, step 3808 may proceed to step 3810. In some embodiments, one or more warnings may be provided based on determining the SOC is within a certain proximity of threshold. For example, the FCS 612 may send one or more of an audible and/or a visual warning when the aircraft is within 20%, 15%, 10%, and/or 5% of the threshold level.

In some embodiments, the method may not detect that the battery SOC is below the threshold. Instead, in step 3816, the FCS 612 may detect the presence of another emergency condition that triggers the aircraft to prompt or perform an emergency landing. For example, the FCS 612 may detect battery failure(s), propeller failure(s), electric engine failure(s), fire, bird strike, and/or another emergency of the aircraft. In some embodiments, the FCS 612 may determine that the structural and/or electrical health of the battery packs has dropped below a threshold level which triggers a landing. For example, the FCS 612 may determine and/or receive an indication (e.g., from one or more battery management systems) on the structural and/or electrical health level of one or more battery packs. The structural and/or electrical health of the battery packs may be based on measurements from one or more vibration gauges, strain gauges, temperature sensors, voltage sensors, and/or current sensors located on battery packs, high voltage circuitry, and/or controlled flight elements (e.g., engines, propellers etc.). Further, the structural and/or electrical health level of the battery packs may be determined based on whether the battery packs and/or EPUs are meeting expected performance metrics using predetermined values, look-up tables, and/or models stored by the FCS 612 and/or a battery management system.

In some embodiments, the FCS 612 and/or battery management system(s) may determine that the structural and/or electrical health of the battery packs has dropped below the threshold when a set number of battery packs fail (e.g., perform outside an established range). In some embodiments, the FCS 612 may determine that the structural and/or electrical health of the battery packs has dropped below the threshold when the orientation of EPUs supplied by the failing battery packs causes instability and/or uncontrollability of the aircraft. This determination of whether the failing battery packs cause instability and/or uncontrollability of the aircraft may be based on the number of engines, orientation of engines, type of propeller fed by each engine (e.g. lift, thrust, and/or combination), and/or a mode of flight (thrust-borne flight, transition flight, or wing-borne flight).

In some embodiments, the FCS 612 may detect the presence of an emergency condition based on a failure of the electric engine(s) and/or associated propeller(s) which causes instability and/or uncontrollability of the aircraft. The determination of whether the failing electric engine(s) and/or associated propeller(s) causes instability and/or uncontrollability of the aircraft may be based on the on the number of engines, orientation of engines, type of propeller fed by each engine (e.g. lift, thrust, and/or combination), and/or a mode of flight (thrust-borne flight, transition flight, or wing-borne flight). Examples of emergency conditions with respect to propeller failure and/or electric engine failure will now be made. It should be understood that describing an aircraft using "X-tilt-Y" terminology may refer to the total number of propellers on the aircraft (i.e., X) and the number of tilt propellers that may be configured to provide vertical lift and/or forward thrust depending on its orientation (i.e., Y). Further, a quadrant may refer to one of four corner regions of an aircraft as divided by an axis along the fuselage and an axis along the wings. Therefore, the origin may refer to the point at which the fuselage and wings intersect. As used herein, an aircraft that functions acceptably may refer to an aircraft that may be capable of Continued Safe Flight and Landing (CSFL) (e.g., satisfies one or more constraints, satisfies one or more parameters, does not meet enough, or any, criteria for triggering an emergency landing, etc.). An aircraft that functions marginally may refer to an aircraft that may be in a state of quasi-emergency and an emergency landing may be required (e.g., satisfies some constraints but not others, satisfies one or more parameters but not others, meeting some but not all criteria for triggering an emergency landing, etc.). An aircraft that functions poorly may refer to an aircraft that may be in a state of emergency and requires an emergency landing (e.g., meets at least one or all criteria for triggering an emergency landing, etc.).

Referring back to FIG. 9A, aircraft 900A may be configured to have a 12-tilt-6 configuration with all the propellers aft of the wings configured as lift propellers and all the propellers forward the wings configured as tilt propellers. In a 12-tilt-6 configuration, an aircraft may function as expected when no engines are damaged. Considering thrust-borne flight, the aircraft may function acceptably if: any one EPU is not working or if any two engines in diagonally opposite quadrants are not working (e.g., EPUs 901 and 912, 902 and 911, 904 and 907). Further considering thrust-borne flight, the aircraft may function marginally if: any set of four EPUs occupying different quadrants and symmetrical about the axis along the fuselage are not working (e.g., EPUs 902, 905, 908, and 911; EPUs 901, 906, 907, 912; EPUs 903, 904, 909, 910), if any set of four EPUs occupying different quadrants and are symmetrical about an axis along the wing after reflection across an axis about the fuselage (e.g., EPUs 901, 904, 909, 912; EPUs 903, 906, 907, 910), or if any three EPUs in different quadrants are not working. Further considering thrust-borne flight, the aircraft may function poorly if: two or more EPUs in a single quadrant are not working.

Considering wing-borne flight, the aircraft may function acceptably if: any one engine for a tilt propeller is not working and/or any number of engines for lift propellers are not working. Further considering wing-borne flight, the aircraft may function marginally if: any two engines for tilt propellers are not working and/or any number of engines for lift propellers are not working. Further considering wing-borne flight, the aircraft may function in glide only if: more than two engines for a tilt propeller are not working.

Referring back to FIG. 9B, aircraft 900B may be configured to have an 8-tilt-4 configuration with all the propellers aft of the wings configured as lift propellers and all the propellers forward the wings configured as tilt propellers. In an 8-tilt-4 configuration, an aircraft may function as expected when no EPUs are damaged. Considering thrust-borne flight, the aircraft may function acceptably if: any one EPU is not working or if any two EPUs in diagonally opposite quadrants are not working (e.g., EPUs 913 and 919; EPUs 913 and 920). Further considering thrust-borne flight, the aircraft may function poorly if: two or more EPUs in the same quadrant are not working, if two or more EPUs on the same side of the fuselage are not working, if two or more forward EPUs are not working, if two or more aft EPUs are not working, if any combination of more than two EPUs are not working, or any other combination not listed herein.

Considering wing-borne flight, the aircraft may function acceptably if: any one EPU for a tilt propeller is not working and/or up to four EPUs for lift propellers are not working. Further considering wing-borne flight, the aircraft may function marginally if: any two EPUs for tilt propellers are not working and/or up to four EPUs for lift propellers are not working. Further considering wing-borne flight, the aircraft may function in glide only if: more than two EPUs for a tilt propeller are not working.

Referring back to FIG. 9C, aircraft 900C may be configured to have a 6-tilt-6 configuration. In a 6-tilt-6 configuration, an aircraft may function as expected when no EPUs are damaged. Considering thrust-borne flight, the aircraft may function acceptably if: any one EPU is not working or if any two EPUs opposite each other are not working (e.g., EPUs 921 and 924; EPUs 922 and 926; EPUs 923 and 925). Further considering thrust-borne flight, the aircraft may function at most marginally if: any two non-adjacent EPUs are not working (e.g., EPUs 921 and 923; EPUs 921 and 926). Further considering thrust-borne flight, the aircraft may function poorly if: any two adjacent EPUs are not working (e.g., EPUs 921 and 922; EPUs 921 and 925) or if more than two EPUs are not working.

Considering wing-borne flight, the aircraft may function acceptably if: any one engine is not working or if any two EPUs on opposite sides of the fuselage are not working (e.g., EPUs 921 and 923; EPUs 921 and 924; EPUs 921 and 926). Further considering wing-borne flight, the aircraft may function at least marginally if: any two EPUs on the same side of the fuselage are not working. Further considering wing-borne flight, the aircraft may function in glide only if: more than two EPUs on the same side of the fuselage are not working (e.g., EPUs 921, 922, and 925).

Referring back to FIG. 9D, aircraft 900D may be configured to have a 4-tilt-4 configuration. In a 4-tilt-4 configuration, an aircraft may function as expected when no EPUs are damaged. In some embodiments, each rotor may have cycle control capabilities. Considering thrust-borne flight, the aircraft may function acceptably if: any one EPU is not working or if any two EPUs diagonally opposite each other are not working (e.g., EPUs 927 and 930). Further considering thrust-borne flight, the aircraft may function poorly if: more than EPUs are not working or if any two EPUs on the same side are not working (e.g., EPUs 927 and 928; EPUs 927 and 929).

Considering wing-borne flight, the aircraft may function acceptably if: any one EPU is not working or if any two EPUs on opposite sides of the fuselage are not working (e.g., EPUs 927 and 928; EPUs 927 and 930). Further considering wing-borne flight, the aircraft may function at most marginally if: any two EPUs on the same side of the fuselage are not working (e.g., EPUs 927 and 929). Further considering wing-borne flight, the aircraft may function in glide only if: any other number and/or combination of EPUs are not working and not previously described herein.

It may be understood that the above provided examples are merely exemplary and that for any X-tilt-Y configuration there exists a range of aircraft functionality after a number and/or combination of EPU failures or propeller failures that may trigger a controlled emergency landing, for example through step 3816.

The FCS 612 may monitor the conditions of the batteries, electric engines, and propellers on an ongoing basis to determine whether there an emergency landing needs to be performed. For example, the FCS 612 may initially detect one or more issues with one or more batteries, electric engines, and/or propellers that requires the aircraft to land. The FCS 612 may determine that the aircraft is still capable of controlled flight and landing without assistance. However, upon detecting the present emergency condition has worsened, the FCS 612 may determine that an emergency landing is necessary to better ensure the pilot's survival.

Returning to FIG. 38, in step 3810, method 3800 may involve determining the landing mode for a controlled emergency landing. In some embodiments, a number of factors may influence this determination. For example, the AGL altitude, the airspeed, a landing terrain available to the aircraft (e.g., the surrounding or potential landing ground terrain, infrastructure), availability of a suitable landing site, atmospheric conditions (e.g., windspeed, air pressure), or the battery SOC may make one landing mode safer or more desirable than the other. A suitable landing site may refer to a landing site that provides for a safer landing due to one or more predetermined characteristics. For example, a suitable landing site may include a large, flat area with no infrastructure (e.g., a field, a clearing). In some embodiments, a set of suitable landing sites may be predetermined and may be stored in a memory (e.g., of the FCS).

For example, it may be safer to perform a controlled emergency vertical landing in an infrastructure-rich environment (e.g., urban area). Further, at a lower AGL altitude, a slower airspeed and/or a lower battery SOC, a thrust-borne landing may be safer to the occupants. At a higher AGL altitude, a higher airspeed and/or a sufficient battery SOC, it may be safe to increase forward airspeed and initiate a glide into a wing-borne landing. If a wing-borne landing is determined to be better for a controlled emergency landing, step 3810 may proceed to step 3812. Alternatively or additionally, the FCS 612 may determine the landing mode based on whether there are other detected emergencies. For example, the FCS 612 may control the aircraft into a wing-borne landing if one or more lift propellers are experiencing a failure that causes instability. If wing-borne landing is determined to be better (e.g., safer, increased survival chance for occupants) for a controlled emergency landing, step 3810 may proceed to step 3812. If a thrust-borne landing is determined to be better (e.g., safer, increased survival chance for occupants) for a controlled emergency landing, step 3810 may proceed to step 3814. Additionally or alternatively, in some embodiments, at least one processor may control a descent rate based on a determined flight mode. For example, the FCS 612 may implement a conventional (e.g., wing-borne) landing based on the determined flight mode and control the descent rate accordingly.

In step 3812, method 3800 may involve implementing a wing-borne landing. Implementing a wing-borne landing may involve providing one or more warnings to the pilot, maintaining airspeed, shutting off non-essential systems to conserve power, performing descent rate control, and/or performing envelope control. One or more warnings to the pilot may include audible and/or visual warnings to the pilot indicating that the aircraft will be performing a controlled emergency landing. In some embodiments, the one or more warnings may indicate to the pilot that the emergency landing will be a wing-borne landing. In some embodiments, the FCS 612 may warn the pilot to maintain a certain airspeed for wing-borne flight, while in other embodiments the FCS 612 may automatically control the airspeed of the aircraft to ensure wing-borne flight may be maintained. Further, in some embodiments, a wing-borne landing may further involve diverting to a closer conventional landing site. In some embodiments, the FCS 612 may shut off non-essential systems for wing-borne flight. For example, the FCS 612 may shut off climate control (e.g., A/C), lighting, non-essential display features, propellers, and/or engines. In some embodiments, implementing a conventional (e.g., wing-borne) landing may include controlling the descent rate of the aircraft while permitting a pilot maneuver (e.g., a pilot maneuver using full capabilities of the aircraft or a pilot maneuver using limited, such as through software, capabilities of the aircraft). For example, the FCS 612 may permit the pilot to perform a flare maneuver while controlling (e.g., restricting with a maximum and or minimum) the descent rate.

In some embodiments, implementing a wing-borne landing may involve preventing the pilot from switching to or activating a thrust-borne landing. Further, in some embodiments, as described above, the FCS 612 may control the descent rate and/or the envelope of the aircraft according to the determined landing mode and not the prevented landing mode. For example, the FCS 612 may send commands to control surface actuators(s) to descend the aircraft at a first descent rate different than a descent rate of the prevented landing mode. In some embodiments, the FCS 612 may limit the potential envelope of the aircraft (e.g., roll and/or pitch angles) to reduce the energy consumption of the aircraft.

In step 3813, method 3800 may involve monitoring whether a flare maneuver can be performed based on or more criteria (e.g., based on time to ground or proximity to ground). In some embodiments, step 3813 may involve granting the pilot full control concerning when to perform the flare maneuver (e.g., manual flare). In other embodiments, step 3813 may involve an assisted flare maneuver. For example, there may be a visual and/or auditory warning or cue instructing the pilot when to perform the flare maneuver. In other embodiments, step 3813 may involve an autonomous flare maneuver (e.g, fully assisted flare). For example, the aircraft may perform the flare maneuver without pilot input. When performing the flare maneuver, the FCS 612 may allow and/or control descent rate to be reduced and/or pitch envelope limits to be increased (allowing more pitch). Further, in some embodiments, the method may involve detecting (e.g., with landing detection sensors) that the aircraft has landed and further increasing the pitch envelope limit to cushion the impact of landing.

In step 3814, method 3800 may involve implementing a thrust-borne landing. Implementing a thrust-borne landing may involve providing one or more warnings to the pilot, shutting off particular systems, such as those designated as non-essential (e.g., cabin climate control), activating descent control, and/or activating envelope control. One or more warnings to the pilot may include audible and/or visual warnings to the pilot indicating that the aircraft will be performing a controlled emergency landing. In some embodiments, the one or more warnings may indicate to the pilot that the emergency landing will be a thrust-borne landing. In some embodiments, the FCS 612 may shut off non-essential systems for thrust-borne flight. For example, the FCS 612 may shut off climate control (e.g., A/C), lighting, non-essential display features, and/or control surfaces. Further, in some embodiments, as described above, the FCS 612 may control the descent rate of the aircraft. For example, the FCS 612 may send commands to the electric propulsion system 602 and/or the control surface actuators 622 to descend the aircraft. In some embodiments, the FCS 612 may limit the potential envelope of the aircraft (e.g., roll and/or pitch angles) to reduce the energy consumption of the aircraft.

In step 3815, method 3800 may involve monitoring whether a flare maneuver can be performed based on or more criteria (e.g., based on time to ground or proximity to ground). In some embodiments, step 3815 may involve granting or permitting the pilot full control concerning when to perform the flare maneuver. In other embodiments, step 3815 may involve an assisted flare maneuver. For example, there may be a visual and/or auditory warning or cue instructing the pilot when to perform the flare maneuver. In other embodiments, step 3815 may involve an autonomous flare maneuver. For example, the aircraft may perform the flare maneuver without pilot input. When performing the flare maneuver, the FCS 612 may allow and/or control descent rate to be reduced and/or pitch envelope limits to be increased (allowing more pitch). Further, in some embodiments, the method may involve detecting (e.g., with landing detection sensors) that the aircraft has landed and further increasing the pitch envelope limit to cushion the impact of landing.

Figure 39:
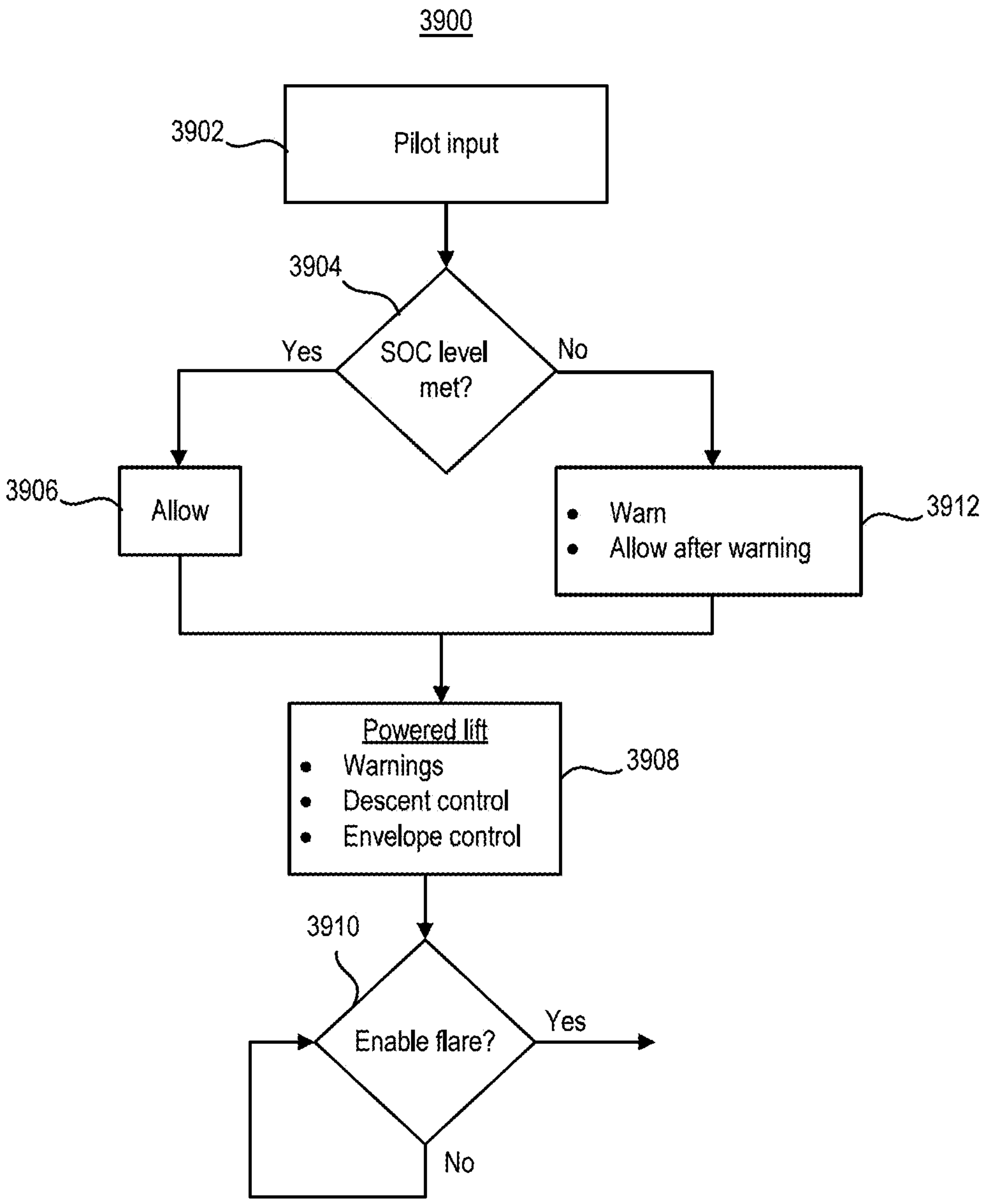
FIG. 39 illustrates a flow diagram of exemplary method of a forced controlled emergency landing, consistent with disclosed embodiments.

FIG. 39 illustrates a flow diagram of an exemplary process 3900 of a forced controlled emergency landing, consistent with disclosed embodiments. Process 3900 may be implemented as software (e.g., in at least one module, at least one program, at least one application, and/or at least one function, etc.), hardware (e.g., at least one processor, such as an FCC, BMU, controller, etc.), or a combination of both.

In step 3902, process 3900 may involve receiving pilot input. Pilot input may include the pilot activating or triggering an emergency landing procedure (e.g., on a button, lever, and/or display of pilot input 626). In some embodiments, the triggered emergency landing procedure is a thrust-borne landing.

In step 3904, process 3900 may involve checking if the battery SOC is at or above a predetermined threshold. The predetermined threshold may be, or may be based on, an amount of energy required to land the aircraft in a thrust-borne manner. As described with respect to FIG. 36A, energy consumption for landing the aircraft in a thrust-borne manner may be greater than that required to land the aircraft in a wing-borne manner. If the SOC is at or above the threshold, process 3900 may proceed to step 3906. If the SOC is below the threshold, process 3900 may proceed to step 3912.

In step 3906, process 3900 may involve initiating the emergency landing procedure while the SOC is above the threshold (e.g., pilot-initiated, due to the presence of an emergency condition), as detailed above with respect to FIG. 38. The FCS 612 may provide one or more warnings to the pilot. In some embodiments, the warnings may involve visual and/or auditory messages informing the pilot whether an emergency landing is possible in a thrust-borne mode. In some embodiments, the warning may indicate that a thrust-borne landing is not possible and the aircraft will be performing the emergency landing in a wing-borne manner. Step 3912 may further involve requesting confirmation from the pilot to override the warning and initiate the emergency landing procedure. In some embodiments, the pilot may not be able to override the prohibition on thrust-borne landing.

In step 3908, process 3900 may involve performing a thrust-borne descent as described above with respect to FIG. 38, step 3814.

In step 3910, process 3900 may involve a flare maneuver as described above with respect to FIG. 38, step 3815. In some embodiments, no pilot input may be received, and the FCS 612 may monitor a battery level to determine whether it is in proximity to a battery level threshold level needed to perform a thrust-borne landing. The FCS 612 may provide one or more warnings to the pilot (e.g., audible and/or visible warnings through pilot output 626) to indicate that the aircraft may soon be unable to support a thrust-borne landing. For example, in some embodiments, the FCS 612 may send warnings at 20%, 15%, 10%, and/or 5% of the energy required to perform a thrust-borne landing.

Figure 40:
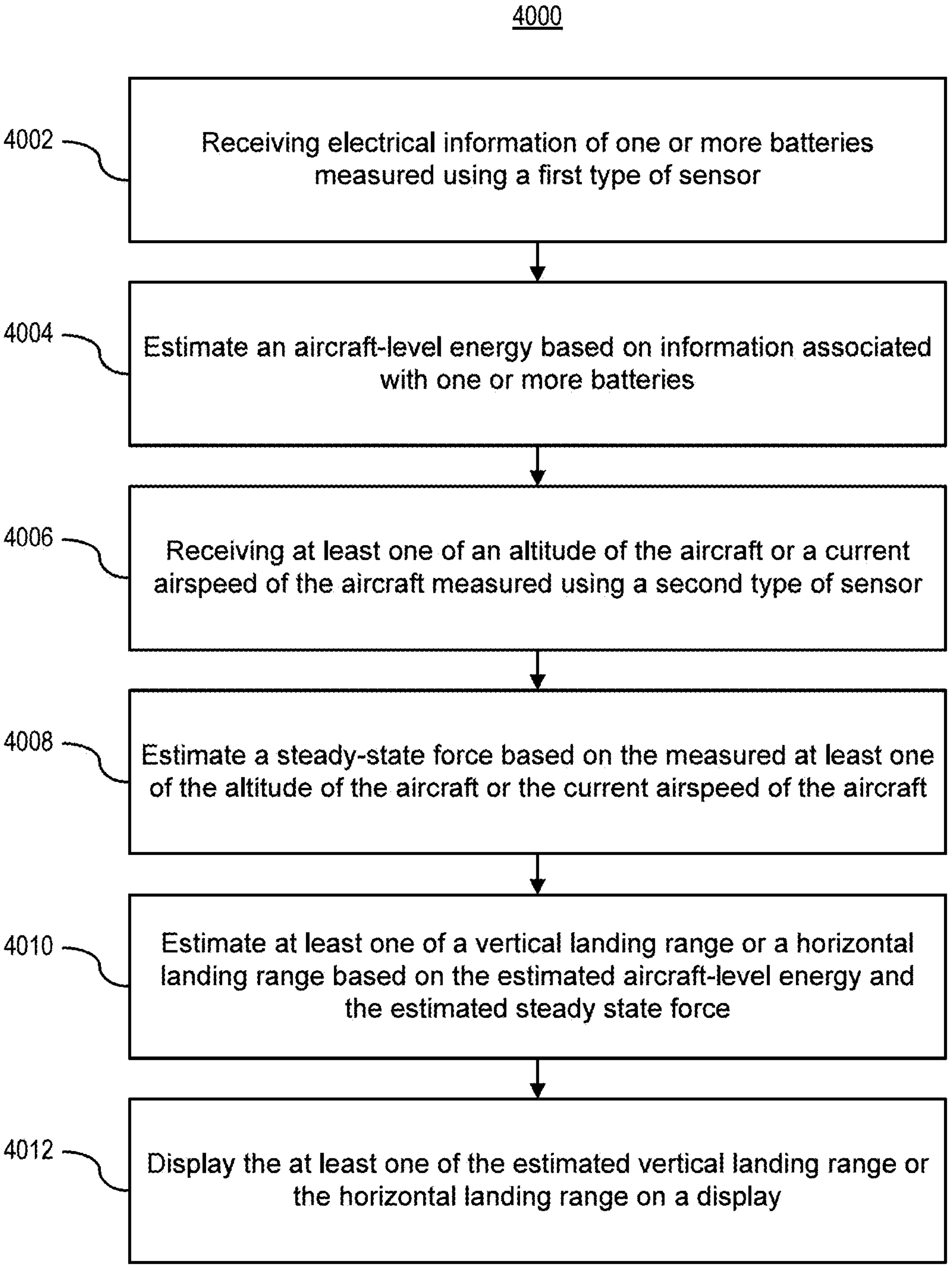
FIG. 40 illustrates a flow diagram of an exemplary method for range estimation, consistent with disclosed embodiments.

FIG. 40 illustrates a flow diagram of an exemplary process 4000 for range estimation, consistent with disclosed embodiments. Process 4000 may be implemented as software (e.g., in at least one module, at least one program, at least one application, and/or at least one function, etc.), hardware (e.g., at least one processor, such as an FCC, BMU, controller, etc.), or a combination of both. In some embodiments, one or more steps of process 4000 may be combined with, for example, one or more steps, functions, operations, etc. described with respect to FIGS. 35A and 35B.

In step 4002, at least one processor (e.g., FCC, BMU) may measure electrical information of one or more batteries using a first type of sensor. For example, the electrical information may include voltage, current, temperature, any combination of the foregoing, or any other measurable electrical parameter. In some embodiments, the electrical information may be associated with a battery pack (e.g., pack-level information). Additionally or alternatively, in some embodiments, the electrical information may be associated with a battery cell or module of cells (e.g., cell-level information). For example, one or more high fidelity sensors may measure and send voltage information associated with a row of cells to a BMU. Some non-limiting examples of the first type of sensor may include a voltage sensor, a current sensor, and a temperature sensor (e.g., thermistor). Other examples of measuring electrical information are discussed above, such as, without limitation, with respect to FIGS. 6, 10, 11, 12, 23, 26, 37A, and 37B.

In step 4004, at least one processor (e.g., FCC, BMU) may estimate an aircraft-level energy based on information associated with one or more batteries. For example, an FCC may perform energy estimation operations similar to those of step 3522, as described and exemplified above with respect to FIG. 35A. In some embodiments, the aircraft-level energy may be based on electrical information of one or more batteries of the aircraft, consistent with disclosed embodiments. In some embodiments, the electrical information may be dynamic. For example, as the aircraft flies, voltages, currents, levels of charge, temperatures, etc., may change, influenced by both aircraft operations as well as flight environments. The electrical information may include, for example, at least one voltage, at least one temperature, at least one amount of charge, at least one historical value, at least one dimension, or any other measurement information of a battery, consistent with disclosed embodiments. For example and without limitation, examples of electrical information are discussed above, such as, without limitation, with respect to FIGS. 6, 10, 11, 12, 23, 26, 37A, and 37B. The electrical information may be measured by at least one first type of sensor, such as a voltage sensor, heat sensor, thermistor, current sensor, or any sensor capable of measuring electrical activity. In some embodiments, the aircraft-level energy estimate may be based on battery-pack level energy estimates. For example, the aircraft-level energy estimate may be combination (e.g., summation, weighted summation, etc.) of one or more energy estimates for one or more (e.g., each, each available) battery packs. In some embodiments, the aircraft-level energy may be estimated based on an estimation of a state of energy of the one or more batteries, consistent with disclosed embodiments. By way of non-limiting example, the aircraft-level energy estimate may be a combination of a battery pack-level SOE estimated by a first processor (e.g., by a Control MCU) and a battery cell row-level SOE estimated by a second processor (e.g., by an Estimation MCU). Each battery cell-row level SOE may be combined (e.g., summation, weighted summation) to determine a high fidelity pack-level SOE. In some embodiments, the high fidelity pack-level SOE may be combined (e.g., summation, weighted summation) with or verified by (e.g., within a predetermined threshold) the battery-pack level SOE estimated by the first processor.

In some embodiments, at least one processor may be configured to adjust an aircraft-level energy estimate based on a failure of a battery pack. A failure of a battery pack may include a thermal runaway, a short condition, or any other event or condition that may negatively affect the expected performance of a battery pack. For example, an FCC may be configured to determine when a battery pack has failed (e.g., partially, totally) and may adjust the aircraft-level energy estimate accordingly (e.g., decrease).

In step 4006, at least one processor (e.g., FCC, BMU) may measure, determine, or estimate at least one of an altitude of the aircraft or a current airspeed of the aircraft using a second type of sensor. For example, the aircraft state information may be measured by at least one second type of sensor, such as a pitot tube, an accelerometer, a gyroscope, a transducer, a GPS unit, a transceiver, or any sensor capable of measuring a physical state of the aircraft or one of its components. A second type of sensor that measures aircraft state information may be different from a first type of sensor that measures electrical information, such as for a battery. Alternatively, in some embodiments, a first type of sensor that measures electrical information may be the same as a second type of sensor that measures aircraft state information.

In some embodiments, the altitude measuring and/or airspeed measuring sensor is a high-fidelity sensor. For example, the altitude measuring and/or airspeed measuring sensor (e.g., inertial measurement unit) may be configured to measure altitude and/or airspeed for a particular part (e.g., wing) of the aircraft. Additionally or alternatively, in some embodiments, the altitude measuring and/or airspeed measuring sensor is a lower fidelity sensor. For example, the altitude measuring and/or airspeed measuring sensor (e.g., inertial measurement unit) may be configured to measure altitude and/or airspeed for a broadly for the entire aircraft. Other examples of measuring aircraft state information are discussed above, such as, without limitation, with respect to FIGS. 6, 10, 11, 12, 23, 26, 37A and 37B, In step 4008, at least one processor (e.g., FCC, BMU) may estimate a steady-state force based on the measured at least one of an altitude of the aircraft or the current airspeed of the aircraft, both of which may be considered to be aircraft state information. Additionally or alternatively, other aircraft state information may be used. For example, an FCC may perform steady-state force estimation operations similar to those of step 3530, as described and exemplified above with respect to FIG. 35A. In some embodiments, the at least one of a measured altitude or a measured airspeed may be based on inertial, vibrational, mechanical, or positional, consistent with disclosed embodiments. In some embodiments, aircraft state information may be dynamic. For example, as the aircraft flies, its speed, altitude, angle of attack, flight configuration, effector positions, etc., may change, influenced by both aircraft operations as well as flight environments.

In step 4010, at least one processor (e.g., FCC, BMU) may estimate at least one of a vertical landing range or a horizontal landing range based on the estimated aircraft-level energy and the estimated steady-state force. For example, an FCC may perform range estimation operations similar to those of step 3536, as described and exemplified above with respect to FIG. 35B. A vertical landing range may refer to an estimated maximum distance or time an aircraft can travel and perform a vertical landing (e.g., thrust-borne landing). A horizontal landing range (also referred to as a conventional landing range) may refer to an estimated maximum distance or time an aircraft can travel and perform a horizontal landing (e.g., wing-borne landing). In some embodiments, the at least one processor may estimate only a vertical landing range. In other embodiments, the at least one processor may estimate only a horizontal landing range.

In some embodiments, before, as part of, or after step 4010, at least one processor may be configured to determine a flight mode of the aircraft. For example, an FCC may be configured to determine the flight mode (e.g., cruise, hover) of the aircraft. In some embodiments, at least one processor may be configured to estimate at least one of the vertical landing range or the horizontal landing range further based on the determined flight mode. For example, an aircraft in cruise, wing-borne flight may have a longer conventional landing range (i.e., requires less energy) compared to an aircraft in hover phase.

In some embodiments, different range estimation functions may be used. For example, a first range estimation process may be used for an aircraft taking off and a second range estimation process may be used for an aircraft in cruise, as described and exemplified above with respect to FIG. 33. In some embodiments, a first range estimation function may be used for a horizontal landing range and a second range estimation function may be used for a vertical landing range. For example, a first range estimation function (e.g., a first algorithm) may be used to determine a conventional landing range of the aircraft and a second, different range estimation function (e.g., a second algorithm) may be used to determine a vertical landing range of the aircraft. The range estimation functions may differ with respect to inputs, constraints, data manipulations, outputs, or the like. For example, the first range estimation function may be configured to calculate a first amount of energy estimated as needed to perform and complete a horizontal landing, and the second range estimation function may be configured to calculate a second amount of energy estimated as needed to perform and complete a vertical landing. In some embodiments, the first range estimation function and/or the second range estimation function may be based on a current, planned, or anticipated phase of flight of the aircraft, consistent with disclosed embodiments.

In step 4012, at least one processor (e.g., FCC, BMU) may display the estimated at least one of the vertical landing range or the horizontal landing range on a display. For example, an FCC may update energy displays similar to step 3524, as described and exemplified above with respect to FIG. 35B. In some embodiments, the at least one processor may be configured to cause a display to display one or more estimated ranges. For example, an FCC may send for display on a display device (e.g., aircraft flight display, avionics display) a digital representation of the estimated vertical landing range and/or horizontal landing range to an initial destination. Further, the FCC may send for display on the display device a digital representation of the alternate destination range to an alternate destination different than the initial destination.

Figure 41:
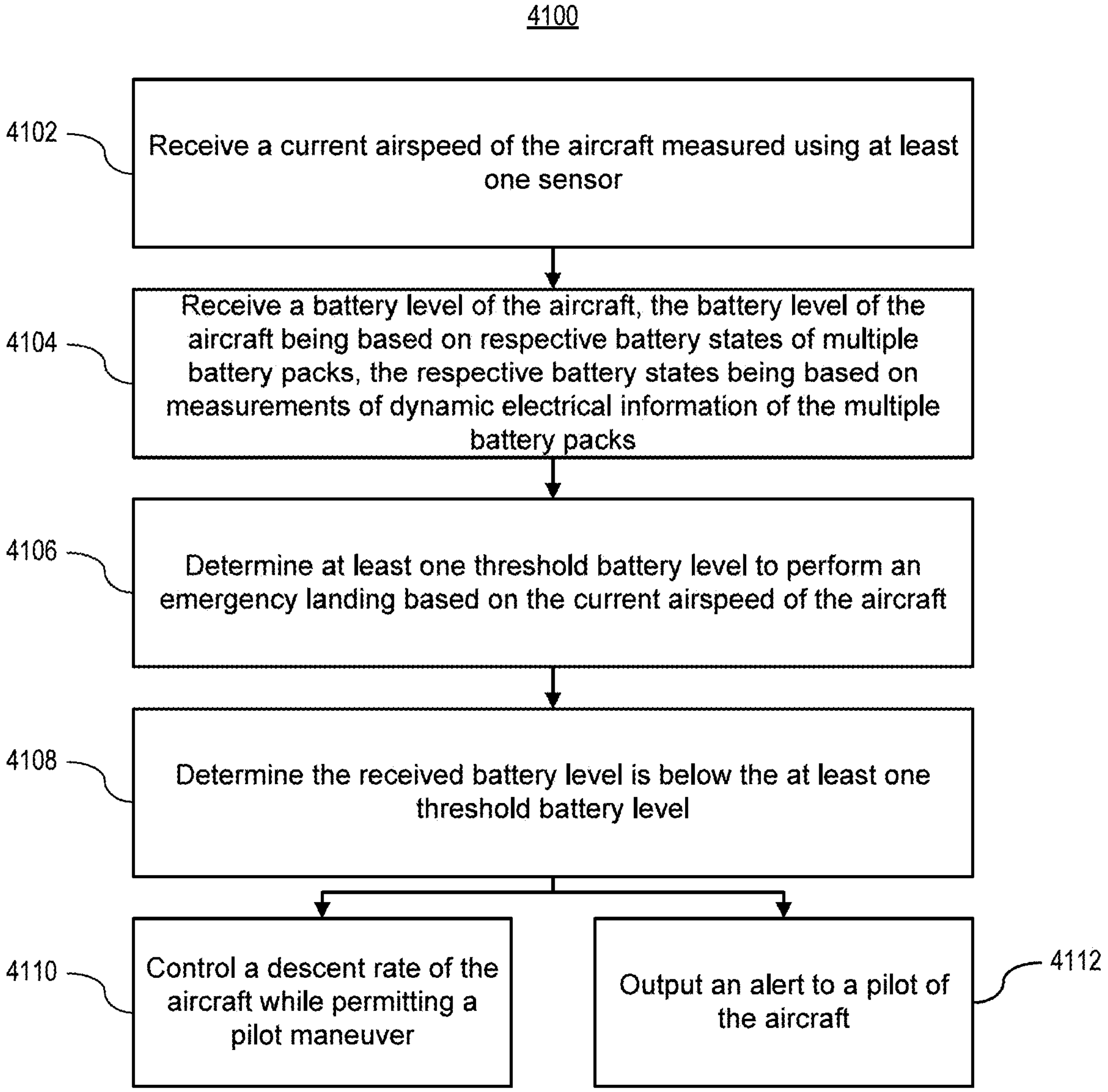
FIG. 41 illustrates a flow diagram of an exemplary method for a controlled emergency landing, consistent with disclosed embodiments.

FIG. 41 illustrates a flow diagram of an exemplary process for a controlled emergency landing, consistent with disclosed embodiments. Process 4100 may be implemented as software (e.g., in at least one module, at least one program, at least one application, and/or at least one function, etc.), hardware (e.g., at least one processor, such as an FCC, BMU, controller, etc.), or a combination of both. In some embodiments, one or more steps of process 4100 may be combined with, for example, one or more steps, functions, operations, etc. described with respect to FIGS. 38 and 39.

In step 4102, at least one processor (e.g., FCC) may receive a current airspeed of the aircraft measured using at least one sensor. For example, an FCC may receive, from at least one sensor (e.g., pitot tube, IMU, accelerometer), the current airspeed of the aircraft. Receiving the airspeed of the aircraft may include at least one of estimating the current airspeed of the aircraft, calculating the current airspeed of the aircraft, or determining the current airspeed of the aircraft, consistent with disclosed embodiments.

In step 4104, at least one processor (e.g., FCC) may receive a battery level of the aircraft, the battery level of the aircraft being based on respective battery states of multiple battery packs, the respective battery states being based on measurements of dynamic electrical information of the multiple battery packs. For example, the battery level may include an SOC, SOE, or SOP associated with one or more battery packs of the aircraft. By way of further example, a battery level of the aircraft may include an aggregation of respective battery states of multiple battery packs and/or may represent an amount of energy available to the aircraft for at least a subset of possible aircraft operations. The battery states may include a SOT, SOC, SOE, SOP, and/or SOH, each of which are based on one or more dynamic electrical information. For example, SOE estimation is based on a number of electrical information that changes with respect to time, including voltage measurements, current measurements, an estimated SOC, impedance measurements, and battery capacity estimations, as described and exemplified above with respect to FIGS. 21 and 22A-22C.

In some embodiments, receiving the battery level of the aircraft may include estimating the battery level, calculating the battery level, or determining the battery level. In some embodiments, the respective battery states of multiple battery packs may be based on measurements of dynamic electrical information of the multiple battery packs. For example, SOE estimation is based on a number of electrical information that changes with respect to time, including voltage measurements, current measurements, an estimated SOC, impedance measurements, and battery capacity estimations, as described and exemplified above with respect to FIGS. 21 and 22A-22C. Alternatively, in some embodiments, one battery state of one battery pack may be used.

In step 4106, at least one processor (e.g., FCC) may determine at least one threshold battery level to perform an emergency landing based on the current airspeed of the aircraft. For example, an FCC may threshold determination operations similar to step 3806, as described and exemplified above with respect to FIG. 38. In some embodiments, a first battery level threshold may be associated with a first landing mode and a second battery level threshold may be associated with a second landing mode. For example, a first battery level threshold may be determined for a conventional landing mode and a second battery level threshold may be determined for a thrust-borne landing mode.

In step 4108, at least one processor (e.g., FCC) may determine if the received battery level is below the at least one threshold battery level. For example, an FCC may compare the received battery level (e.g., SOC, SOC, SOP) against the at least one battery level threshold to determine if it is below any battery level threshold. If the received battery level is above one or more battery level thresholds (e.g., each), step 4108 may return to step 4102 or 4104.

In step 4110, at least one processor (e.g., FCC) may, based on determining the received battery level is below the at least one threshold battery level, control a descent rate of the aircraft while permitting a pilot maneuver. For example, an FCC may automatically adjust one or more aircraft parameters (e.g., airspeed, engine thrust, aircraft orientation or angle) to control the descent rate of the aircraft in a controlled manner. In some embodiments, the at least one processor may permit a pilot maneuver. For example, an FCC may, while controlling the descent rate, permit the pilot to perform one or more emergency maneuvers (e.g., flare maneuver). In some embodiments, the pilot maneuver may be at least partially assisted or manual. For example, the FCC may assist the pilot (e.g., partially, fully autonomously) in performing the flare maneuver or may not assist the pilot (e.g., manual) in performing the flare maneuver. In some embodiments, the at least one processor may adjust a level of assistance to the pilot for the pilot maneuver based on a pilot input. For example, a pilot may provide an input to the FCC indicating a level of assistance the FCC should provide during the flare maneuver.

In some embodiments, as part of or before step 4110, at least one processor may be configured to determine a landing mode. For example, a landing mode In step 4112, at least one processor (e.g., FCC) may, based on determining the received battery level is below the at least one threshold battery level, output an alert to a pilot of the aircraft. For example, an FCC may output an alert (e.g., visual, auditory, and/or haptic) to the pilot informing the pilot that a controlled emergency landing has been initiated, is being initiated, or will be initiated shortly (e.g., within 30 seconds, 1 minute, etc.). In some embodiments, the alert may be part of an assisted pilot maneuver. For example, the alert may instruct the pilot when to perform the flare maneuver (i.e., partially assisted). In general, it may be understood that steps 4110 and 4112 may be performed in any order, including simultaneously, with respect to each other, and after step 4108.

In some embodiments, outputting the alert may include sending the alert to a ground system. A ground system may include an airport, flight control center, an emergency response station (e.g., police, fire, emergency medical), or any other ground system related to the aircraft and/or controlled emergency landings.

Figure 42:
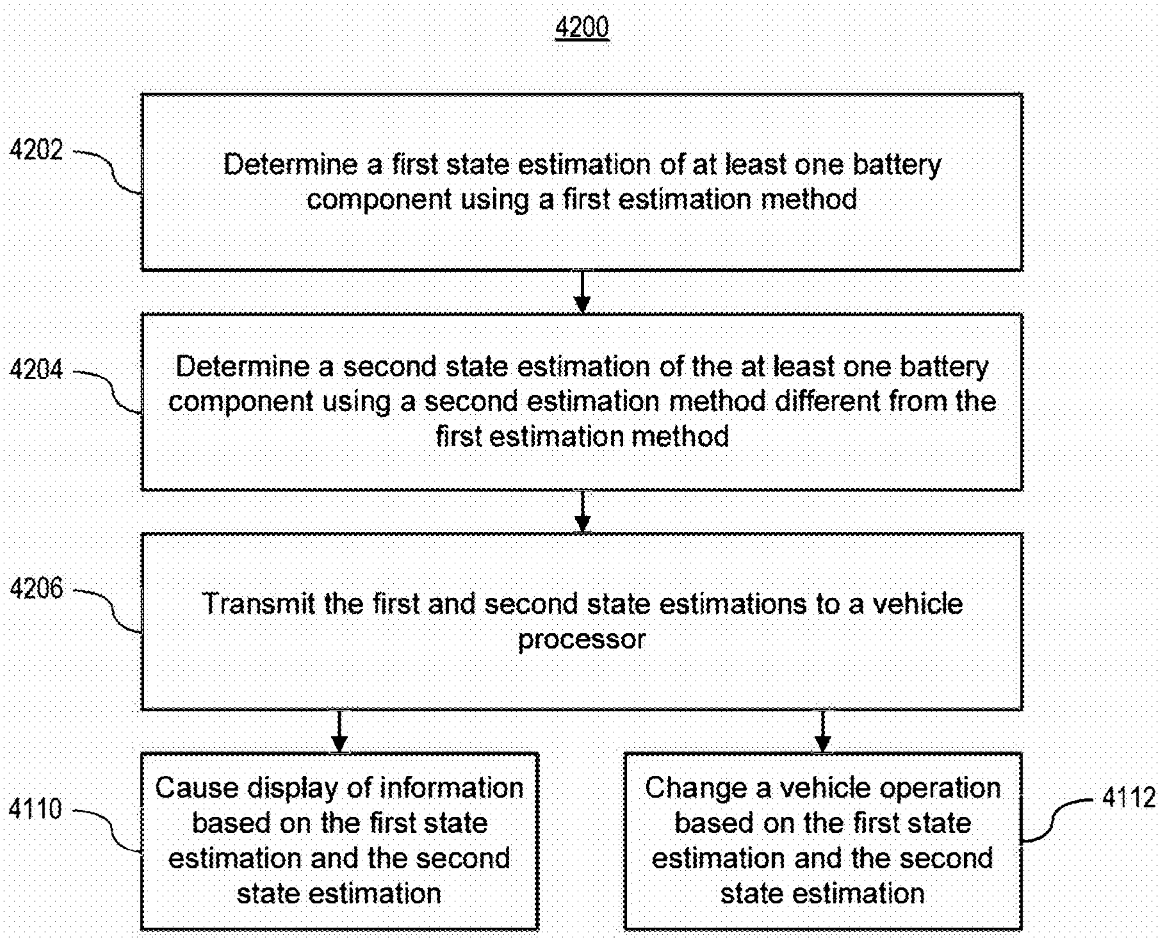
FIG. 42 a flow diagram of an exemplary method for battery state estimation, consistent with disclosed embodiments.

FIG. 42 a flow diagram of an exemplary method for battery state estimation, consistent with disclosed embodiments. Process 4200 may be implemented as software (e.g., in at least one module, at least one program, at least one application, and/or at least one function, etc.), hardware (e.g., at least one processor, such as an FCC, BMU, controller, etc.), or a combination of both. In some embodiments, each step of process 4200 may be performed by one or more processors. Additionally or alternatively, in some embodiments, different steps of process 4200 may be performed by different processors. In some embodiments, one or more steps of process 4200 may be combined with, for example, one or more steps, functions, operations, etc. described with respect to FIGS. 17-30.

In step 4202, at least one processor (e.g., FCC, BMU, controller) may determine a first state estimation of at least one battery component using a first estimation method. For example, a first processor (e.g., Control MCU) may perform a first battery state estimation using a first estimation method. In some embodiments, the first estimation method may include at least one battery pack-level estimate. A battery state estimation may refer to a variable associated with the state of the battery or other representation of a battery state or capability, and may include a battery state of temperatures (SOT), a battery state of charge (SOC), a battery state of energy (SOE), a battery state of power (SOP), and/or a battery state of health (SOH). In some embodiments, a battery state estimation may be based on measurements of dynamic electrical information of the at least one battery component, such as at least one battery pack and/or multiple battery cells of at least one battery pack. For example, SOE estimation is based on a number of electrical information that changes with respect to time, including voltage measurements, current measurements, an estimated SOC, impedance measurements, and battery capacity estimations, as described and exemplified above with respect to FIGS. 21 and 22A-22C.

In step 4204, at least one processor (e.g., FCC, BMU, controller) may determine second state estimation of the at least one battery component using a second estimation method different from the first estimation method. For example, a second processor (e.g., Estimation MCU) may perform a second battery state estimation (e.g., SOT, SOC, SOE, SOP, and/or SOH) using a second estimation method. In some embodiments, the second estimation method may include a battery cell-level estimate. In some embodiments, the first estimation method and the second estimation method may be the same estimation method. For example, when the first estimation method and the second estimation method are the same estimation method, a level of redundancy and safety is implemented that may be different that the redundancy and safety implemented by the use of two differing estimation methods.

In step 4206, at least one processor (e.g., FCC, BMU, controller) may transmit (e.g., send) the first and second state estimations to a vehicle processor. For example, a BMU may send the first and second state estimations to an FCC.

In step 4208, at least one processor (e.g., FCC, BMU, controller) may cause display of information based on the first state estimation and the second state estimation. For example, an FCC may cause a display to display information (e.g., as a graph, as a table of numbers, etc.) that may inform a pilot of the battery state estimation. In some embodiments, the at least one processor may send for display both the first and second state estimations. Additionally or alternatively, in some embodiments, the at least one processor may send for display a single state estimation. For example, the FCC may send the first state estimation, the second state estimation, or a third state estimation that is a combination (e.g., summation, weighted summation, etc.) of the first and second state estimations. In some embodiments, the at least one processor may cause display of the information while simultaneously performing other operations (e.g., steps 4202, 4204, and/or 4206), such as performing estimations of energy, a flight state, and/or flight conditions, as discussed above.

In step 4210, at least one processor (e.g., FCC, BMU, controller) may change a vehicle operation based on the first state estimation and the second state estimation. For example, an FCC may modify one or more elements of system 1000 (e.g., control allocation 1029, vehicle dynamics 1030) based on the first and second battery state estimations. Changing a vehicle operation may refer to modifying, adjusting, or affecting a change in at least one of a control law, flight mode, aircraft orientation, airspeed, or any other aspect of operation. For example, changing a vehicle operation may include transitioning the aircraft from one flight mode to another. As another non-exclusive example, changing a vehicle operation may include decreasing at least one of a speed or altitude of the aircraft. As yet another non-exclusive example, changing a vehicle operation may include decreasing power to one or more aircraft components, such as those not necessary for flying the aircraft (e.g., cabin lighting, HVAC components). By way of non-limiting example, if the first and/or second battery state estimation indicates a lower (e.g., than expected, estimated) SOE, the FCC may turn off systems designated as non-essential (e.g., interior lights) to conserve power. As another non-limiting example, if the first and/or second battery state estimation indicates a higher (e.g., than expected) SOT for a battery (e.g., battery cell, battery cell row, battery cell pack), the FCC may remove the battery pack from the high voltage circuitry (e.g., by blowing one or more pyro fuse, opening one or more contactors, commanding a BMU/BMS to turn off the battery pack). In some embodiments, the at least one processor may change a vehicle operation based on the first state estimation, the second state estimation, a third state estimation that is a combination (e.g., summation, weighted summation, etc.) of the first and second state estimations, or any combination thereof. For example, the FCC may be configured to determine an overall SOE for a battery pack by combining a cell-level SOE and a pack-level SOE. Then if the overall SOE indicates a lower (e.g., than expected, estimated) SOE, the FCC may turn off systems designated as non-essential to conserve power.

Additional aspects of the present disclosure may be further described via the following clauses:

1. A computer-implemented method for estimating an available range of an aircraft in flight, the method comprising:
   - receiving, using the at least one hardware processor, electrical information of one or more batteries measured using a first sensor;
   - estimating, using the at least one hardware processor, an aircraft-level energy based on electrical information of the one or more batteries;
   - receiving, using the at least one hardware processor, one or more of an altitude of the aircraft or a current airspeed of the aircraft measured using a second sensor;
   - estimating, using the at least one hardware processor, a steady-state force based on the one or more of the altitude of the aircraft or the current airspeed of the aircraft;
   - estimating, using the at least one hardware processor, one or more of a vertical landing range or a horizontal landing range based on the one or more of the estimated aircraft-level energy or the estimated steady-state force; and
   - displaying, using the at least one hardware processor, the one or more of the estimated vertical landing range or the estimated horizontal landing range on a display.
2. The computer-implemented method of clause 1, wherein the aircraft-level energy is estimated based on an estimation of a state of energy of the one or more batteries.
3. The computer-implemented method of clause 1 or 2, further comprising:
   - determining, using the at least one hardware processor, a flight mode of the aircraft,
   - wherein estimating the one or more of the vertical landing range or the horizontal landing range is also based on the determined flight mode.
4. The computer-implemented method of any one of clauses 1-3, wherein the electrical information includes one or more of a state of health of the one or more batteries, a state of charge of the one or more batteries, a state of energy of the one or more batteries, or a state of power of the one or more batteries.
5. The computer-implemented method of any one of clauses 1-4, wherein:
   - the vertical landing range is estimated using a first algorithm configured to estimate a first amount of energy needed to perform and complete a conventional landing, and
   - the horizontal landing range is estimated using a second algorithm configured to estimate a second amount of energy needed to perform and complete a vertical landing.
6. The computer-implemented method of any one of clauses 1-5, further comprising:
   - comparing, using the at least one hardware processor, the one or more of the estimated vertical landing range or the estimated horizontal landing range to a range remaining to an initial destination to obtain a range comparison result; and
   - using, using the at least one hardware processor, the range comparison result to determine range information to render on the display.
7. The computer-implemented method of any one of clauses 1-6, further comprising:
   - determining, using the at least one hardware processor, an alternate destination within a remaining range of the aircraft, the alternate destination being different than an initial destination.
8. The computer-implemented method of any one of clauses 1-7, further comprising:
   - estimating, using the at least one hardware processor, a completion fraction of an outbound maneuver based on the estimated aircraft-level energy;
   - predicting, using the at least one hardware processor, altitude-based cruise performance based at least in part on an aeromodel; and
   - blending, using the at least one hardware processor, an updated steady-state force based on one or more of the estimated completion fraction, the estimated steady-state force, or the predicted altitude-based cruise performance.
9. The computer-implemented method of any one of clauses 1-8, further comprising:
   - determining, using the at least one hardware processor, wing-borne energy based on the estimated aircraft-level energy,
   - wherein estimating the one or more of the vertical landing range or the horizontal landing range is also based on the determined wing-borne energy.
10. The computer-implemented method of any one of clauses 1-9, wherein:

the first sensor comprises at least one of a voltage sensor, a current sensor, or a temperature sensor, and the second sensor comprises at least one of a pitot tube, an accelerometer, a gyroscope, a transducer, a GPS unit, or a transceiver.

11. A computer-readable medium storing instructions that, when executed by at least one processor, cause the at least one processor to perform the method of any one of clauses 1-10.

12. A system, comprising:

at least one processor; and at least one computer-readable medium containing instructions that, when executed by the at least one processor, cause the system to perform the method of any one of clauses 1-10.

13. An aircraft, comprising:

at least one processor; and at least one computer-readable medium containing instructions that, when executed by the at least one processor, cause the at least one processor to perform the method of any one of clauses 1-10.

14. A computer-implemented method for controlled emergency landing of an aircraft comprising:

receiving, using at least one hardware processor, a current airspeed of the aircraft measured using at least one sensor;

receiving, using the at least one hardware processor, a battery level of the aircraft, the battery level of the aircraft being based on respective battery states of multiple battery packs, the respective battery states being based on measurements of dynamic electrical information of the multiple battery packs;

determining, using the at least one hardware processor, at least one threshold battery level to perform an emergency landing based on the current airspeed of the aircraft;

determining, using the at least one hardware processor, if the received battery level is below the at least one threshold battery level; and based on determining the received battery level is below the at least one threshold battery level, performing, using the at least one hardware processor, one or more of:

controlling a descent rate of the aircraft while permitting a pilot maneuver; or outputting an alert.

15. The computer-implemented method of clause 14, further comprising:

determining, using the at least one hardware processor, a flight mode of the aircraft, wherein determining the at least one threshold battery level is further based on the determined flight mode.

16. The computer-implemented method of clause 14 or 15, further comprising:

determining, using the at least one hardware processor, a landing mode for the aircraft based on one or more of an altitude of the aircraft, the current airspeed of the aircraft, landing terrain available to the aircraft, availability of a suitable landing site, an atmospheric condition, or the received battery level of the aircraft; and controlling, using the at least one hardware processor, the descent rate based on the determined landing mode.

17. The computer-implemented method of clause 16, wherein:

determining the landing mode includes preventing execution of at least one different landing mode, and the at least one different landing mode is associated with a different descent rate than the determined landing mode.

18. The computer-implemented method of any one of clauses 14-17, wherein the pilot maneuver is a flare.

19. The computer-implemented method of clause 18, wherein execution of the flare is at least partially assisted or manual.

20. The computer-implemented method of any one of clauses 14-19, further comprising determining, using the at least one hardware processor, presence of an emergency condition; and in response to the emergency condition, performing, using the at least one hardware processor, one or more of:

outputting an alert to the pilot of the aircraft; or automatically controlling the descent rate of the aircraft.

21. The computer-implemented method of clause 20, wherein the emergency condition includes one or more of: at least one battery failure, at least one propeller failure, at least one electric propulsion unit (EPU) failure, a fire, or a bird strike.

22. A computer-readable medium storing instructions that, when executed by at least one processor, cause the at least one processor to perform the method of any one of clauses 14-21.

23. A system, comprising:

at least one processor; and at least one computer-readable medium containing instructions that, when executed by the at least one processor, cause the system to perform the method of any one of clauses 14-21.

14. An aircraft, comprising:

at least one processor; and at least one computer-readable medium containing instructions that, when executed by the at least one processor, cause the at least one processor to perform the method of any one of clauses 14-21.

25. A computer-implemented method for estimating a battery state for a vehicle, the method comprising:

determining, using at least one hardware processor, a first state estimation of at least one battery component using a first estimation method, wherein first state estimation is based on measurements of dynamic electrical information of at least one battery component;

determining, using the at least one hardware processor, a second state estimation of the at least one battery component using a second estimation method different from the first estimation method; and transmitting, using the at least one hardware processor, the first and second state estimations to a vehicle processor of the vehicle, wherein the vehicle processor is configured to perform one or more of:

causing display of information based on the first state estimation and the second state estimation; or changing, based on the first state estimation and the second state estimation, a vehicle operation.

26. The computer-implemented method of clause 25, wherein the first state estimation and the second state estimation each include a state of temperature estimation of one or more of at least one battery cell or at least one battery pack.

27. The computer-implemented method of clause 26, wherein the state of temperature estimation is based on measurements from multiple thermistors located on the at least one battery component.
28. The computer-implemented method of clause 26, wherein the state of temperature estimation is based on one or more of: one or more temperatures measured by one or more sensors at the at least one battery component or one or more virtual temperatures of the at least one battery component.
29. The computer-implemented method of any one of clauses 25-28, wherein the first state estimation and the second state estimation each include a state of charge estimation of one or more of at least one battery cell or at least one battery pack.
30. The computer-implemented method of clause 29, wherein the state of charge estimation is based on one or more of:
    an estimated temperature of one or more of at least one battery cell or at least one battery pack; or
    a measured temperature of one or more of the at least one battery cell or at the least one battery pack.
31. The computer-implemented method of clause 30, wherein the estimated temperature is based at least in part on a coulomb counting model.
32. The computer-implemented method of any one of clauses 29-31, wherein the state of charge estimation is based on an output of an online model, the online model being configured to receive input of one or more of a cell current, a cell voltage, a cell temperature, or an ambient temperature.
33. The computer-implemented method of clause 32, wherein the online model is calibrated based on an offline calibration process of the model.
34. The computer-implemented method of any one of clauses 25-33, wherein the first state estimation and the second state estimation each include a state of energy estimation of one or more of at least one battery cell or at least one battery pack.
35. The computer-implemented method of clause 34, wherein the state of energy estimation is based on a flight mode.
36. The computer-implemented method of clause 34 or 35, wherein the state of energy estimation is determined using backward forecasting.
37. The computer-implemented method of any one of clauses 34-36, wherein the state of energy estimation is determined at least in part by calculating, using the at least one hardware processor, an effect of a soft short condition experienced by aircraft circuitry.
38. The computer-implemented method of clause 37, wherein the soft short condition is at least a partial short of an electrical component internal to a battery pack.
39. The computer-implemented method of clause 37 or 38, wherein the soft short condition is at least a partial short of an electrical component external to a battery pack.
40. The computer-implemented method of any one of clauses 25-39, wherein the first state estimation and the state second estimation each include a state of power estimation of one or more of at least one battery cell or at least one battery pack.
41. The computer-implemented method of clause 40, wherein the state of power estimation defines a limit to prevent the battery component from violating an operating range.
42. The computer-implemented method of clause 41, wherein the operating range includes one or more of: a cell voltage range, a cell temperature range, a maximum current carry limit, or a voltage range of a connected load.
43. The computer-implemented method of any one of clauses 25-42, wherein the first state estimation and the second state estimation each include a state of health estimation of one or more of at least one battery cell or at least one battery pack.
44. The computer-implemented method of clause 43,
    wherein the state of health estimation is determined by calculating, using the at least one hardware processor, one or more of a capacity fade or an impedance growth of the battery component, and
    the method further comprises:
        determining, using the at least one hardware processor, that the capacity fade and the impedance growth of the battery component surpasses a predetermined threshold; and
        based on determining that the capacity fade and the impedance growth of the battery component surpasses a predetermined threshold, outputting, using the at least one hardware processor, an alert.
45. The computer-implemented method of any one of clauses 25-44, wherein the vehicle is an aircraft, optionally a vertical take-off and landing aircraft.
46. The computer-implemented method of any one of clauses 25-45, wherein the first state estimation includes a battery pack-level state estimation and the second state estimation includes a battery cell-level state estimation.
47. The computer-implemented method of any one of clauses 25-46, wherein the first state estimation is based on measurements from a first set of sensors and the second state estimation is based on measurements from a second set of sensors different from the first set of sensors.
48. The computer-implemented method of any one of clauses 25-47, wherein changing a vehicle operation includes at least one of:
    modifying a control law;
    switching a flight mode;
    changing an aircraft orientation; or
    changing an airspeed.
49. A computer-readable medium storing instructions that, when executed by at least one processor, cause the at least one processor to perform the method of any one of clauses 25-48.
50. A battery management unit (BMU) for an electric vehicle, comprising:
    at least one processor; and
    at least one computer-readable medium containing instructions that, when executed by the at least one processor, cause the at least one processor to perform the method of any one of clauses 25-48.
51. A battery pack for an electric vehicle, comprising:
    at least one battery cell;
    at least one processor; and
    at least one computer-readable medium storing instructions that, when executed by at least one processor, cause the at least one processor to perform the method of any one of clauses 25-48.
52. An aircraft, comprising:
    a battery pack including at least one battery cell;
    at least one processor; and at least one computer-readable medium containing instructions that, when executed by the at least one processor, cause the at least one processor to perform the method of any one of clauses 25-48.

The foregoing description has been presented for purposes of illustration. It is not exhaustive and does not limit the invention to the precise forms or embodiments disclosed. Modifications and adaptations of the invention will be apparent to those skilled in the art from consideration of the specification and practice of the disclosed embodiments of the inventions disclosed herein.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Also, words such as "be" or "is" or "are" may refer to "include" or "includes" unless specifically directed otherwise. As used herein, unless specifically stated otherwise, being "based on" may include being dependent on, being interdependent with, being derived from (e.g., using), being associated with, being defined at least in part by, being influenced by, occurring upon, occurring after, and/or being responsive to. As used herein, "related to" may include being inclusive of, being expressed by, being indicated by, or being based on. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

Other embodiments will be apparent to those skilled in the art from consideration of the specification and practice of the implementations disclosed herein. It is intended that the architectures and circuit arrangements shown in figures are only for illustrative purposes and are not intended to be limited to the specific arrangements and circuit arrangements as described and shown in the figures. It is also intended that the specification and examples be considered as exemplary only, with the true scope and spirit of the invention being indicated by the following claims. The foregoing description has been presented for purposes of illustration. It is not exhaustive and does not limit the invention to the precise forms or embodiments disclosed. Modifications and adaptations of the invention will be apparent to those skilled in the art from consideration of the specification and practice of the disclosed embodiments of the inventions disclosed herein. It is also intended that the sequence of steps shown in figures is only for illustrative purposes and is not intended to be limited to any particular sequence of steps. Moreover, steps may be combined from multiple different figures into a single embodiment. As such, those skilled in the art can appreciate that these steps can be performed in a different order while implementing the same method.

What is claimed is:

1. A computer-implemented method for estimating a battery state for a vehicle, the method comprising:

determining a first battery state estimation of at least one battery component using a first estimation method, wherein the first battery state estimation is based on measurements of dynamic electrical information of at least one battery component, wherein the first battery state estimation includes a battery pack-level state estimation;

determining a second battery state estimation of the at least one battery component using a second estimation method different from the first estimation method, wherein the second battery state estimation includes a battery cell-level estimation; and transmitting the first battery state estimation and the second battery state estimation to a vehicle processor of the vehicle, wherein the vehicle processor is configured to perform:

causing display of information based on the first battery state estimation and the second battery state estimation; and changing a vehicle operation based on the first battery state estimation and the second battery state estimation, wherein the first battery state estimation and the second battery state estimation each include one of: a state of temperature estimation, a state of charge estimation, a state of energy estimation, a state of power estimation, or a state of health estimation.

2. The computer-implemented method of claim 1, wherein the first battery state estimation and the second battery state estimation each include the state of temperature estimation.

3. The computer-implemented method of claim 2, wherein the state of temperature estimation is based on measurements from multiple thermistors located on the at least one battery component.

4. The computer-implemented method of claim 2, wherein the state of temperature estimation is based on one or more temperatures measured by one or more sensors at the at least one battery component and one or more virtual temperatures of the at least one battery component.

5. The computer-implemented method of claim 1, wherein the first battery state estimation and the second battery state estimation each include the state of charge estimation.

6. The computer-implemented method of claim 5, wherein the state of charge estimation is based on an estimated temperature of one or more of at least one battery cell and at least one battery pack and a measured temperature of one or more of the at least one battery cell and the at least one battery pack.

7. The computer-implemented method of claim 6, wherein the estimated temperature is based at least in part on a coulomb counting model.

8. The computer-implemented method of claim 5, wherein the state of charge estimation is based on an output of an online model, the online model being configured to receive input of at least one of: a cell current, a cell voltage, a cell temperature, or an ambient temperature.

9. The computer-implemented method of claim 8, wherein the online model is calibrated based on an offline calibration process of the model.

10. The computer-implemented method of claim 1, wherein the first battery state estimation and the second battery state estimation each include the state of energy estimation.

11. The computer-implemented method of claim 10, wherein the state of energy estimation is based on a flight mode.

12. The computer-implemented method of claim 10, wherein the state of energy estimation is determined using backward forecasting.

13. The computer-implemented method of claim 10, wherein the state of energy estimation is determined at least in part by calculating an effect of a soft short condition experienced by aircraft circuitry.

14. The computer-implemented method of claim 13, wherein the soft short condition includes at least a partial short of an electrical component internal to a battery pack.

15. The computer-implemented method of claim 13, wherein the soft short condition includes at least a partial short of an electrical component external to a battery pack.

16. The computer-implemented method of claim 1, wherein the first battery state estimation and the state battery second estimation each include the state of power estimation.

17. The computer-implemented method of claim 16, wherein the state of power estimation defines a limit to prevent the battery component from violating an operating range.

18. The computer-implemented method of claim 17, wherein the operating range includes at least one of; a cell voltage range, a cell temperature range, a maximum current carry limit, or a voltage range of a connected load.

19. The computer-implemented method of claim 1, wherein the first battery state estimation and the second battery state estimation each include the state of health estimation.

20. The computer-implemented method of claim 19, wherein:

the state of health estimation is determined by calculating at least one of a capacity fade or an impedance growth of the battery component; and the method further comprises:

determining that at least one of the capacity fade or the impedance growth of the battery component surpasses a predetermined threshold; and based on determining that at least one of the capacity fade or the impedance growth of the battery component surpasses a predetermined threshold, outputting an alert.

21. The computer-implemented method of claim 1, wherein the vehicle is an aircraft or a vertical take-off and landing aircraft.

22. The computer-implemented method of claim 1, wherein the first battery state estimation is based on measurements from a first set of sensors and the second battery state estimation is based on measurements from a second set of sensors different from the first set of sensors.

23. The computer-implemented method of claim 1, wherein changing a vehicle operation includes at least one of:

modifying a control law;

switching a flight mode;

changing an aircraft orientation; or changing an airspeed.

24. A non-transitory computer-readable medium storing instructions that, when executed by at least one processor, cause the at least one processor to:

determine a first battery state estimation of at least one battery component using a first estimation method, wherein the first battery state estimation is based on measurements of dynamic electrical information of at least one battery component, wherein the first battery state estimation includes a battery pack-level state estimation;

determine a second battery state estimation of the at least one battery component using a second estimation method different from the first estimation method, wherein the second battery state estimation includes a battery cell-level estimation; and transmit the first battery state estimation and the second battery state estimation to a vehicle processor of a vehicle, wherein the vehicle processor is configured to perform:

causing display of information based on the first battery state estimation and the second battery state estimation; and changing an operation of the vehicle based on the first battery state estimation and the second battery state estimation, wherein the first battery state estimation and the second battery state estimation each include one of: a state of temperature estimation, a state of charge estimation, a state of energy estimation, a state of power estimation, or a state of health estimation.

25. A battery management unit (BMU) for an electric vehicle, comprising:

at least one processor; and at least one non-transitory computer-readable medium containing instructions that, when executed by the at least one processor, cause the at least one processor to:

determine a first battery state estimation of at least one battery component using a first estimation method, wherein the first battery state estimation is based on measurements of dynamic electrical information of at least one battery component, wherein the first battery state estimation includes a battery pack-level state estimation;

determine a second battery state estimation of the at least one battery component using a second estimation method different from the first estimation method, wherein the second battery state estimation includes a battery cell-level estimation; and transmit the first battery state estimation and the second battery state estimation to a vehicle processor of the electric vehicle, wherein the vehicle processor is configured to perform:

causing display of information based on the first battery state estimation and the second battery state estimation; and changing an operation of the electric vehicle based on the first battery state estimation and the second battery state estimation, wherein the first battery state estimation and the second battery state estimation each include one of: a state of temperature estimation, a state of charge estimation, a state of energy estimation, a state of power estimation, or a state of health estimation.

26. An aircraft, comprising:

a battery pack including at least one battery cell;

at least one processor; and at least one non-transitory computer-readable medium containing instructions that, when executed by the at least one processor, cause the at least one processor to:

determine a first battery state estimation of at least one battery component using a first estimation method, wherein the first battery state estimation is based on measurements of dynamic electrical information of at least one battery component, wherein the first battery state estimation includes a battery pack-level state estimation;

determine a second battery state estimation of the at least one battery component using a second estimation method different from the first estimation method, wherein the second battery state estimation includes a battery cell-level estimation; and transmit the first battery state estimation and the second battery state estimation to a vehicle processor of the aircraft, wherein the vehicle processor is configured to perform:

causing display of information based on the first battery state estimation and the second battery state estimation; and changing an operation of the aircraft based on the first battery state estimation and the second battery state estimation, wherein the first battery state estimation and the second battery state estimation each include one of: a state of temperature estimation, a state of charge estimation, a state of energy estimation, a state of power estimation, or a state of health estimation.

* * * * *